(12) United States Patent
Lutz et al.

(10) Patent No.: US 8,324,986 B2
(45) Date of Patent: Dec. 4, 2012

(54) MEMS RESONATOR ARRAY STRUCTURE AND METHOD OF OPERATING AND USING SAME

(75) Inventors: Markus Lutz, Mountain View, CA (US); Zhiyu Pan, San Jose, CA (US); Aaron Partridge, Cupertino, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/040,757

(22) Filed: Mar. 4, 2011

(65) Prior Publication Data
US 2011/0199167 A1 Aug. 18, 2011

Related U.S. Application Data

(63) Continuation of application No. 12/002,894, filed on Dec. 18, 2007, now Pat. No. 7,907,035.

(51) Int. Cl.
H03H 9/48 (2006.01)
H03H 9/50 (2006.01)
H03H 9/46 (2006.01)
H03H 9/05 (2006.01)
H03H 9/09 (2006.01)

(52) U.S. Cl. ......... 333/186; 333/187; 333/197; 333/199
(58) Field of Classification Search .................. 333/186, 333/187, 197, 199
See application file for complete search history.

(56) References Cited

U.S. PATENT DOCUMENTS

| 6,628,177 | B2 | 9/2003 | Clark et al. |
| 6,940,370 | B2 | 9/2005 | Bircumshaw et al. |
| 7,145,402 | B2 | 12/2006 | Mattila et al. |
| 7,616,077 | B1 | 11/2009 | Wittwer et al. |
| 7,907,035 | B2 * | 3/2011 | Lutz et al. ..................... 333/186 |
| 2005/0140467 | A1 | 6/2005 | Duwel et al. |
| 2005/0174197 | A1 | 8/2005 | Nguyen et al. |
| 2005/0206479 | A1 | 9/2005 | Nguyen et al. |
| 2006/0114541 | A1 | 6/2006 | Van Beek |
| 2007/0001783 | A1 | 1/2007 | Lutz et al. |
| 2007/0013464 | A1 | 1/2007 | Pan et al. |
| 2007/0046398 | A1 | 3/2007 | Nguyen et al. |
| 2007/0103258 | A1 | 5/2007 | Weinstein et al. |
| 2008/0284544 | A1 | 11/2008 | Hashimura |

OTHER PUBLICATIONS

International Search Report for PCT/US08/84913, dated Feb. 13, 2009.
M.U. Demirci et al., "Mechanically Corner-Coupled Square Microresonator Array for Reduced Series Motional Resistance," Transducers '03, The 12th International Conference on Solid-State Sensors, Actuators and Microsystems, Boston, Jun. 8-12, 2003, vol. 2, pp. 955-958.

(Continued)

*Primary Examiner* — Barbara Summons
(74) *Attorney, Agent, or Firm* — Kenyon & Kenyon LLP

(57) ABSTRACT

A MEMS array structure including a plurality of bulk mode resonators may include at least one resonator coupling section disposed between the plurality of bulk mode resonators. The plurality of resonators may oscillate by expansion and/or contraction in at least one direction/dimension. The MEMS array structure may include a plurality of sense electrodes and drive electrodes spaced apart from the plurality of bulk mode resonators by a gap. Each of at least one of the plurality of bulk mode resonators may be mechanically coupled to a substrate via or approximately at a respective at least one nodal point.

34 Claims, 97 Drawing Sheets

OTHER PUBLICATIONS

S.A. Chandorkar et al., "Limits of Quality Factor in Bulk-Mode Micromechanical Resonators," MEMS 2008, IEEE 21$^{st}$ International Conference on Micro Electro Mechanical Systems, Tucson, AZ, Jan. 13-17, 2008, pp. 74-77.

S.A. Bhave et al., "Fully-Differential Poly-SiC Lamé'-Mode Resonator and Checkerboard Filter," MEMS 2005, IEEE 18$^{th}$ International Conference on Micro Electro Mechanical Systems, Jan. 30-Feb. 3, 2005, pp. 223-226.

Sheng-Shian Li et al., "A Micromechanical Parallel-Class Disk-Array Filter," MEMS 2005, IEEE 2007 Frequency Control Symposium, May 29-Jun. 1, 2007, Geneva, pp. 1356-1361.

Sheng-Shian Li et al., "An MSI Micromechanical Differential Disk-Array Filter," Transducers & Eurosensors '07, The 14$^{th}$ International Conference on Solid-State Sensors and Actuators, Lyon, France, Jun. 11-14, 2007, pp. 307-311.

M.U. Demirci et al., "A Low Impedance VHF Micromechanical Filter Using Coupled-Array Composite Resonators," Transducers '05, The 13th International Conference on Solid-State Sensors, Actuators and Microsystems, Seoul, Korea, Jun. 5-9, 2005, vol. 2, pp. 2131-2134.

* cited by examiner

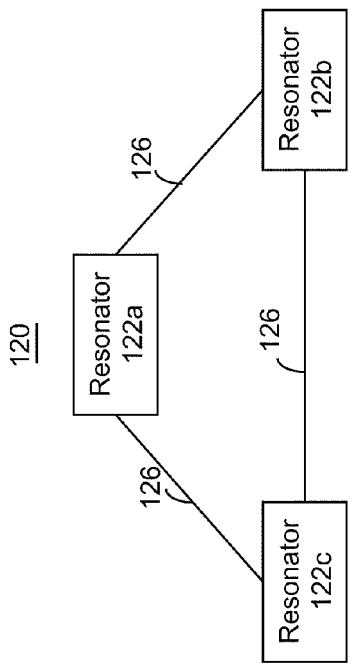
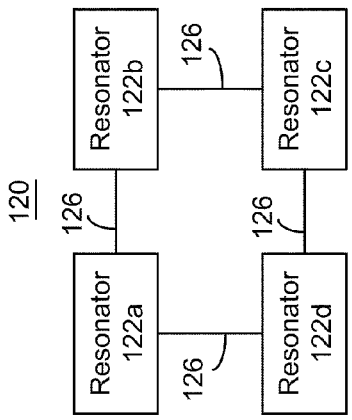
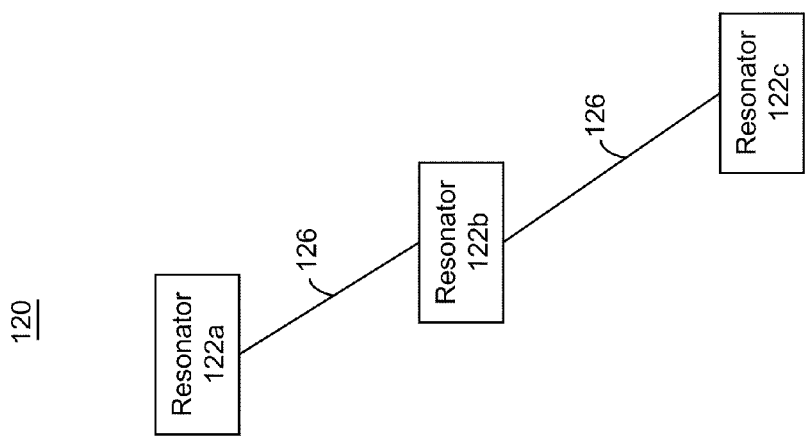

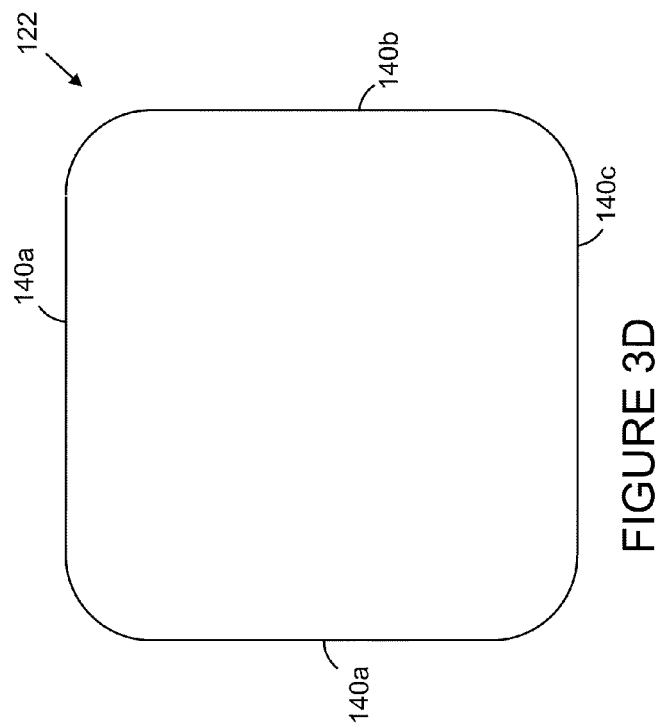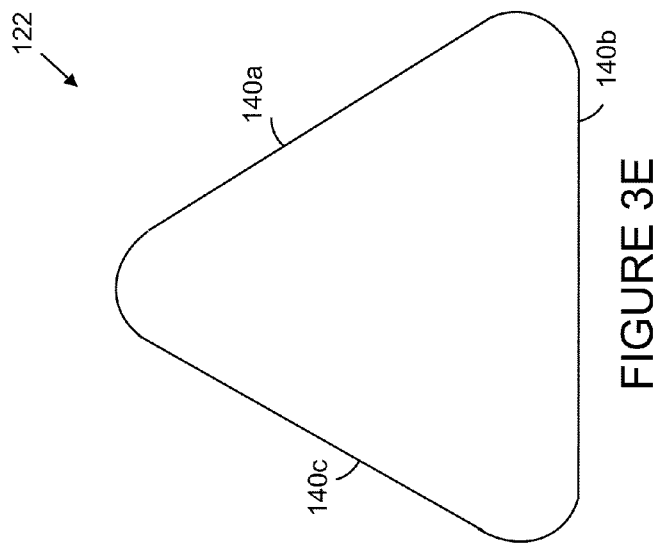

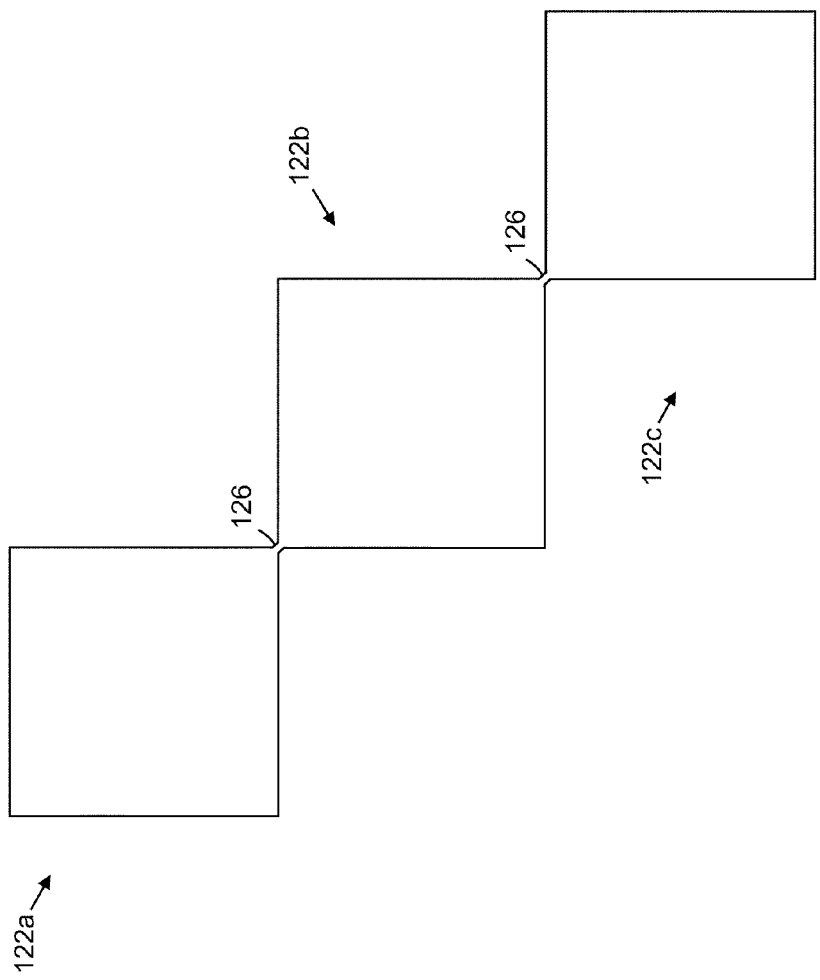

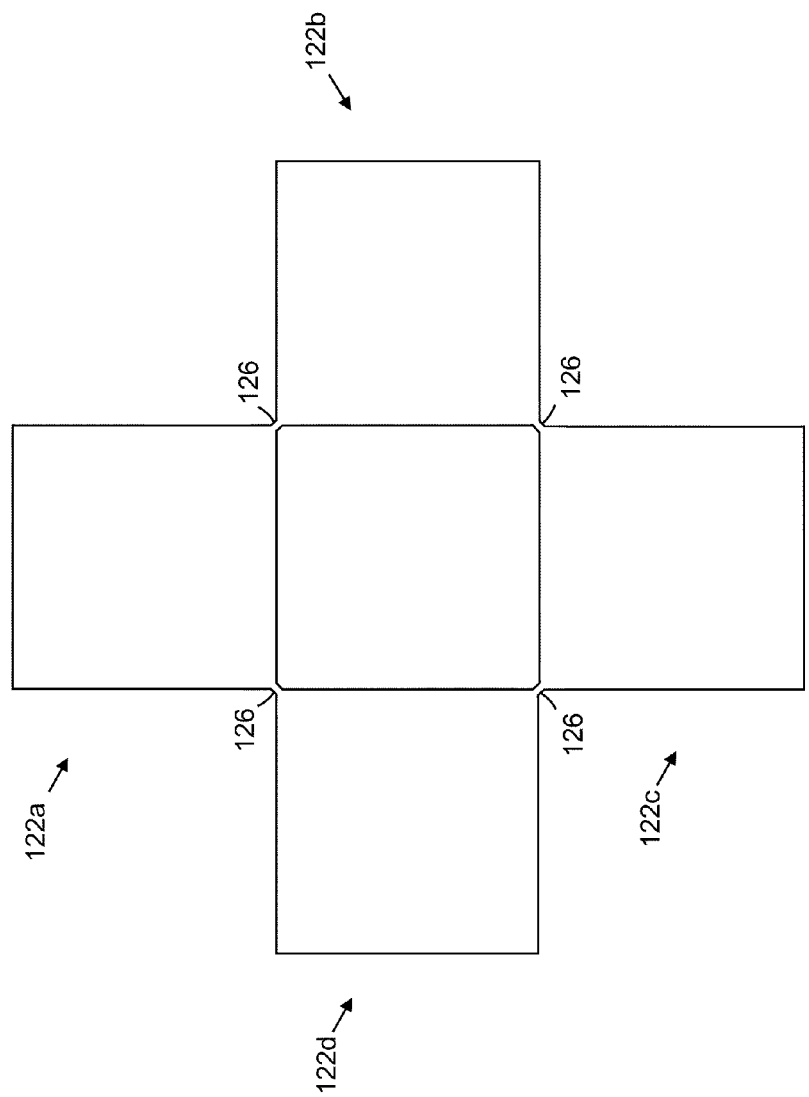

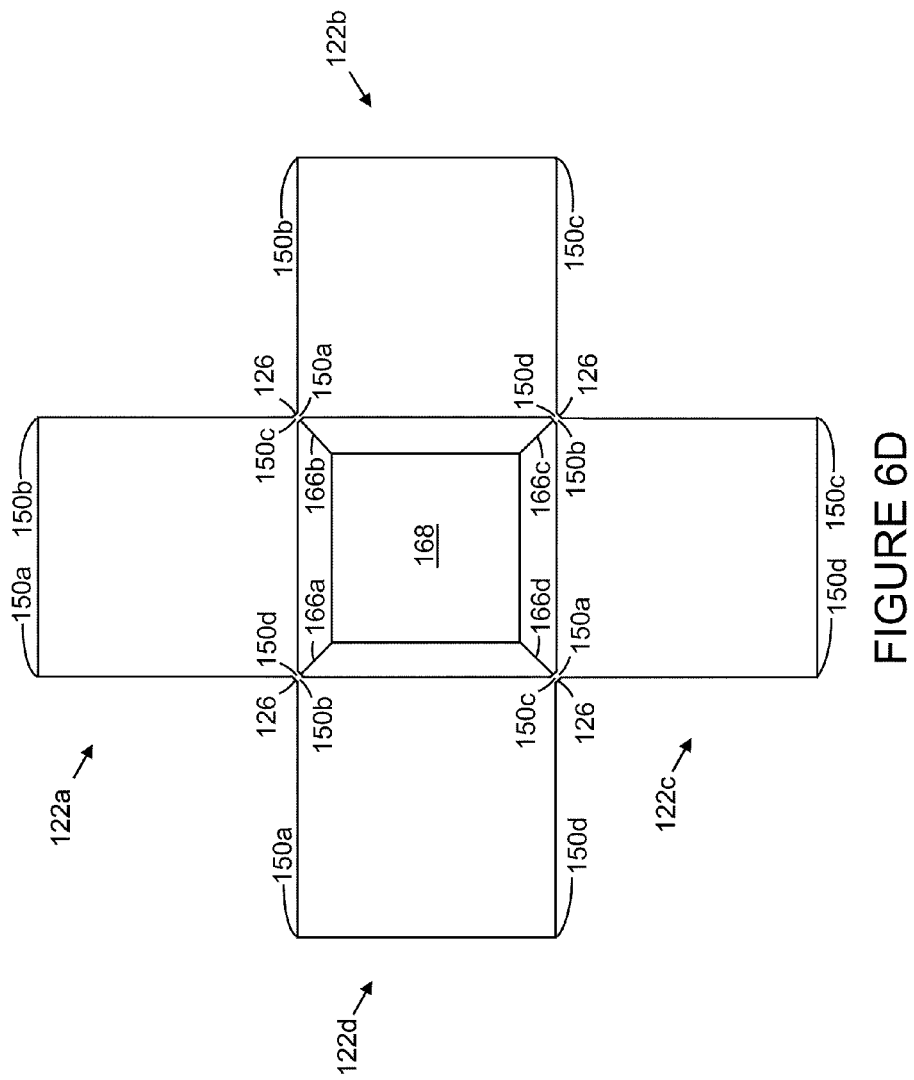

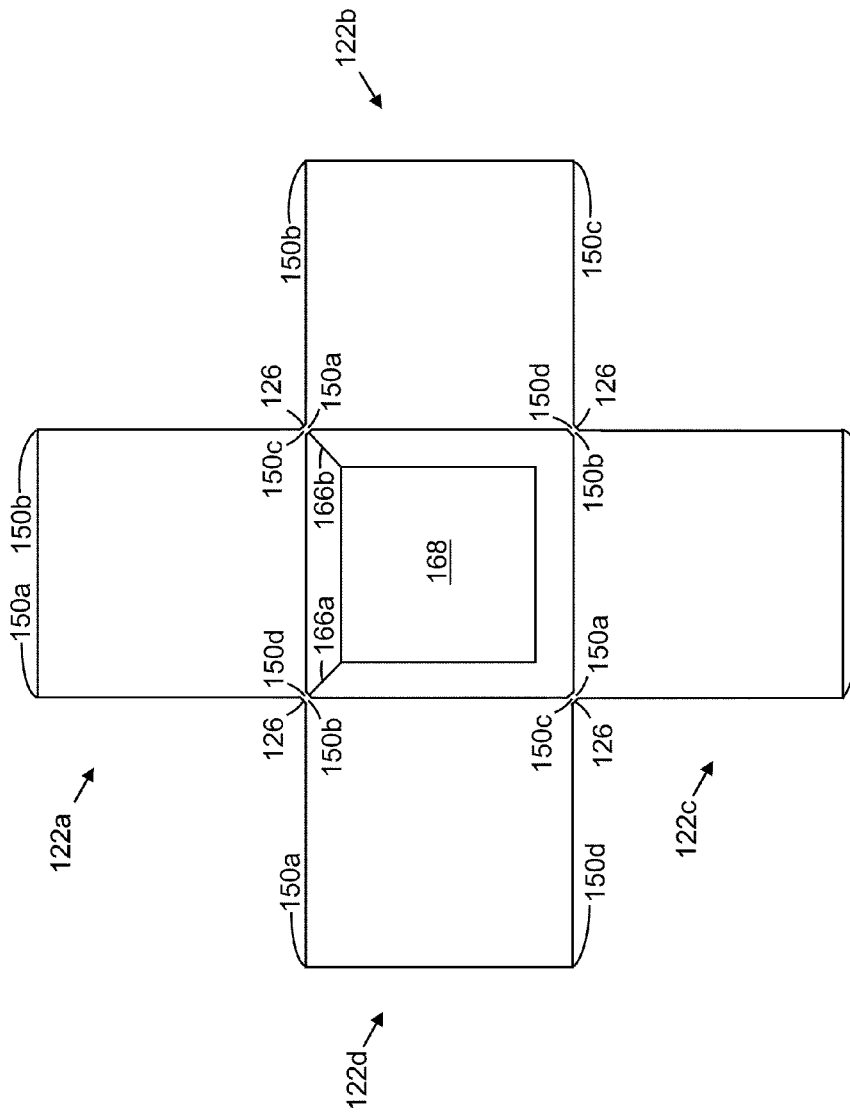

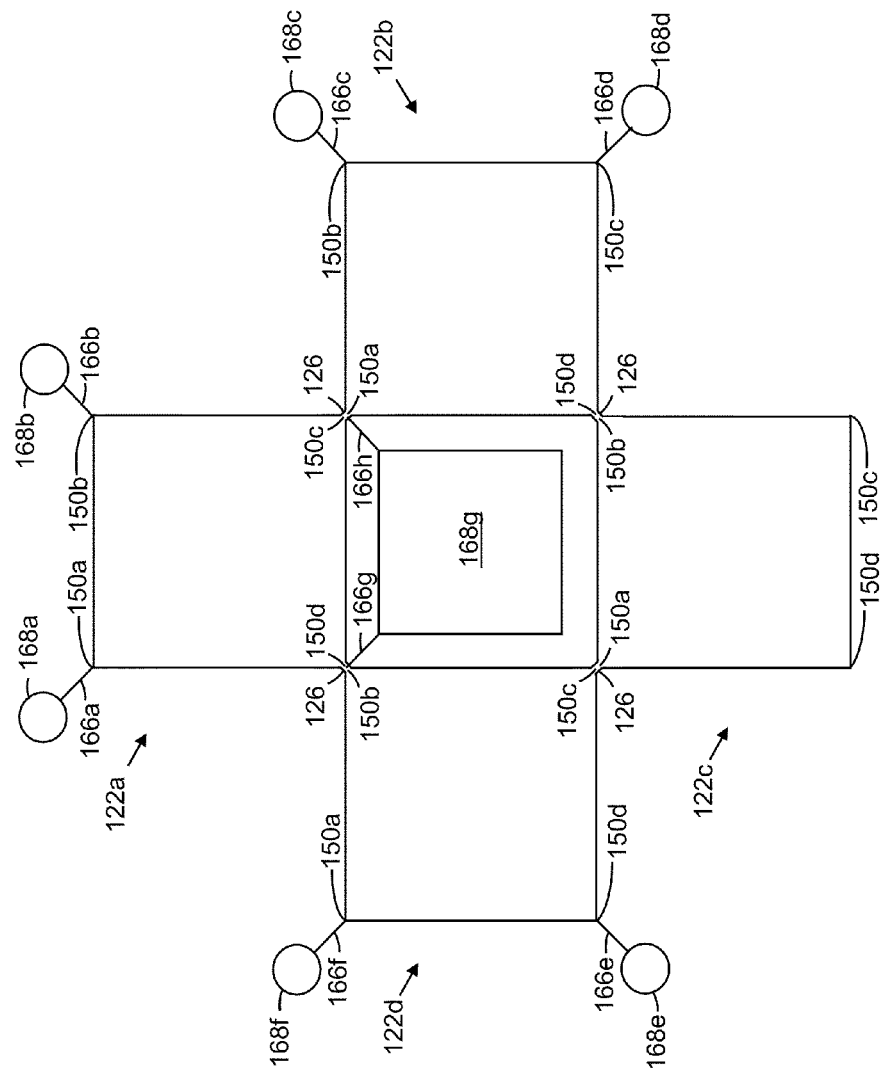

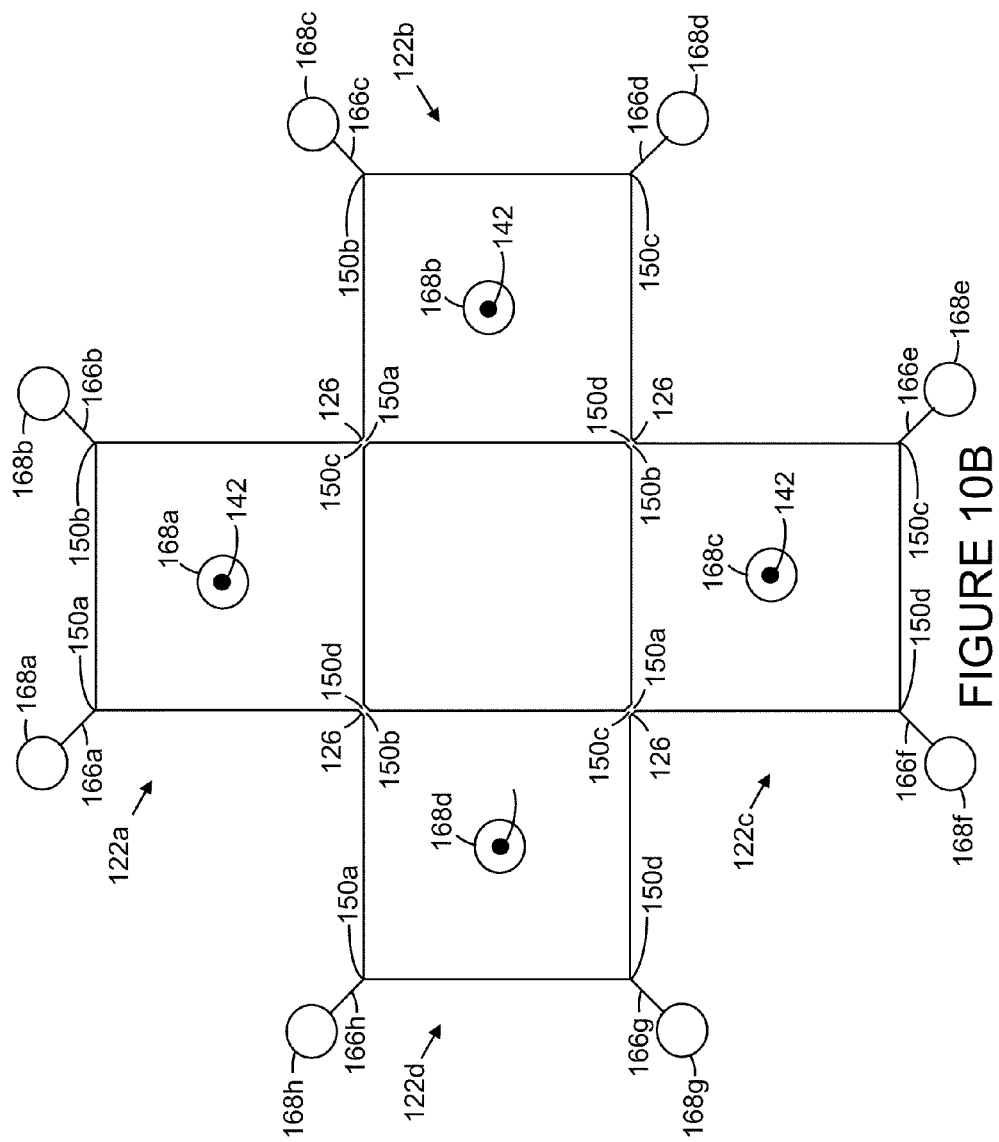

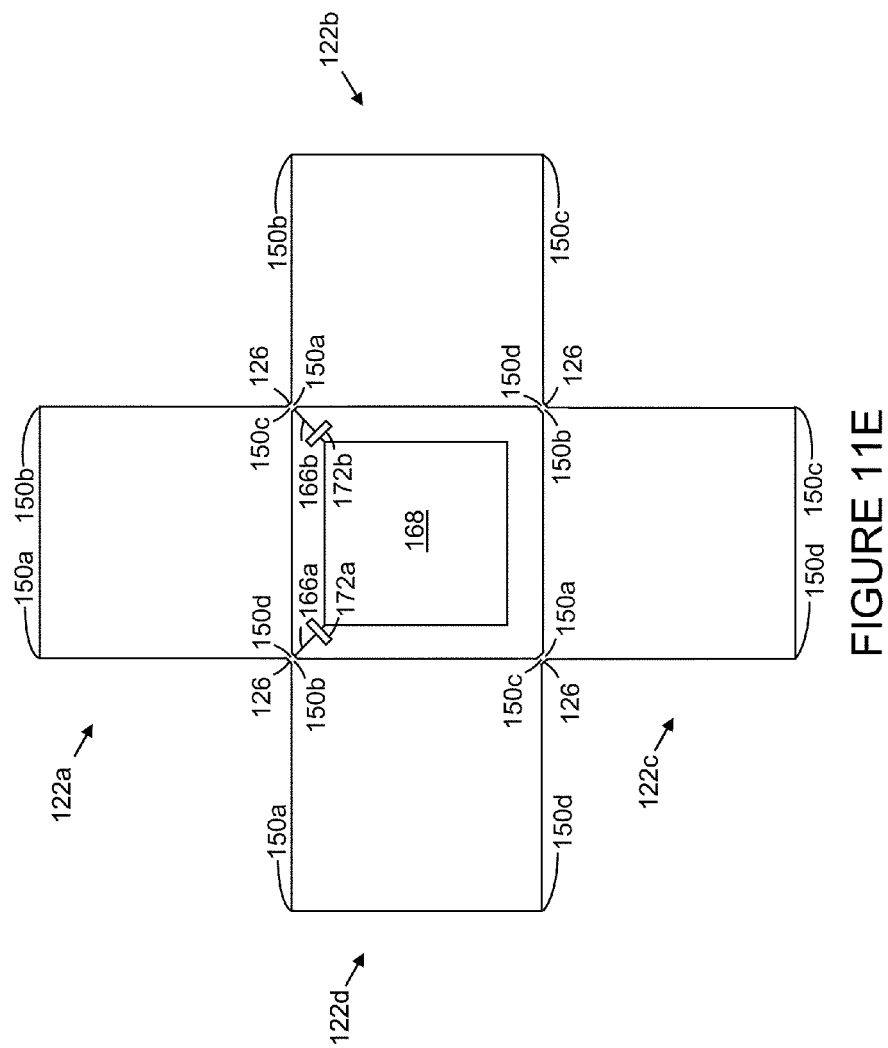

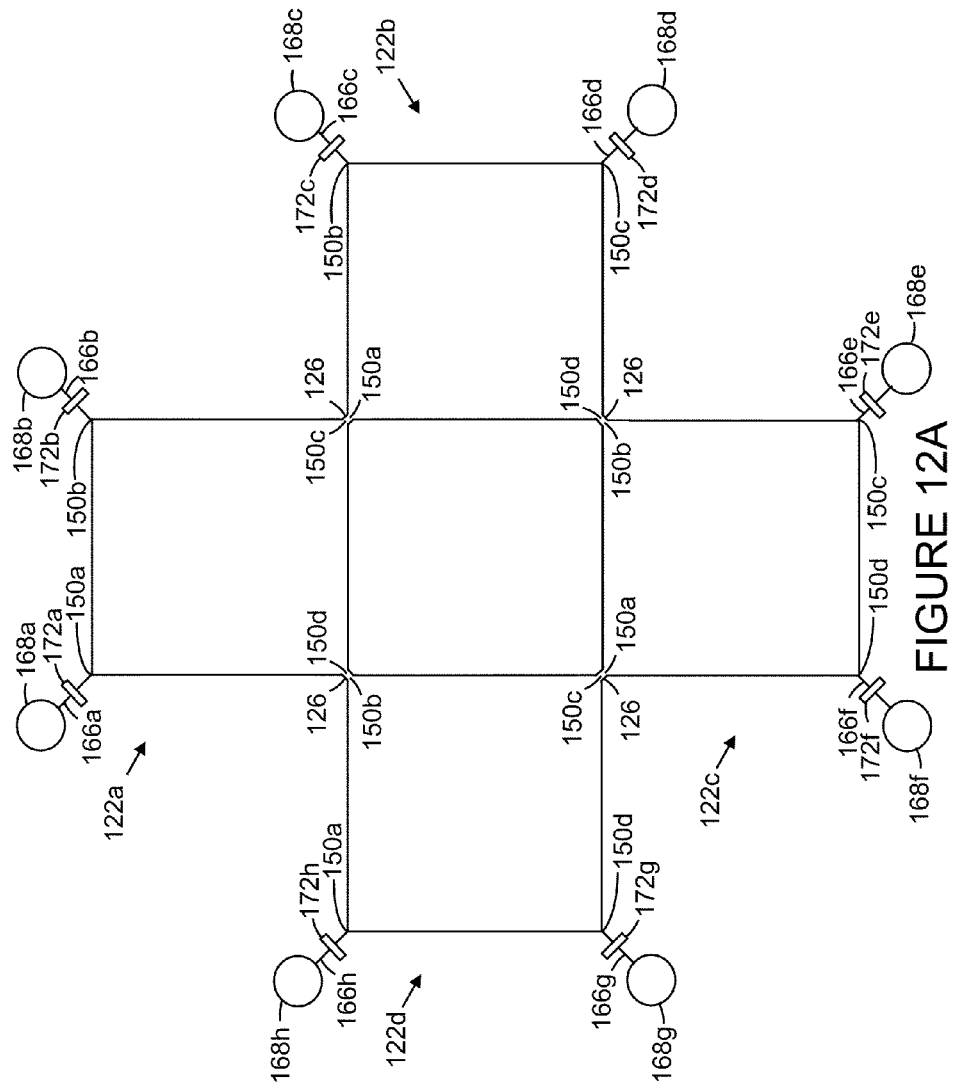

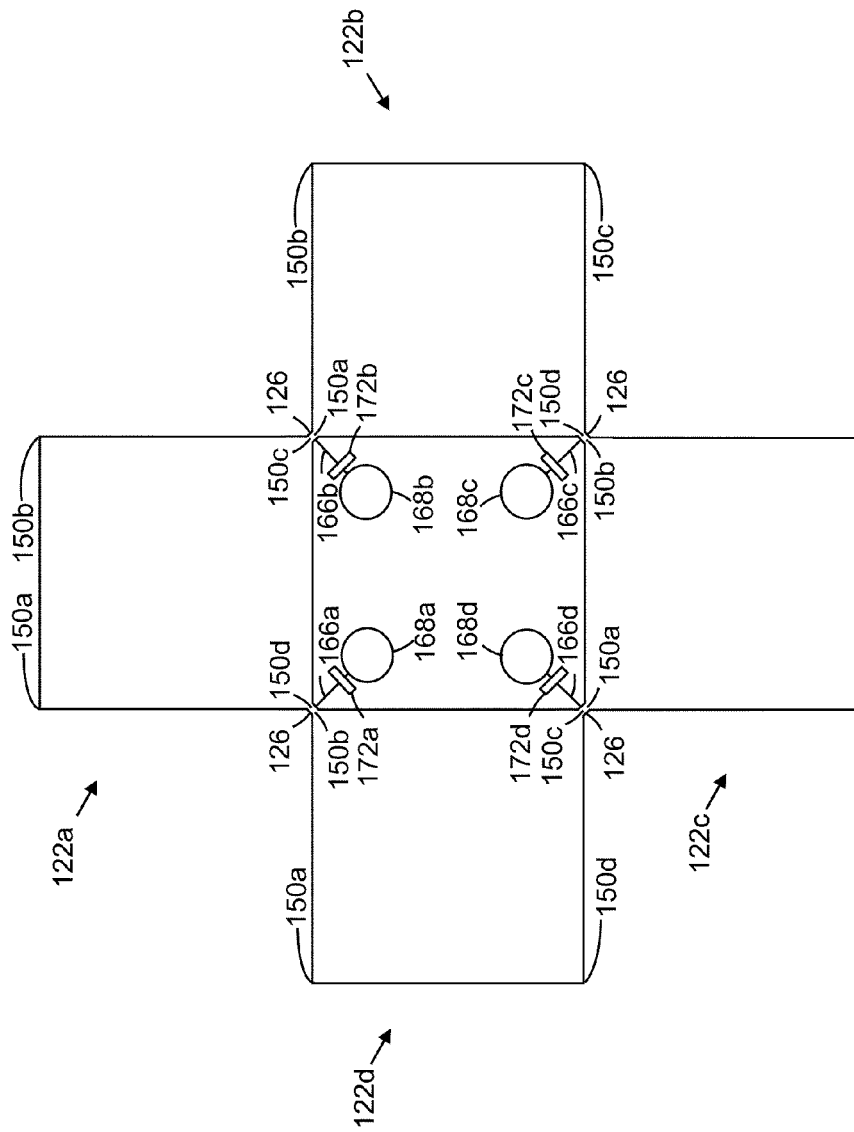

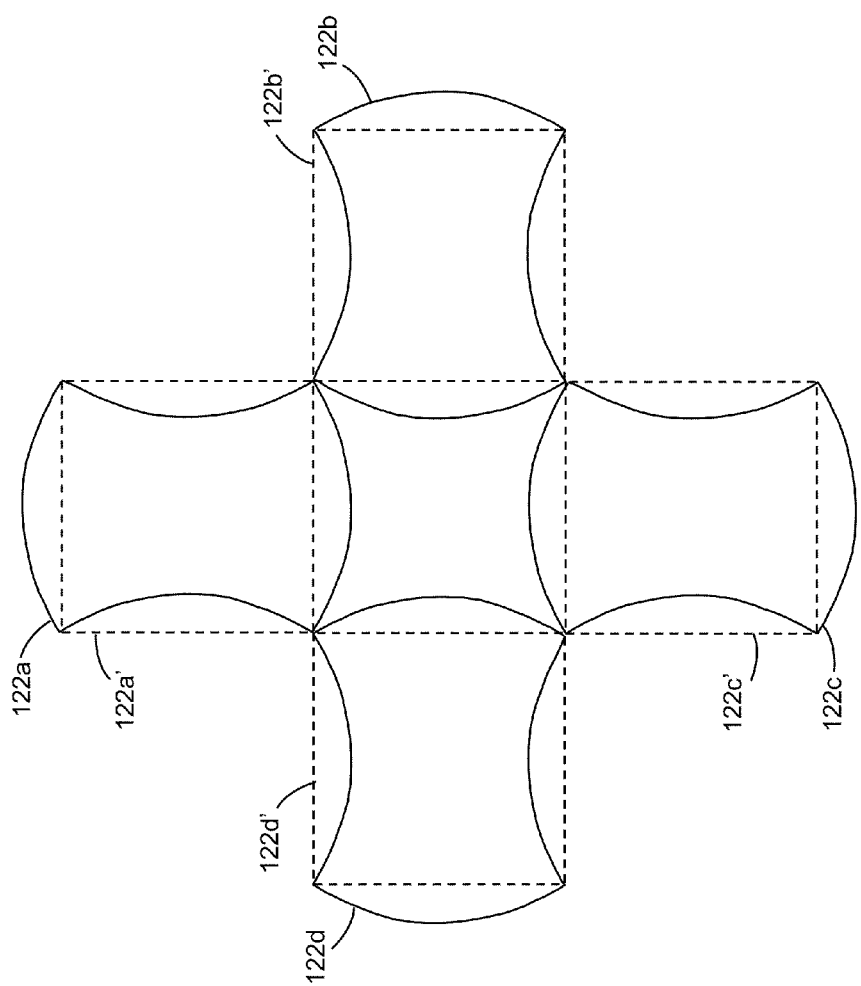

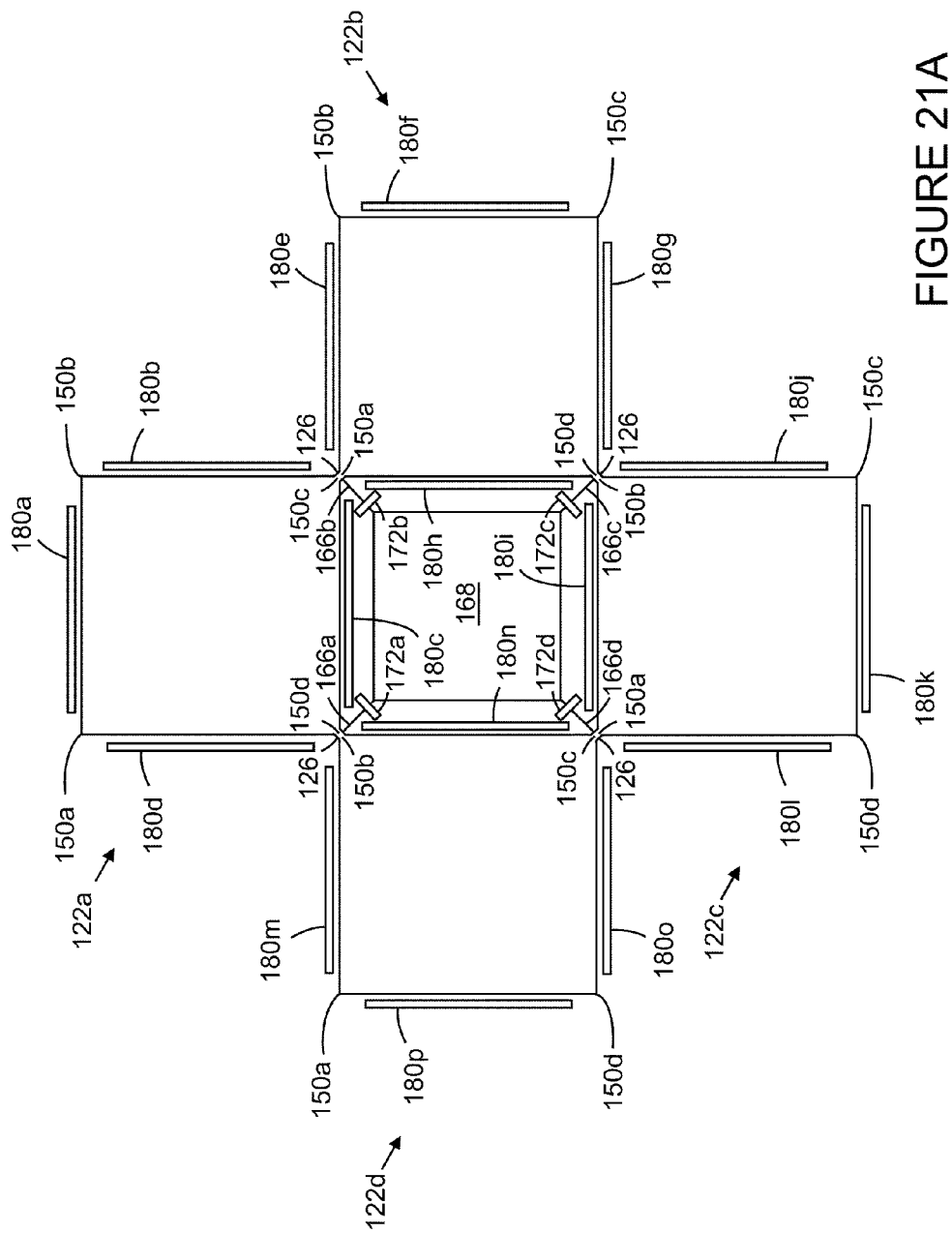

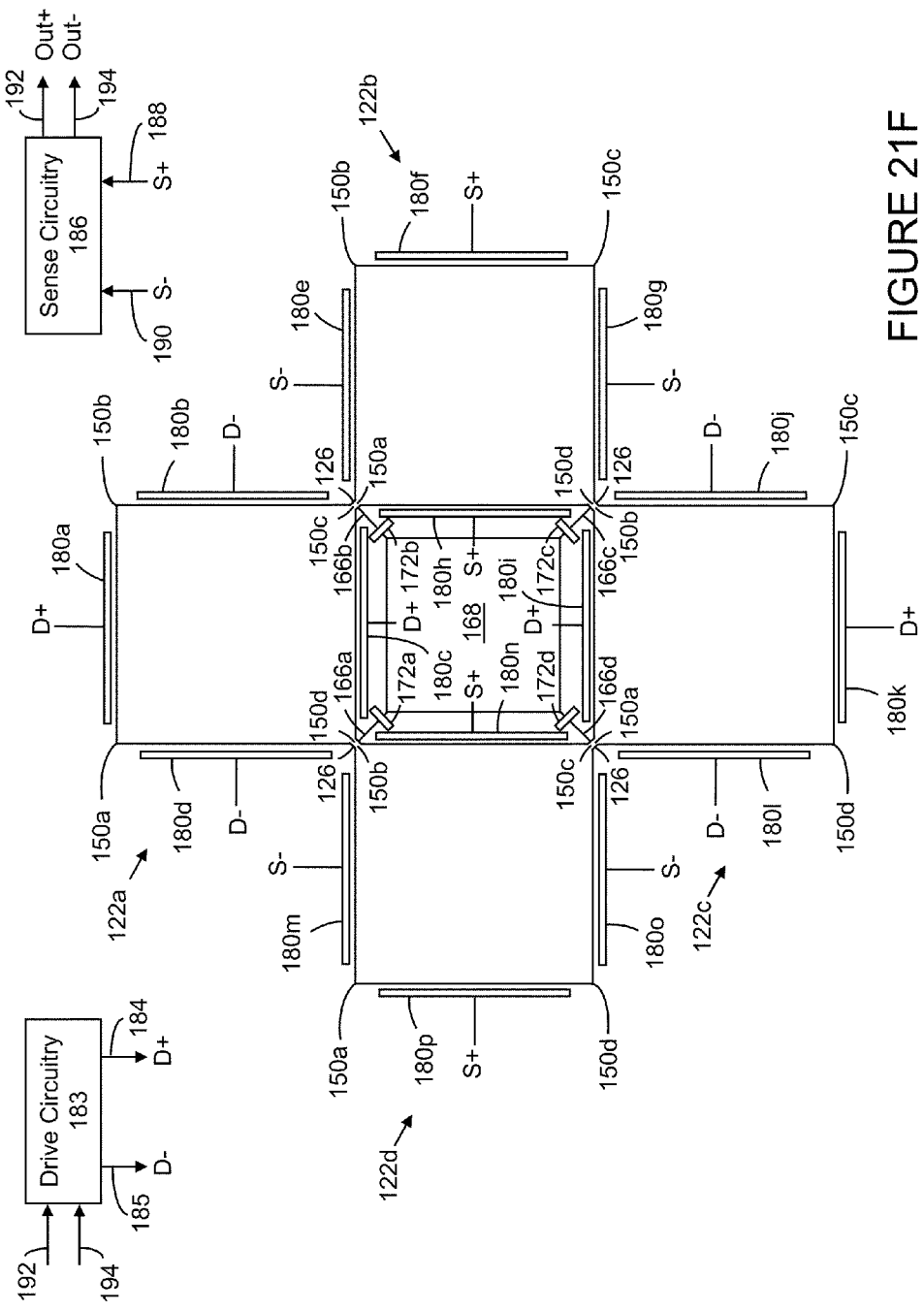

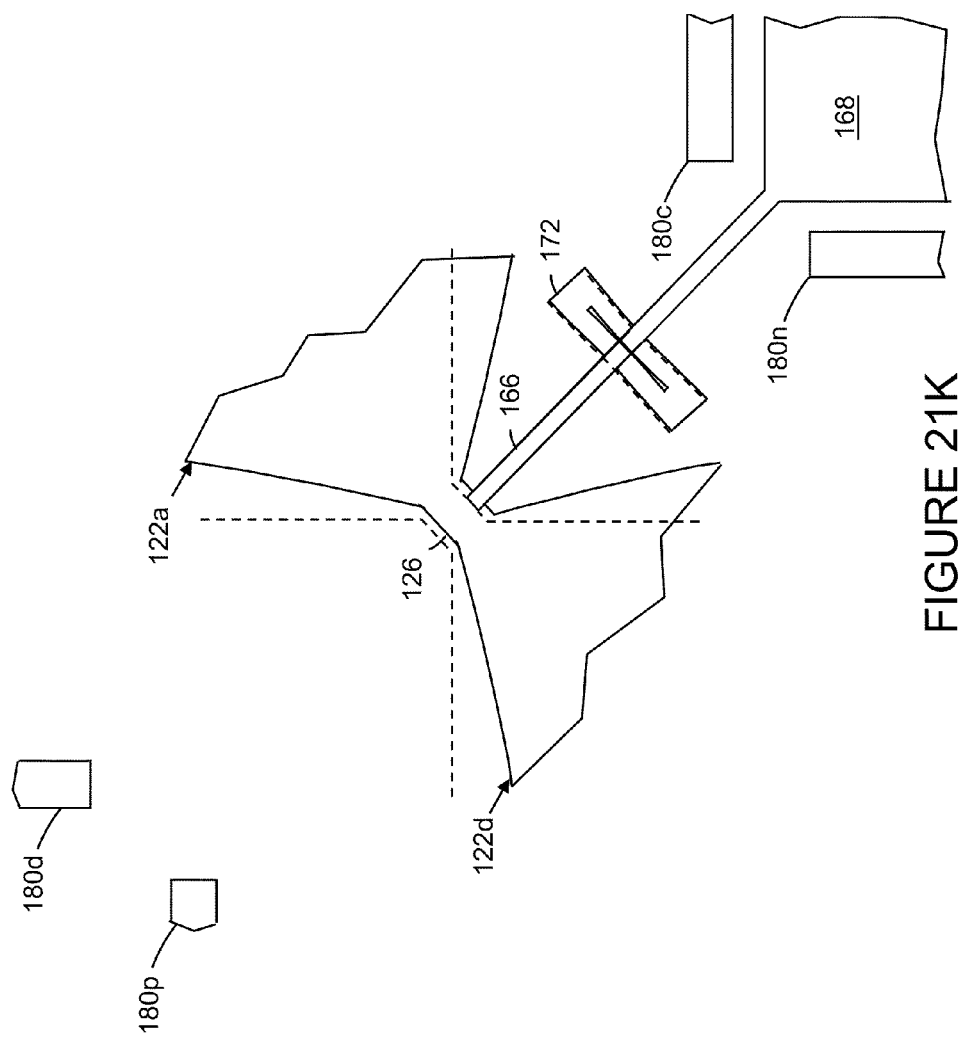

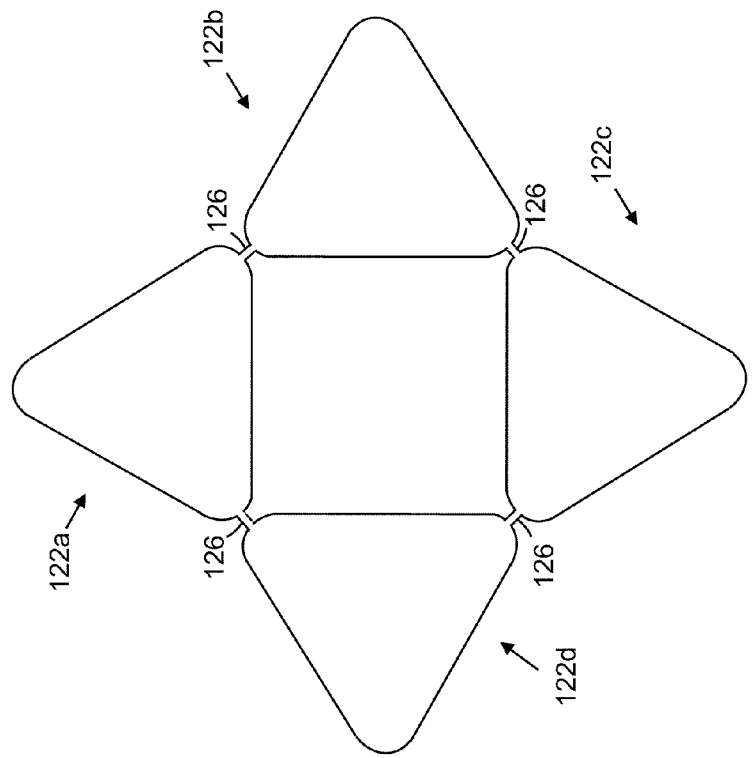
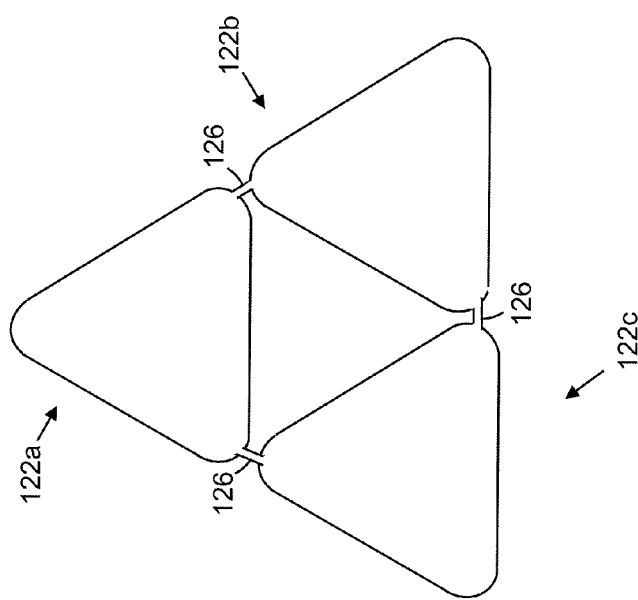
FIGURE 26B
FIGURE 26A

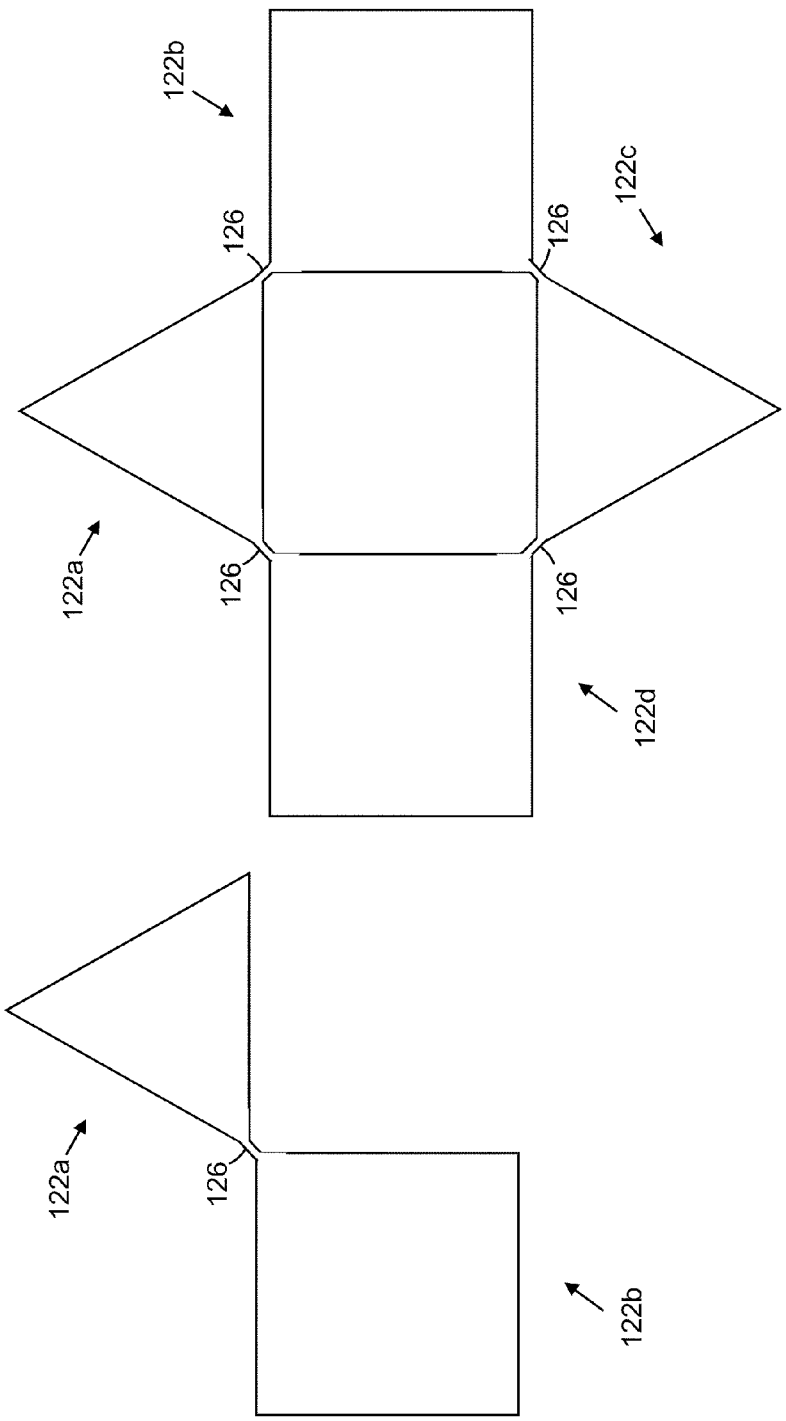

MEMS RESONATOR ARRAY STRUCTURE AND METHOD OF OPERATING AND USING SAME

CROSS-REFERENCES TO RELATED APPLICATIONS

This application is a continuation of, and claims priority under 35 U.S.C. §120 to, U.S. patent application Ser. No. 12/002,894 filed on Dec. 18, 2007, now U.S. Pat. No. 7,907,035, which is expressly incorporated by reference herein in its entirety.

BACKGROUND

This invention relates to microelectromechanical or nanoelectromechanical resonator structures and methods for use in association with resonator structures.

Generally, high quality ("Q") factor microelectromechanical resonators are regarded as a promising choice for frequency references and filters. However, to achieve higher frequencies, the dimensions of such resonators are being scaled smaller. The smaller dimensions have led to reduced driving and/or sensing capacitances, which can in turn adversely impact signal strength, stability and/or the "Q" factor of the resonator.

There is a need for a resonator structure that helps overcome one, some or all of the shortcomings described above.

SUMMARY OF THE INVENTION

There are many inventions described and illustrated herein, as well as many aspects and embodiments of those inventions. This Summary discusses some of the inventions described and claimed herein. By no means is this Summary of the Invention is not exhaustive of the scope of the present inventions.

In one aspect, the present invention includes a MEMS array structure, where the MEMS array structure comprises a plurality of bulk mode resonators including a first bulk mode resonator and a second bulk mode resonator; and at least one resonator coupling section including a first resonator coupling section disposed between the first bulk mode resonator and the second bulk mode resonator to mechanically couple the first bulk mode resonator and the second bulk mode resonator.

In one embodiment, the first bulk mode resonator includes a nodal point, the second bulk mode resonator includes a nodal point, and the first resonator coupling section is disposed between the nodal point of the first bulk mode resonator and the nodal point of the second bulk mode resonator.

In another embodiment, the first bulk mode resonator and the second bulk mode resonator are coupled to a common substrate anchor.

In another embodiment, the MEMS array structure further includes at least one anchor coupling section including a first anchor coupling section disposed between the at least one resonator coupling section and the substrate anchor.

In another embodiment, the first anchor coupling section includes at least one stress/strain relief mechanism.

In another embodiment, the first anchor coupling section includes a spring.

In another embodiment, the plurality of bulk mode resonators have a first state of oscillation in which the first bulk mode resonator is contracted, at least in part, in at least one of a first direction and a second direction, and expanded, at least in part, in at least one of a third direction and a fourth direction, and in which the second bulk mode resonator is expanded, at least in part, in at least one of the first direction and the second direction, and contracted, at least in part, in at least one of the third direction and the fourth direction, wherein the second direction is opposite the first direction, and the fourth direction is opposite the third direction.

In another embodiment, the third direction and the fourth direction are perpendicular to the first direction and the second direction.

In another embodiment, the plurality of bulk mode resonators have a second state of oscillation in which the first bulk mode resonator is expanded, at least in part, in at least one of the first direction and the second direction, and contracted, at least in part, in at least one of the third direction and the fourth direction, and the second bulk mode resonator is contracted, at least in part, in at least one of the first direction and the second direction, and expanded, at least in part, in at least one of the third direction and the fourth direction.

In another embodiment, oscillation by the first bulk mode resonator induces oscillation by the second bulk mode resonator.

In another embodiment, the MEMS array structure further includes a plurality of sense electrodes to provide a sense signal indicative of oscillation of at least one of the plurality of bulk mode resonators.

In another embodiment, the sense signal comprises a differential sense signal.

In another embodiment, the MEMS array structure further includes sense circuitry to receive the sense signal and to provide an output signal in response thereto.

In another embodiment, the output signal comprises a differential output signal.

In another embodiment, the MEMS array structure further includes a plurality of drive electrodes to receive a drive signal to induce at least one of the plurality of bulk mode resonators to oscillate.

In another embodiment, the MEMS array structure further includes drive circuitry to receive the output signal and to provide the drive signal in response thereto.

In another embodiment, the drive signal comprises a differential drive signal.

In another embodiment, the MEMS array structure further includes a first plurality of electrodes and a second plurality of electrodes, the first plurality of electrodes being disposed juxtaposed the first bulk mode resonator, the second plurality of electrodes being disposed juxtaposed the second bulk mode resonator.

In another embodiment, the first plurality of electrodes includes at least one electrode to sense oscillation of the first bulk mode resonator.

In another embodiment, the second plurality of electrodes includes at least one electrode to receive a drive signal to induce oscillation of the second bulk mode resonator.

In another embodiment, the first plurality of electrodes includes a first electrode, a second electrode, a third electrode and a fourth electrode and the second plurality of electrodes includes a first electrode, a second electrode, a third electrode and a fourth electrode.

In another embodiment, the first bulk mode resonator includes a first outer surface and a second outer surface, the second bulk mode resonator includes a first outer surface and a second outer surface, the first plurality of electrodes includes a first electrode and a second electrode, the first electrode of the first plurality of electrodes being disposed juxtaposed the first outer surface of the first bulk mode resonator, the second electrode of the first plurality of electrodes being disposed juxtaposed the second outer surface of the first bulk mode resonator, the second plurality of electrodes includes a first electrode and a second electrode, the first electrode of the second plurality of electrodes being disposed juxtaposed the first outer surface of the second bulk mode resonator, the second electrode of the second plurality of electrodes being disposed juxtaposed the second outer surface of the second bulk mode resonator.

In another embodiment, the first bulk mode resonator further includes a third outer surface, the second bulk mode resonator further includes a third outer surface, the first plurality of electrodes further includes a third electrode disposed juxtaposed the third outer surface of the first bulk mode resonator, the second plurality of electrodes further includes a third electrode disposed juxtaposed the third outer surface of the second bulk mode resonator.

In another embodiment, the first bulk mode resonator further includes a fourth outer surface, the second bulk mode resonator further includes a fourth outer surface, the first plurality of electrodes further including a fourth electrode disposed juxtaposed the fourth outer surface of the first bulk mode resonator, the second plurality of electrodes further including a fourth electrode disposed juxtaposed the fourth outer surface of the second bulk mode resonator.

In another embodiment, the MEMS array structure further includes a third bulk mode resonator and a third plurality of electrodes, the third plurality of electrodes being disposed juxtaposed the third bulk mode resonator, the at least one resonator coupling section further including a second resonator coupling section disposed between the second bulk mode resonator and the third bulk mode resonator to mechanically couple the second bulk mode resonator and the third bulk mode resonator.

In another embodiment, the third plurality of electrodes includes a first electrode, a second electrode, a third electrode and a fourth electrode.

In another embodiment, the MEMS array structure further includes a fourth bulk mode resonator and a fourth plurality of electrodes, the fourth plurality of electrodes being disposed juxtaposed the fourth bulk mode resonator, the at least one resonator coupling section further including a third resonator coupling section disposed between the third bulk mode resonator and the fourth bulk mode resonator to mechanically couple the third bulk mode resonator and the fourth bulk mode resonator.

In another embodiment, the fourth plurality of electrodes includes a first electrode, a second electrode, a third electrode and a fourth electrode.

In another embodiment, the first plurality of electrodes includes a first electrode and a second electrode, the first electrode and the first bulk mode resonator defining a capacitance, the capacitance defined by the first electrode and the first bulk mode resonator having a first magnitude if the first bulk mode resonator is in a first state of oscillation and a second magnitude if the first bulk mode resonator is in a second state of oscillation.

In another aspect, the present invention includes a MEMS array structure, where the MEMS array structure includes a plurality of resonators including a first resonator and a second resonator, wherein the plurality of resonators have a first state of oscillation in which the first resonator is contracted, at least in part, in at least one of a first direction and a second direction, and expanded, at least in part, in at least one of a third direction and a fourth direction, and in which the second resonator is expanded, at least in part, in at least one of the first direction and the second direction, and contracted, at least in part, in at least one of the third direction and the fourth direction, wherein the second direction is opposite the first direction, and the fourth direction is opposite the third direction; and at least one resonator coupling section including a first resonator coupling section disposed between the first resonator and the second resonator to mechanically couple the first resonator and the second resonator.

In one embodiment, the third direction and the fourth direction are perpendicular to the first direction and the second direction.

In another embodiment, the plurality of resonators have a second state of oscillation in which the first resonator is expanded, at least in part, in at least one of the first direction and the second direction, and contracted, at least in part, in at least one of the third direction and the fourth direction, and the second resonator is contracted, at least in part, in at least one of the first direction and the second direction, and expanded, at least in part, in at least one of the third direction and the fourth direction.

In another embodiment, the third direction and the fourth direction are perpendicular to the first direction and the second direction.

In another aspect, the present invention includes a MEMS array structure, where the MEMS array structure includes a plurality of bulk mode resonators including a first bulk mode resonator and a second bulk mode resonator; a first plurality of electrodes disposed juxtaposed the first bulk mode resonator; and a second plurality of electrodes disposed juxtaposed the second bulk mode resonator, wherein at least one electrode of the first plurality of electrodes is coupled to at least one electrode of the second plurality of electrodes.

In one embodiment, the MEMS array structure further includes circuitry coupled to the at least one electrode of the first plurality of electrodes and the at least one electrode of the second plurality of electrodes.

In another aspect, the present invention includes a MEMS array structure, wherein the MEMS array structure includes a plurality of bulk mode resonators including a first bulk mode resonator and a second bulk mode resonator; a first plurality of electrodes to receive a drive signal and induce oscillation of the first bulk mode resonator; and a second plurality of electrodes to receive the drive signal and induce oscillation of the second bulk mode resonator, wherein at least one electrode of the first plurality of electrodes is coupled to at least one electrode of the second plurality of electrodes.

In one embodiment, the MEMS array structure further includes drive circuitry to provide the drive signal.

In another aspect, the present invention includes a MEMS array structure, wherein the MEMS array structure includes a plurality of bulk mode resonators including a first bulk mode resonator and a second bulk mode resonator; a first plurality of electrodes to sense oscillation of the first bulk mode resonator; a second plurality of electrodes to sense oscillation of the second bulk mode resonator; and wherein at least one of the first plurality of electrodes is coupled to at least one of the second plurality of electrodes.

In one embodiment, the MEMS array structure further includes sense circuitry, coupled to the first plurality of electrodes and the second plurality of electrodes, to provide an output signal.

Again, there are many inventions described and illustrated herein. This Summary of the Invention is not exhaustive of the scope of the present inventions. Moreover, this Summary of the Invention is not intended to be limiting of the invention and should not be interpreted in that manner. Thus, while certain aspects and embodiments have been described and/or outlined in this Summary of the Invention, it should be understood that the present inventions are not limited to such aspects, embodiments, description and/or outline.

It should be understood that all aspects and/or embodiments of the present invention that are not described in this Summary of the Invention and do not appear in the claims that follow are preserved for presentation in one or more divisional/continuation patent applications.

In addition, although various features, attributes and advantages have been described in this Summary of the Invention and/or are apparent in light thereof, it should be understood that such features, attributes and advantages are not required, and except where stated otherwise, need not be present in the aspects and/or the embodiments of the present invention.

Moreover, various objects, features and/or advantages of one or more aspects and/or embodiments of the present invention will become more apparent from the following detailed description and the accompanying drawings. It should be understood however, that any such objects, features, and/or advantages are not required, and except where stated otherwise, need not be present in the aspects and/or embodiments of the present invention.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

FIG. 2E is a schematic representation of another embodiment of a MEMS resonator array, according to certain aspects of the present inventions, wherein the bulk mode resonators of the array are arranged in a linear array;

FIG. 2F is a schematic representation of another embodiment of a MEMS resonator array, according to certain aspects of the present inventions, wherein the bulk mode resonators of the array are arranged in a triangular array;

FIG. 2G is a schematic representation of another embodiment of a MEMS resonator array, according to certain aspects of the present inventions, wherein the bulk mode resonators of the array are arranged in 2×2 array;

FIG. 3D is a top view representation of another embodiment of a bulk mode resonator, in an at rest state, that may be employed in the MEMS resonator arrays of FIGS. 2A-2G, according to certain aspects of the present inventions;

FIG. 3E is a top view representation of another embodiment of a bulk mode resonator, in an at rest state, that may be employed in the MEMS resonator arrays of FIGS. 2A-2G, according to certain aspects of the present inventions;

FIG. 3F is a side view of one embodiment of the resonator of FIG. 3C, in an at rest state, according to certain aspects of the present inventions;

FIGS. 4A-4E illustrate top view representations of various embodiments of MEMS resonator arrays each having a plurality of bulk mode resonators that may each be the same as or similar to the bulk mode resonator of FIGS. 3A-3B, and one or more resonator coupling sections to mechanically couple each of the plurality of resonators to one or more other resonators of the plurality of bulk mode resonators, according to certain aspects of the present inventions;

FIG. 6D illustrates a top view of one embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a substrate anchor employed in another anchoring technique and/or configuration to mechanically couple one or more of the plurality of resonators to one or more substrate anchors, according to certain aspects of present the inventions;

FIG. 6E illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a substrate anchor employed in another anchoring technique and/or configuration to mechanically couple one or more of the plurality of resonators to one or more substrate anchors, according to certain aspects of present the inventions;

FIG. 8B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in anchoring technique and/or configuration to mechanically couple one or more of the plurality of resonators to one or more substrate anchors, according to certain aspects of present the inventions;

FIG. 10B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, according to certain aspects of present the inventions;

FIG. 11E illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling section and a substrate anchor employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions;

FIG. 12A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling section and a plurality of substrate anchors employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions;

FIG. 12C illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions;

FIG. 19B is a top view of the plurality of bulk mode resonators of the resonator array of FIG. 19A, with the plurality of bulk mode resonators shown in a first state of oscillation, wherein in relation to an at rest state, the first and third bulk mode resonators are contracted in at least one of first and second directions and expanded in at least one of third and fourth directions, and the second and fourth bulk mode resonators are expanded in at least one of first and second directions and contracted in at least one of third and fourth directions, according to certain aspects of the present inventions;

FIG. 21A is a top view of one embodiment of a resonator array including a plurality of bulk mode resonators, a plurality of resonator coupling sections and a plurality of electrodes that may be the same as or similar to the plurality of bulk mode resonators, the plurality of resonator coupling sections and the plurality of electrodes, respectively, of the resonator array illustrated in FIG. 18C, and further including a plurality of anchor coupling sections and a substrate anchor that may be the same as or similar to the plurality of anchor coupling sections and the substrate anchor, respectively, of the resonator array illustrated in FIG. 11D, according to certain aspects of the present inventions;

FIG. 21F is a top view of one embodiment of a resonator array including a plurality of bulk mode resonators, a plurality of resonator coupling sections, a plurality of electrodes, drive circuitry and sense circuitry that may be the same as or similar to the plurality of bulk mode resonators, the plurality of resonator coupling sections, the plurality of electrodes, drive circuitry and sense circuitry, respectively, of the resonator array illustrated in FIG. 19I, and further including a plurality of anchor coupling sections and a substrate anchor that may be the same as or similar to the plurality of anchor coupling sections and the substrate anchor, respectively, of the resonator array illustrated in FIG. 11D, according to certain aspects of the present inventions;

FIG. 21K illustrates an enlarged top view of a portion of one embodiment of the resonator array of FIG. 21J including the first and fourth bulk mode resonators, one of the resonator coupling sections, one of the anchor coupling sections and the anchor, with the portion of the resonator array shown in a state corresponding to the first state of oscillation illustrated in FIGS. 19B-19D, wherein in relation to an at rest state, the first bulk mode resonator is contracted in at least one of first and second directions and expanded in at least one of third and fourth directions, and the fourth bulk mode resonator is expanded in at least one of first and second directions and contracted in at least one of third and fourth directions, according to certain aspects of present the inventions;

FIGS. 26A-26B illustrate top views of various embodiments of MEMS resonator arrays each having a plurality of bulk mode resonators that may be the same as or similar to the bulk mode resonator of FIG. 3E, and one or more resonator coupling sections to mechanically couple each of the plurality of resonators to one or more other resonators of the plurality of bulk mode resonators, according to certain aspects of the present inventions;

FIG. 27A illustrates a top view of one embodiment of a MEMS resonator array having a plurality of resonators each mechanically coupled to one or more adjacent resonators of the plurality of resonators, wherein the plurality of resonators includes a first resonator having a first shape and a second resonator having a second shape different than the first shape and mechanically coupled to the first resonator, according to certain aspects of the present inventions;

FIG. 27B illustrates a top view of one embodiment of a MEMS resonator array having a plurality of resonators each mechanically coupled to one or more adjacent resonators of the plurality of resonators, wherein the plurality of resonators includes two resonators having a first shape and two resonators having a second shape different than the first shape and mechanically coupled to the two resonators having the first shape, according to certain aspects of the present inventions;

DETAILED DESCRIPTION

Figure 1A:
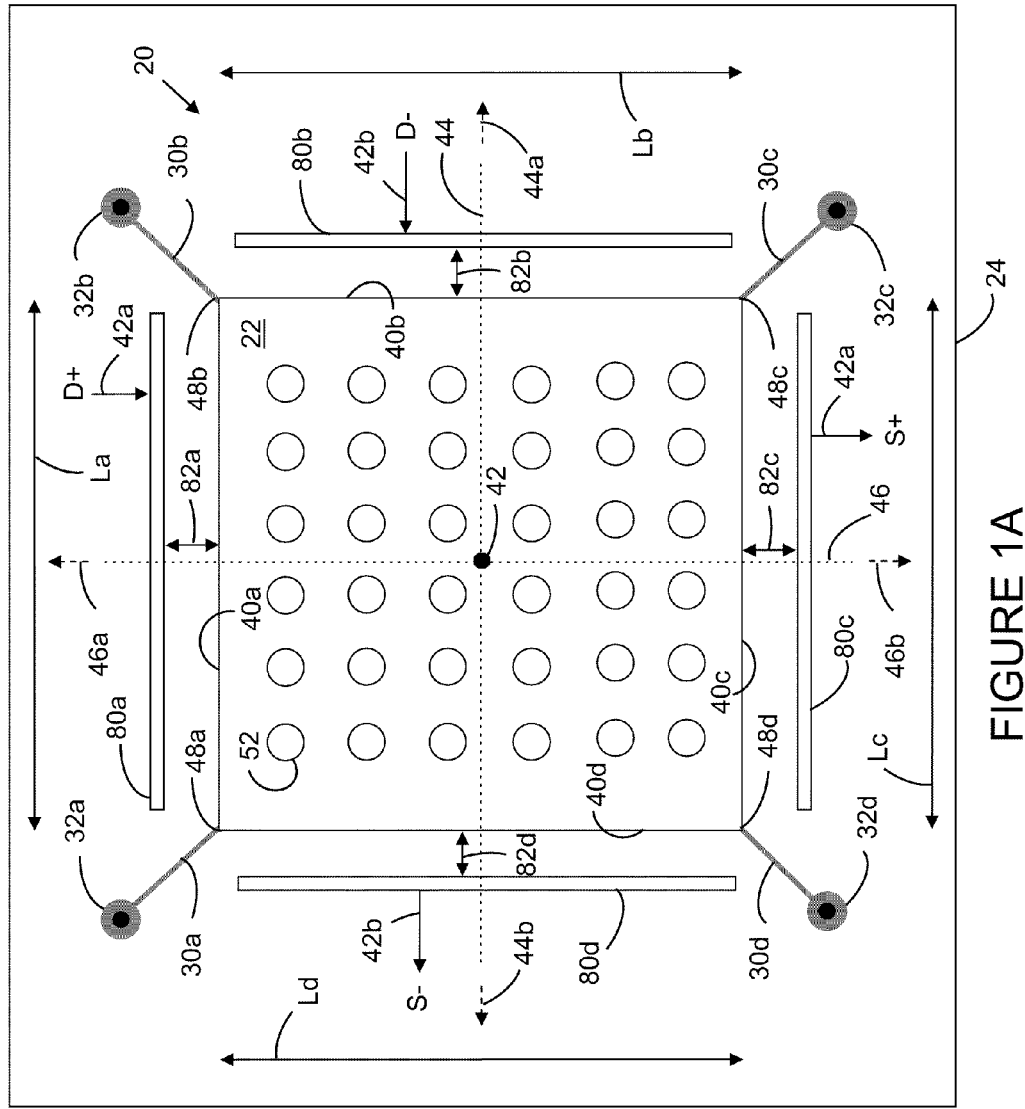
FIG. 1A is a top view representation of one type of microelectromechanical resonator device.

There are many inventions described and illustrated herein, as well as many aspects and embodiments of those inventions.

In one aspect, the present invention is directed to a microelectromechanical system that includes a plurality of bulk mode resonators arranged in an array. Each of the bulk mode resonators is mechanically coupled to one or more (i.e., one, some or all) other bulk mode resonators in the array. In one embodiment, each resonator of the array is mechanically coupled to at least one other bulk mode resonator by a resonator coupling section. For example, a resonator coupling section may be disposed between two or more resonators of the array to mechanically couple the two or more resonators. In one embodiment, each bulk mode resonator of the array is mechanically coupled to one or more other bulk mode resonators that are adjacent to the bulk mode resonator. In one embodiment, each bulk mode resonator of the array is mechanically coupled to all of the bulk mode resonators that are adjacent to the bulk mode resonator. In such embodiment, each resonator of the array may be mechanically coupled to each adjacent resonator by one or more resonator coupling sections.

In one embodiment, the plurality of bulk mode resonators includes a plurality of bulk mode resonators arranged in an N×M (where N and M are integers) array. In one embodiment, the plurality of bulk mode resonators includes two mechanically coupled, bulk mode resonators arranged in a linear array. In another embodiment, the plurality of bulk mode resonators includes three mechanically coupled, bulk mode resonators arranged in an L shape array. In another embodiment, the plurality of bulk mode resonators includes three mechanically coupled, bulk mode resonators arranged in a triangular shape array. In another embodiment, the plurality of bulk mode resonators includes four mechanically coupled, bulk mode resonators arranged in a 2×2 array. In another embodiment, the plurality of bulk mode resonators includes four mechanically coupled, bulk mode resonators arranged in a square shape array.

In one embodiment, one or more bulk mode resonators in the array has a square and/or rectangular shape. In another embodiment, one or more resonators in the array has a triangular shape. In another embodiment, one or more resonators in the array has a rounded square and/or rounded rectangular shape. In another embodiment, one or more resonators in the array has a rounded triangular shape.

In some embodiments, when induced and/or during operation, each resonator of the array oscillates in a bulk acoustic mode. In some embodiments, when induced and/or during operation, each resonator oscillates in a bulk acoustic mode that includes expansion and contraction. In some embodiments, each resonator of the array exhibits the same or substantially the same expansion and contraction. Moreover, in some embodiments, when induced or during operation, each resonator oscillates or vibrates at the same or substantially the same frequency.

In some embodiments, one, some or all resonators of the array includes one or more nodal points or areas (i.e., portions of the resonator that are stationary, experience little movement, and/or are substantially stationary in one or more degrees of freedom (whether from a rotational and/or translational perspective) during oscillation of the resonator. In some embodiments, one or more of the nodal points may be suitable and/or located at one or more points or areas of the resonator to allow the resonator and/or array to be mechanically coupled to the substrate through such nodal point or points such that energy loss into the substrate may be minimized, limited and/or reduced, thereby enhancing the Q-factor of the resonator and/or the array. Notably, such a configuration may help minimize and/or reduce communication of stress and/or strain between the resonating mass of one or more resonators of the array and the substrate.

In some embodiments, one or more of the resonators are mechanically coupled to the substrate by one or more anchor coupling sections mechanically coupled between one or more nodes and the substrate.

In addition, in some embodiments, each resonator has a relatively stable or fixed center of gravity during oscillation. In this way, the resonators may reduce and/or avoid energy loss and the array may have a higher Q-factor.

Notably, the present inventions are described in the context of microelectromechanical systems. The present inventions, however, are not limited in this regard. Rather, the inventions described herein are applicable to, for example, nanoelectromechanical systems. Thus, the present inventions are pertinent to microelectromechanical and nanoelectromechanical (herein collectively "MEMS" unless specifically noted to the contrary) systems, for example, gyroscopes, resonators, and/or accelerometers, implementing one or more of the present inventions.

Figure 1B:
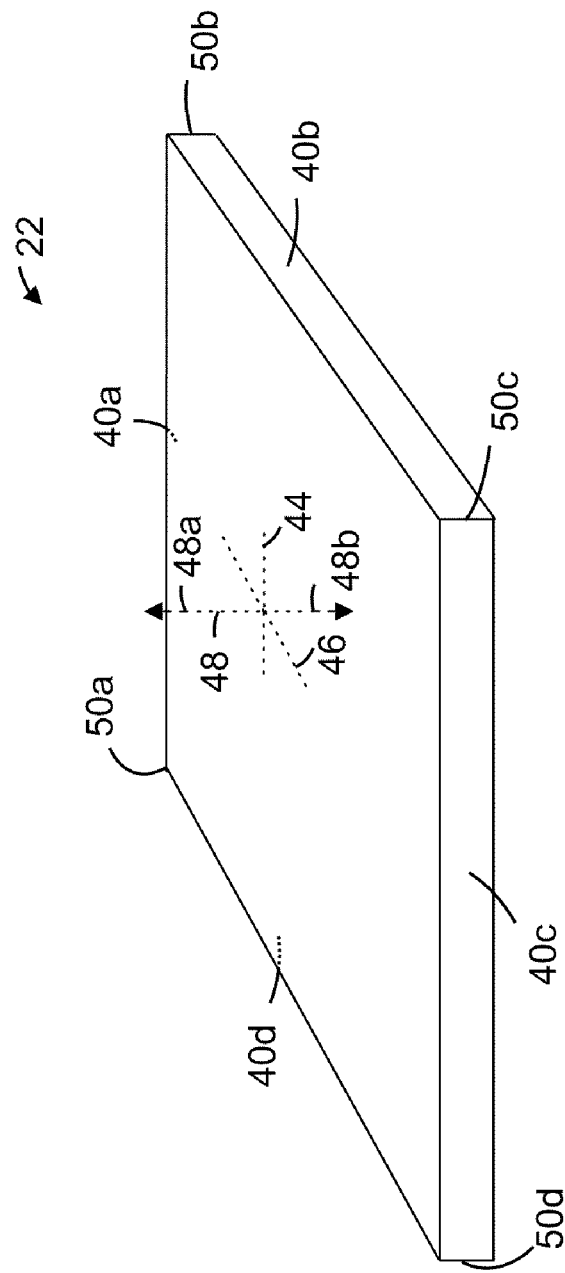
FIG. 1B is a schematic perspective representation of one type of bulk mode resonator, in an at rest state, which may be employed in the resonator device of FIG. 1A.

There are many types of well known microelectromechanical resonator devices. FIG. 1A illustrates a top view of one such type of resonator device 20. This resonator device 20 includes a bulk mode resonator 22 anchored to a substrate 24 via couplings 30*a*-30*d* and anchors 32*a*-32*d*. The resonator 22 has four outer surfaces 40*a*-40*d* having lengths La-Ld, respectively. Resonator 22 may further have a center 42. In the non-operating (at rest) state, that resonator 22 has a generally square shape as shown. In such state, surfaces 40*a*, 40*c* are parallel to a first reference axis 44 that extends in first and second directions 44*a*, 44*b*. Surfaces 40*b*, 40*d* are parallel to a second reference axis 46 that extends in third and fourth directions 46*a*, 46*b*. Each of the surfaces 40*a*-40*d* is also parallel or substantially parallel to a third reference axis 48 (FIG. 1B), which extends in fifth and sixth directions 48*a*, 48*b* (FIG. 1B).

The four outer surfaces 40*a*-40*d* define four corners 50*a*-50*d*. For example, a first end of fourth outer surface 40*d* and a first end of first outer surface 40*a* define a first corner 50*a*. A second end of first outer surface 40*a* and a first end of second outer surface 40*b* define a second corner 50*b*. A second end of second outer surface 40*b* and a first end of third outer surface 40*c* define a third corner 50*c*. A second end of third outer surface 40*c* and a second end of fourth outer surface 40*d* define a fourth corner 50*d*.

Resonator 22 further includes a plurality of openings 52. During fabrication of resonator system 20, openings 52 facilitate etching and/or removal of sacrificial material from beneath the resonator 22 so that the resonator 22 is free to oscillator as set forth below.

The resonator further includes four electrodes 80*a*-80*d*. First electrode 80*a* is spaced apart from outer surface 40*a* by a gap 82*a*. Second electrode 80*b* is spaced apart from outer surface 40*b* by a gap 82*b*. Third electrode 80*c* is spaced apart from outer surface 40*c* by a gap 82*c*. Fourth electrode 80*d* is spaced apart from outer surface 40*d* by a gap 82*d*.

The electrodes 80a-80d and the resonator 22 collectively define four capacitances. The first electrode 80a and resonator 22 define a first capacitance. The second electrode 80b and resonator 22 define a second capacitance. The third electrode 80c and resonator 22 define a third capacitance. The fourth electrode 80d and resonator 22 define a fourth capacitance.

As further described below, two of the electrodes, e.g., first and second electrodes 80a, 80b, are employed as drive electrodes. The other two electrodes, e.g., third and fourth electrodes 80c, 80d, are employed as sense electrodes. In the non-operating, at rest state, resonator 22 is centered between the four electrodes 80a-80d.

In operation, the drive electrodes, e.g., first and second electrodes 80a, 80b, receive a differential excitation signal that includes first and second signals, D+, D−, via signal lines 42a, 42b, respectively. The excitation signal induces a time varying electrostatic force that causes the resonator 22 to oscillate.

As further described below, the resonator 22 oscillates in plane, in a bulk acoustic mode (often referred to as "bulk mode"). The oscillation may be linear or substantially linear, e.g., described by linear, stationary differential equations of motion. If resonator 22 has a high "Q" (quality factor) factor, the shape of resonator 22 during oscillation depends primarily on the characteristics of the resonator 22.

Unless stated otherwise, the phrase "oscillate in a bulk mode" may mean to oscillate, at least primarily, by expansion and/or contraction rather than by bending. For example, the solid may contract in at least one direction/dimension (for example, the "x" direction) and expand in at least one direction/dimension (for example, the "y" and/or "z" directions). The solid may expand in at least one direction/dimension (for example, the "x" direction) and contract in at least one direction/dimension (for example, the "y" and/or "z" directions). Indeed, the sold may contraction in all directions/dimensions (providing very high frequency).

Notably, although the discussion below describes contraction/expansion in one direction, the resonator may expand and/or contract in more than one direction/dimension (for example, simultaneously in the "x" and "y" directions). In this embodiment, the resonator is driven in a frequency mode which might be advantageous for lower noise at high frequencies. This mode may be "selected" by driving the appropriate electrodes.

In some embodiments, at least ninety percent of the oscillation is a result of expansion and/or contraction rather than bending, and more preferably all or substantially all of the oscillation is a result of expansion and/or contraction rather than bending. Similarly, unless stated otherwise, the phrase "bulk mode resonator" means a resonator that oscillates in a bulk mode.

Figure 1C:
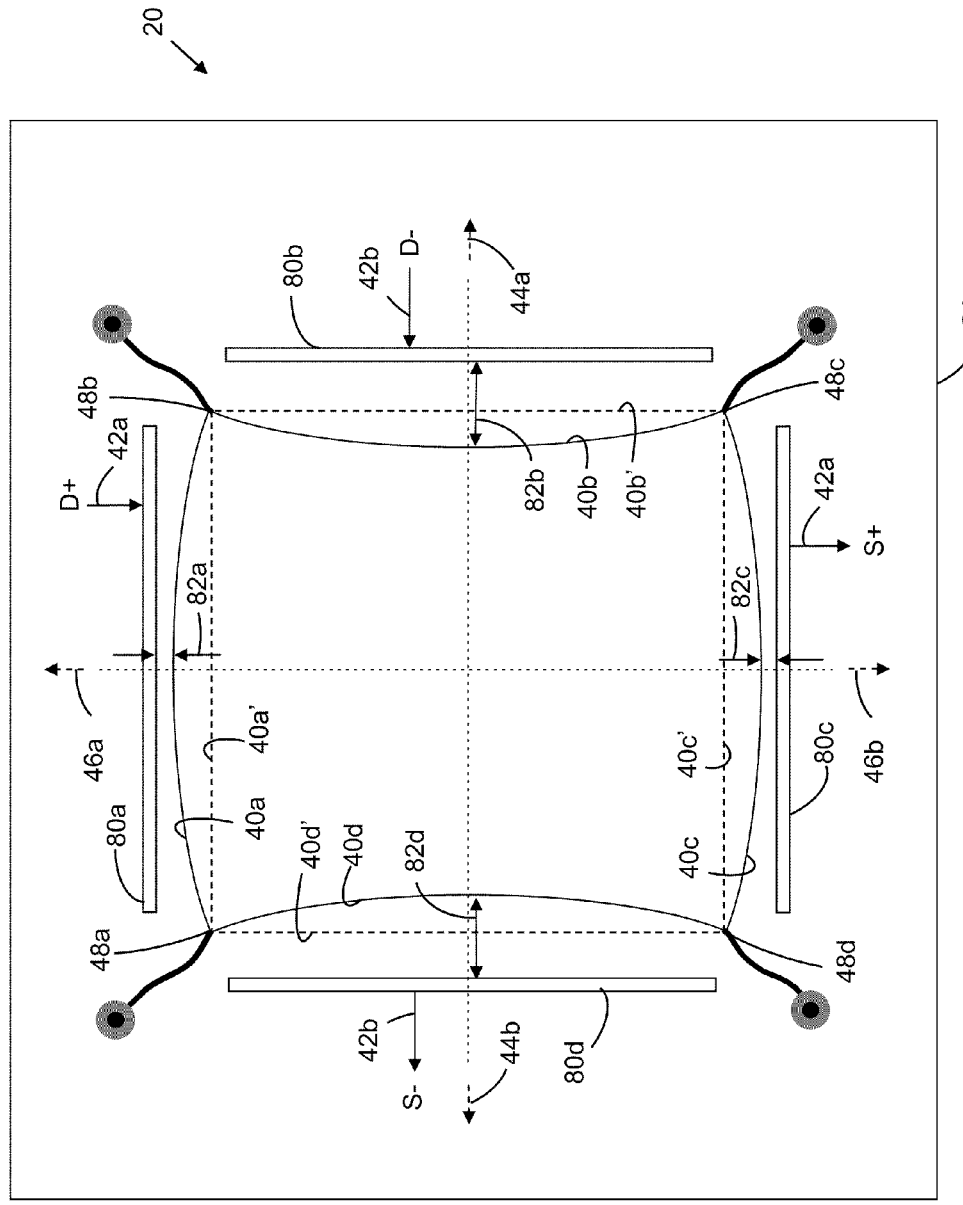
FIG. 1C is a top view representation of the resonator device of FIG. 1A, with the resonator in a first state of oscillation, wherein in relation to an at rest state, the resonator is contracted along a first axis and expanded along a second axis.

With reference to FIG. 1C, in a first phase of oscillation, resonator 22 (i) contracts in first and second directions 44a, 44b and (ii) expands in third and fourth directions 46a, 46b, resulting in a first state for resonator 22. The contraction in first and second directions 44a, 44b causes an increase in the size of the second and fourth gaps 82b, 82d. The expansion in the third and fourth directions 46a, 46b causes a decrease in the size of the first and third gaps 82a, 82c. For comparison, dotted lines 40a'-40d' show the shape and position, of surfaces 40a-40d, respectively, in the at rest state.

Figure 1D:
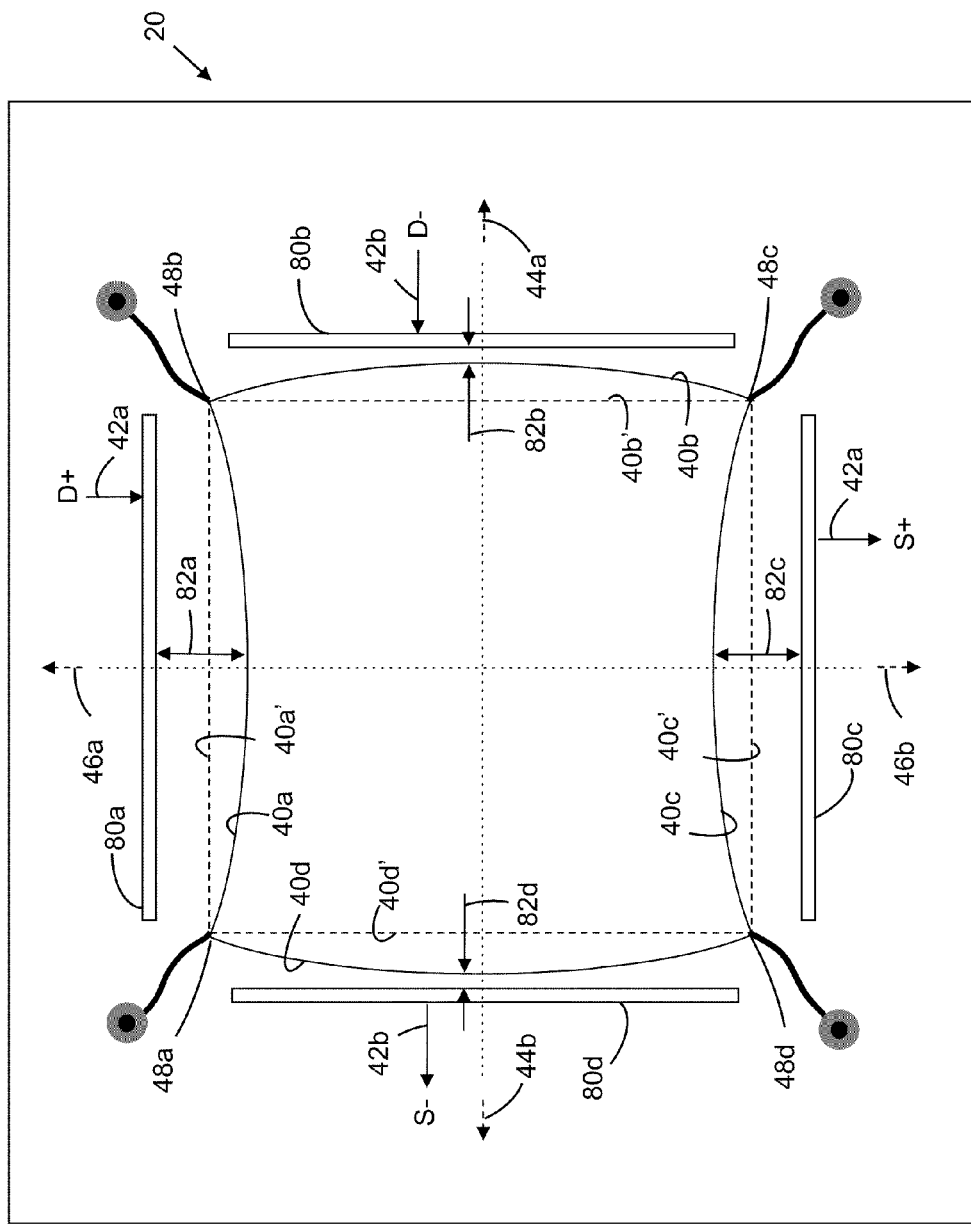
FIG. 1D is a top view representation of the resonator device of FIG. 1A, with the resonator in a second state of oscillation, wherein in relation to the at rest state, the resonator is expanded along a first axis and contracted along a second axis.

With reference to FIG. 1D, in a second phase of oscillation, the resonator 22 (i) expands in the first and second directions 44a, 44b and (ii) contracts in third and fourth directions 46a, 46b, resulting in a second state for resonator 22. The expansion in first and second directions 44a, 44b causes a decrease in the size of second and fourth gaps 82b, 82d. The contraction in third and fourth directions 46a, 46b causes an increase in the size of the first and third gaps 82a, 82c. As stated above, dotted lines 40a'-40d' show the shape and position, of surfaces 40a-40d, respectively, in the at rest state.

The oscillation results in a differential signal that includes first and second signals, S+, S−, indicative thereof, at sense electrodes, e.g., third and fourth electrodes 80c, 80d, and at signal lines 42c, 42d coupled thereto. The differential signal S+, S− may be, for example, in the form of a differential voltage and/or a differential current.

For example, in the first phase of oscillation, the increase in the size of the fourth gap 82d causes a decrease in the magnitude of the fourth capacitance (i.e., defined by the fourth electrode 80d and resonator 22), which in turn causes an electrical current into or out of the fourth electrode 80d and a change in the voltage of the fourth electrode 80d in accordance therewith. The decrease in the size of the third gap 82c causes an increase in the magnitude of the third capacitance (i.e., defined by the third electrode 80c and resonator 22), which in turn causes an electrical current into or out of the third electrode 80c and a change in the voltage of the third electrode 80c in accordance therewith. In the second phase of oscillation, the decrease in the size of the fourth gap 82d causes an increase in the magnitude of the fourth capacitance (i.e., defined by the fourth electrode 80d and resonator 22), which in turn causes an electrical current into or out of the fourth electrode 80d and a change in the voltage of the fourth electrode in accordance therewith. The increase in the size of the third gap 82c causes a decrease in the magnitude of the third capacitance (i.e., defined by the third electrode 80c and resonator 22), which in turn causes an electrical current into or out of the third electrode 80c and a change in the voltage of the third electrode in accordance therewith. The magnitude of the differential signal S+, S− depends at least in part, on the magnitude of the change in the third capacitance and the magnitude of the change in the fourth capacitance, i.e., the magnitude of capacitive transduction between the resonator 22 and the sense electrodes, e.g., third and fourth electrodes 80c, 80d, in each phase of oscillation.

As mentioned above, one aspect of the present inventions is directed to a microelectromechanical system that includes a plurality of bulk mode resonators arranged in an array. Each of the bulk mode resonators is mechanically coupled to one or more other bulk mode resonators in the array.

Figure 2A:
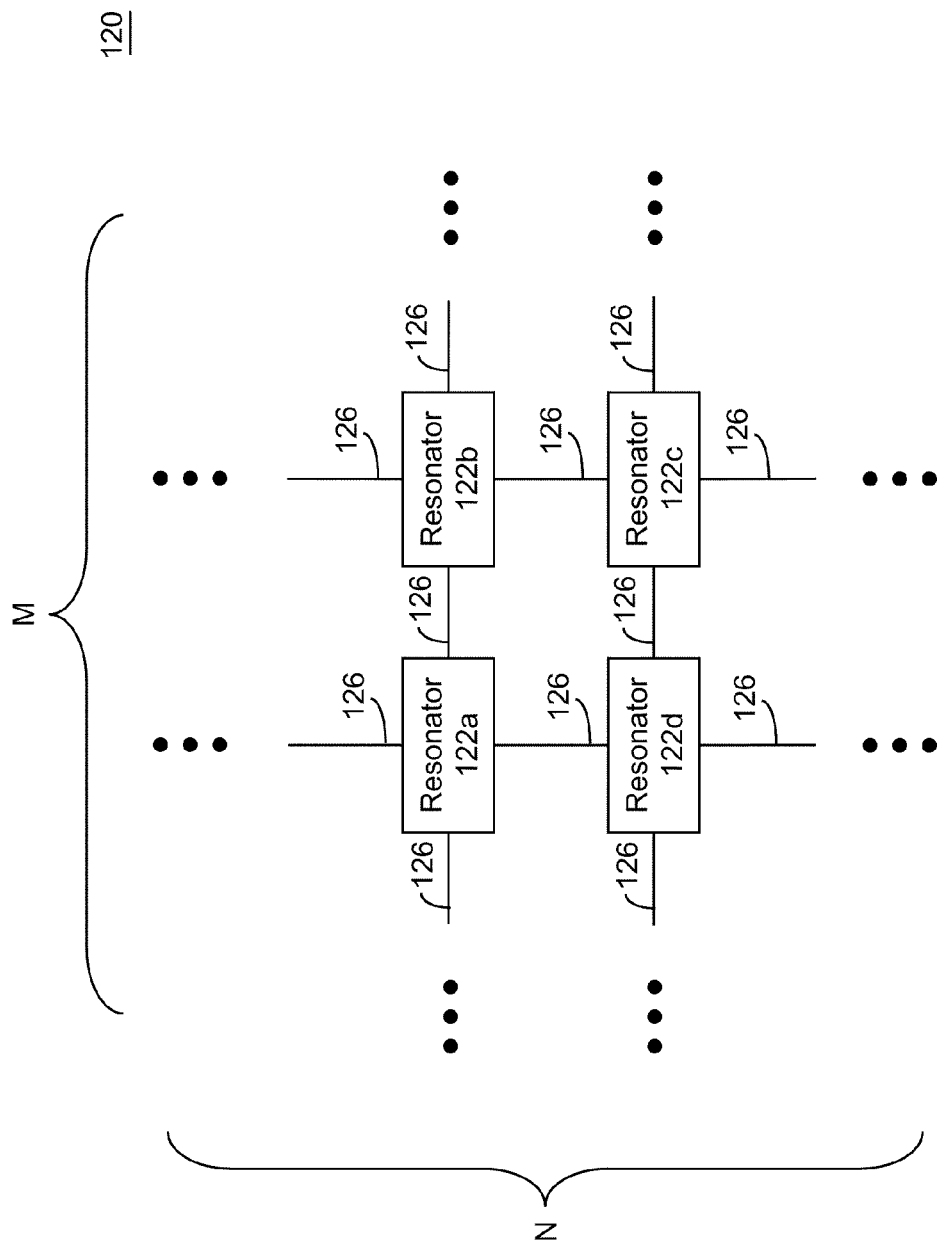
FIG. 2A is a schematic representation of one embodiment of a MEMS resonator array having a plurality of bulk mode resonators in an N×M resonator configuration, wherein each of the bulk mode microelectromechanical resonators of the array is coupled to adjacent bulk mode microelectromechanical resonators of the array, according to certain aspects of the present inventions.

With reference to FIG. 2A, in one embodiment, a MEMS resonator array 120 includes a plurality of bulk mode resonators, e.g., bulk mode resonators 122a-d, and one or more resonator coupling sections 126. The plurality of bulk mode resonators 122a-122d are arranged in an N×M (where N and M are integers) array. Each of the bulk mode resonators 122a-122d is mechanically coupled, via one or more of the resonator coupling sections 126, to each adjacent bulk mode resonator of the MEMS resonator array 120. In this way, each bulk mode resonator of the MEMS resonator array 120 is coupled to all adjacent bulk mode resonators of the MEMS resonator array 120. In the illustrated embodiment, for example, resonator 122a and resonator 122b are mechanically coupled by a coupling section 126 disposed between resonator 122a and resonator 122b. Resonator 122b and resonator 122c are mechanically coupled by a coupling section 126 disposed between resonator 122b and resonator 122c. Resonator 122c and resonator 122d are mechanically coupled by a coupling section 126 disposed between resonator 122c and resonator 122d. Resonator 122d and resonator 122a are mechanically coupled by a coupling section 126 disposed between resonator 122d and resonator 122a.

Figure 2B:
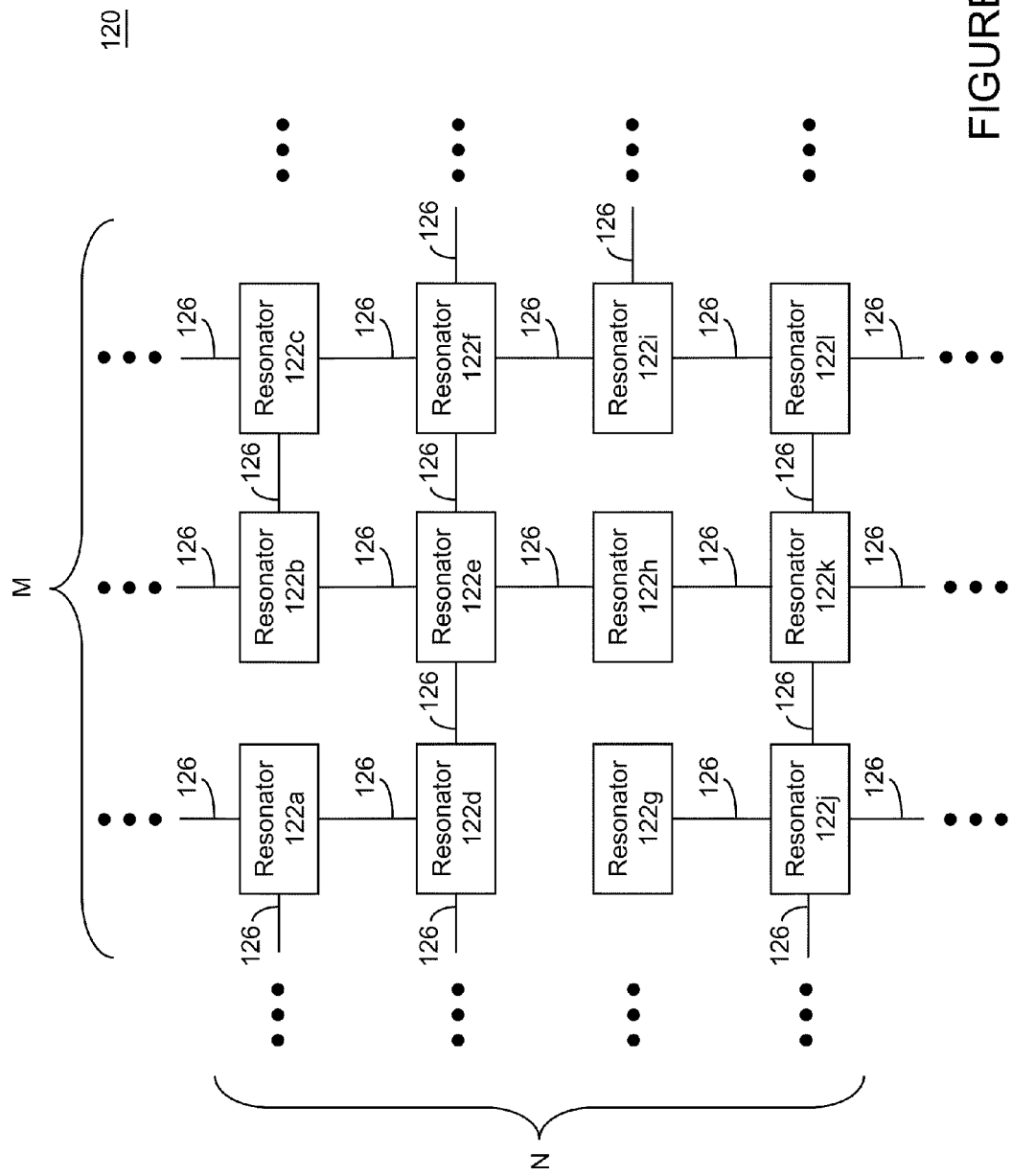
FIG. 2B is a schematic representation of one embodiment of a MEMS resonator array having a plurality of bulk mode resonators in an N×M MEMS resonator configuration, and wherein each resonator of the array is coupled to at least one adjacent resonator of the array, according to certain aspects of the present inventions.

With reference to FIG. 2B, in another embodiment, MEMS resonator array 120 includes a plurality of bulk mode resonators 122a-122l and a plurality of resonator coupling sections 126. The plurality of bulk mode resonators 122a-122l are arranged in an N×M (where N and M are integers) array. Each of the bulk mode resonators 126a-126l is mechanically coupled, via one or more of the resonator coupling sections 126, to at least one adjacent bulk mode resonator of the MEMS resonator array 120. In the illustrated embodiment, for example, resonator 122e is mechanically coupled to adjacent resonators 122b, 122d, 122f and 122h. In contrast, resonator 122h is mechanically coupled to adjacent resonators 122e and 122k. Resonator 122h is not coupled to adjacent resonators 122g and 122i.

Figure 2D:
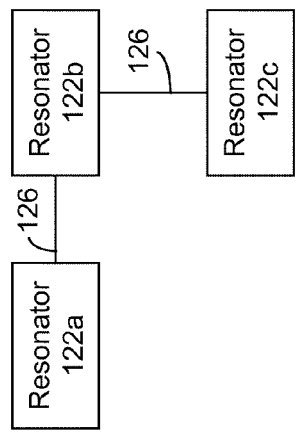
FIG. 2D is a schematic representation of another embodiment of a MEMS resonator array, according to certain aspects of the present inventions, wherein the bulk mode resonators of the array are arranged in an L shape array.
Figure 2C:
FIG. 2C is a schematic representation of another embodiment of a MEMS resonator array, according to certain aspects of the present inventions, wherein the bulk mode resonators of the array are arranged in a linear array.

With reference to FIG. 2C, in one embodiment, MEMS resonator array 120 includes a plurality of bulk mode resonators 122a-122b arranged in a linear array. Resonator 122a and resonator 122b are mechanically coupled by a coupling section 126 disposed between resonator 122a and resonator 122b.

With reference to FIGS. 2D-2F, in further embodiments, MEMS resonator array 120 includes a plurality of bulk mode resonators 122a-122c arranged in an L shape array (see FIG. 2D), a linear array (see FIG. 2E) and a triangular shape array (see FIG. 2F), respectively. In these embodiments, resonator 122a and resonator 122b are mechanically coupled by a coupling section 126 disposed between resonator 122a and resonator 122b. Resonator 122b and resonator 122c are mechanically coupled by a coupling section 126 disposed between resonator 122b and resonator 122c. In addition, in the embodiment of FIG. 2F, resonator 122c and resonator 122a are mechanically coupled by a coupling section 126 disposed between resonator 122c and resonator 122a.

With reference to FIG. 2G, in another embodiment, MEMS resonator array 120 includes a plurality of bulk mode resonators 122a-122d arranged in a 2×2 array. In the illustrated embodiment, the 2×2 array has a rectangular shape. Resonator 122a and resonator 122b are mechanically coupled by a coupling section 126 disposed between resonator 122a and resonator 122b. Resonator 122b and resonator 122c are mechanically coupled by a coupling section 126 disposed between resonator 122b and resonator 122c. Resonator 122c and resonator 122d are mechanically coupled by a coupling section 126 disposed between resonator 122c and resonator 122d. Resonator 122d and resonator 122a are mechanically coupled by a coupling section 126 disposed between resonator 122d and resonator 122a.

In some embodiments, two of the bulk mode resonators of the resonator array are mechanically coupled by two or more resonator coupling sections.

Figure 2H:
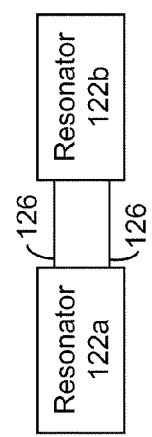
FIG. 2H is a schematic representation of one embodiment of a MEMS resonator array having two bulk mode resonators mechanically coupled by two or more resonator coupling sections disposed between the two bulk resonators.

For example, with reference to FIG. 2H, in another embodiment, MEMS resonator array 120 includes a plurality of bulk mode resonators, e.g., first and second bulk mode resonators 122a-122b. The first bulk mode resonator 122a is mechanically coupled to the second bulk mode resonator 122b by a first resonator coupling section 126 disposed between the first and second bulk mode resonators 122a-122b. The first bulk mode resonator 122a is also mechanically coupled to the second bulk mode resonator 122b by a second resonator coupling section 126 disposed between the first and second bulk mode resonators 122a-122b.

Figure 3A:
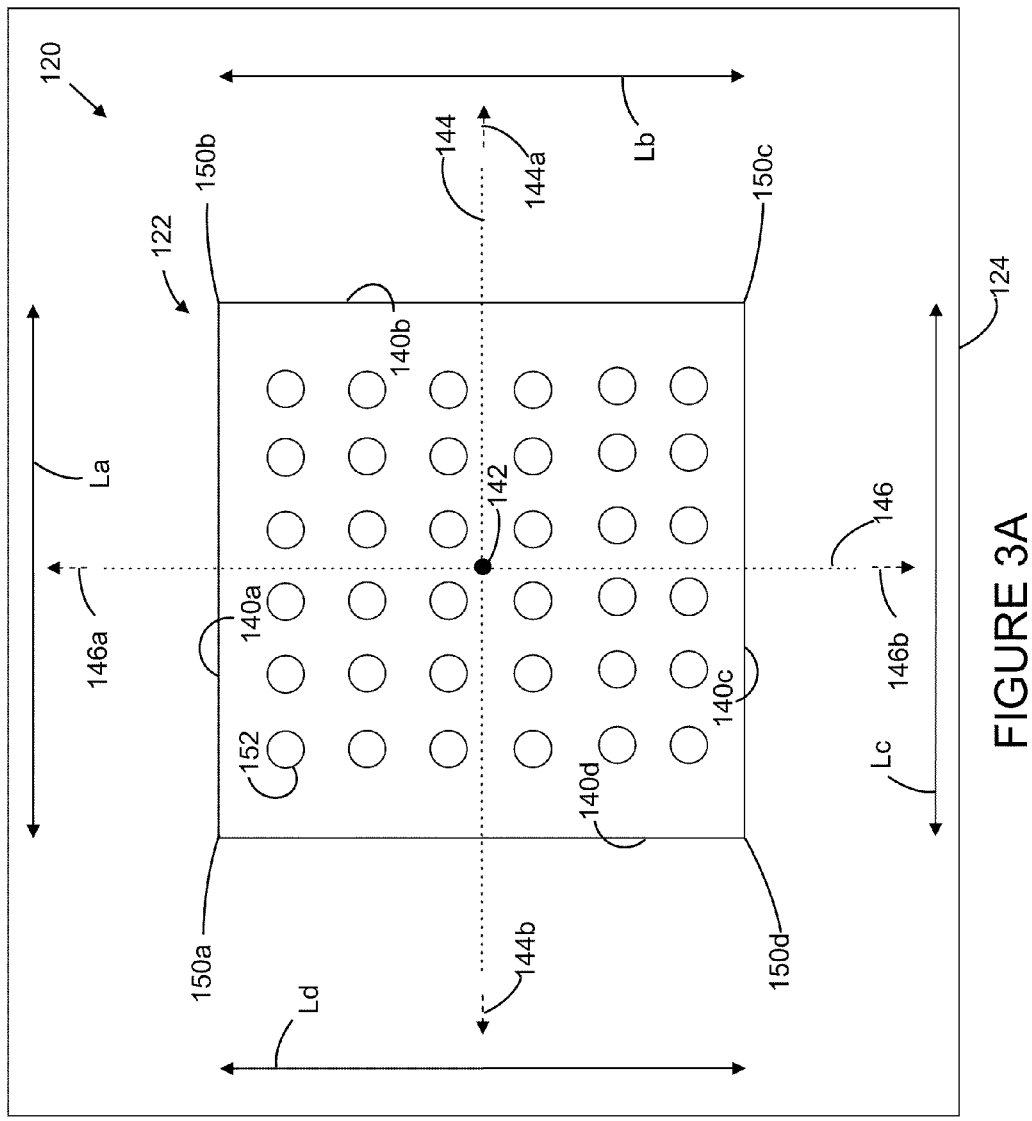
FIG. 3A is a top view representation of one embodiment of a bulk mode resonator, in an at rest state, that may be employed in the MEMS resonator arrays of FIGS. 2A-2G, according to certain aspects of the present inventions.
Figure 3B:
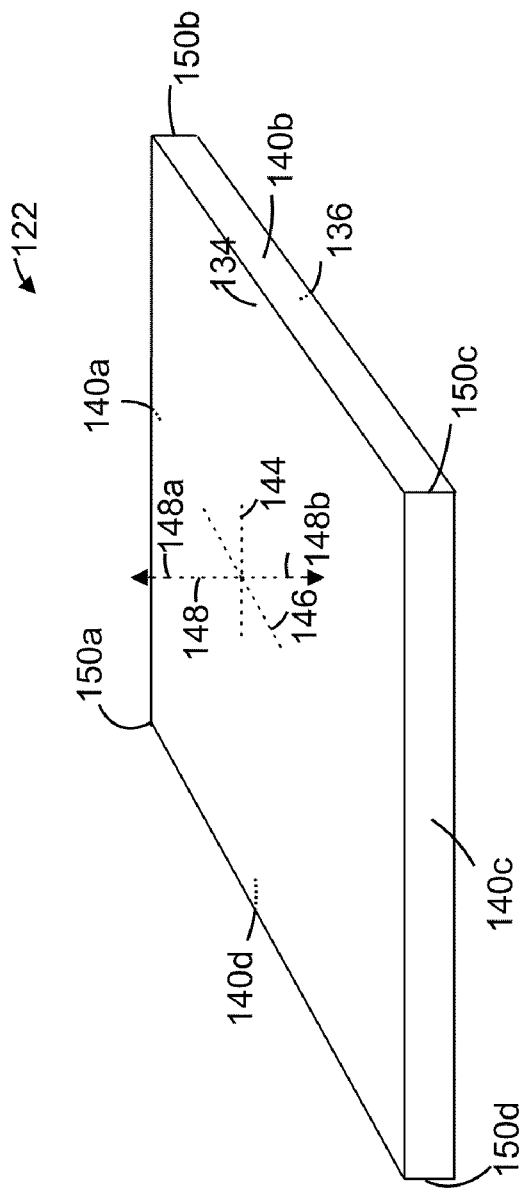
FIG. 3B is a schematic perspective representation of one embodiment of the resonator of FIG. 3A, in an at rest state, according to certain aspects of the present inventions.

FIGS. 3A-3B are top view and schematic perspective representations, respectively, of one embodiment of a bulk mode resonator 122 that may be employed in the MEMS resonator arrays of FIGS. 2A-2G, according to certain aspects of the present inventions. In this embodiment, resonator 122 has first and second major outer surfaces 134, 136 (e.g., disposed on a top and a bottom, respectively, of the resonator 122) and four outer surfaces 140a-140d disposed on sides of the resonator 122. First and second outer surfaces 140a, 140b are disposed on first and second sides of resonator 122, respectively. Third outer surface 140c is disposed on a third side of resonator 122, opposite the first side of resonator 122. Fourth outer surface 140d is disposed on a fourth side of resonator 122, opposite the second side of resonator 122. Resonator 122 may further have a center 142.

In the non-operating (at rest) state, the resonator 122 has a square shape or generally square shape and outer surfaces 140a-140d straight or at least substantially straight with lengths La-Ld, respectively, that are equal or at least substantially equal to one another. In such state, first and third outer surfaces 140a, 140c are oriented parallel or at least substantially parallel to a first reference axis 144 that extends in first and second directions 144a, 144b. Second and fourth outer surfaces 140b, 140d are oriented parallel or at least substantially parallel to a second reference axis 146 that extends in third and fourth directions 146a, 146b, perpendicular to the first and second directions. First and third outer surfaces 140a, 140c face in the third and fourth directions 146a, 146b, respectively. Second and fourth outer surfaces 140b, 140d face in the first and second directions 144a, 144b, respectively. Surfaces 140a-140d are also oriented parallel or substantially parallel to a third reference axis 148 (FIG. 3B), which extends in fifth and sixth directions 148a, 148b (FIG. 3B), perpendicular to the first and second directions. First and second major outer surfaces 134, 136 face in the fifth and sixth direction 148a, 148b, respectively, and are oriented parallel to or substantially parallel to the first reference axis 144 and the second reference axis 146.

Notably, although first second and third reference axes are described and illustrated, a resonator 122 and/or resonator array 120 may or may not have any axes. Thus, in some embodiments, a resonator 122 and/or resonator array 120 may have fewer than three axes and/or no axes at all.

The four outer surfaces 140a-140d define four corners 150a-150d. For example, a first end of fourth outer surface 140d and a first end of first outer surface 140a define a first corner 150a. A second end of first outer surface 140a and a first end of second outer surface 140b define a second corner 150b. A second end of second outer surface 140b and a first end of third outer surface 140c define a third corner 150c. A second end of third outer surface 140c and a second end of fourth outer surface 140d define a fourth corner 150d.

Resonator 122 further includes a plurality of openings 152. During fabrication of resonator 120, openings 152 facilitate etching and/or removal of sacrificial material from beneath the resonator 122 so that the resonator 122 is released and free to oscillator as set forth below.

Figure 3C:
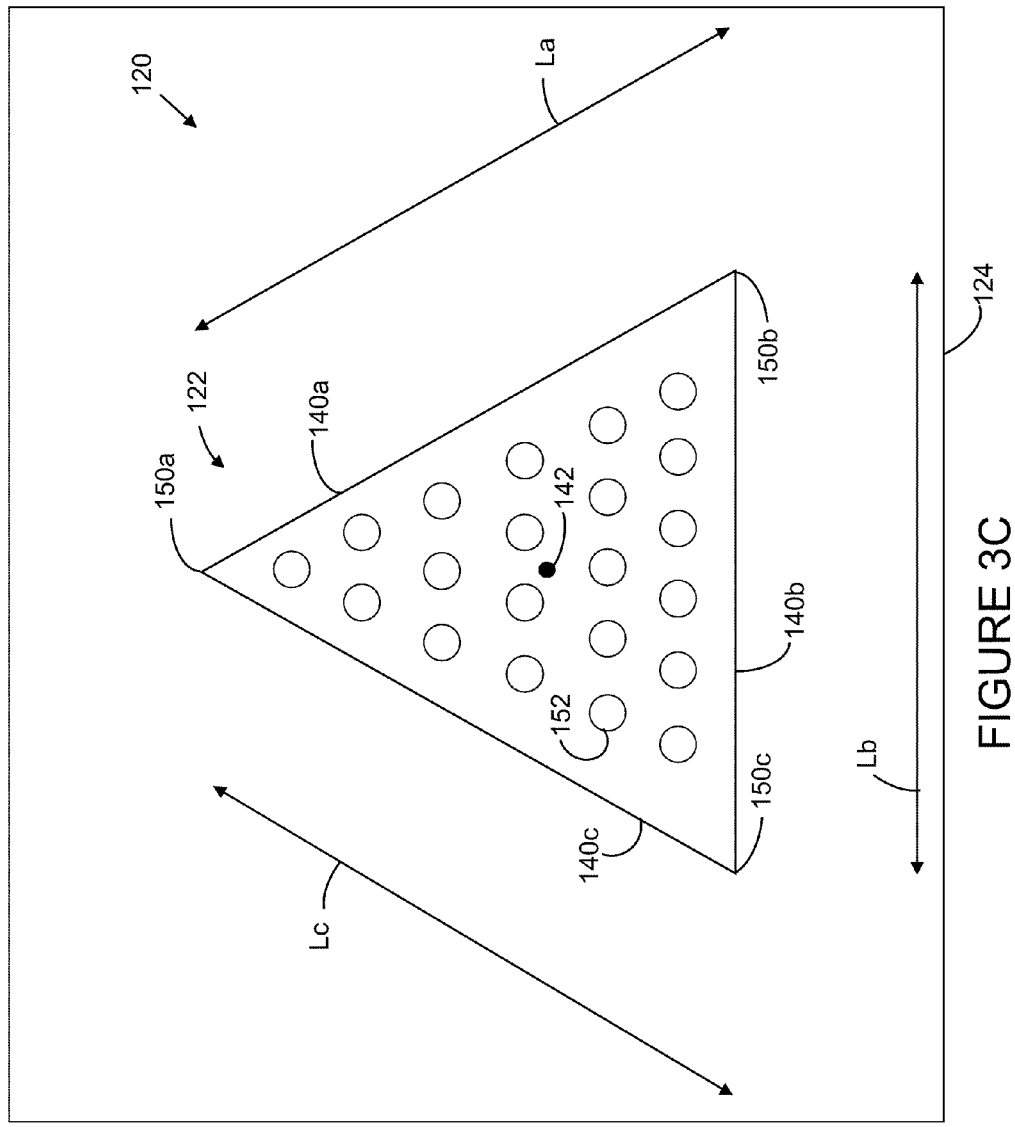
FIG. 3C is a top view representation of another embodiment of a bulk mode resonator, in an at rest state, that may be employed in the MEMS resonator arrays of FIGS. 2A-2G, according to certain aspects of the present inventions.

FIGS. 3C, 3F, are top and side view representations, respectively, of another embodiment of a bulk mode resonator 122 that may be employed in the MEMS resonator arrays of FIGS. 2A-2G, according to certain aspects of the present inventions. In this embodiment, resonator 122 has first and second major outer surfaces 134, 136 (e.g., disposed on a top and a bottom, respectively, of the resonator 122) and three outer surfaces 140a-140c disposed on sides of the resonator 122. Resonator 122 may further have a center 142. In the non-operating (at rest) state, the resonator 122 has a triangular or substantially triangular shape and outer surfaces 140a-140c are straight or substantially straight with lengths La-Lc, respectively, that are equal or at least substantially equal to one another.

FIG. 3D illustrates another embodiment of a resonator 122 that may be employed in the MEMS resonator arrays 120 illustrated in FIGS. 2A-2G. In the non-operating state (at rest) state, the resonator 122 has a rounded square or substantially rounded square shape formed by four straight or substantially straight outer surfaces 140a-140d connected via four curved outer surfaces.

FIG. 3E illustrates another embodiment of a resonator 122 that may be employed in the MEMS resonator arrays 120 illustrated in FIGS. 2A-2G. In the non-operating state, resonator 122 has a rounded triangular or substantially rounded triangular shape formed by three straight or substantially straight outer surfaces 140a-140c connected via three curved outer surfaces.

In some aspects of the present inventions, one or more of the structures and/or techniques described and illustrated in non-provisional patent application entitled "MEMS Resonator Structure and Method", filed on even date herewith (hereinafter the "MEMS Resonator Structure and Method Patent Application") in the name of Lutz et al., are employed in a MEMS resonator array 120. For example, in some embodiments, one or more resonators 122 employed in a MEMS resonator array 120 comprises a MEMS resonator that is the same as and/or similar to a resonator mass 52 employed in one or more resonators 50 described and/or illustrated in the MEMS Resonator Structure and Method Patent Application.

For the sake of brevity, the structures and methods described and/or illustrated in the MEMS Resonator Structure and Method Patent Application will not be repeated. It is expressly noted, however, that the entire contents of the MEMS Resonator Structure and Method Patent Application, including, for example, the features, attributes, alternatives, materials, techniques and/or advantages of all of the inventions/embodiments, are incorporated by reference herein although, unless stated otherwise, the aspects and/or embodiments of the present inventions are not limited to such features, attributes alternatives, materials, techniques and/or advantages.

Notably, in one aspect of the present inventions, the array of bulk mode resonators employs two or more bulk mode resonators each of which may have any shape whether now known or later developed. Moreover, each of the two or more resonators may have a shape that is the same as and/or different than one or more of the other resonators of the two or more bulk mode resonators.

The characteristics (e.g., size, shape, density) of the bulk mode resonator 122 may determine one or more resonant frequencies of the bulk mode resonator 122.

TABLE 1 provides a resonant frequency and exemplary dimensions for one embodiment of a bulk mode resonator 122 that has a square shape, in a non operating state, and is fabricated from a polycrystalline silicon material. The entire resonator 122 oscillates or vibrates at the same frequency.

TABLE 1

| | Width (μm) | Length (μm) | Resonant Frequency (MHz) |
|---|---|---|---|
| Example 1 | 45 | 45 | 100 |

TABLE 2 a resonant frequency and dimensions for one embodiment of a bulk mode resonator 122 that has a square shape, in a non operating state, and is fabricated from a monocrystalline silicon material. The entire resonator 122 oscillates or vibrates at the same frequency.

TABLE 2

| | Width (μm) | Length (μm) | Resonant Frequency (MHz) |
|---|---|---|---|
| Example 1 | 150 | 150 | 30 |
| Example 2 | 9.5 | 9.5 | 500 |

Notably, the dimensions of the resonators set forth in Tables 1 and 2 are merely exemplary embodiments and are based on a simplified linear model with no release etch holes. The frequency may strongly depend on the amount and size of release etch holes. Tolerances due to material constants, height, slotting, may exceed +/−40% frequency variation.

The dimensions, characteristics and/or parameters of a resonator according to one or more aspects of the present invention may be determined using a variety of techniques including modeling and simulation techniques (for example, a finite element modeling and/or simulation process implemented via a computer driven analysis engine, such as FEMLab (from Consol), ANSYS (ANSYS INC.), IDEAS and/or ABAKUS) and/or empirical data/measurements. For example, a finite element analysis engine, using or based on a set of boundary conditions (for example, the size of the resonator structure 120), may be employed to design, determine and assess the dimensions, characteristics and/or parameters of resonator 122 and/or other elements or properties of the resonator structure 120 that are discussed below. Notably, an empirical approach may also be employed (in addition to or in lieu of a finite element analysis (or the like) approach) to design, determine and assess the dimensions, characteristics and/or parameters of a resonator 122 and/or other elements or properties of the resonator structure 120.

FIGS. 4A-4E illustrate top view representations of various embodiments of MEMS resonator arrays 120 each having a plurality of bulk mode resonators 122 having a square shape, in an at rest state, such as illustrated in FIGS. 3A-3B, and one embodiment of resonator coupling section(s) 126 that may be employed to mechanically couple each of the plurality of bulk mode resonators 122 to one or more other resonators of the plurality of bulk mode resonators 122, according to certain aspects of the present inventions.

Figure 4C:
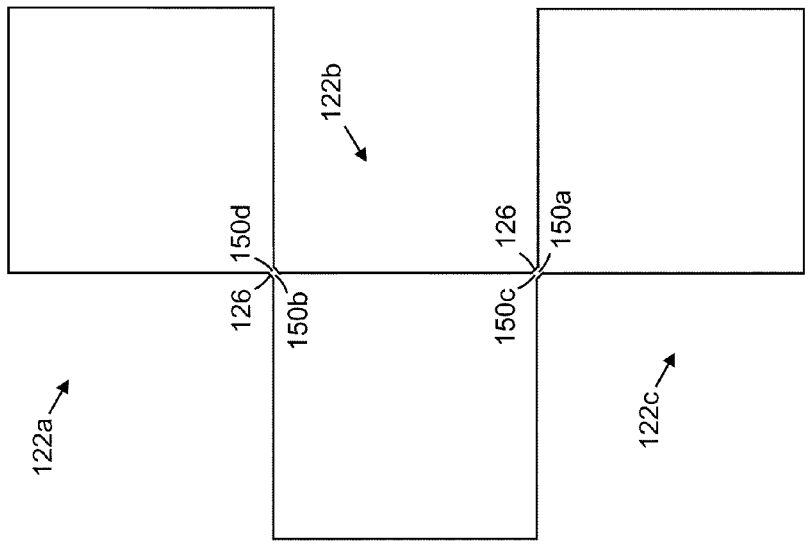
Figure 4A:
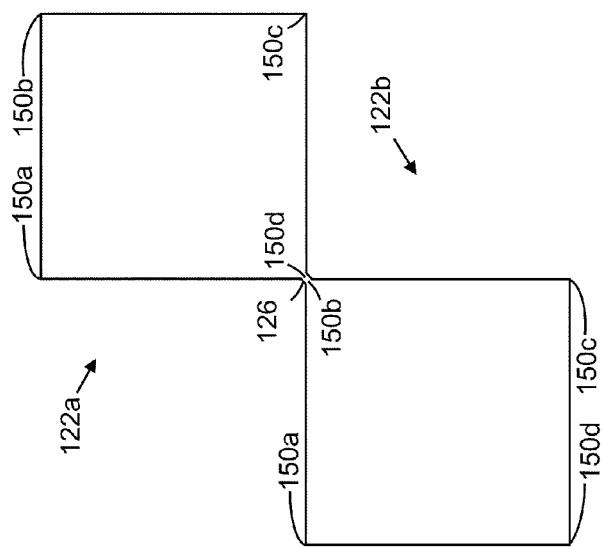
Figure 4B:
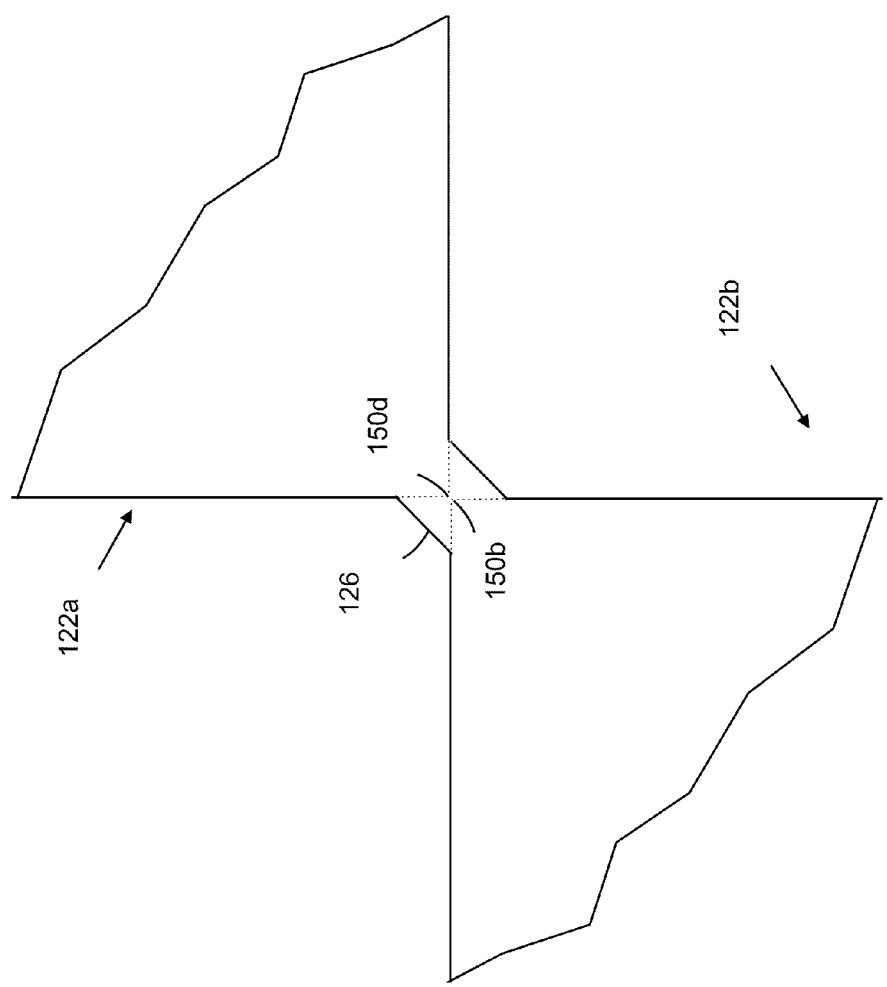

With reference to FIGS. 4A-4B, in one embodiment, resonator array 120 includes first and second bulk mode resonators 122a, 122b that are mechanically coupled by a resonator coupling section 126 disposed between the first and second bulk mode resonators 122a-122b. In the illustrated embodiment, for example, resonator coupling section 126 has a first end mechanically coupled to first resonator 122a and second end mechanically coupled to the second resonators 122b. The resonator coupling section 126 may have straight, or substantially straight, sides, and a uniform, or substantially uniform, width, as illustrated, or any other configuration.

With reference to FIGS. 4C-4D, in further embodiments, resonator array 120 includes three bulk mode resonators 122a-122c mechanically coupled via two resonator coupling sections 126. For example, first and second resonators 122a-122b are mechanically coupled by a first resonator coupling section 126 disposed between the first and second resonators 122a-122b. Second and third resonators 122b-122c are mechanically coupled by a second resonator coupling section 126 disposed between the second and third resonators 122b-122c.

Each of resonator coupling sections 126 has the same or substantially the same configuration (e.g., size, shape) as that of the resonator coupling section 126 illustrated in FIGS. 4A-4B. For example, the resonator coupling section 126 that mechanically couples resonators 122*a* and 122*b* is substantially identical in shape and dimensions as resonator coupling section 126 that mechanically couples resonators 122*b* and 122*c*. In some other embodiments, however, one or more of the resonator coupling sections 126 may have a configuration that is different that one or more of the other resonator coupling sections 126.

With reference to FIG. 4E, in another embodiment, resonator array 120 includes four resonators 122*a*-122*c* that are mechanically coupled via four resonator coupling sections 126. For example, first and second resonators 122*a*-122*b* are mechanically coupled by a first resonator coupling section 126 disposed between the first and second resonators 122*a*-122*b*. Second and third resonators 122*b*-122*c* are mechanically coupled by a second resonator coupling section 126 disposed between the second and third resonators 122*b*-122*c*. Third and fourth resonators 122*c*-122*d* are mechanically coupled by a third resonator coupling section 126 disposed between the third and fourth resonators 122*c*-122*d*. First and fourth resonators 122*a*-122*d* are mechanically coupled by a fourth resonator coupling section 126 disposed between the first and fourth resonators 122*a*-122*d*.

Each of resonator coupling sections 126 has the same or substantially the same configuration (e.g., size, shape) as that of the resonator coupling section 126 illustrated in FIGS. 4A-4B. For example, the resonator coupling section 126 that mechanically couples resonators 122*a* and 122*b* is substantially identical in shape and dimensions as the resonator coupling section 126 that mechanically couples resonators 122*b* and 122*c*, substantially identical in shape and dimensions as the resonator coupling section 126 that mechanically couples resonators 122*c* and 122*d*, and substantially identical in shape and dimensions as the resonator coupling section 126 that mechanically couples resonators 122*d* and 122*a*. In some other embodiments, however, one or more of the resonator coupling sections 126 may have a configuration that is different that one or more of the other resonator coupling sections 126.

In some embodiments, one or more of the resonator coupling sections 126 has a width and/or length that is different than the width and/or length of one or more other resonator coupling sections 126.

Figure 4G:
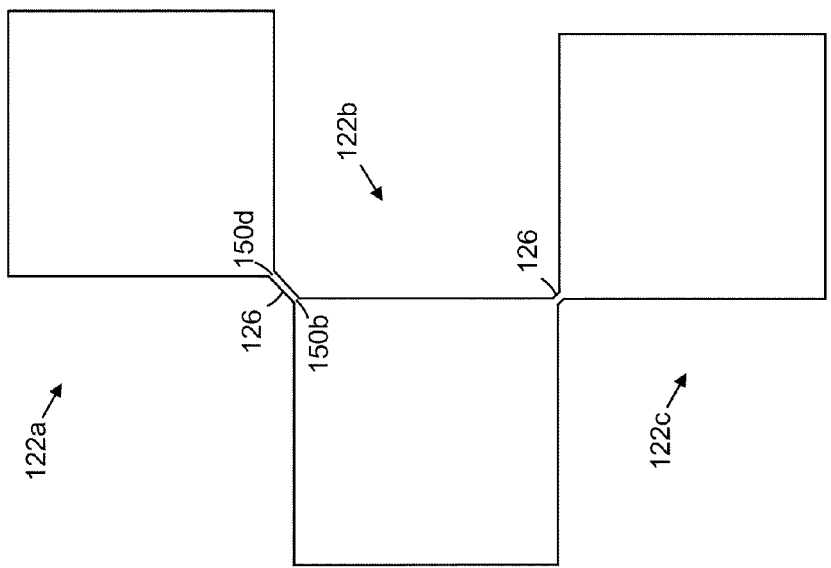
FIG. 4G illustrates a top view representation of another embodiment of a MEMS resonator array having a plurality of bulk mode resonators that may each be the same as or similar to the bulk mode resonator of FIGS. 3A-3B, and two different types of resonator coupling sections, according to certain aspects of the present inventions.
Figure 4F:
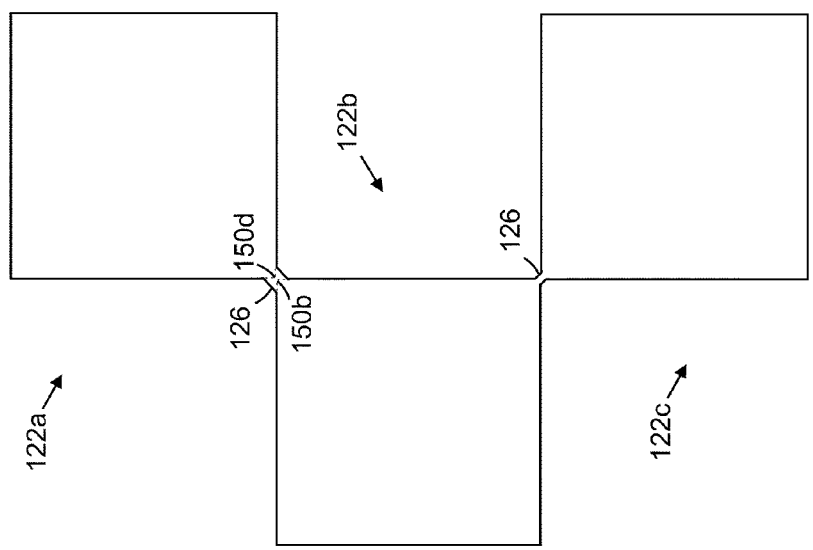
FIG. 4F illustrates a top view representation of one embodiment of a MEMS resonator array having a plurality of bulk mode resonators that may each be the same as or similar to the bulk mode resonator of FIGS. 3A-3B, and two different types of resonator coupling sections, according to certain aspects of the present inventions.

FIG. 4F illustrates a top view representation of one embodiment of a MEMS resonator array having a plurality of bulk mode resonators each having, in an at rest state, a square shape, such as, for example, illustrated in FIGS. 3A-3B, and two different types of resonator coupling sections 126, according to certain aspects of the present inventions. In this embodiment, one of the resonator coupling sections 126 has a width that is different than the width of the other resonator coupling section 126.

FIG. 4G illustrates a top view representation of one embodiment of a MEMS resonator array having a plurality of bulk mode resonators each having, in an at rest state, a square shape, such as, for example, illustrated in FIGS. 3A-3B, and two different types of resonator coupling sections 126, according to certain aspects of the present inventions. In this embodiment, one of the resonator coupling sections 126 has a length that is different than the length of the other resonator coupling section 126.

Figure 4I:
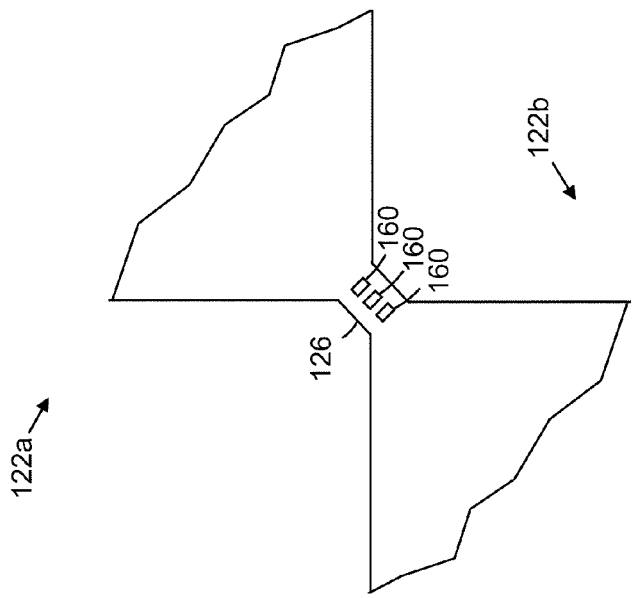
FIG. 4I illustrates an enlarged top view representation of a portion of another embodiment of a MEMS resonator array having a plurality of bulk mode resonators that may each be the same as or similar to the bulk mode resonator of FIGS. 3A-3B, and another embodiment of a resonator coupling section to mechanical couple two of the plurality of resonators, according to certain aspects of the present inventions.
Figure 4H:
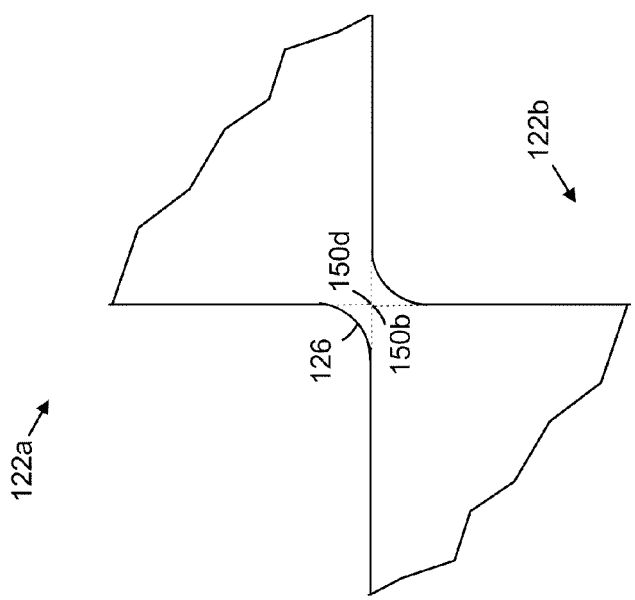
FIG. 4H illustrates an enlarged top view representation of a portion of one embodiment of a MEMS resonator array having a plurality of bulk mode resonators that may each be the same as or similar to the bulk mode resonator of FIGS. 3A-3B, and one embodiment of a resonator coupling section to mechanically couple two of the plurality of resonators, according to certain aspects of the present inventions.

With reference to FIG. 4H, in another embodiment, one or more of the resonator coupling sections 126 includes a design (for example, shape and width) to manage, control, reduce and/or minimize the stress concentration in or at the connection between the resonator coupling section 126 and the resonator 122 coupled thereto. In this embodiment, at least one end of resonator coupling section 126 has a fillet to enhance the management of the stresses between resonator coupling section 126 and the associated resonator 122. As a result, the width of resonator coupling section 126 at the first end of the resonator coupling section 126 and/or the width of resonator coupling section 126 at the second end of the resonator coupling section are each greater than a width of resonator coupling section 126 at a middle or resonator coupling section and/or a midpoint between the first and second ends of the resonator coupling section 126.

Such a design, however, may tend to increase the loading in some areas of the resonator 122 relative to non-filleted designs. In this regard, by adjusting the shape and width of resonator coupling section 126 (for example by filleting resonator coupling section 126 in the vicinity of elongated beam 106), the stress on resonator coupling section 126 and associated resonator 122 may be managed, controlled, reduced and/or minimized. In this way, the durability and/or stability of MEMS resonator array 120 may be increased, enhanced and/or optimized while the mode of operation or mode shape remains relatively undisturbed (or any disturbance is acceptable) and thereby the quality of the nodal points (discussed in more detail below), if any, remains relatively undisturbed (or any disturbance is acceptable). In addition thereto, reducing, minimizing and/or limiting the loading on elongated beams 106 may facilitate an adverse impact on the "Q" factor MEMS resonator array 120.

Other designs and/or configurations of resonator coupling section 126 may be employed to, for example, affect the durability and/or stability of MEMS resonator array 120 as well as minimize, reduce or limit any adverse impact on "Q" factor of MEMS resonator array 120. Indeed, all designs of resonator coupling section 126 whether now known or later developed are intended to fall within the scope of the present inventions. For example, with reference to FIGS. 4I and 4J, in some embodiments, one or more resonator coupling sections 126 includes one or more voids 160. The one or more voids 160 may each be of any shape and/or size and may extend partially or entirely through the height/thickness of the resonator coupling section 126.

Figure 4J:
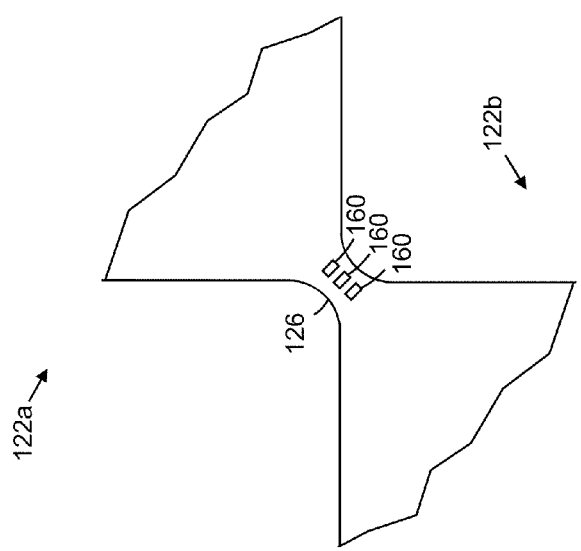
FIG. 4J illustrates an enlarged top view representation of a portion of another embodiment of a MEMS resonator array having a plurality of bulk mode resonators that may each be the same as or similar to the bulk mode resonator of FIGS. 3A-3B, and another embodiment of a resonator coupling section to mechanical couple two of the plurality of resonators, according to certain aspects of the present inventions.

In one embodiment, one or more of the resonator coupling sections 126 includes one or more voids 160 and one or more fillets at one or more ends of the resonator coupling section 126 (see FIG. 4J). Implementing one or more voids in one or more of the resonator coupling sections 126 reduces the mass of resonator coupling section 126 which further minimizes, reduces or limits the loading on resonator 122 and thereby further minimizes, reduces or limits any adverse impact on "Q" factor of MEMS resonator array 120. Notably, in certain embodiments, resonator coupling sections 126 have small dimensions (for example, the shape, length, width and/or thickness of resonator coupling sections 126) to provide a small mass while adding little to no stiffness to resonator 122 is preferred.

As mentioned above, in some embodiments, one or more (i.e., one, some or all) resonators 122 of the resonator array 120 includes one or more nodal points or areas (i.e., portions of the resonator that are stationary, experience little movement, and/or are substantially stationary in one or more degrees of freedom (whether from a rotational and/or translational perspective) during oscillation of the resonator. In some embodiments, each resonator of the array includes one or more nodal points or areas (i.e., portions of the resonator that are stationary, experience little movement, and/or are substantially stationary in one or more degrees of freedom (whether from a rotational and/or translational perspective) during oscillation of the resonator.

It may be advantageous to mechanically couple the individual resonators 122 through or at one or more of such nodal points. For example, by coupling through, at or near one or more nodal points, the vertical and/or horizontal energy losses of resonator 122 may be minimized, limited and/or reduced, which may result or help provide a relatively high Q MEMS resonator array.

In one embodiment, one or more nodal points may be located in or near one or more outer area, portion or region of one or more of the resonators 122. Resonator coupling section 126 may be disposed between one or more nodal points of one resonator 122 and one or more nodal points of another resonator. With reference to FIG. 4A-4B, in one embodiment, resonators 122a and 122b each include nodal points located on or near corners 150a-150d. Resonator coupling section 126 may be connected at or near a corner, e.g., corner 150d, of resonator 122a and at or near a corner, e.g., corner 150b, of resonator 122b. Notably, however, some embodiments may not mechanically couple the resonators 122 through, at or near one or more nodal points, if any nodal points exist.

Figure 5A:
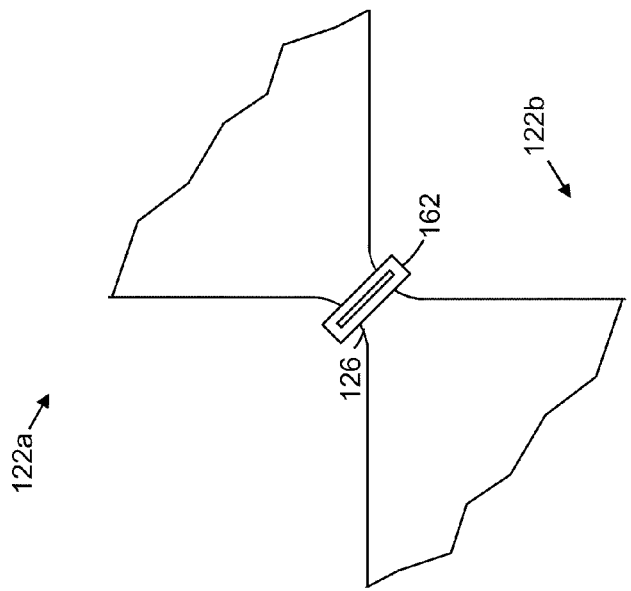
FIG. 5A illustrates an enlarged top view of a portion of one embodiment of a MEMS resonator array having a plurality of bulk mode resonators that may each be the same as or similar to the bulk mode resonator of FIGS. 3A-3B, and another embodiment of a resonator coupling section to mechanical couple two of the plurality of resonators, wherein the resonator coupling section includes one or more loading relief mechanisms disposed within the resonator coupling section, according to certain aspects of the present inventions.
Figure 5B:
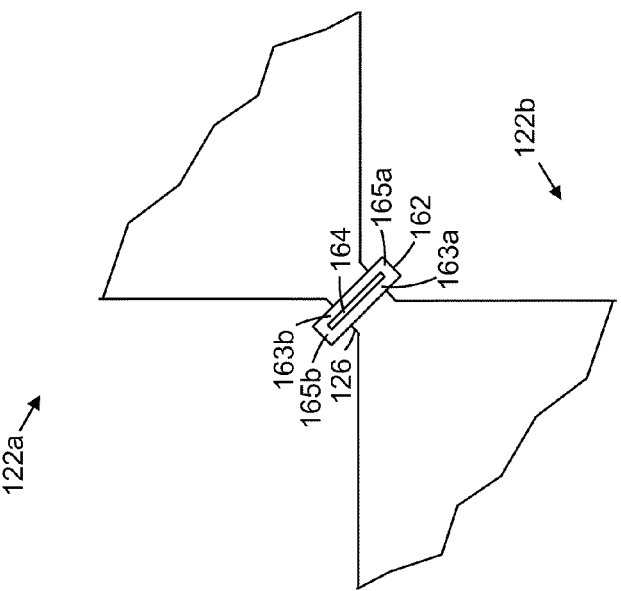
FIG. 5B illustrates an enlarged top view of a portion of another embodiment of a MEMS resonator array having a plurality of bulk mode resonators that may each be the same as or similar to the bulk mode resonator of FIGS. 3A-3B, and another embodiment of a resonator coupling section to mechanical couple two of the plurality of resonators, wherein the resonator coupling section includes one or more loading relief mechanisms disposed within the resonator coupling section, according to certain aspects of the present inventions.

With reference to FIGS. 5A and 5B, in some embodiments MEMS resonator array 120 employs one or more loading relief mechanisms 162 (for example, springs or spring-like components) within one or more resonator coupling sections 126 to manage, control, reduce, eliminate and/or minimize any stress or strain on the associated resonators 122 that are mechanically coupled by the one or more resonator coupling sections 126. In the embodiments of FIGS. 5A-5B, resonator coupling section 126, which mechanically couples resonator 122a and resonator 122b, includes a loading relief mechanism 162, e.g., disposed within the resonator coupling section 126.

Notably, loading relief mechanisms 162 may be well known springs or spring-like components, or may be any mechanism that reduces, eliminates and/or minimizes stress and/or strain on resonator 122.

In the embodiments of FIGS. 5A-5B, loading relief mechanism 162 comprises a spring or spring like component that includes first and second elongated portions 163a, 163b that are spaced apart from one another by a gap 164. The spring or spring like component further includes first and second end portions 165a, 165b. The first end portion 165a joins a first end of the first elongated portion 163a to a first end of the second elongated portion 163b. The second end portion 165b joins a second end of the first elongated portion 163a to a second end of the second elongated portion 163b. The first and second elongated portions 163a, 163b may be straight and may have uniform thicknesses. However, other configurations may be employed.

In operation, loading relief mechanisms 162 slightly expand and contract in conjunction with the motion of one, some or all of resonators 122 in order to reduce, eliminate and/or minimize any stress or strain on associated resonators 122 which are coupled by resonator coupling section 126. In addition, this coupling technique of MEMS resonator array 120 may further reduce, eliminate and/or minimize loading on the resonators 122 thereby decreasing, reducing, minimizing and/or eliminating energy losses of resonators 122 due to the mechanical coupling to adjacent resonators.

In some embodiments, loading relief mechanisms 162 may be implemented within and/or at one or more ends of one or more of the one or more resonator coupling section 126. The loading relief mechanisms 162 may be employed in conjunction with any of the mechanical coupling techniques and/or architectures described and/or illustrated herein.

In some embodiments, MEMS resonator array 120 includes one or more anchor coupling sections to mechanically couple one or more resonators 122 to one or more substrate anchors.

Figure 6B:
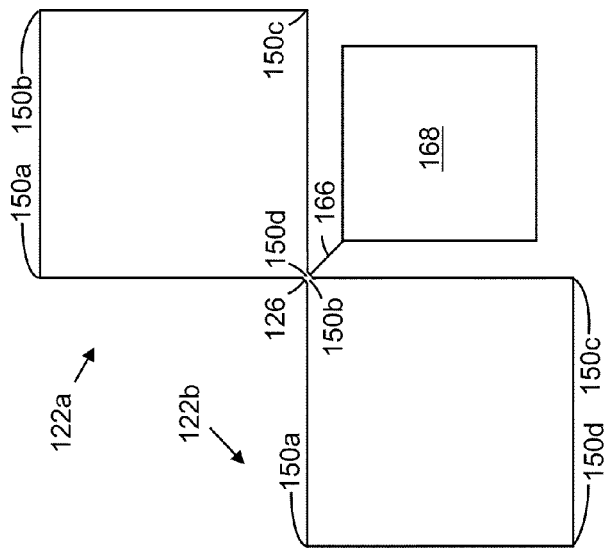
FIG. 6B illustrates a top view of another embodiment of a MEMS resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including an anchor coupling section and a substrate anchor employed in another anchoring technique and/or configuration to mechanically couple one or more of the plurality of resonators to one or more substrate anchors, according to certain aspects of the present inventions.
Figure 6A:
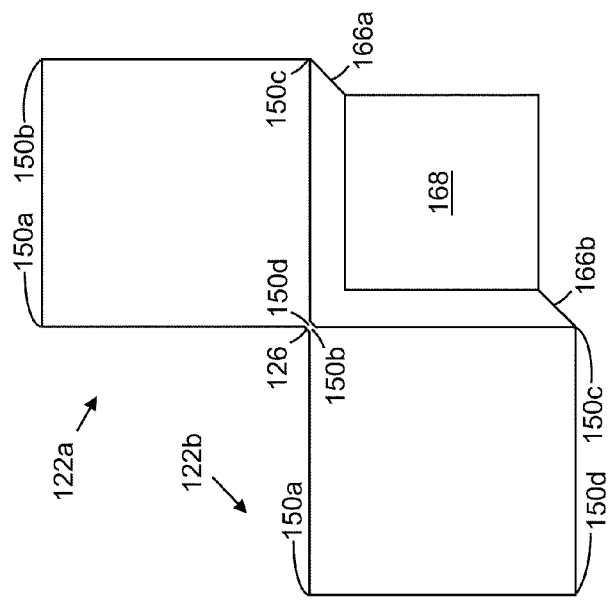
FIG. 6A illustrates a top view of one embodiment of a MEMS resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including a plurality of anchor coupling sections and a substrate anchor employed in one anchoring technique and/or configuration to mechanically couple one or more of the plurality of resonators to one or more substrate anchors, according to certain aspects of the present inventions.

With reference to FIG. 6A, in one embodiment, resonator array 120 includes a plurality of resonators 122a-122b, resonator coupling section 126 and a plurality of anchor coupling sections 166a-166b. The plurality of resonators 122a-122b and the resonator coupling section 126 may be the same as or similar to the plurality of resonators 122a-122b and the resonator coupling section 126, respectively, of the resonator array 120 illustrated in FIG. 4A. The plurality of resonators 122a-122b are mechanically coupled to one another by the resonator coupling section 126. The plurality of resonators 122a-122b are mechanically coupled to the anchor 168 via anchor coupling sections 166a-166b, respectively. In the illustrated embodiment, for example, a first one of the anchor coupling sections, e.g., anchor coupling section 166a, is disposed between the first resonator 122a and substrate anchor 168 and mechanically couples the first resonator 122a to the substrate anchor 168 and the substrate 124 (via the substrate anchor 168), for example, to secure, fix and/or connect the first resonator 122a to the substrate 124. A second one of the anchor coupling sections, e.g., anchor coupling section 166b, is disposed between the second resonator 122b and anchor 168 and mechanically couples the second resonator 122b to the substrate anchor 168 and the substrate 124 (via the substrate anchor 168), for example, to secure, fix and/or connect the second resonator 122b to the substrate 124.

Thus, two or more resonators, e.g., resonators 122a-122b, may be coupled to a common anchor, e.g., anchor 168. In this embodiment, the resonators 122a-122b are separately connected to the common anchor 168.

In some embodiments, in operation, the motion of the resonator is such that the MEMS resonator array and/or the individual resonators 122 include one or more nodal points (i.e., areas or portions of the resonator structure that do not move, experience little movement, and/or are substantially stationary when the resonators oscillate). It may be advantageous to anchor the MEMS resonator array and/or the individual resonators 122 to the substrate 124 through or at one or more of the nodal points, if any, of one or more of the individual resonators 122 of the MEMS resonator array. For example, by anchoring through, at or near one or more nodal points the vertical and/or horizontal energy losses of resonator 122 may be minimized, limited and/or reduced, which may result or provide a relatively high Q MEMS structure.

In some embodiments, one or more anchor coupling sections 166 may be disposed between one or more nodal points of one or more resonators 122 and one or more anchors mechanically coupled to the substrate. In some embodiments, one or more nodal points may be located in or near one or more outer area, portion or region of one or more of the resonators 122, and one or more of such resonators 122 are anchored to the substrate 124 through or at one or more of such nodal points.

For example, in some embodiments, one or more resonators, e.g., resonators 122a-122b, each include nodal points located on or near corners 150a-150d. Resonator coupling section 126 may be connected to resonator 122a at or near corner 150d of resonator 122a and may be connected to resonator 122b at or near corner 150b of resonator 122b. Anchor coupling section 166a may be connected to resonator 122a at or near corner 150c of resonator 122a. Similarly, anchor coupling section 166b may be connected at or near corner 150c of resonator 122b.

Notably however, in some embodiments, one or more (one, some or all) of the resonators are not anchored through, at or near one or more nodal points, if any nodal points even exist.

Figure 6C:
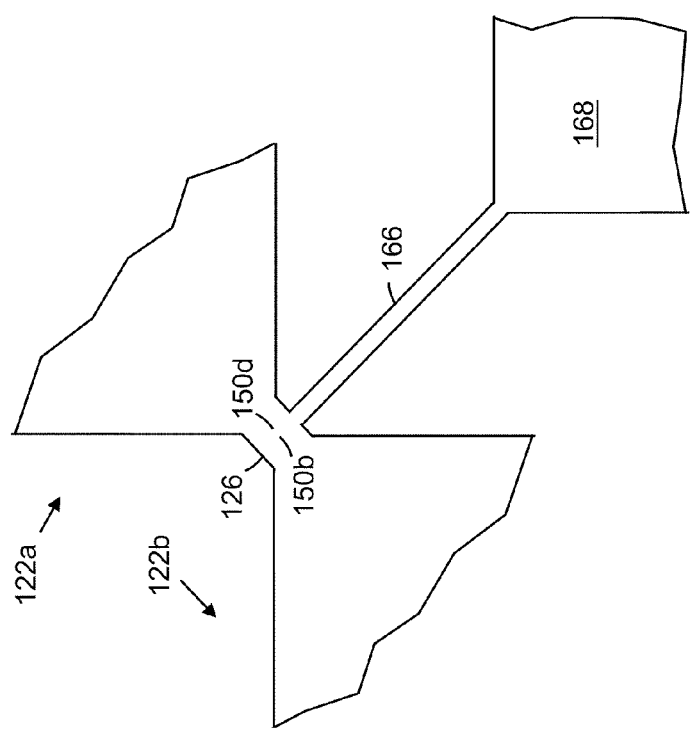
FIG. 6C illustrates an enlarged top view of a portion of one embodiment of the resonator array of FIG. 6B, including one embodiment of the anchor coupling section and one embodiment of the substrate anchor, according to certain aspects of present the inventions.

In some embodiments, two or more resonators are mechanically coupled to a common anchor via a common anchor coupling section. For example, with reference to FIGS. 6B and 6C, in one embodiment, resonator array 120 includes a plurality of resonators 122a-122b, a resonator coupling section 126 and an anchor coupling section 166. The resonators 122a-122b are mechanically coupled to one another by the resonator coupling section 126. The resonators 122a-122b are mechanically coupled to an anchor 168 via the anchor coupling section 166. In the illustrated embodiment, for example, anchor coupling section 166 is disposed between the resonator coupling section 126 and the substrate anchor 168 to mechanically couple the resonator 122a-122b to the substrate anchor 168 and the substrate 124 (via the substrate anchor 168), for example, to secure, fix and/or connect the resonators 122a-122b to the substrate 124. In the illustrated embodiment, anchor coupling section 166 is connected directly to the resonator coupling section 126 and the substrate anchor 168. In some other embodiments, however, anchor coupling section 166 may connect directly to resonator 122a (and/or resonator 122b) and the substrate anchor 168, rather than to resonator coupling section 126.

Some embodiments may employ a plurality of common anchor coupling sections. For example, with reference to FIG. 6D, in one embodiment, resonator array 120 includes a plurality of resonators 122a-122d and a plurality of resonator coupling sections 126, a plurality of an anchor coupling sections 166a-166d and an anchor 168. The plurality of resonators 122a-122d and plurality of resonator coupling sections 126 may be the same as or similar to the plurality of bulk mode resonators 122a-122d and the plurality of resonator coupling sections 126, respectively, of the resonator array 120 illustrated in FIG. 4E. The plurality of resonators 122a-122d are mechanically coupled to the anchor 168 via the plurality of anchor coupling section 166a-166d. In the illustrated embodiment, for example, a first anchor coupling section 166a is coupled between the first resonator coupling section 126 and anchor 168 to mechanically couple the first and fourth resonators 122a-122d to the substrate anchor 168 and the substrate 124 (via the substrate anchor 168), for example, to secure, fix and/or connect resonators 122a-122d to the substrate 124. A second anchor coupling section 166b is mechanically coupled between the second resonator coupling section 126 and anchor 168 to mechanically couple the first and second resonators 122a-122b to the substrate anchor 168 and the substrate 124 (via the substrate anchor 168), for example, to secure, fix and/or connect resonators 122a-122b to the substrate 124. A third anchor coupling section 166c is mechanically coupled between the third resonator coupling section 126 and anchor 168 to mechanically couple the second and third resonators 122b-122c to the substrate anchor 168 and the substrate 124 (via the substrate anchor 168), for example, to secure, fix and/or connect resonators 122b-122c to the substrate 124. A fourth anchor coupling section 166d is mechanically coupled between the fourth resonator coupling section 126 and anchor 168 to mechanically couple the third and fourth resonators 122c-122d to the substrate anchor 168 and the substrate 124 (via the substrate anchor 168), for example, to secure, fix and/or connect resonators 122c-122d to the substrate 124.

In the illustrated embodiment, the each of the anchor coupling sections 166a-166d is connected directly to a resonator coupling section 126 and the substrate anchor 168. In some other embodiments, however, one or more of the anchor coupling sections 166a-166d may connect directly to one or more of the resonators 122a-122d and the substrate anchor 168, rather than to a resonator coupling section 126.

Figure 6F:
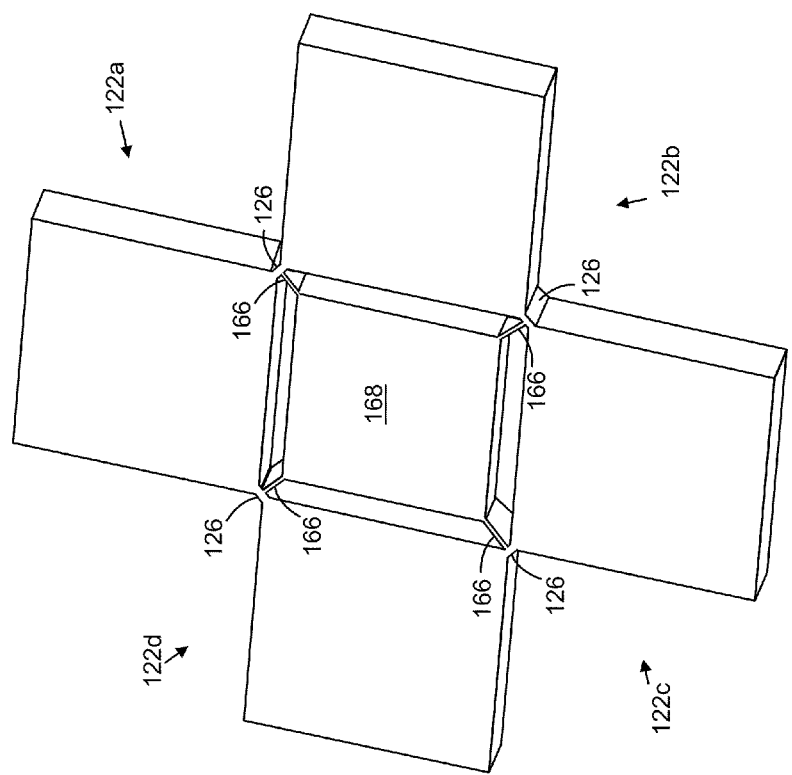
FIG. 6F is perspective view of one embodiment of the MEMS resonator array of FIG. 6D, according to certain aspects of the present inventions.

FIG. 6F is perspective view of one embodiment of the MEMS resonator array of FIG. 6D.

Other anchoring techniques and/or configurations may also be employed. With reference to FIG. 6E, in one embodiment, a resonator array 120 includes four resonators 122a-122d and a plurality of resonator coupling sections 126, but only two anchor coupling sections 168a-168b.

Figure 7A:
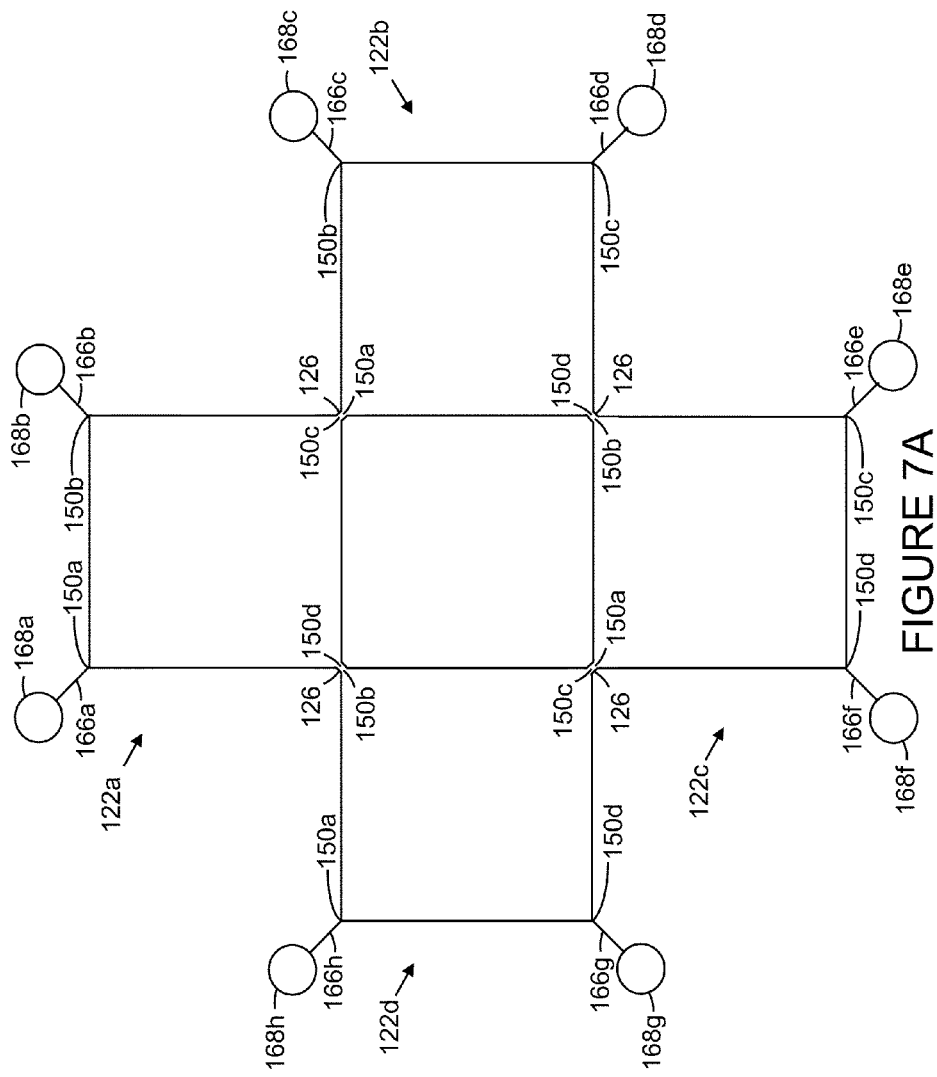
FIG. 7A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, according to certain aspects of present the inventions.

In some embodiments, MEMS resonator array 120 includes one or more individual anchors that are each "dedicated" to a respective one of resonators 122. For example, with reference to FIG. 7A, in one embodiment, in lieu of a common type anchoring structure, resonator 122a is anchored separately to one or more individual anchors, e.g., anchors 168a, 168b. Resonator 122b is anchored separately to one or more individual anchors, e.g., anchors 168c, 168d. Resonator 122c is anchored separately to one or more individual anchors, e.g., anchors 168e, 168f. Resonator 122d is anchored separately to one or more individual anchors, e.g., anchors 168g, 168h.

Figure 7B:
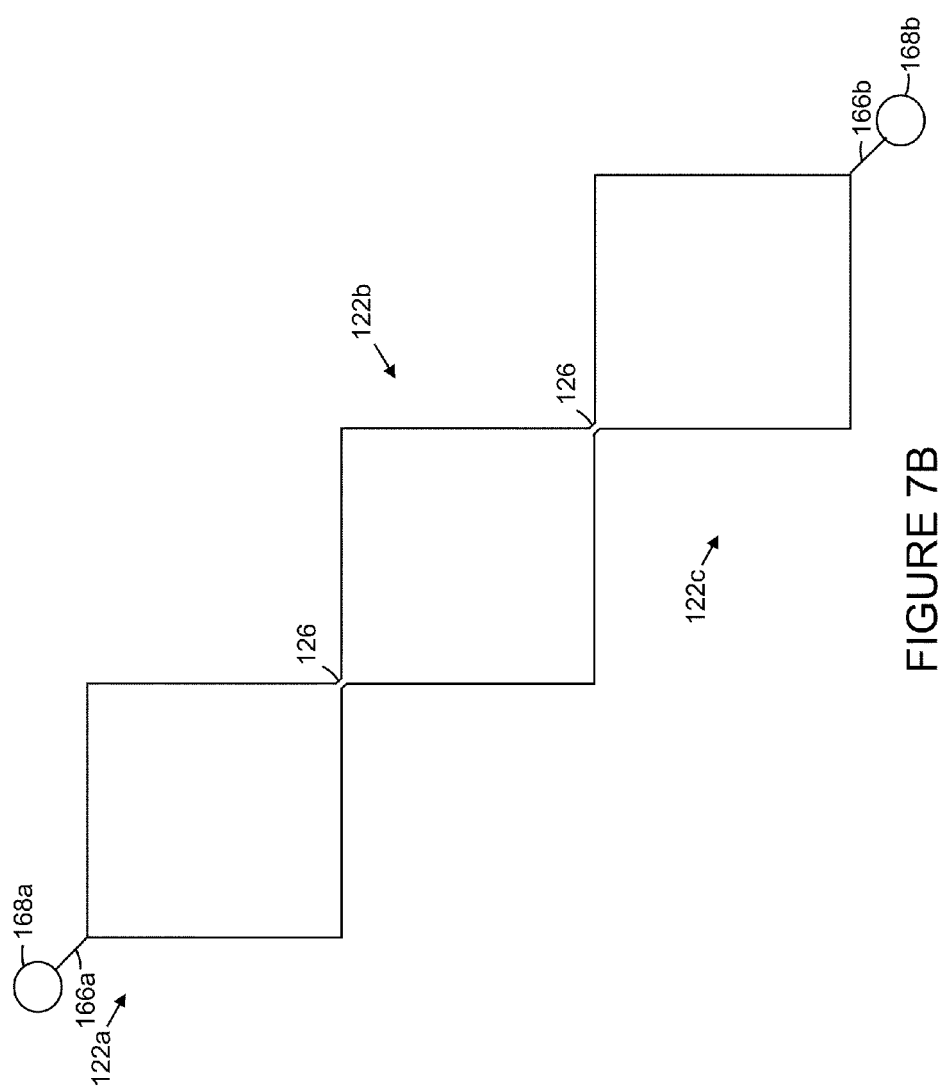
FIG. 7B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4D, and further including a plurality of anchor coupling sections and a plurality of substrate anchors employed in another anchoring technique and/or configuration to mechanically couple one or more of the plurality of resonators to one or more substrate anchors, according to certain aspects of present the inventions.
Figure 7C:
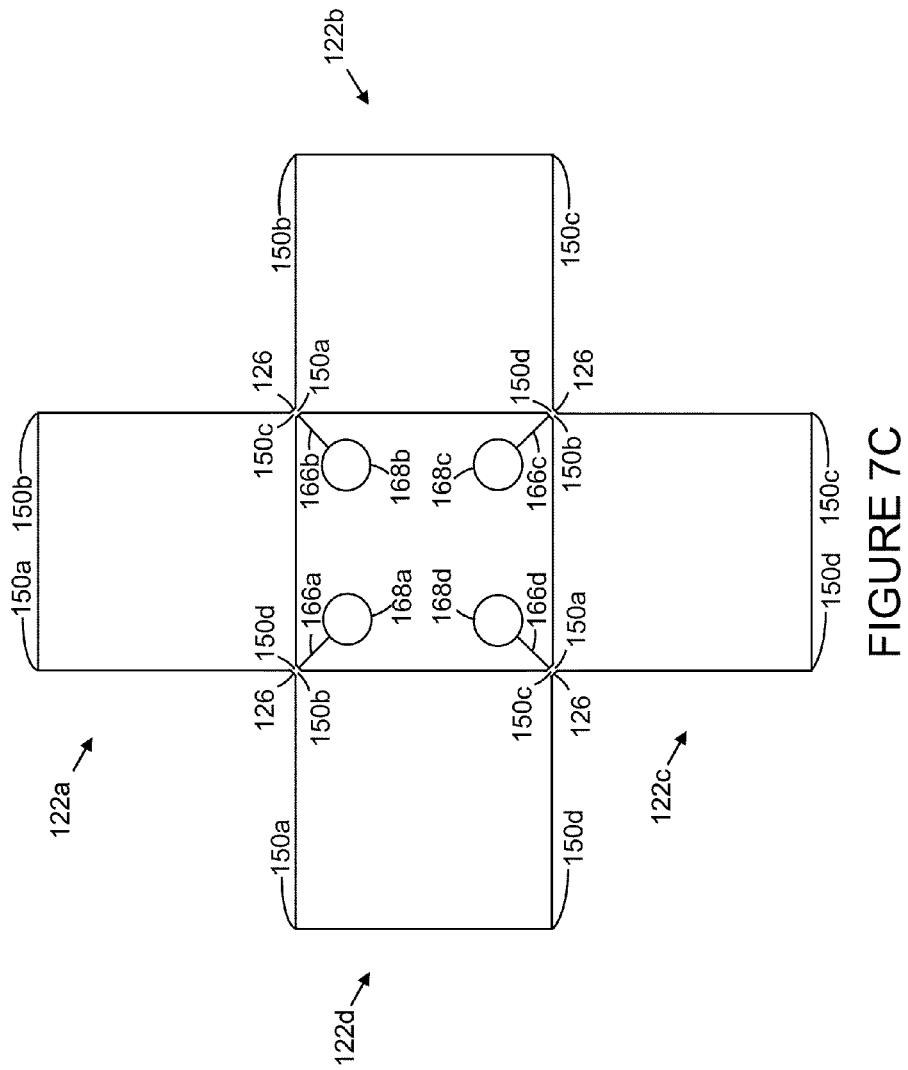
FIG. 7C illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, according to certain aspects of present the inventions.

With reference to FIG. 7B, in another embodiment, resonator 122a is anchored separately to one individual anchor, e.g., anchor 168. Resonator 122c is anchored separately to one individual anchor, e.g., anchors 168b. In some other embodiments, MEMS resonator array 120 includes two or more individual anchors 168 that are each "dedicated" to more than one but less than all of the resonators 122. For example, with reference to FIG. 7C, in one embodiment, resonator array 120 includes separate anchors 168a-168d. Resonators 122d and 122a are connected through a common anchor coupling section 166a to anchor 168a. Resonators 122a and 122b are connected through a common anchor coupling section 166b to anchor 168b. Resonators 122b and 122c are connected through a common anchor coupling section 166c to anchor 168c. Resonators 122c and 122d are connected through a common anchor coupling section 166d to anchor 168d.

Figure 8A:
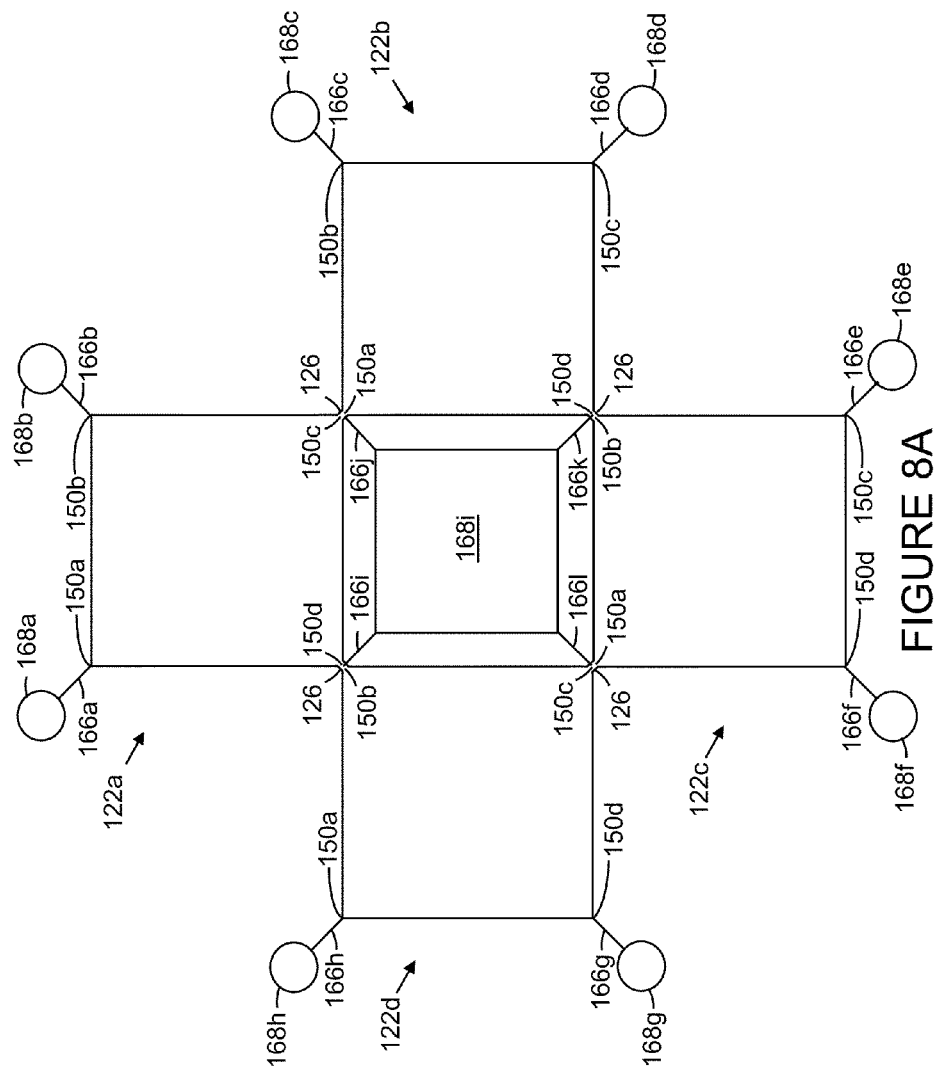
FIG. 8A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, according to certain aspects of present the inventions.

Moreover, the anchoring structure of MEMS resonator array 120 may include combinations or permutations of common and individual anchor techniques (see for example, FIGS. 8A-8B). For example, with reference to FIG. 8A, resonators 122a-122d are anchored to a common anchor 168i and anchored separately to individual anchors as follows. Resonator 122a is anchored separately to one or more individual anchors, e.g., anchors 168a, 168b. Resonator 122b is anchored separately to one or more individual anchors, e.g., anchors 168c, 168d. Resonator 122c is anchored separately to one or more individual anchors, e.g., anchors 168e, 168f. Resonator 122d is anchored separately to one or more individual anchors, e.g., anchors 168g, 168h. All combinations and permutations of the various anchoring techniques are intended to fall within the scope of the present inventions.

Notably, in each of the anchor techniques illustrated in FIGS. 6A-6F, FIGS. 7A-7C and FIGS. 8A-8B, one or more anchor coupling sections 166 extend outward from one or more resonators 122, to connect one or more resonators 122 to one or more substrate anchors 168 located "outside" the one or more resonators 122.

As stated above, one or more nodal points may be located in or near one or more outer area, portion or region, e.g., one or more corners 150a-150d, of one or more of the resonators 122, and one or more of such resonators 122 may be anchored to the substrate 124 through or at one or more of such nodal points. For example, by anchoring through, at or near one or more nodal points the vertical and/or horizontal energy losses of resonator 122 may be minimized, limited and/or reduced, which may result or provide a relatively high Q MEMS structure. However, in some embodiments, one or more of the resonators 122 are not anchored through, at or near one or more nodal points, if any exist.

Figure 9A:
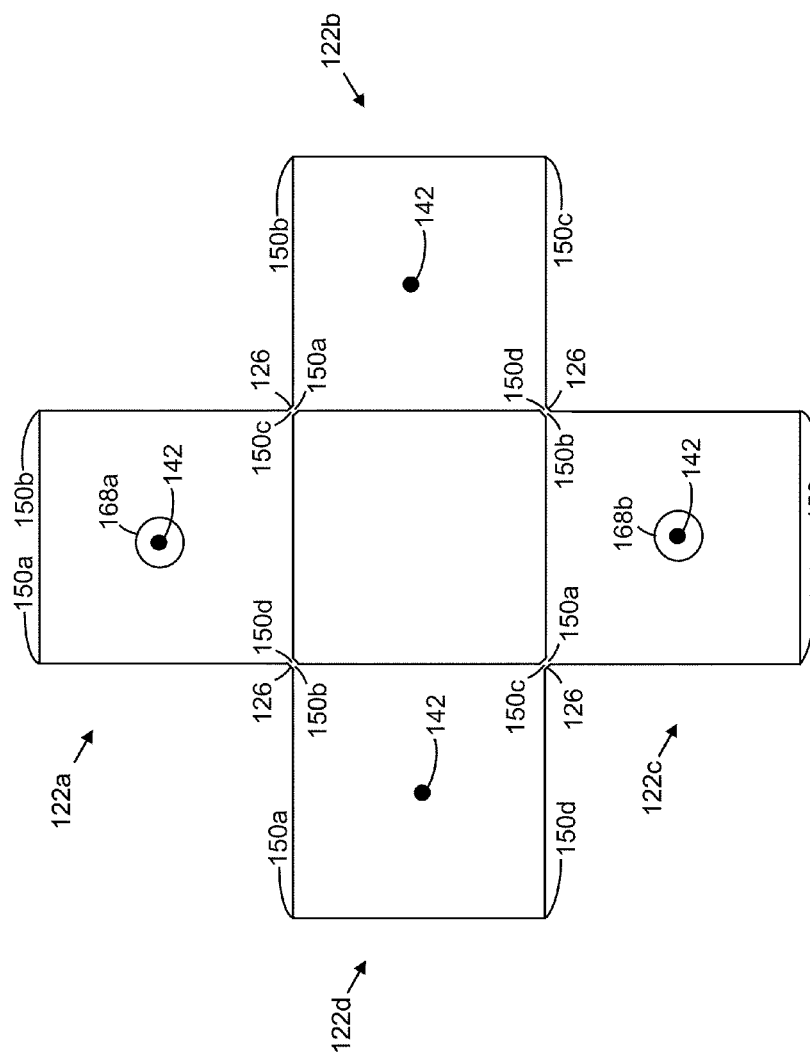
FIG. 9A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of substrate anchors employed in another anchoring technique and/or configuration to mechanically couple one or more of the plurality of resonators to one or more substrate anchors, according to certain aspects of present the inventions.
Figure 9B:
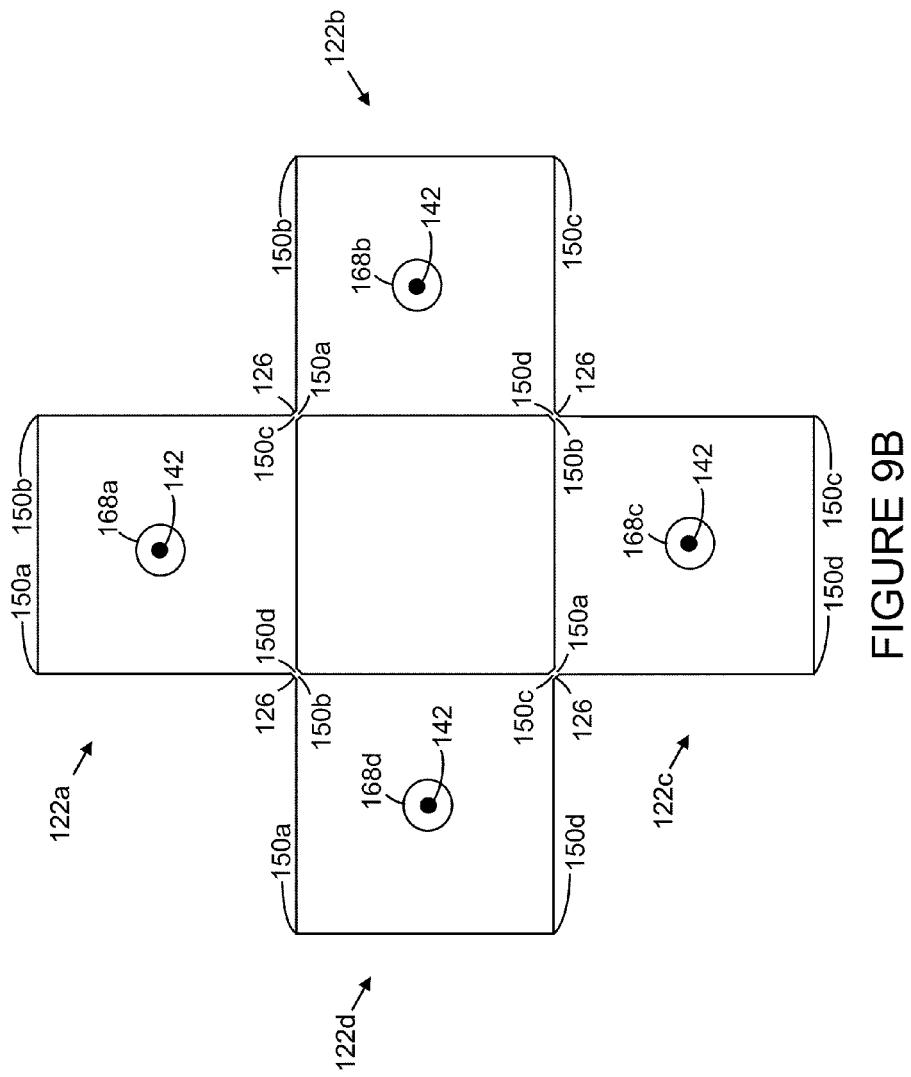
FIG. 9B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of substrate anchors employed in another anchoring technique and/or configuration to mechanically couple one or more of the plurality of resonators to one or more substrate anchors, according to certain aspects of present the inventions.

In lieu of and/or in addition to nodal points located on or near an outer area portion or region of resonator 122, resonator 122 may include one or more nodal points located in or near an inner area, portion or region of resonator 122, e.g., in or near center 142. With reference to FIGS. 9A-9B, in some embodiments, one or more resonators 122 includes a nodal point at the center 142 of the resonator 122 and the center 142 of one or more of such resonators 122 is coupled to one or more anchors, e.g., anchors 168a-168d (FIG. 9A) or anchors 168a-168b (FIG. 9B), to secure, fix and/or connect one or more of resonators 122 of MEMS resonator array 120 to the substrate via one or more anchors 168, e.g., anchors 168a-168d (FIG. 9A) or anchors 168a-168b (FIG. 9B). By anchoring through, at or near one or more nodal points the vertical and/or horizontal energy losses of resonator 122 may be minimized, limited and/or reduced, which may result or provide a relatively high Q MEMS structure. In some embodiments, at least one resonator 122 of the MEMS resonator array 120 is anchored to a "center" anchor 168, e.g., anchors 168a-168d (FIG. 9A) or anchors 168a-168b (FIG. 9B), according to this technique. However, as stated above, in some embodiments, one or more of the resonators 122 are not anchored through, at or near one or more nodal points, if any exist.

Figure 10A:
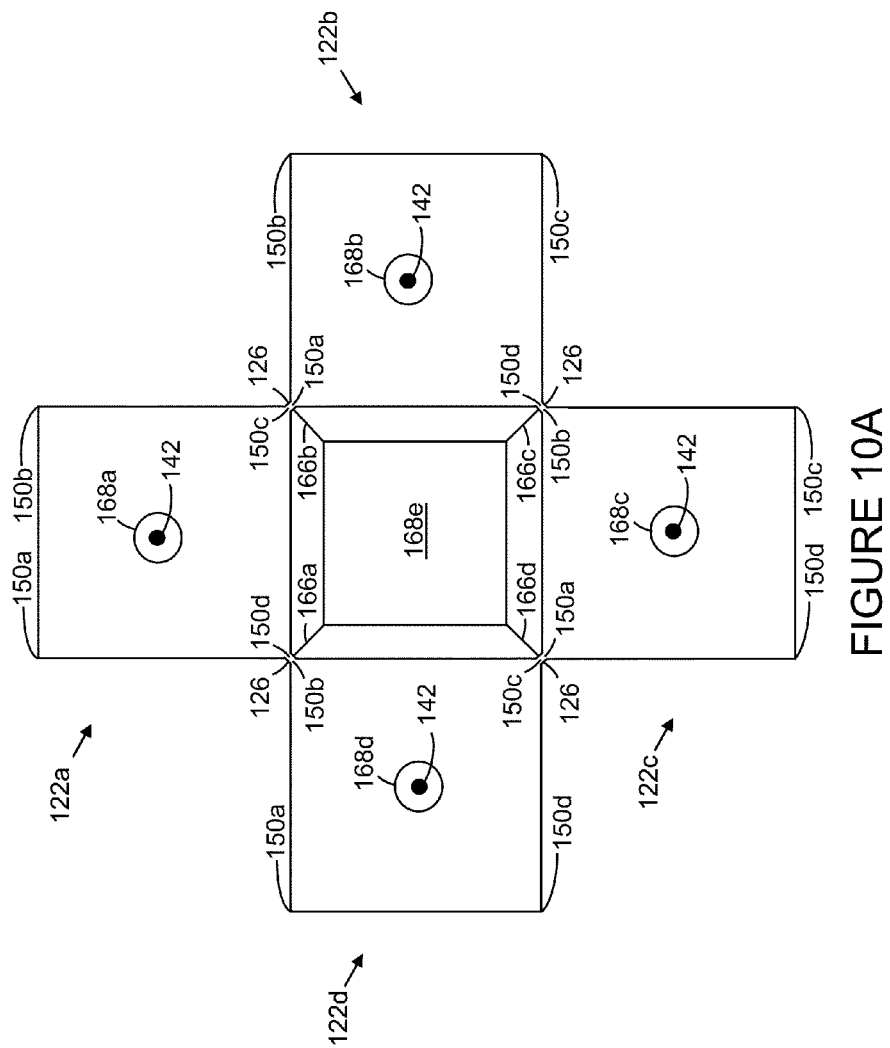
FIG. 10A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, according to certain aspects of present the inventions.

With reference to FIGS. 10A-10B, in some embodiments, the one or more "center" anchors may be in addition to or in lieu of one or more anchors coupled to one or more outer area portion or region of the resonator 122.

Notably, MEMS resonator array 120 may also be anchored to the substrate by anchoring one or more—but not all—of resonators 122 to the substrate. For example, with reference to FIG. 7B, one or more resonators, e.g., resonators 122a and 122c, are directly anchored to one or more substrate anchors, e.g., anchors 168a, 168b, via one or more anchor coupling sections 166, e.g., anchor coupling sections 166a, 166b. One or more other resonators, e.g., resonator 122b, are indirectly connected to one or more anchors 168, e.g., one or more of anchors 168a 168b, via one or more of the resonators, e.g., one or more of resonators 122a, 122c, directly anchored to the one or more substrate anchors, e.g., anchors 168a, 168b, via the one or more anchor coupling sections 166, e.g., anchor coupling sections 166a, 166b. With reference to FIG. 6E, one or more resonators, e.g., resonators 122a, 122b and 122d, are directly anchored to a common substrate anchor, e.g., anchor 168, via one or more anchor coupling sections 166, e.g., anchor coupling sections 166a, 166b. One or more other resonators, e.g., resonator 122c, are indirectly connected to one or more anchors 168, e.g., anchor 168, via one or more of the resonators, e.g., one or more of resonators 122a, 122b and 122d, directly anchored to the one or more substrate anchors, e.g., anchor 168, via the one or more anchor coupling sections 166, e.g., anchor coupling sections 166a, 166b. Thus, in some embodiments, one or more resonators 122 are directly anchored to the substrate and one or more resonators 122 are indirectly anchored to the substrate. The one or more resonators that are directly anchored to the substrate may be anchored to a "common" type anchor (see, for example, FIG. 6E) or an "individual" type anchor (see, for example, FIGS. 7B, 9A), or both types of anchors (see. for example, FIG. 8B).

With reference to FIGS. 11A-11F, FIGS. 12A-12C and FIGS. 13A-13B, in some embodiments, one or more of the anchor coupling sections 166 includes one or more stress/strain relief mechanisms 172 (for example, springs or spring-like components) to manage, control, reduce, eliminate and/or minimize any stress or strain on the substrate at the location of the anchor 168 which is caused by the motion of one, some or all of points at which MEMS resonator array 120 is anchored through or at the substrate. For example, with reference to FIG. 11A, in one embodiment, resonator 122a is mechanically coupled to anchor 168 via an anchor coupling section 166a having a stress/strain relief mechanism 172a. Similarly, resonator 122b is mechanically coupled to anchor 168 via an anchor coupling section 166b having a stress/strain relief mechanism 172b.

In this embodiment, stress/strain relief mechanism includes a spring or spring like component that includes first and second elongated portions 173a, 173b spaced apart by a gap 174. The spring or spring like component further includes first and second end portions 175a, 175b. The first end portion 175a joins a first end of the first elongated portion 173a to a first end of the second elongated portion 173b. The second end portion 175b joins a second end of the first elongated portion 173a to a second end of the second elongated portion 173b. The first and second elongated portions 173a, 173b may be straight and may have uniform thicknesses. However, other stress/strain relief mechanisms with other configurations may be employed in addition thereto and/or in lieu thereof.

Figure 11B:
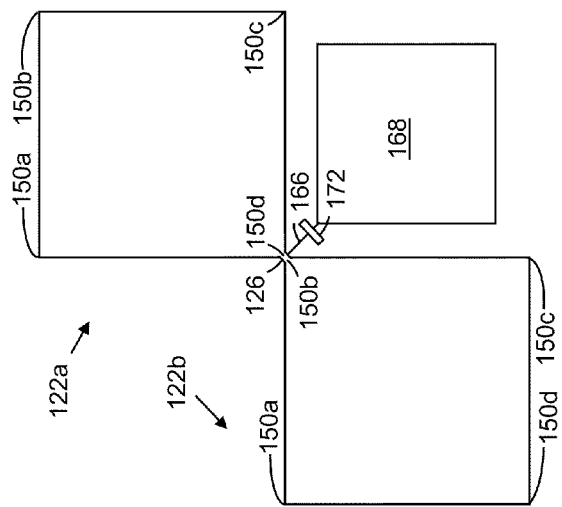
FIG. 11B illustrates a top view of another embodiment of a MEMS resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including an anchor coupling section and a substrate anchor employed in another anchoring technique and/or configuration to mechanically couple one or more of the plurality of resonators to one or more substrate anchors, wherein the anchor coupling section includes a stress/strain relief mechanism, according to certain aspects of the present inventions.
Figure 11A:
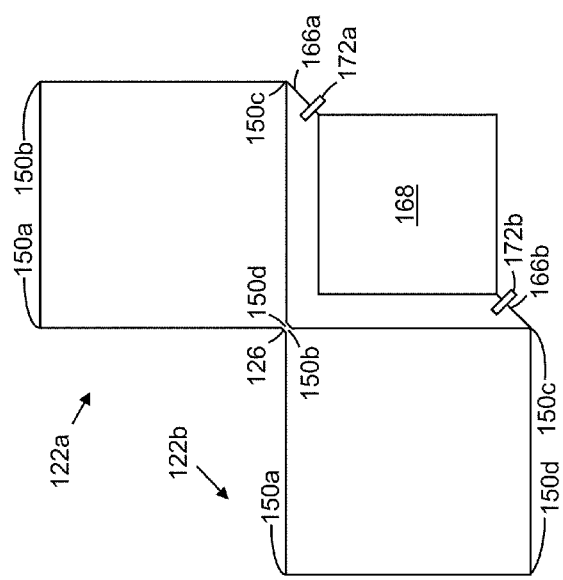
FIG. 11A illustrates a top view of one embodiment of a MEMS resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including a plurality of anchor coupling sections and a substrate anchor employed in another anchoring technique and/or configuration to mechanically couple one or more of the plurality of resonators to one or more substrate anchors, wherein each of the anchor coupling sections includes a stress/strain relief mechanism, according to certain aspects of the present inventions.
Figure 11C:
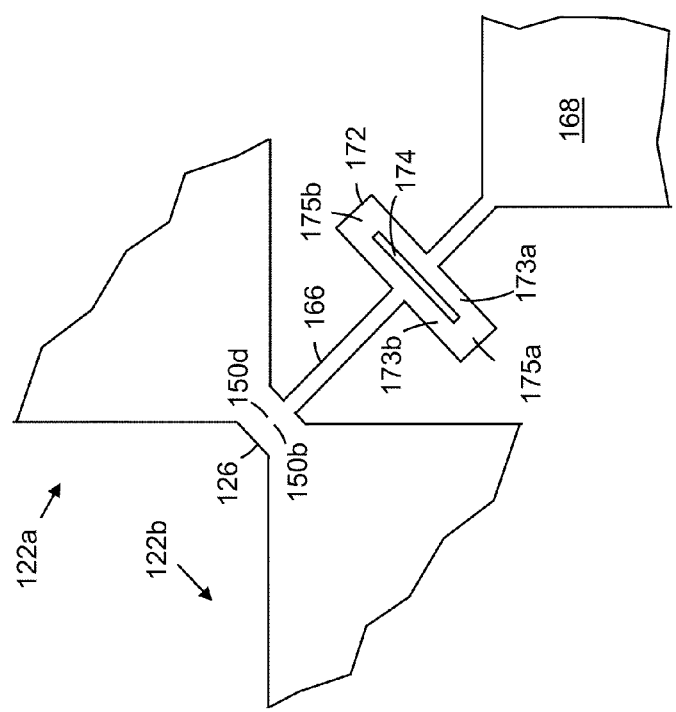
FIG. 11C illustrates an enlarged top view of a portion of one embodiment of the resonator array of FIG. 11B including one embodiment of the anchor coupling section that includes the stress/strain relief mechanism and one embodiment of the substrate anchor, according to certain aspects of present the inventions.

With reference to FIGS. 11B and 11C, in another embodiment, resonators 122a and 122b are mechanically coupled to anchor 168 via resonator coupling section 126 and an anchor coupling section having a stress/strain relief mechanism 172.

Figure 11D:
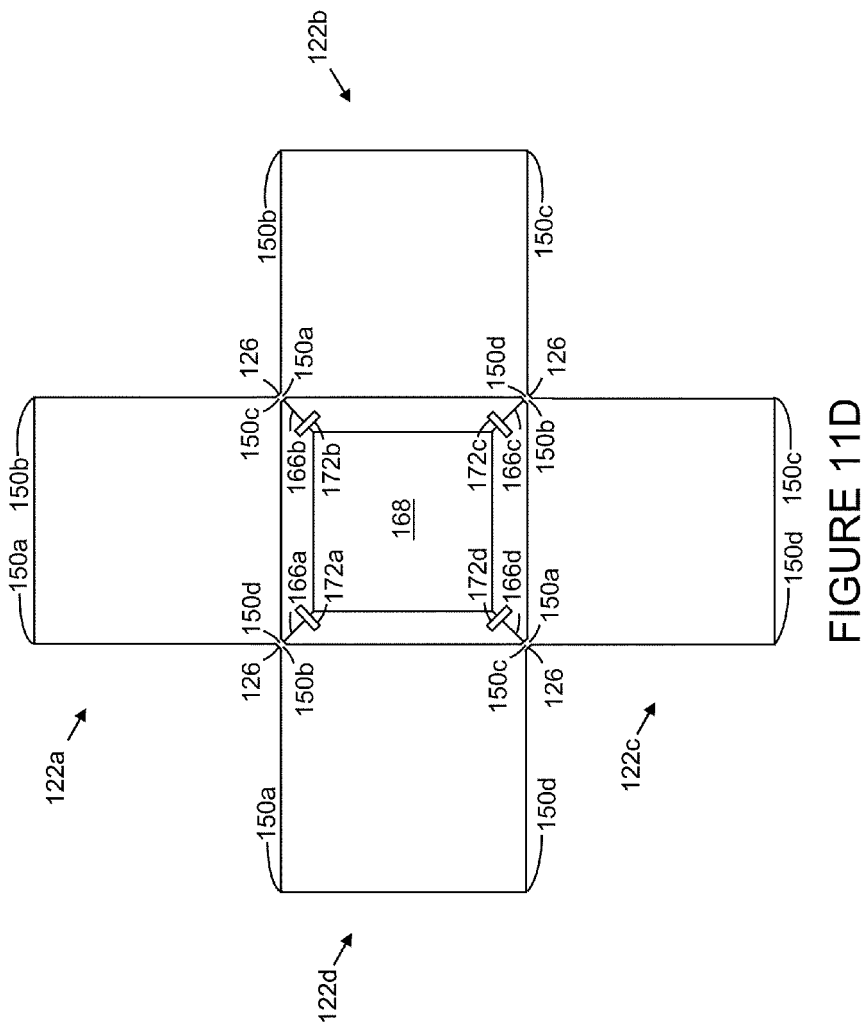
FIG. 11D illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a substrate anchor employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions.

With reference to FIG. 11D, in another embodiment, resonators 122a, 122d are mechanically coupled to anchor 168 via resonator coupling section 126 and an anchor coupling section 166a having a stress/strain relief mechanism 172a. Resonators 122a, 122b are mechanically coupled to anchor 168 via resonator coupling section 126 and an anchor coupling section 166b having a stress/strain relief mechanism 172b. Resonators 122b, 122c are mechanically coupled to anchor 168 via resonator coupling section 126 and an anchor coupling section 166c having a stress/strain relief mechanism 172c. Resonators 122c, 122d are mechanically coupled to anchor 168 via resonator coupling section 126 and an anchor coupling section 166d having a stress/strain relief mechanism 172d.

With reference to FIG. 11E, in another embodiment, resonators 122a, 122d are mechanically coupled to anchor 168 via resonator coupling section 126 and an anchor coupling section 166a having a stress/strain relief mechanism 172a. Resonators 122a, 122b are mechanically coupled to anchor 168 via resonator coupling section 126 and an anchor coupling section 166b having a stress/strain relief mechanism 172b.

Figure 11F:
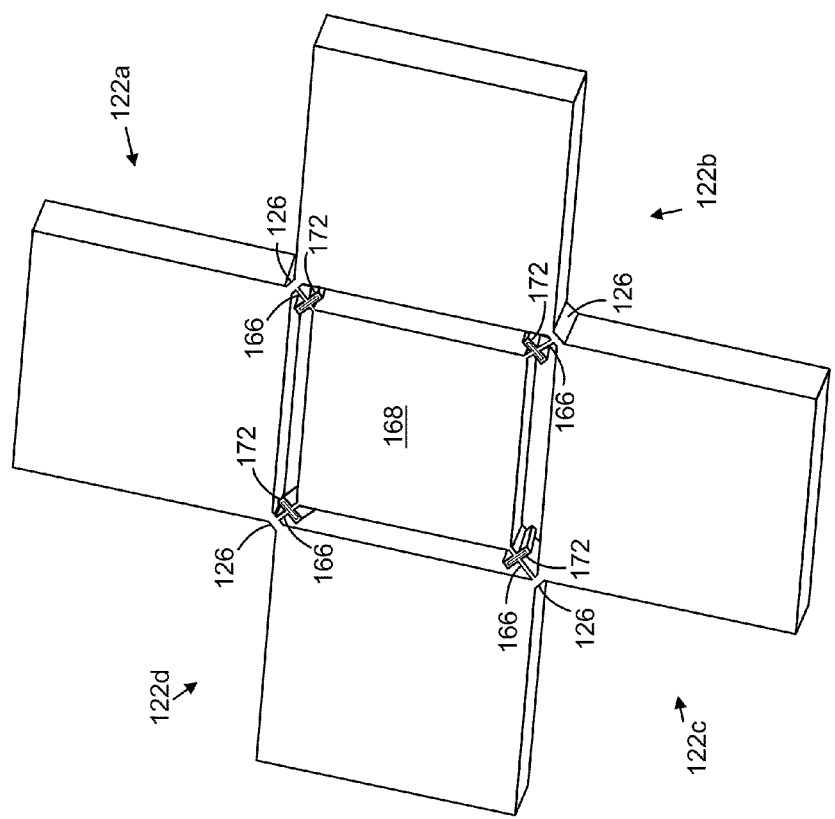
FIG. 11F is perspective view of one embodiment of the MEMS resonator array of FIG. 11D, according to certain aspects of the present inventions.
Figure 12B:
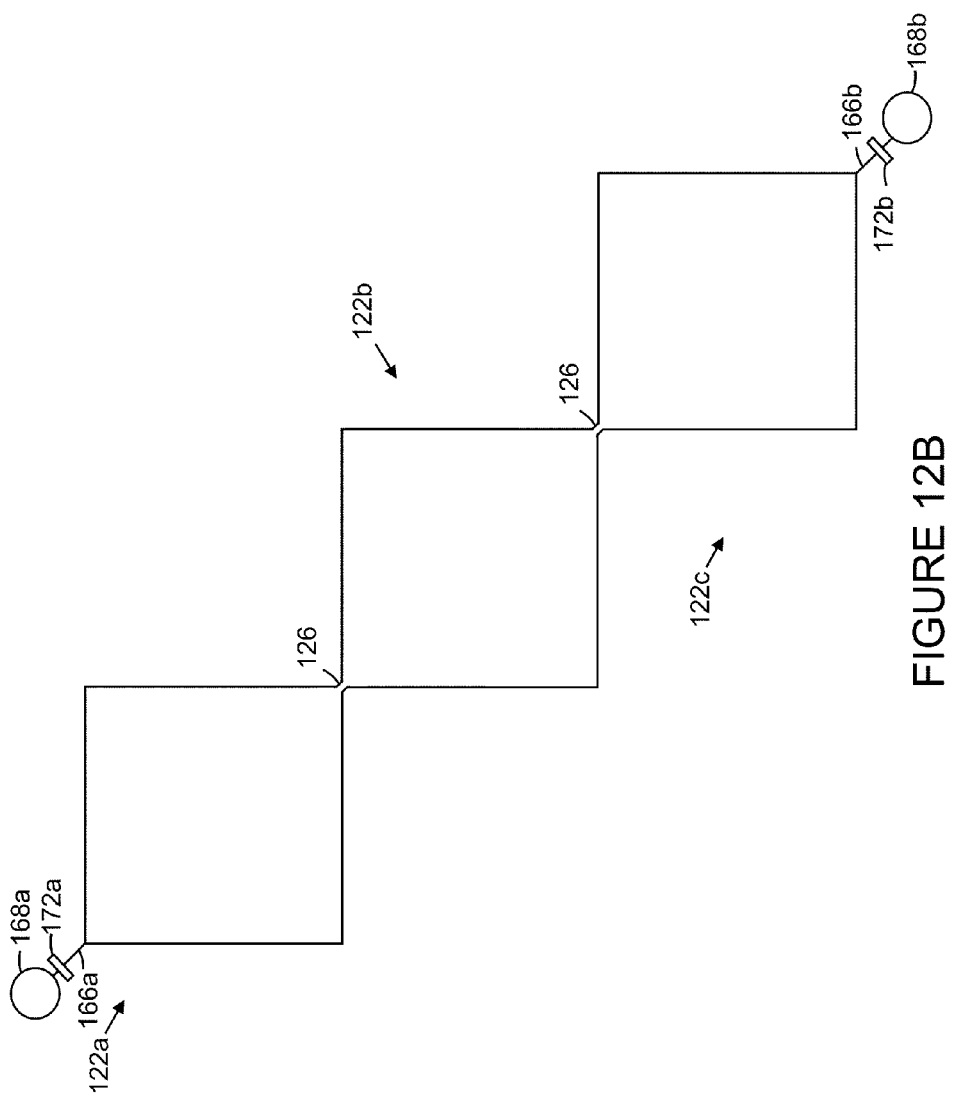
FIG. 12B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4D, and further including a plurality of anchor coupling sections and a plurality of substrate anchors employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions.
Figure 13A:
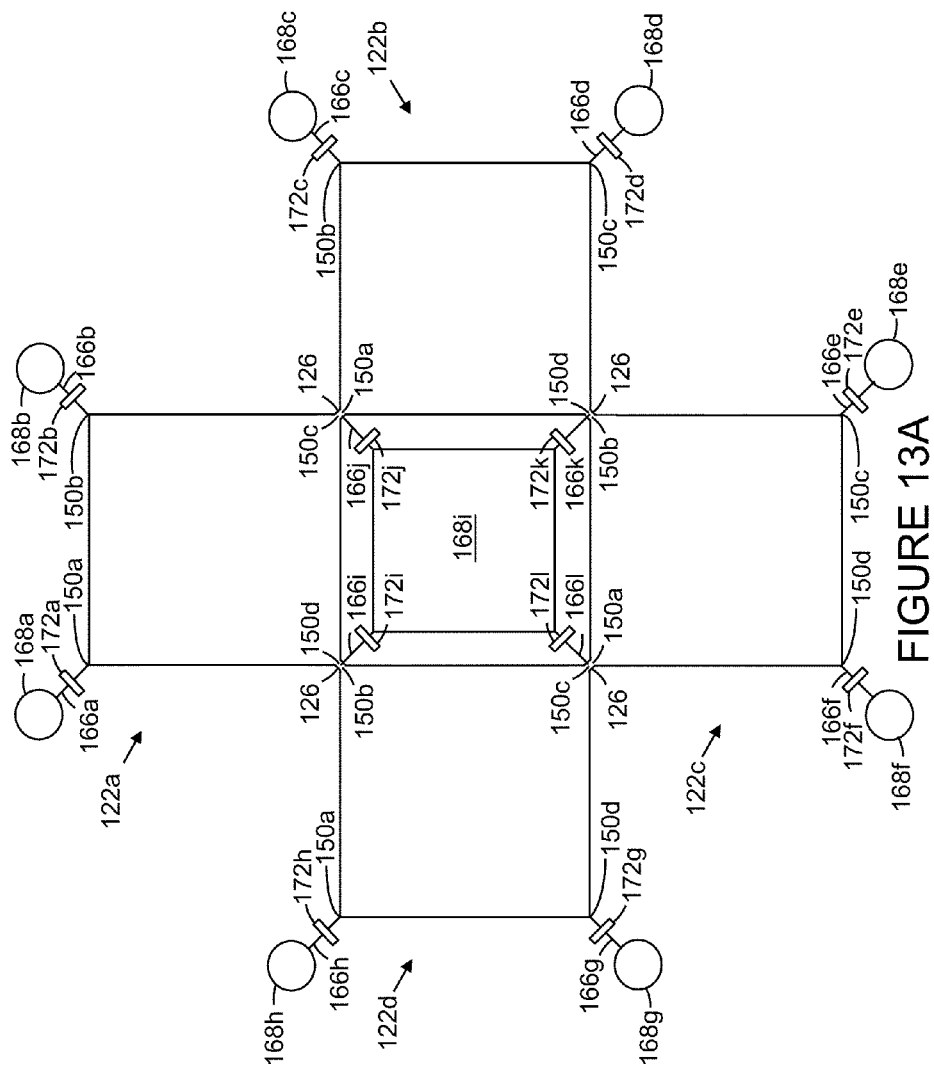
FIG. 13A illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions.
Figure 13B:
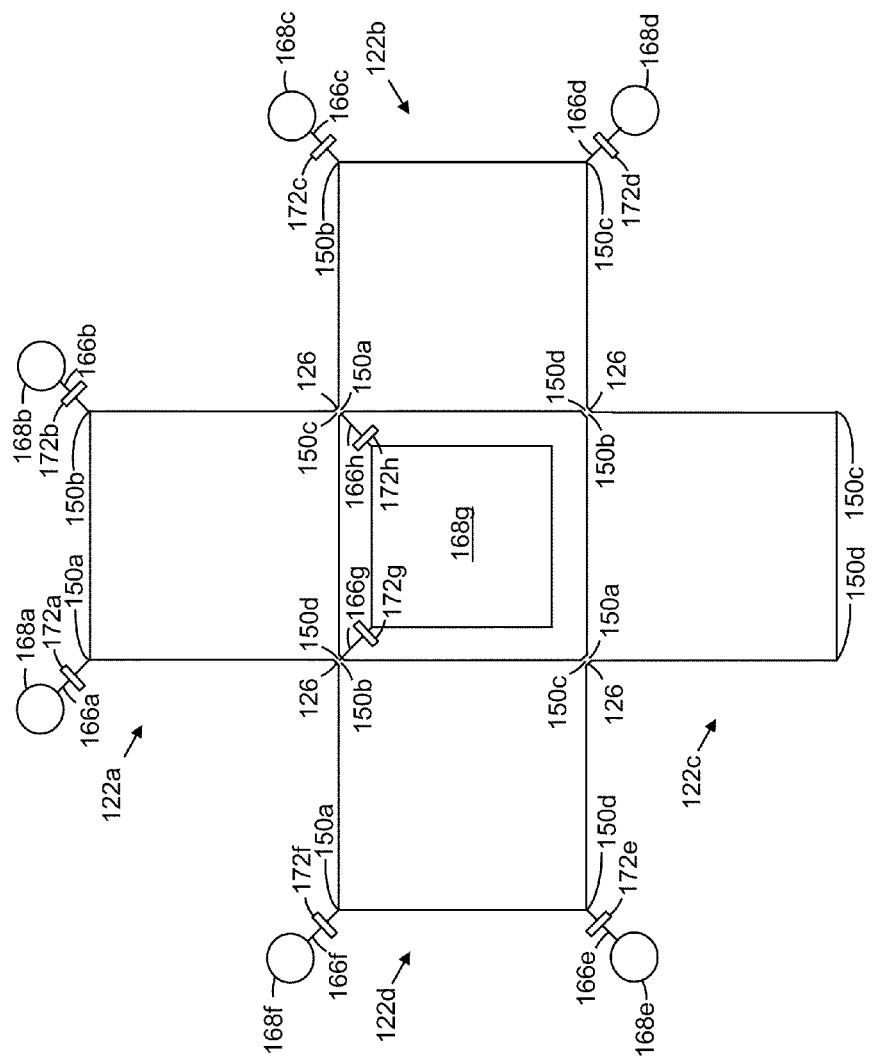
FIG. 13B illustrates a top view of another embodiment of a MEMS resonator array having a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of anchor coupling sections and a plurality of substrate anchors employed in another anchoring technique and/or configuration to mechanically couple one or more of the plurality of resonators to one or more substrate anchors, wherein each of the anchor coupling sections includes a stress/strain relief mechanism and may be the same as or similar to the anchor coupling section of the resonator array illustrated in FIG. 11C, according to certain aspects of the present inventions.
Figure 14B:
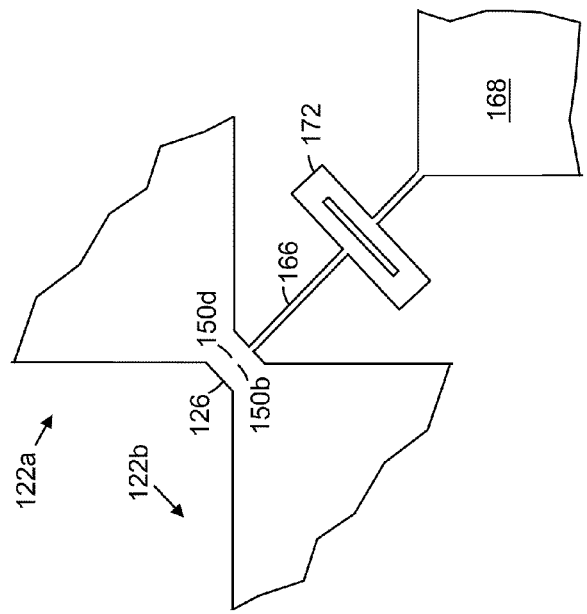
FIG. 14B is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, according to certain aspects of the present inventions.
Figure 14A:
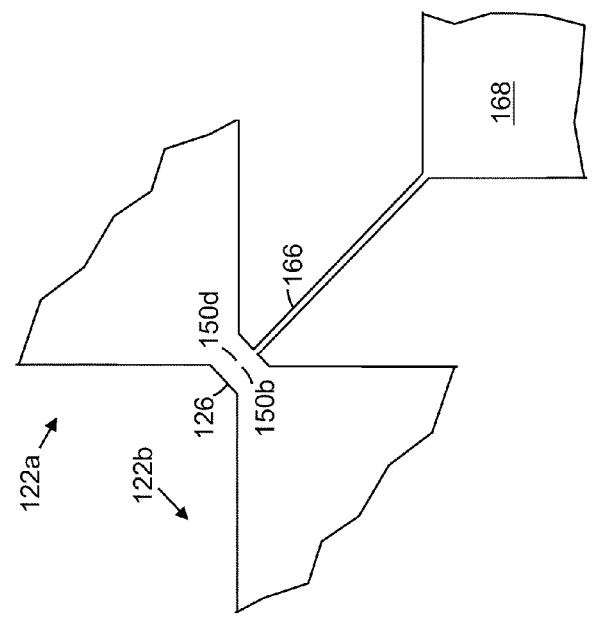
FIG. 14A is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, according to certain aspects of the present inventions.
Figure 14D:
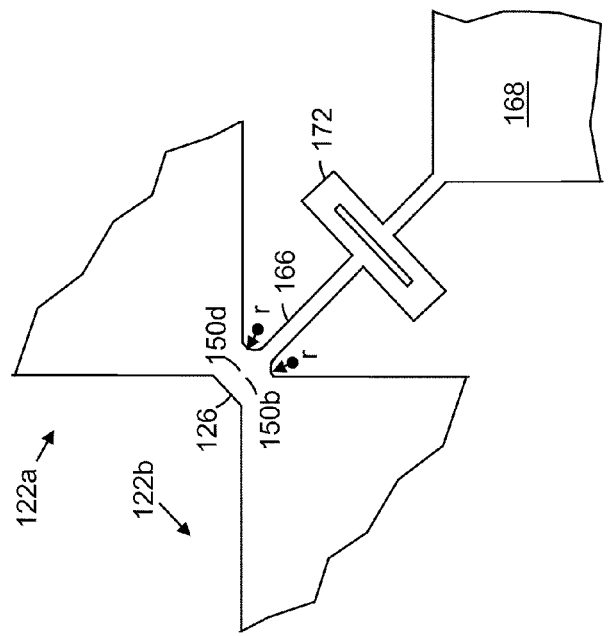
FIG. 14D is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes one or more rounded or curved sections and a stress/strain relief mechanism, according to certain aspects of the present inventions.
Figure 14C:
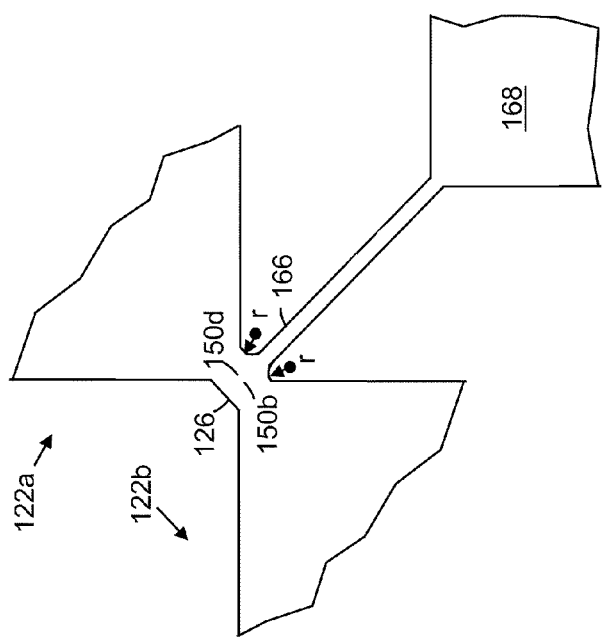
FIG. 14C is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes one or more rounded or curved sections, according to certain aspects of MEMS resonator array of the present inventions.
Figure 15A:
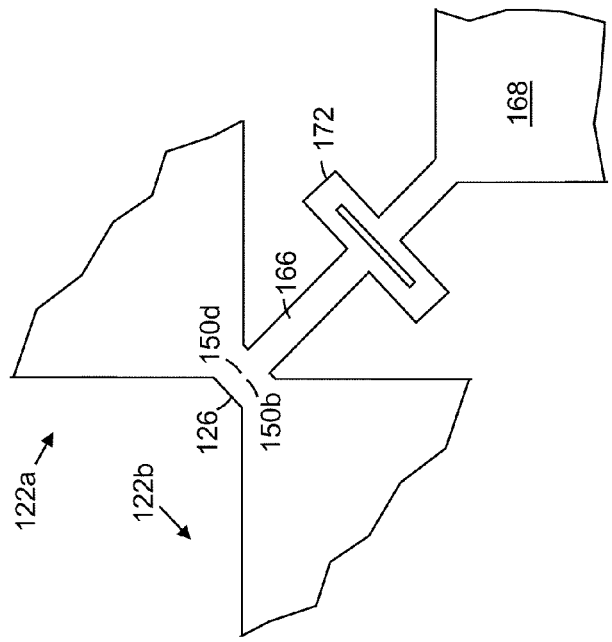
FIG. 15A is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, according to certain aspects of the present inventions.
Figure 15B:
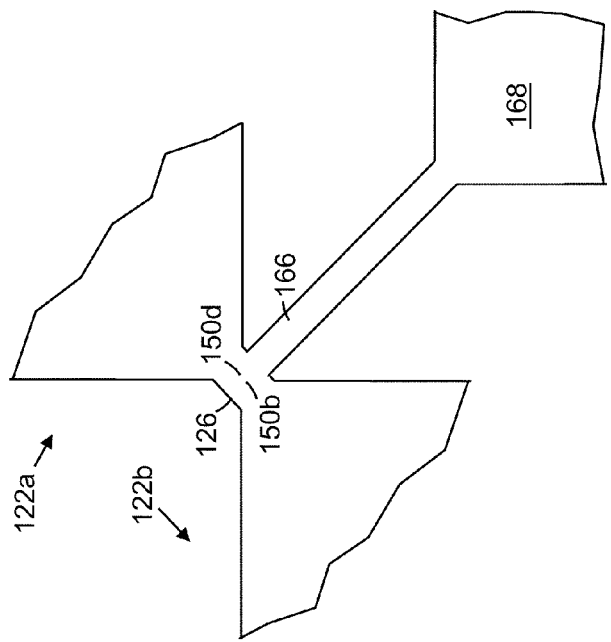
FIG. 15B is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes a stress/strain relief mechanism, according to certain aspects of the present inventions.
Figure 15D:
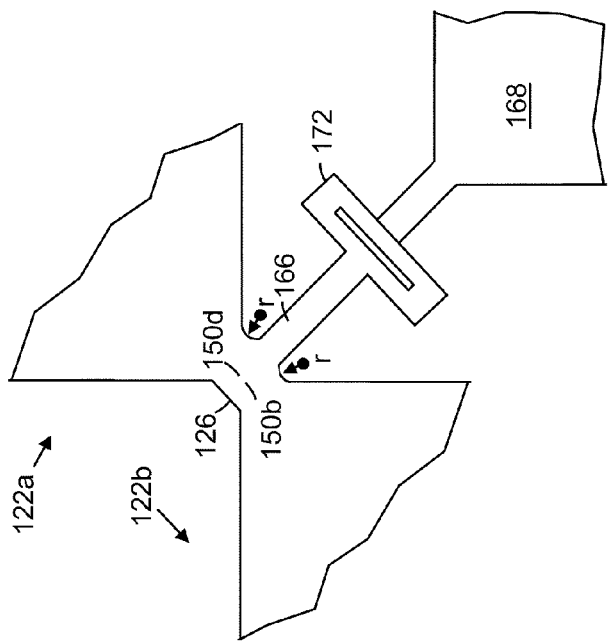
FIG. 15D is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes one or more rounded or curved sections and a stress/strain relief mechanism, according to certain aspects of the present inventions.
Figure 15C:
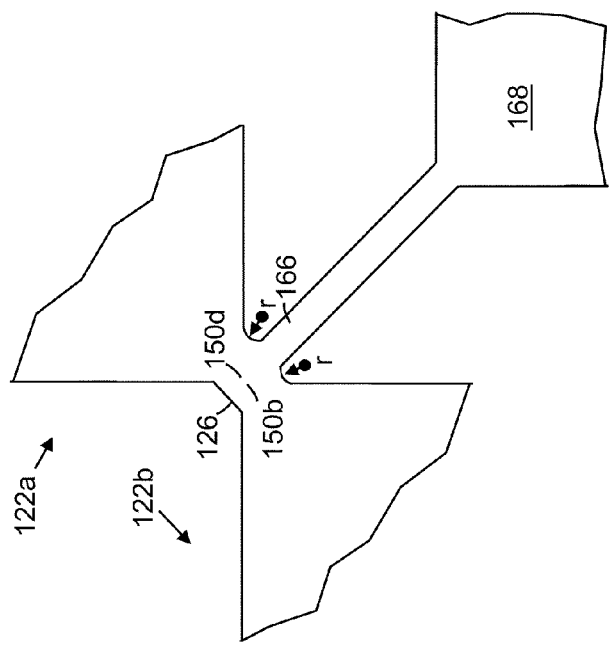
FIG. 15C is an enlarged top view of a portion of one embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes one or more rounded or curved sections, according to certain aspects of the present inventions.
Figure 16B:
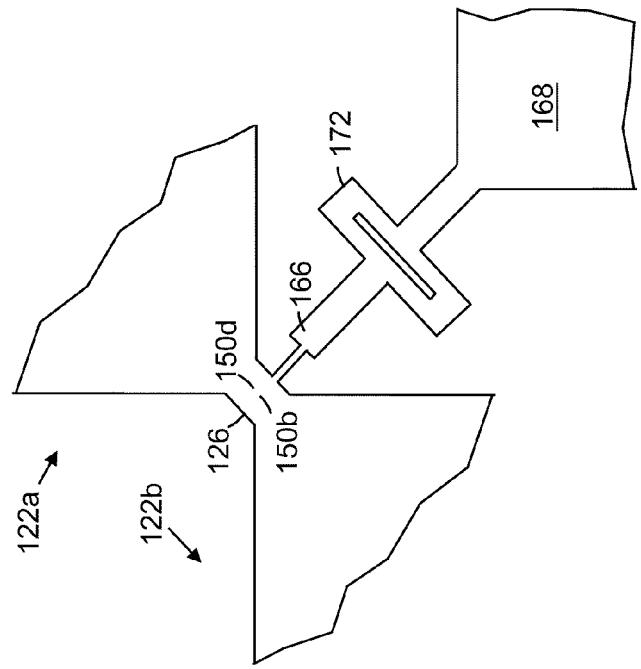
FIG. 16B is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes a stress/strain relief mechanism, according to certain aspects of the present inventions.
Figure 16A:
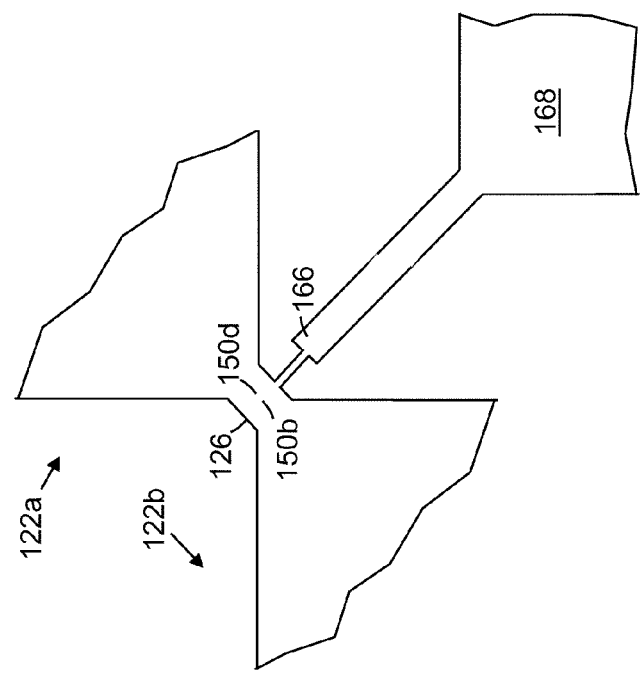
FIG. 16A is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, according to certain aspects of the present inventions.
Figure 17B:
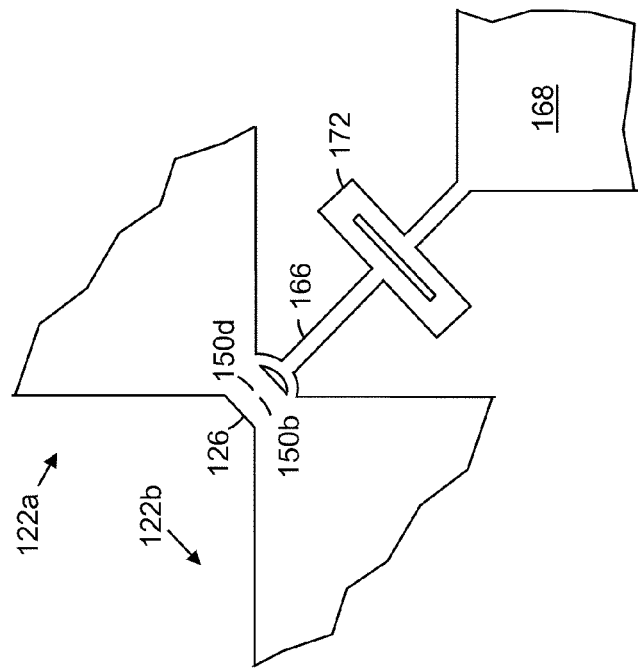
FIG. 17B is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, wherein the anchor coupling section includes a stress/strain relief mechanism, according to certain aspects of the present inventions.
Figure 17A:
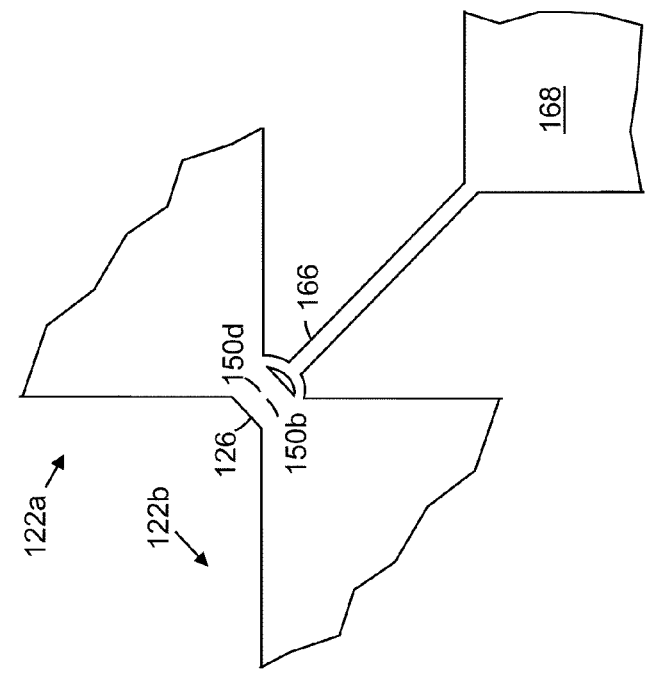
FIG. 17A is an enlarged top view of a portion of another embodiment of a resonator array having a plurality of bulk mode resonators and a resonator coupling section that may be the same as or similar to the plurality of bulk mode resonators and the resonator coupling section, respectively, of the resonator array illustrated in FIGS. 4A-4B, and further including another embodiment of an anchor coupling section and a substrate anchor employed in another anchoring technique and/or configuration to mechanically couple one or more of the plurality of resonators to one or more substrate anchors, according to certain aspects of the present inventions.

FIG. 11F is perspective view of one embodiment of the MEMS resonator array of FIG. 11D, according to certain aspects of the present inventions.

With reference to FIGS. 11A-11F, FIGS. 12A-12C and FIGS. 13A-13B, in operation, stress/strain relief mechanisms 172 expand and contract in conjunction with the motion of one, some or all of resonators 122a-122d in order to reduce, eliminate and/or minimize any stress or strain on the substrate and/or to compensate for small remaining movements of the anchoring point due to small asymmetries from manufacturing, material properties may change thereby resulting in a non-100% optimized design (even where Finite Element Modeling (also known as Finite Element Analysis, "FEA" or "F E Analysis") is employed). In this way, the anchoring architecture of MEMS resonator array 120 may be relatively stress-free and/or strain-free which may significantly decrease, reduce, minimize and/or eliminate any anchor energy loss and thereby increase, enhance, maximize the Q (and output signal) of resonators 122 and anchor stress will have little to no effect on the resonating frequency of resonators 122. Notably, in addition to decreasing, reducing, minimizing and/or eliminating anchor energy losses, an anchor coupling section 166 with stress/strain relief mechanism 172 may suspend resonators 122 of MEMS resonator array 120 above the substrate.

It may be advantageous to implement stress/strain relief mechanisms 172 in those situations where the point at which MEMS resonator array 120 is anchored through or at the substrate is not sufficiently or adequately motionless (i.e., where there is undesirable movement of the resonator 122 which may originate from or be caused by one or more resonators 122 or the substrate) or where additional de-coupling from the substrate is desired. For example, it may also be advantageous to employ stress/strain relief mechanisms 172 to reduce, eliminate and/or minimize communication of energy between one or more resonators 122 and the substrate (for example, in those situations where there is an impedance mismatch to a resonator 122 or where "noise" originates in the substrate and is communicated to one or more resonator 122).

The stress/strain relief mechanisms 172 may be employed in conjunction with any of the anchoring techniques and/or architectures described and/or illustrated herein. For example, stress/strain relief mechanisms 172 may be implemented within one or more of the one or more anchor coupling sections 166 of FIGS. 12A-12C and/or FIGS. 13A-13B.

The stress/strain relief mechanisms 172 may be well known springs or spring-like components, or may be any mechanism that reduces, eliminates and/or minimizes: (i) stress and/or strain on the substrate at the location of the anchor which is caused by the motion of one, some or all of points at which one or more resonators 122 are anchored through or at the substrate, and/or (ii) communication of energy between one or more resonators 122 and the substrate.

Notably, resonators 122 need not be anchored at every nodal point or area but may be anchored at one or more locations, preferably at one or more nodal locations (areas or locations of the resonator that do not move, experience little movement, and/or are substantially stationary when the resonator oscillates). For example, with reference to FIGS. 7A-7C and FIGS. 8A-8B, MEMS resonator array 120, may be anchored at one point, two points and/or three areas or portions of resonators 122 (in some embodiments, preferably at or near nodal points 106 of one or more resonators 122). In this regard, one or more anchor coupling sections 166 connect(s) resonator(s) 122 to corresponding anchors 168.

A finite element analysis and simulation engine may also be employed to design, determine and/or define the location(s) of one or more nodal points at which resonator 122 may be anchored to the substrate with predetermined, minimal and/or reduced energy loss (among other things). In this regard, resonator 122, when induced during operation, move in an expanding and contracting manner. As such, the configuration of resonator 122 may determine the location of nodal points on or in the resonator structure, if any, whereby there is little, no or reduced rotation movement due to the expansion and contraction mode of oscillation. The finite analysis engine may be employed to design, determine and assess the location of such nodal points in or on resonator 122 using a given configuration of resonator 122. In this way, areas or portions in or on resonator 122 that exhibit acceptable, predetermined, and/or little or no movement (radial, lateral and/or otherwise) for anchoring resonator 122 may be rapidly determined and/or identified.

Notably, a finite element analysis and simulation engine may also be employed to design, determine, assess and/or define the location(s) of one or more nodal points of resonators 122 when implemented in MEMS resonator array 120. In addition, an empirical approach may also be employed (in addition to or in lieu of a finite element analysis and simulation engine (or the like)) to design, determine, assess and/or define the location(s) of one or more nodal points of resonators 122 when implemented in MEMS resonator array 120. Indeed, the entire discussion above regarding finite element analysis and simulation engine is pertinent to the design, analysis and response of MEMS resonator array 120 having a plurality of resonators 122. For the sake of brevity those discussions will not be repeated.

The MEMS resonator array may employ any anchor structure and technique whether now known or later developed. Indeed, all structures and techniques are intended to fall within the scope of the present inventions. For example, the MEMS resonator array may employ the anchoring structures and techniques described and illustrated in U.S. Pat. No. 6,952,041 issued to Lutz et al. and entitled "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent"). It is expressly noted that the entire contents of the Anchors for Microelectromechanical Systems Patent, including, for example, the features, attributes, alternatives, materials, techniques and advantages of all of the embodiments and/or inventions, are incorporated by reference herein, although, unless stated otherwise, the aspects and/or embodiments of the present inventions are not limited to such features, attributes, alternatives, materials, techniques and advantages.

In those embodiments where one or more of resonators 122 are anchored to a "center" anchor 168, the design (for example, the shape and width) of anchor coupling sections 166 may impact the (i) the location of nodal points (if any) in or on resonator 122 as well as (ii) the resonant frequency of resonator 122. The design of anchor coupling section 166 may also affect the durability and/or stability of resonator 122. In this regard, by adjusting the shape and width of the anchor coupling section 166 in the vicinity of resonator 122 and/or by filleting anchor coupling section 166 in the vicinity of resonator 122 as shown in FIGS. 14A-14D and FIGS. 15A-15D, the stress on resonator 122 may be managed, controlled, reduced and/or minimized. For example, with reference to FIGS. 14A-14D and FIGS. 15A-15D, the width of anchor coupling section 166 may be increased or decreased and/or fillets may be provided to manage, control, reduce and/or minimize the stress concentration in or at nodal points. In this way, the durability and/or stability of resonator 122 may be increased, enhanced and/or optimized.

Other designs and/or configurations of anchor coupling sections 166 may be employed to, for example, affect the durability and/or stability of resonator 102 as well as the location of nodal points (if any) and the resonant frequency of resonator 122. (See, for example, FIGS. 16A-16B and FIGS. 17A-17B). Indeed, all designs of anchor coupling sections 166 whether now known or later developed are intended to fall within the scope of the present inventions.

Notably, the shape and/or size of resonator 122 in the vicinity of corners 150a-150d may also impact the durability and/or stability of resonator 122.

The aforementioned relationship is discussed in detail in "Microelectromechanical Resonator Structure, and Method of Designing, Operating and Using Same", filed May 19, 2005, and assigned U.S. patent application Ser. No. 11/132, 941. The inventions described and illustrated in the aforementioned patent application may be employed to design, implement, and/or fabricate one or more of the resonators of one or more of the MEMS resonator arrays of the present inventions. For the sake of brevity, those discussions will not be repeated. It is expressly noted, however, that the entire contents of the patent application, including, for example, the features, attributes, alternatives, materials, techniques and/or advantages of all of the inventions/embodiments, are incorporated by reference herein, although, unless stated otherwise, the aspects and/or embodiments of the present inventions are not limited to such features, attributes alternatives, materials, techniques and/or advantages.

Figure 18A:
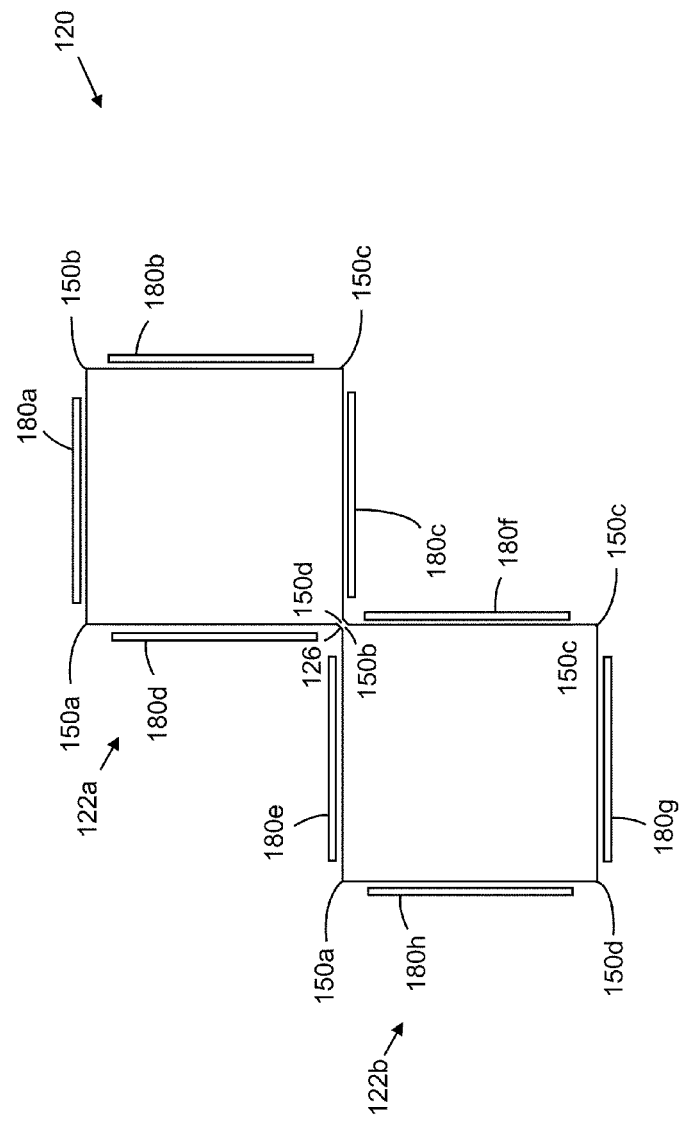
FIG. 18A is a top view of one embodiment of a resonator array including a plurality of bulk mode resonators and a resonator coupling section that may be the same as or similar to the plurality of bulk mode resonators and the resonator coupling section, respectively, of the resonator array illustrated in FIGS. 4A-4B, and further including a plurality of electrodes that includes a first plurality of electrodes and a second plurality of electrodes, according to certain aspects of the present inventions.
Figure 18B:
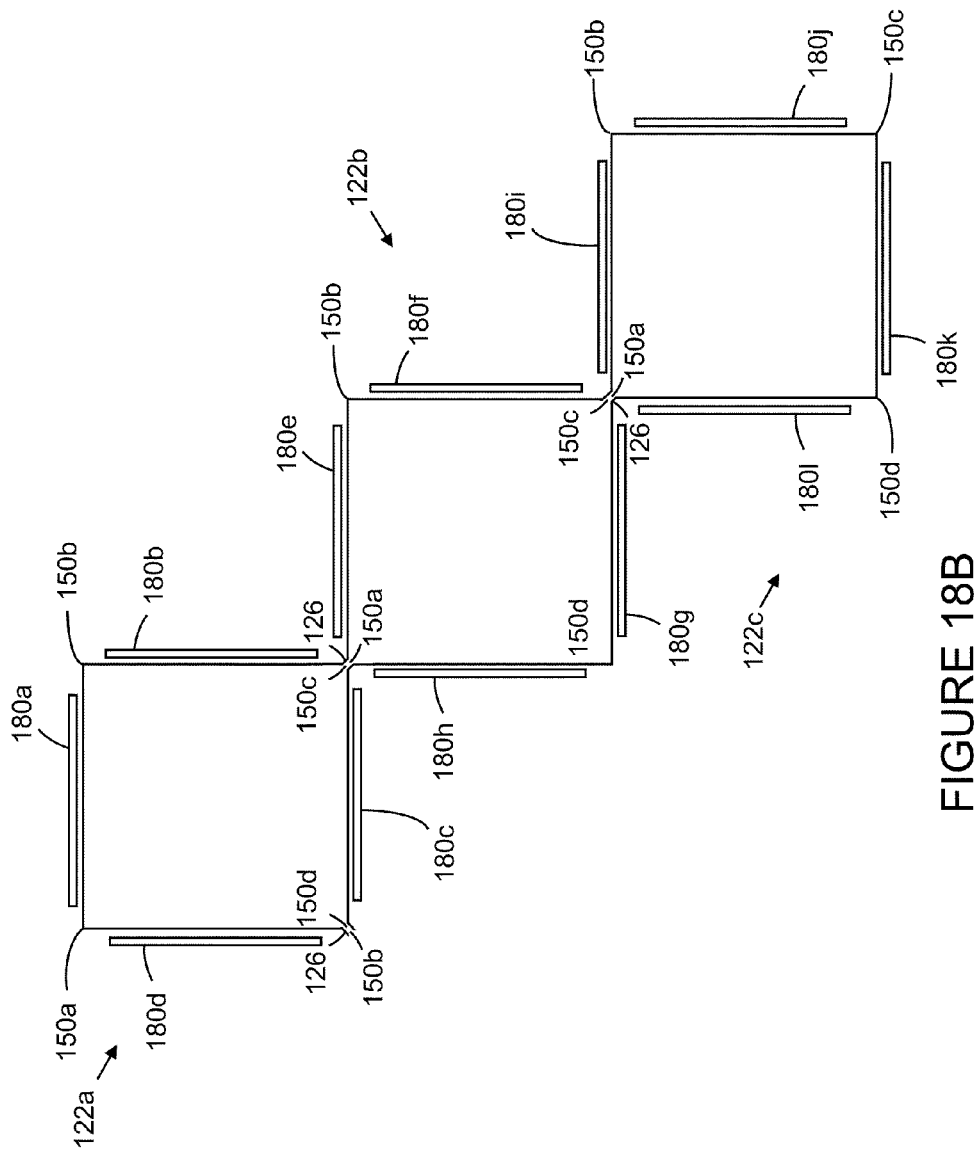
FIG. 18B is a top view of one embodiment of a resonator array including a plurality of bulk mode resonators and a plurality of resonator coupling sections that may be the same as or similar to the plurality of bulk mode resonators and the plurality of resonator coupling sections, respectively, of the resonator array illustrated in FIG. 4D, and further including a plurality of electrodes that includes a first plurality of electrodes, a second plurality of electrodes and a third plurality of electrodes, according to certain aspects of the present inventions.
Figure 18C:
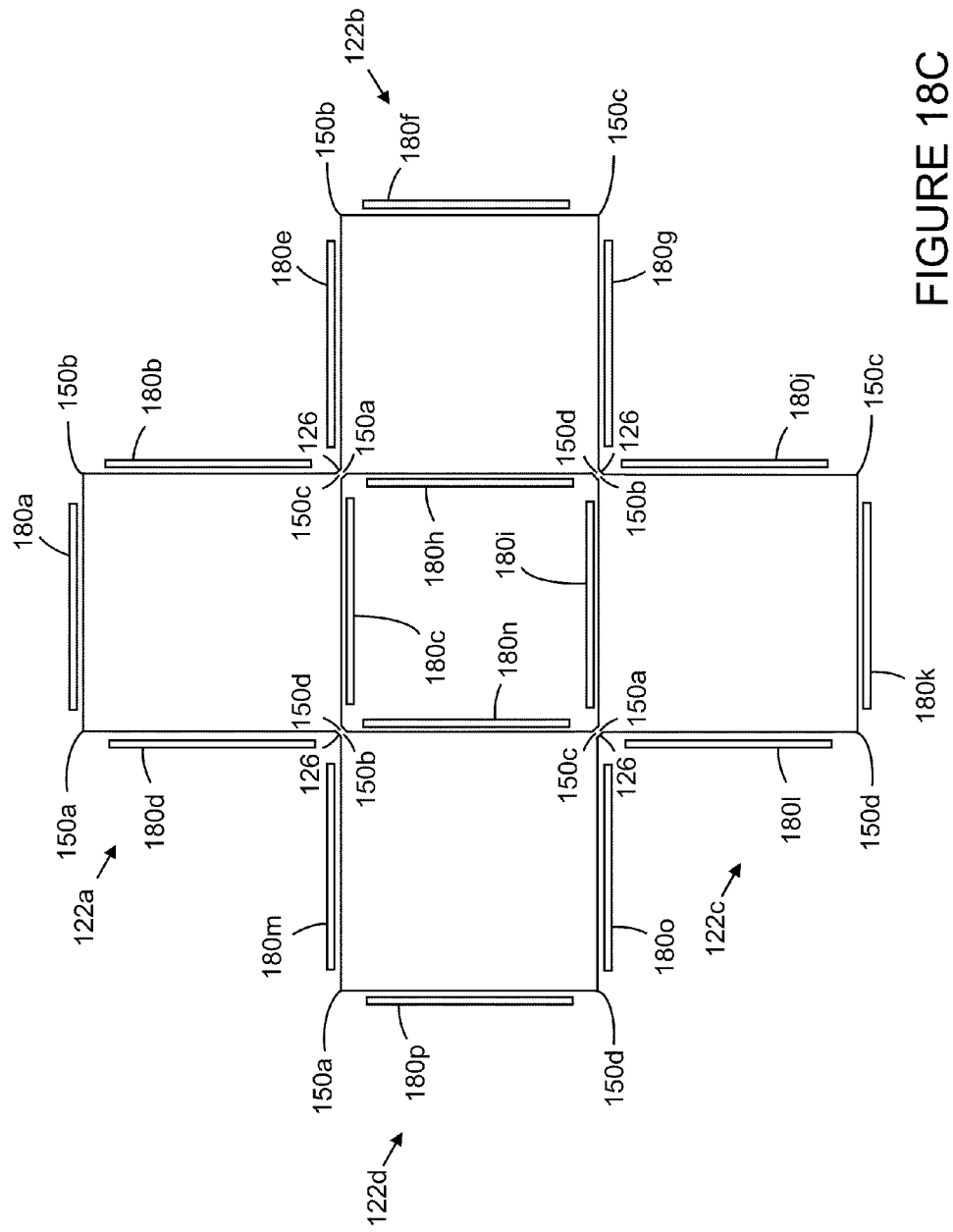
FIG. 18C is a top view of one embodiment of a resonator array including a plurality of bulk mode resonators and a plurality of resonator coupling sections that may be the same as or similar to the plurality of bulk mode resonators and the plurality of resonator coupling sections, respectively, of the resonator array illustrated in FIG. 4E, and further including a plurality of electrodes that includes a first plurality of electrodes, a second plurality of electrodes, a third plurality of electrodes and a fourth plurality of electrodes, according to certain aspects of the present inventions.

With reference to FIGS. 18A-18C, resonator array 120 may include one or more electrodes, which may be employed, for example, in inducing and/or sensing oscillation of one or more bulk mode resonators 122 of resonator array 120.

With reference to FIG. 18A, in one embodiment, resonator array 120 includes a plurality of bulk mode resonators 122a-122b, a resonator coupling section 126, a first plurality of electrodes 180a-180d and a second plurality of electrodes 180e-180h. The plurality of bulk mode resonators 122a-122b and the resonator coupling section 126 may be the same as or similar to the plurality of bulk mode resonators 122a-122b and the resonator coupling section 126, respectively, of the resonator array 120 illustrated in FIGS. 4A-4B. The first plurality of electrodes 180a-180d may be employed, for example, in inducing and/or sensing oscillation of the first bulk mode resonator 122a. The second plurality of electrodes 180e-180h may be employed, for example, in inducing and/or sensing oscillation of the second bulk mode resonator 122b.

Each of the electrodes 180a-180h may have any suitable configuration and positioning. In the illustrated embodiment, for example, each of the electrodes has an elongated shape and is disposed juxtaposed (and/or parallel) an associated bulk mode resonator 122 of the resonator array 120. For example, the first plurality of electrodes 180a-180d are disposed juxtaposed (and/or parallel) the first bulk mode resonator 122a. The second plurality of electrodes 180e-180h are disposed juxtaposed (and/or parallel) the second bulk mode resonator 122b.

Figure 18D:
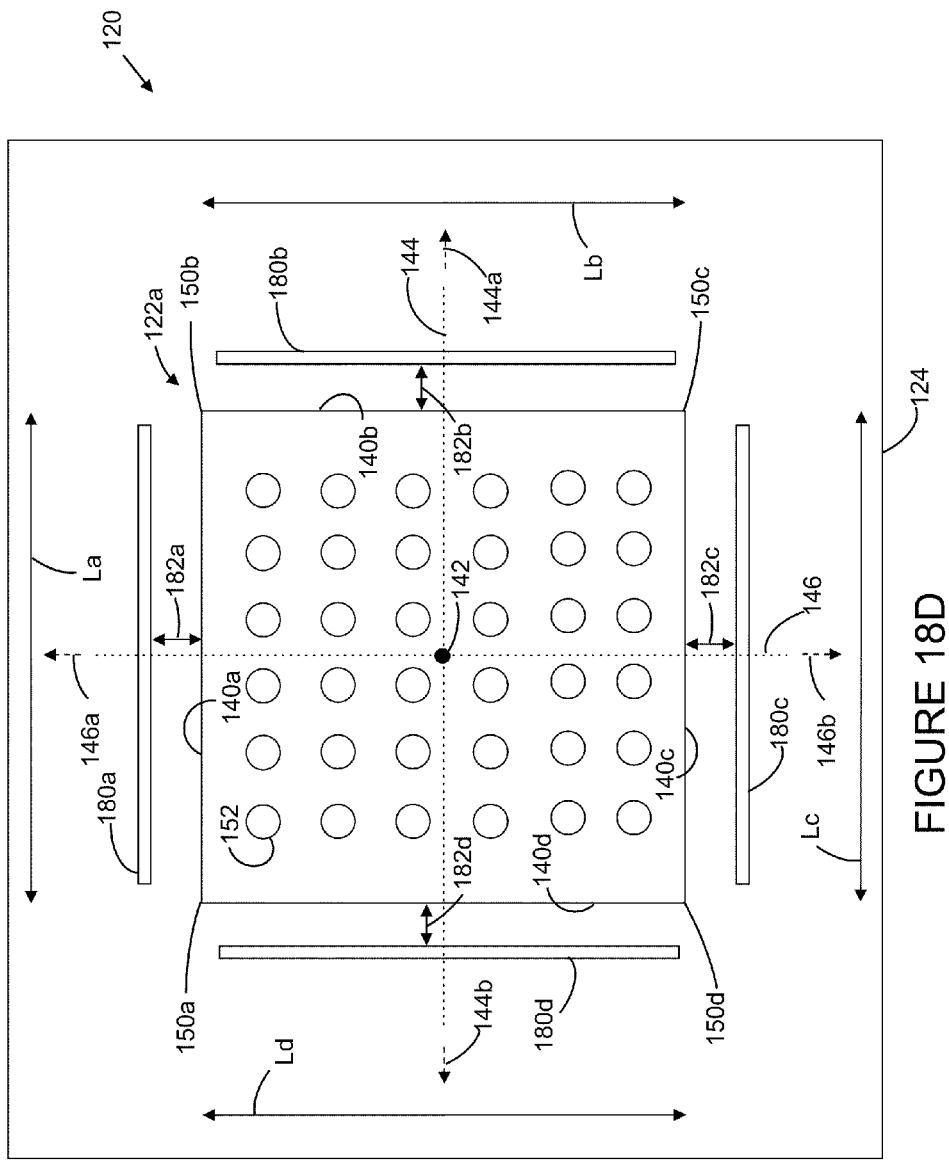
FIG. 18D is an enlarged top view representation of a portion of one embodiment of the resonator array of FIG. 18C, including a first bulk mode resonator and the first plurality of electrodes, according to certain aspects of the present inventions.

In one embodiment, each of the bulk mode resonators 122a-122b has a configuration that is the same as or similar to resonator 122 illustrated in FIG. 3A. (see, for example, FIGS. 18D-18E) In such embodiment, the first plurality of electrodes 180a-180d may be disposed juxtaposed (and/or parallel) to outer surfaces 140a-140d, respectively, of resonator 122a. The second plurality of electrodes 180e-180h may be disposed juxtaposed (and/or parallel) to outer surfaces 140a-140d, respectively, of resonator 122b.

Moreover, each of the electrodes 180a-180h may be spaced apart from the associated resonator 122 by a gap. For example, with reference to FIG. 18D, the first plurality of electrodes 180a-180d may be spaced apart from outer surfaces 140a-140d, respectively, of first bulk mode resonator 122a, by gaps 182a-182d. Similarly, with reference to FIG. 18E, the second plurality of electrodes 180e-180h may be spaced apart from outer surfaces 140a-140d, respectively, of second bulk mode resonator 122b, by gaps 182a-182d.

In the non-operating (at rest) state, each resonator 122 may be centered between the electrodes associated therewith. Thus, the first bulk mode resonator 122a may be centered between the first plurality of electrodes 180a-180d. The second bulk mode resonator 122b may be centered between the second plurality of electrodes 180e-180h.

With reference to FIG. 18B, in another embodiment, a resonator array 120 includes a plurality of bulk mode resonators 122a-122c, a plurality of resonator coupling sections 126, a first plurality of electrodes 180a-180d, a second plurality of electrodes 180e-180h and a third plurality of electrodes 180i-180l. The plurality of bulk mode resonators 122a-122c and the plurality of resonator coupling sections 126 may be the same as or similar to the plurality of bulk mode resonators 122a-122c and the plurality of resonator coupling sections 126, respectively, of the resonator array 120 illustrated in FIG. 4D. The first plurality of electrodes may be employed, for example, in inducing and/or sensing oscillation of the first bulk mode resonator 122a. The second plurality of electrodes 180e-180h may be employed, for example, in inducing and/or sensing oscillation of the second bulk mode resonator 122b. The third plurality of electrodes 180i-180l may be employed, for example, in inducing and/or sensing oscillation of the third bulk mode resonator 122c.

Each of the electrodes 180a-180l may have any suitable configuration and positioning. In the illustrated embodiment, for example, each of the electrodes has an elongated shape and is disposed juxtaposed (and/or parallel) an associated bulk mode resonator 122 of the resonator array 120. For example, the first plurality of electrodes 180a-180d are disposed juxtaposed (and/or parallel) the first bulk mode resonator 122a. The second plurality of electrodes 180e-180h are disposed juxtaposed (and/or parallel) the second bulk mode resonator 122b. The third plurality of electrodes 180i-180l are disposed juxtaposed (and/or parallel) the third bulk mode resonator 122c.

In one embodiment, each of the bulk mode resonators 122a-122c has a configuration that is the same as or similar to resonator 122 illustrated in FIG. 3A. (see, for example, FIGS. 18D-18F) In such embodiment, the first plurality of electrodes 180a-180d may be disposed juxtaposed (and/or parallel) to outer surfaces 140a-140d, respectively, of first bulk mode resonator 122a. The second plurality of electrodes 180e-180h may be disposed juxtaposed (and/or parallel) to outer surfaces 140a-140d, respectively, of second bulk mode resonator 122b. The third plurality of electrodes 180i-180l may be disposed juxtaposed (and/or parallel) to outer surfaces 140a-140d, respectively, of third bulk mode resonator 122c.

Figure 18E:
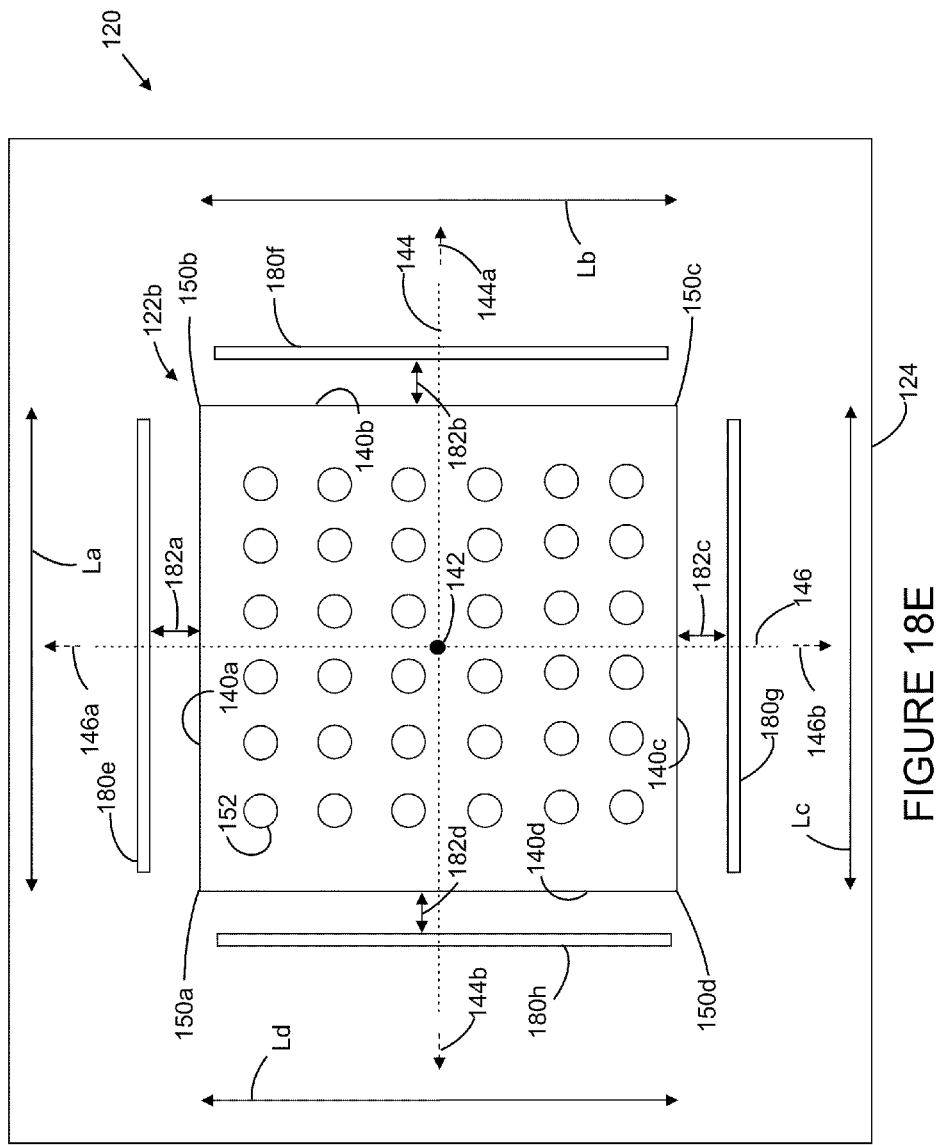
FIG. 18E is an enlarged top view representation of a portion of one embodiment of the resonator array of FIG. 18C, including a second bulk mode resonator and the second plurality of electrodes, according to certain aspects of the present inventions.
Figure 18F:
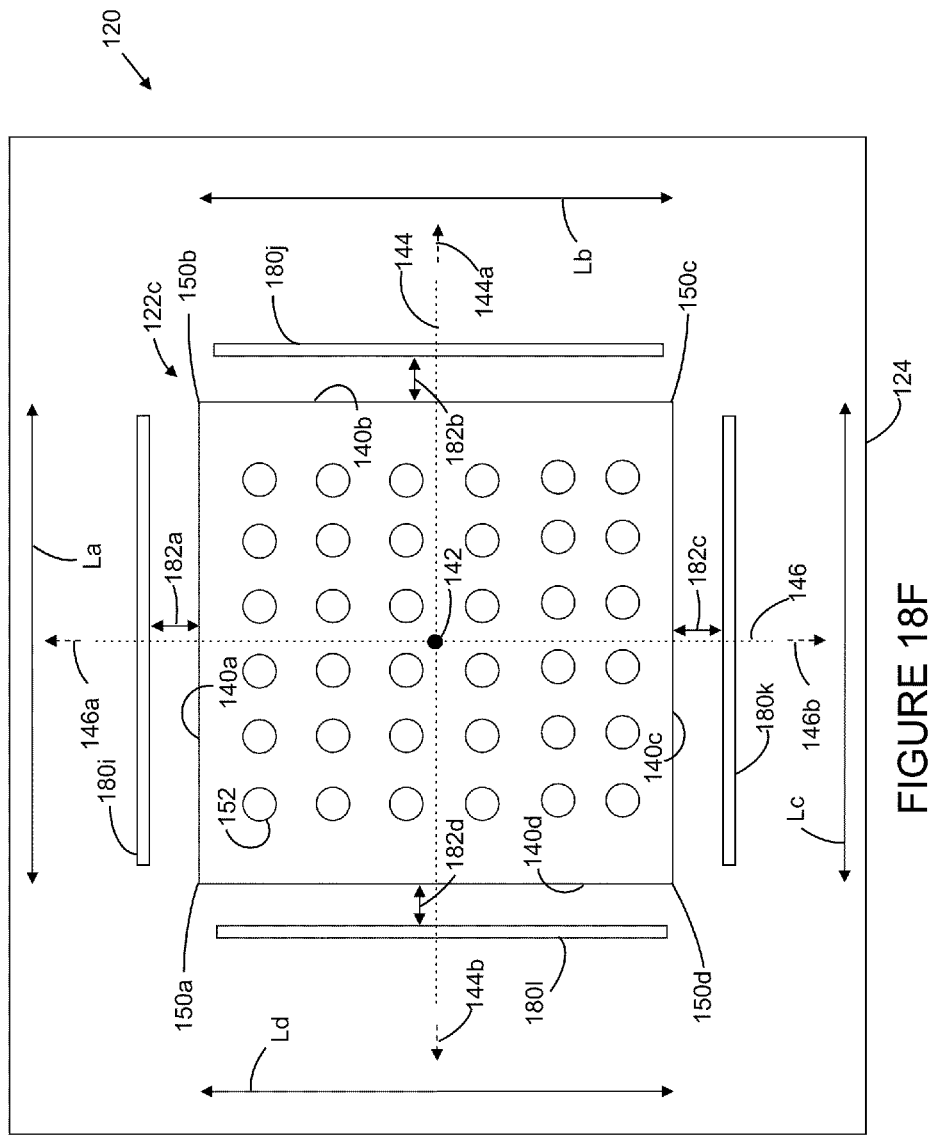
FIG. 18F is an enlarged top view representation of a portion of one embodiment of the resonator array of FIG. 18C, including a third bulk mode resonator and the third plurality of electrodes, according to certain aspects of the present inventions.

Moreover, each of the electrodes 180a-180h may be spaced apart from the associated resonator 122 by a gap. For example, with reference to FIG. 18D, the first plurality of electrodes 180a-180d may be spaced apart from outer surfaces 140a-140d, respectively, of first bulk mode resonator 122a, by gaps 182a-182d. With reference to FIG. 18E, the second plurality of electrodes 180e-180h may be spaced apart from outer surfaces 140a-140d, respectively, of second bulk mode resonator 122b, by gaps 182a-182d. With reference to FIG. 18F, the third plurality of electrodes 180i-180l may be spaced apart from outer surfaces 140a-140d, respectively, of third bulk mode resonator 122c, by gaps 182a-182d.

In the non-operating (at rest) state, each resonator 122 may be centered between the electrodes associated therewith. Thus, the first bulk mode resonator 122a may be centered between the first plurality of electrodes 180a-180d. The second bulk mode resonator 122b may be centered between the second plurality of electrodes 180e-180h. The third bulk mode resonator 122c may be centered between the third plurality of electrodes 180i-180l.

With reference to FIG. 18C, in another embodiment, a resonator array 120 includes a plurality of bulk mode resonators 122a-122c, a plurality of resonator coupling sections 126, a first plurality of electrodes 180a-180d, a second plurality of electrodes 180e-180h, a third plurality of electrodes 180i-180l and a fourth plurality of electrodes 180m-180p.

The plurality of bulk mode resonators 122*a*-122*d* and the plurality of resonator coupling sections 126 may be the same as or similar to the plurality of bulk mode resonators 122*a*-122*d* and the plurality of resonator coupling sections 126, respectively, of the resonator array 120 illustrated in FIG. 4E. The first plurality of electrodes may be employed, for example, in inducing and/or sensing oscillation of the first bulk mode resonator 122*a*. The second plurality of electrodes 180*e*-180*h* may be employed, for example, in inducing and/or sensing oscillation of the second bulk mode resonator 122*b*. The third plurality of electrodes 180*i*-180*l* may be employed, for example, in inducing and/or sensing oscillation of the third bulk mode resonator 122*c*. The fourth plurality of electrodes 180*m*-180*p* may be employed, for example, in inducing and/or sensing oscillation of the fourth bulk mode resonator 122*d*.

Each of the electrodes 180*a*-180*p* may have any suitable configuration and positioning. In the illustrated embodiment, for example, each of the electrodes 180*a*-180*p* has an elongated shape and is disposed juxtaposed (and/or parallel) an associated bulk mode resonator 122 of the resonator array 120. For example, the first plurality of electrodes 180*a*-180*d* are disposed juxtaposed (and/or parallel) the first bulk mode resonator 122*a*. The second plurality of electrodes 180*e*-180*h* are disposed juxtaposed (and/or parallel) the second bulk mode resonator 122*b*. The third plurality of electrodes 180*i*-180*l* are disposed juxtaposed (and/or parallel) the third bulk mode resonator 122*c*. The fourth plurality of electrodes 180*m*-180*o* are disposed juxtaposed (and/or parallel) the fourth bulk mode resonator 122*d*.

In the embodiments of resonator array 120 illustrated in FIGS. 18A-18C, each of the bulk mode resonators In one embodiment, each of the bulk mode resonators 122*a*-122*d* has a configuration that is the same as or similar to resonator 122 illustrated in FIG. 3A. (see, for example, FIGS. 18D-18G) In such embodiment, the first plurality of electrodes 180*a*-180*d* may be disposed juxtaposed (and/or parallel) to outer surfaces 140*a*-140*d*, respectively, of first bulk mode resonator 122*a*. The second plurality of electrodes 180*e*-180*h* may be disposed juxtaposed (and/or parallel) to outer surfaces 140*a*-140*d*, respectively, of second bulk mode resonator 122*b*. The third plurality of electrodes 180*i*-180*l* may be disposed juxtaposed (and/or parallel) to outer surfaces 140*a*-140*d*, respectively, of third bulk mode resonator 122*c*. The fourth plurality of electrodes 180*m*-180*p* may be disposed juxtaposed (and/or parallel) to outer surfaces 140*a*-140*d*, respectively, of fourth bulk mode resonator 122*d*.

Figure 18G:
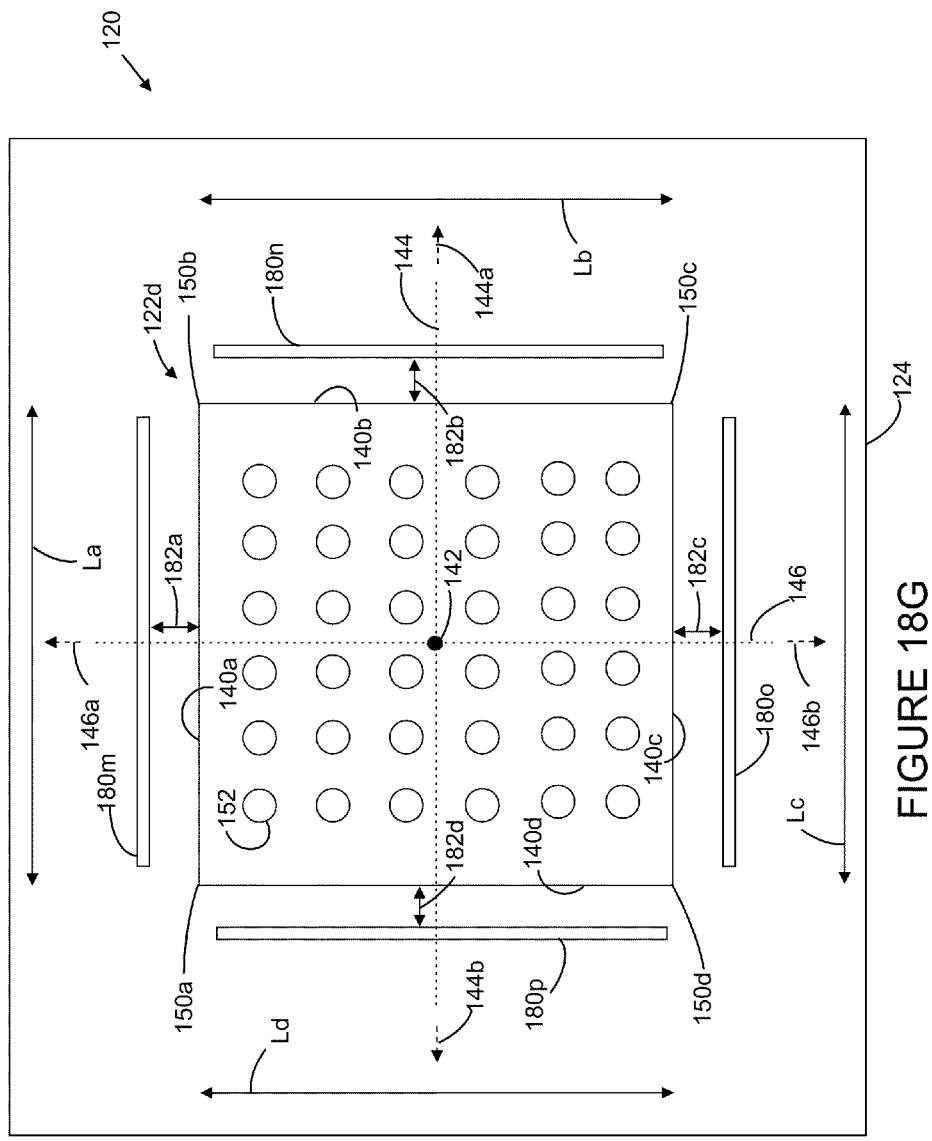
FIG. 18G is an enlarged top view representation of a portion of one embodiment of the resonator array of FIG. 18C, including a fourth bulk mode resonator and the fourth plurality of electrodes, according to certain aspects of the present inventions.

Moreover, each of the electrodes 180*a*-180*h* may be spaced apart from the associated resonator 122 by a gap. For example, with reference to FIG. 18D, the first plurality of electrodes 180*a*-180*d* may be spaced apart from outer surfaces 140*a*-140*d*, respectively, of first bulk mode resonator 122*a*, by gaps 182*a*-182*d*. With reference to FIG. 18E, the second plurality of electrodes 180*e*-180*h* may be spaced apart from outer surfaces 140*a*-140*d*, respectively, of second bulk mode resonator 122*b*, by gaps 182*a*-182*d*. With reference to FIG. 18F, the third plurality of electrodes 180*i*-180*l* may be spaced apart from outer surfaces 140*a*-140*d*, respectively, of third bulk mode resonator 122*c*, by gaps 182*a*-182*d*. With reference to FIG. 18G, the fourth plurality of electrodes 180*m*-180*o* may be spaced apart from outer surfaces 140*a*-140*d*, respectively, of fourth bulk mode resonator 122*d*, by gaps 182*a*-182*d*.

In the non-operating (at rest) state, each resonator 122 may be centered between the electrodes associated therewith. Thus, the first bulk mode resonator 122*a* may be centered between the first plurality of electrodes 180*a*-180*d*. The second bulk mode resonator 122*b* may be centered between the second plurality of electrodes 180*e*-180*h*. The third bulk mode resonator 122*c* may be centered between the third plurality of electrodes 180*i*-180*l*. The fourth bulk mode resonator 122*d* may be centered between the fourth plurality of electrodes 180*m*-180*p*.

In some embodiments, each electrode defines a capacitance in conjunction with the associated resonator 122. For example, in the embodiments of FIGS. 18A-18D, electrode 180*a* and resonator 122*a* define a first capacitance. Electrode 180*b* and resonator 122*a* define a second capacitance. Electrode 180*c* and resonator 122*a* define a third capacitance. Electrode 180*d* and resonator 122*a* define a fourth capacitance. Electrode 180*e* and resonator 122*b* define a fifth capacitance. Electrode 180*f* and resonator 122*b* define a sixth capacitance. Electrode 180*g* and resonator 122*b* define a seventh capacitance. Electrode 180*h* and resonator 122*b* define an eighth capacitance. Electrode 180*i* (FIGS. 18B, 18C) and resonator 122*c* (FIGS. 18B, 18C) define a ninth capacitance. Electrode 180*j* (FIGS. 18B, 18C) and resonator 122*c* (FIGS. 18B, 18C) define a tenth capacitance. Electrode 180*k* (FIGS. 18B, 18C) and resonator 122*c* (FIGS. 18B, 18C) define an eleventh capacitance. Electrode 180*l* (FIGS. 18B, 18C) and resonator 122*c* (FIGS. 18B, 18C) define a twelfth capacitance. Electrode 180*m* (FIG. 18C) and resonator 122*d* (FIG. 18C) define a thirteenth capacitance. Electrode 180*n* (FIG. 18C) and resonator 122*d* (FIG. 18C) define a fourteenth capacitance. Electrode 180*o* (FIG. 18C) and resonator 122*d* (FIG. 18C) define a fifteenth capacitance. Electrode 180*p* (FIG. 18C) and resonator 122*d* (FIG. 18C) define a sixteenth capacitance.

Figure 19A:
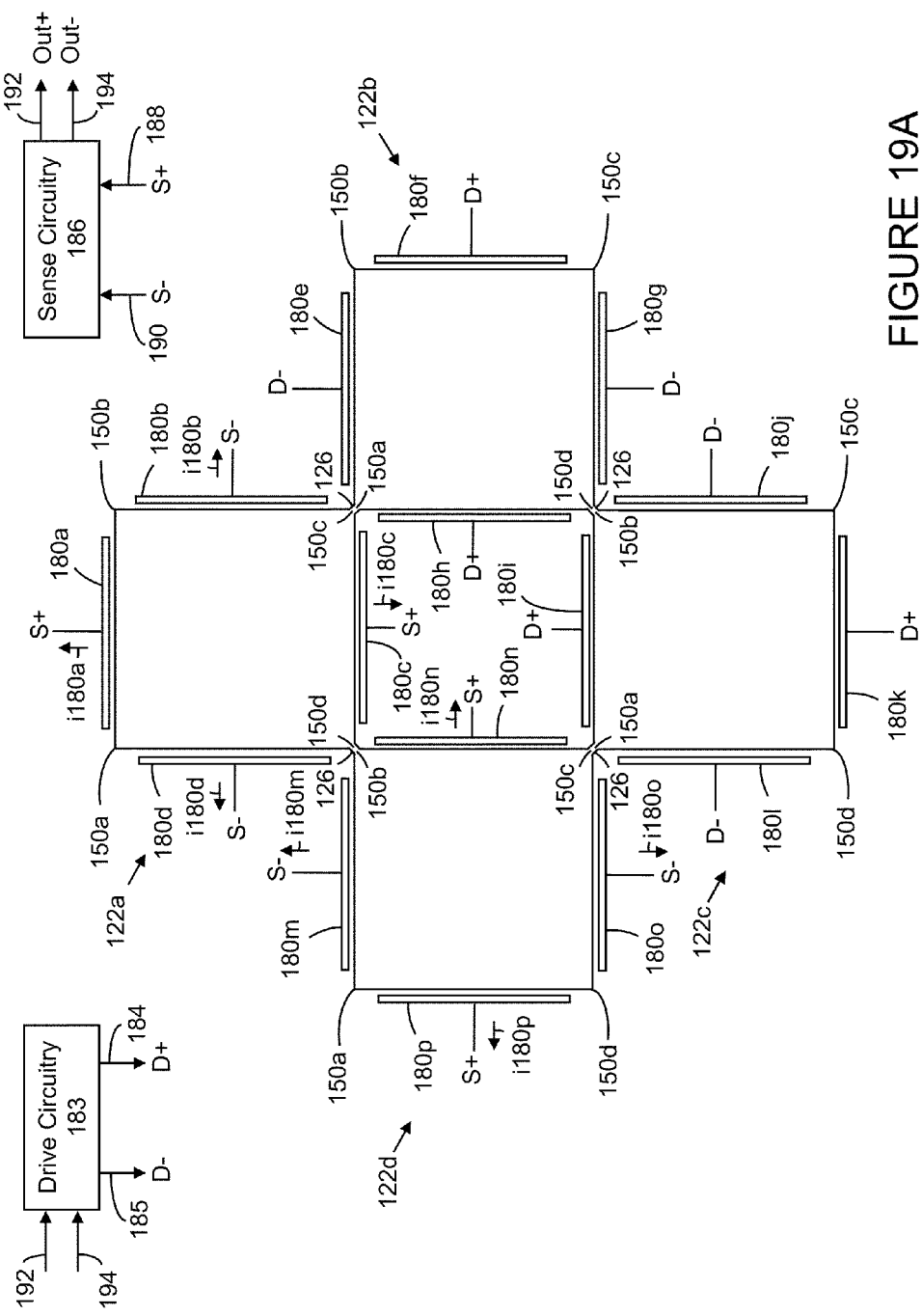
FIG. 19A is a top view of one embodiment of a resonator array including a plurality of bulk mode resonators, a plurality of resonator coupling sections and a plurality of electrodes that may be the same as or similar to the plurality of bulk mode resonators, the plurality of resonator coupling sections and the plurality of electrodes, respectively, of the resonator array illustrated in FIG. 18C, and further including drive circuitry and sense circuitry, according to certain aspects of the present inventions.

With reference to FIG. 19A, in one embodiment of the resonator array 120, the first plurality of electrodes 180*a*-180*d* and the fourth plurality of electrodes 180*m*-180*p* are each employed as sense electrodes. The second plurality of electrodes 180*e*-180*h* and the third plurality of electrodes 180*i*-180*l* are each employed as drive electrodes. The drive electrodes, e.g., electrodes 180*e*-180*h* and 180*i*-180*l*, are electrically connected to differential drive circuitry 183 and receive a differential drive signal D+, D− therefrom. For example, drive electrodes 180*f*/180*h*, 180*i*, 180*k* may receive drive signal D+ from the differential drive circuitry 183 via a signal line 184. Drive electrodes 180*e*, 180*g*, 180*j*, 180*l* may receive drive signal D− from the differential drive circuitry 183 via a signal line 185. In this way, at least one electrode of the second plurality of electrodes is coupled to at least one electrode of the third plurality of electrodes.

The sense electrodes, e.g., electrodes 180*a*-180*d* and 180*m*-180*p*, are electrically connected to differential sense circuitry 186 and provide a differential sense signal S+, S− that is supplied thereto. For example, sense electrodes 180*a*, 180*c*, 180*n*, 180*p* may collectively provide sensed signal S+, which is supplied to differential sense circuitry 186 via a signal line 188. Sense electrodes 180*b*, 180*d*, 180*o*, 180*m* may collectively provide sensed signal S−, which is supplied to differential sense circuitry 186 via a signal line 190. In this way, at least one electrode of the first plurality of electrodes is coupled to at least one electrode of the fourth plurality of electrodes.

In operation, differential drive circuitry 183 generates the differential drive signal D+, D−, which is supplied to drive electrodes 180*e*-180*h* and 180*i*-180*l*, for example as described above, to induce a time varying electrostatic force that causes resonator 122*a* and resonator 122*c* to oscillate (e.g., in plane) at one or more resonant frequencies. The oscillation of resonators 122*a* and 122*c* induces oscillation in resonator 122*b* and resonator 122*d*.

In this embodiment, each resonator 122 of resonator array 120 oscillates or vibrates at the same or substantially the same frequency. Moreover, in this embodiment, each resonator 122 oscillates in a bulk or substantially bulk mode, rather than in a bending mode. The oscillation may be linear or substantially linear, e.g., described by linear, stationary differential equations of motion. Each resonator 122 may have a high "Q" (quality factor), and as a result, the shape of resonator 122 during oscillation may depend primarily on the characteristics of the resonator 122. With reference to FIG. 19B, in one embodiment, in a first phase of oscillation, resonator 122a and resonator 122c (i) contract in first and second directions 144a, 144b and (ii) expand in third and fourth directions 146a, 146b, resulting in a first state for resonator 122a and resonator 122c. Resonator 122b and resonator 122d (i) expand in first and second directions 144a, 144b and (ii) contract in third and fourth directions 146a, 146b, resulting in a first state for resonator 122b and resonator 122d. For reference, the shape and position of resonators 122a-122d in the at rest state are represented by dotted rectangles 122a'-122d', respectively. Electrodes 180a-180p are not shown in FIG. 19B.

Figure 19C:
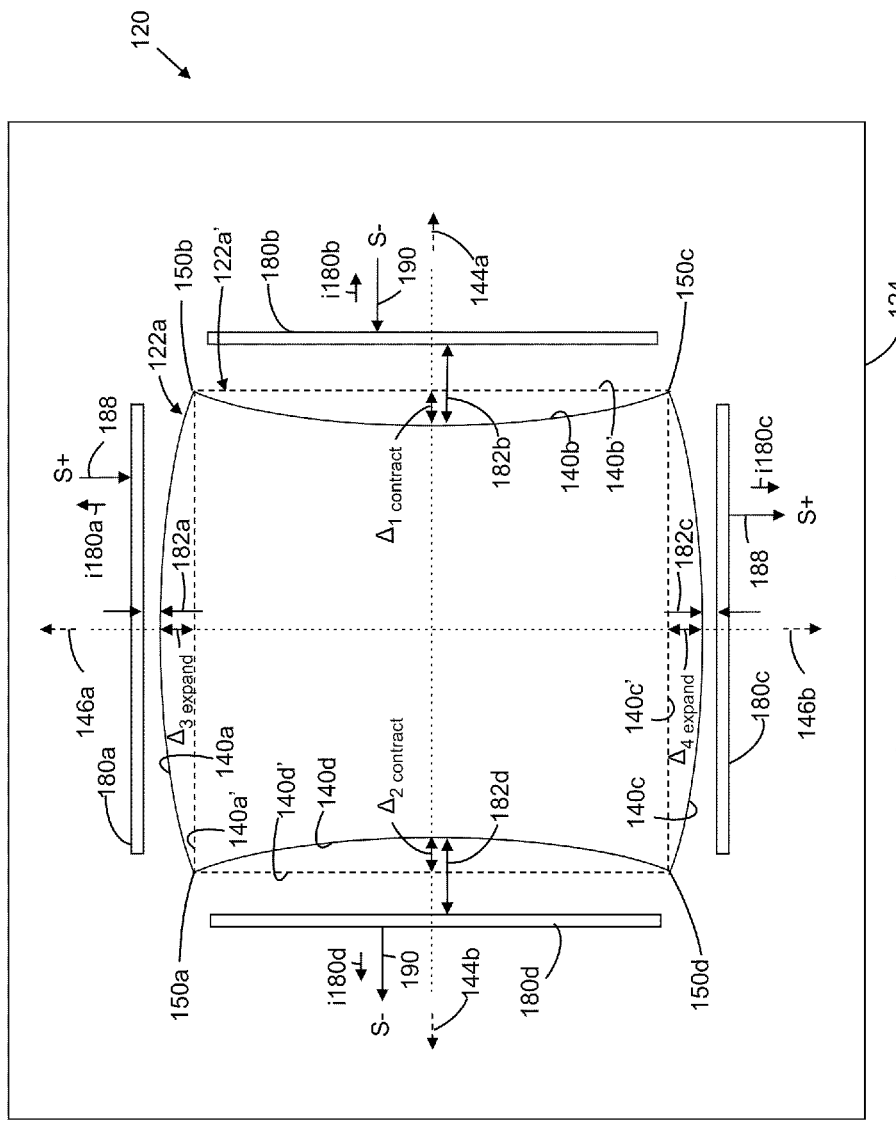
FIG. 19C is an enlarged top view representation of a portion of the resonator array of FIG. 19A, including the first bulk mode resonator and the first plurality of electrodes, with the first bulk mode resonator in a first state of oscillation, wherein in relation to an at rest state, the first bulk mode resonator is contracted in at least one of first and second direction and expanded in at least one of third and fourth directions, according to certain aspects of the present inventions.

With reference to FIG. 19C, focusing on the first bulk mode resonator 122a for example, the contraction of the first bulk mode resonator 122a in first and second directions 144a, 144b causes an increase in the size of the second and fourth gaps 182b, 182d. The expansion of the first bulk mode resonator 122a in the third and fourth directions 146a, 146b causes a decrease in the size of the first and third gaps 182a, 182c. For reference, dotted lines 122a'-122d' show the shape and position of resonators 122a-122d, respectively, in the at rest state.

In some embodiments, the first bulk mode resonator 122a is contracted by an amount $\Delta_{1\ contract}+\Delta_{2\ contract}$ along the first axis 144 and expanded by an amount $\Delta_{3\ expand}+\Delta_{4\ expand}$ along the second axis 146. In some embodiments, the amount $\Delta_{1\ contract}$ is equal to the amount $\Delta_{2\ contract}$ and/or the amount $\Delta_{3\ expand}$ is equal to the amount $\Delta_{4\ expand}$.

Figure 19D:
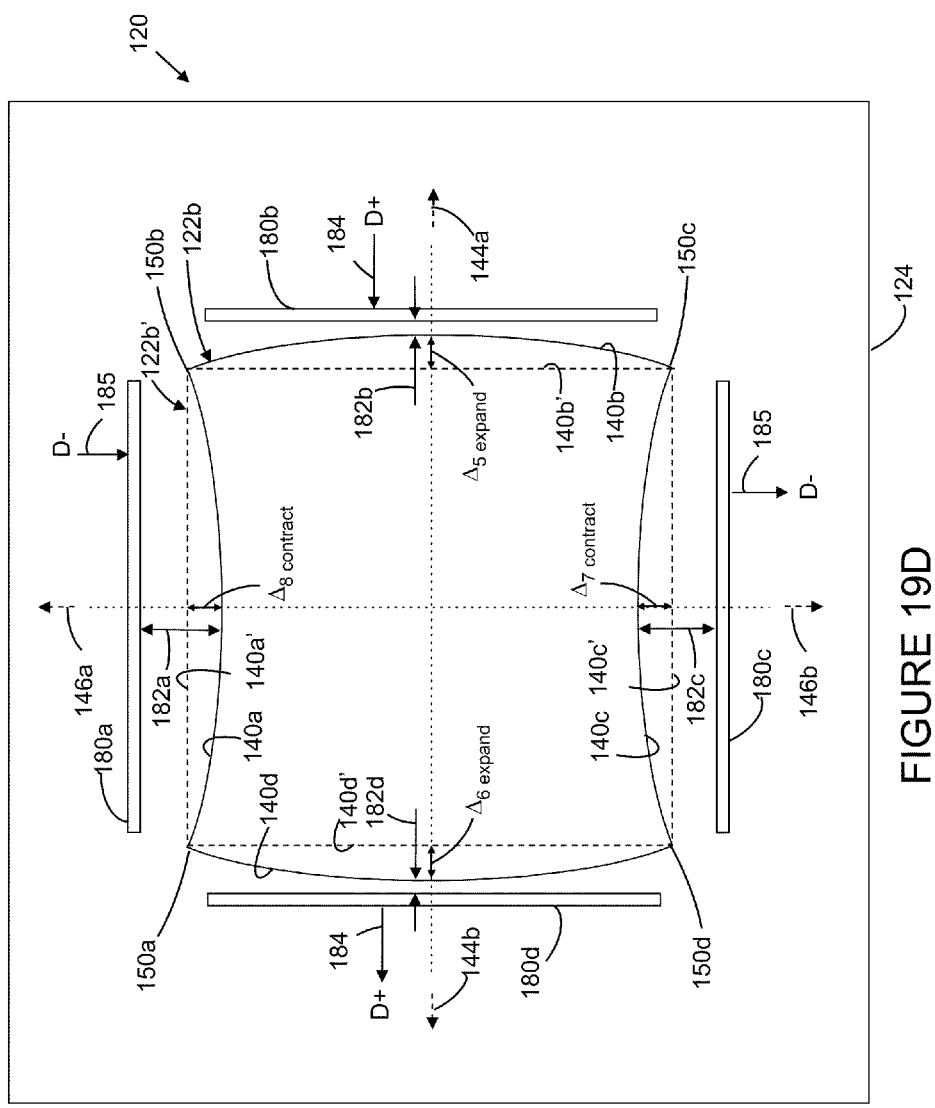
FIG. 19D is an enlarged top view representation of a portion of the resonator array of FIG. 19A, including the second bulk mode resonator and the second plurality of electrodes, with the second bulk mode resonator in a first state of oscillation, wherein in relation to an at rest state, the second bulk mode resonator is expanded in at least one of first and second direction and contracted in at least one of third and fourth directions, according to certain aspects of the present inventions.

With reference to FIG. 19D, focusing now on the second bulk mode resonator 122b, the expansion of second bulk mode resonator 122b in first and second directions 144a, 144b causes a decrease in the size of the second and fourth gaps 182b, 182d. The contraction of second bulk mode resonator 122b in the third and fourth directions 146a, 146b causes an increase in the size of the first and third gaps 182a, 182c. For reference, dotted lines 122a'-122d' show the shape and position of resonators 122a-122d, respectively, in the at rest state.

In some embodiments, the second bulk mode resonator 122b is expanded by an amount $\Delta_{5\ expand}+\Delta_{6\ expand}$ along the first axis 144 and contracted by an amount $\Delta_{7\ contract}+\Delta_{7\ contract}$ along the second axis 146. In some embodiments, the amount $\Delta_{5\ expand}$ is equal to the amount $\Delta_{6\ expand}$ and/or the amount $\Delta_{7\ contract}$ is equal to the amount $\Delta_{8\ contract}$.

Figure 19E:
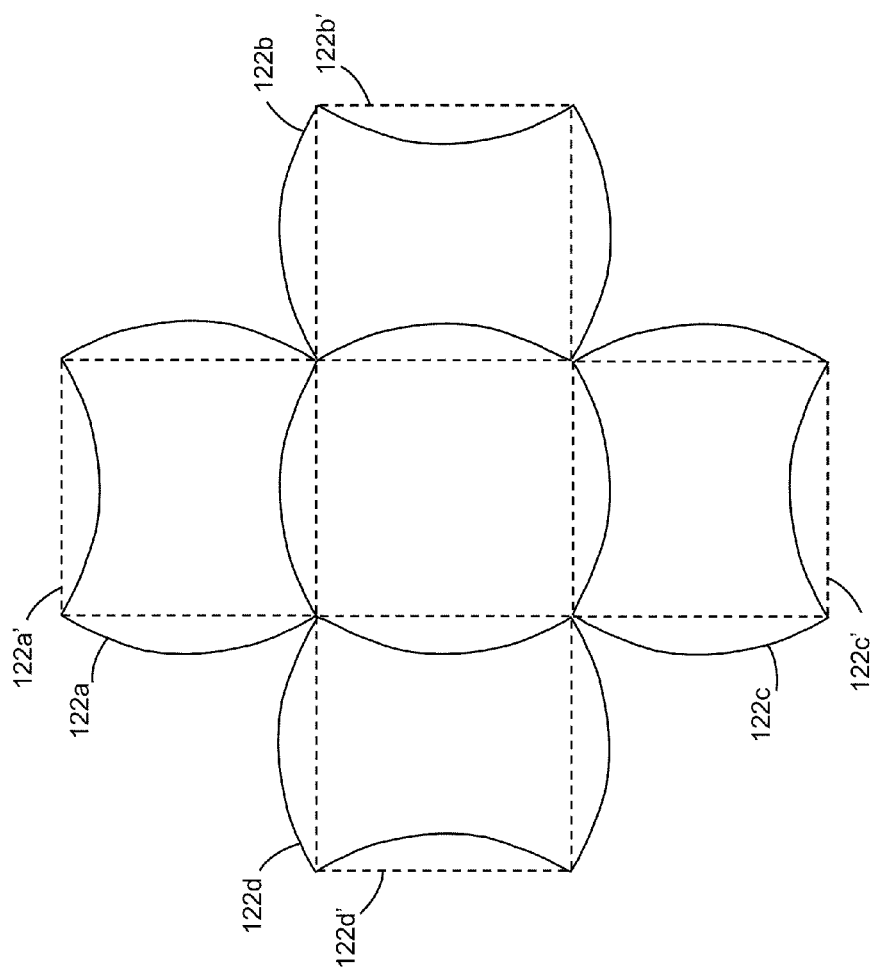
FIG. 19E is a top view of the plurality of bulk mode resonators of the resonator array of FIG. 19A, with the plurality of bulk mode resonators shown in a second state of oscillation, wherein in relation to an at rest state, the first and third bulk mode resonators are expanded in at least one of first and second directions and contracted in at least one of third and fourth directions, and the second and fourth bulk mode resonators are contracted in at least one of first and second directions and expanded in at least one of third and fourth directions, according to certain aspects of the present inventions.

With reference to FIG. 19E, in one embodiment, in a second phase of oscillation, resonator 122a and resonator 122c (i) expand in first and second directions 144a, 144b and (ii) contract in third and fourth directions 146a, 146b, resulting in a second state for resonator 122a and resonator 122c. Resonator 122b and resonator 122d (i) contract in first and second directions 144a, 144b and (ii) expand in third and fourth directions 146a, 146b, resulting in a second state for resonator 122b and resonator 122d. For reference, the shape and position of resonators 122a-122d in the at rest state are represented by dotted rectangles 122a'-122d', respectively. Electrodes 180a-180p are not shown in FIG. 19E.

With reference to FIG. 19F, focusing again on the first bulk mode resonator 122a, the expansion of the first bulk mode resonator 122a in first and second directions 144a, 144b causes a decrease in the size of the second and fourth gaps 182b, 182d. The contraction of the first bulk mode resonator 122a in the third and fourth directions 146a, 146b causes increase in the size of the first and third gaps 182a, 182c.

In some embodiments, the first bulk mode resonator 122a is expanded by an amount $\Delta_{1\ expand}+\Delta_{2\ expand}$ along the first axis 144 and contracted by an amount $\Delta_{3\ contract}+\Delta_{4\ contract}$ along the second axis 146. In some embodiments, the amount $\Delta_{1\ expand}$ is equal to the amount $\Delta_{2\ expand}$ and/or the amount $\Delta_{3\ contract}$ is equal to the amount $\Delta_{4\ contract}$.

With reference to FIG. 19G, focusing now again on second bulk mode resonator 122b, the contraction of second bulk mode resonator 122b in first and second directions 144a, 144b causes an increase in the size of the second and fourth gaps 182b, 182d. The expansion of second bulk mode resonator 122b in the third and fourth directions 146a, 146b causes a decrease in the size of the first and third gaps 182a, 182c.

In some embodiments, the second bulk mode resonator 122b is contracted by an amount $\Delta_{5\ contract}+\Delta_{6\ contract}$ along the first axis 144 and expanded by an amount $\Delta_{7\ expand}+\Delta_{8\ expand}$ along the second axis 146. In some embodiments, the amount $\Delta_{5\ contract}$ is equal to the amount $\Delta_{6\ contract}$ and/or the amount $\Delta_{7\ expand}$ is equal to the amount $\Delta_{8\ expand}$.

In some embodiments, resonators expand by the same amount as one another and contract by the same amount as one another. In some other embodiments, however, resonators may or may not expand by the same amount as one another and/or may or may not contract by the same amount as one another.

The amount of expansion exhibited by a resonator in one state may or may not be equal to the amount of contraction exhibited by the resonator in such state and/or the amount of expansion or contraction exhibited by the resonator in another state. For example, the amount of expansion exhibited by the first bulk mode resonator in the first state may or may not be equal to the amount of contraction exhibited by the first bulk mode resonator in the first state and/or the amount of expansion or contraction exhibited by the first bulk mode resonator in the second state.

Notably, one or more of corners 150a-150d of one or more of the bulk mode resonators 122a-122d may be nodal points and/or may exhibit relatively little or no movement as resonator 122a oscillates between the first and second states. That is, as the bulk mode resonators 122a-122d oscillate between the first state and the second state, one or more of the corners 150a-150d of one or more of the bulk mode resonators 122a-122d may be relatively stationary.

Referring again to FIG. 19A, the sense electrodes 180a-180d and 180m-180p provide a differential sensed signal S+, S−, representative of the oscillation by the associated resonators 122a, 122d (for example, resulting from a change in capacitance between the sense electrodes 180a-180d, 180m-180p and resonators 122a, 122d) due to the oscillating motion of such resonators (e.g., resonators 122a and 122d)). The differential signal S+, S− may be, for example, in the form of a differential voltage and/or a differential current.

In this embodiment, sensed signal S+ and sensed signal S− are each a summation of signals, and/or include contributions, from a plurality of sense electrodes. For example, sensed signal S+ is a summation of electrical currents i180a, i180c into and/or out of sense electrodes 180a, 180c, respectively, and electrical currents i180n, i180p into and/or out of sense electrodes 180n, 180p, respectively. The sensed signal S− is a summation of electrical currents 180*b*, i180*d* into and/or out of the sense electrodes 180*b*, 180*c*, respectively, and electrical currents i180*m*, i180*o* into and/or out of the sense electrodes 180*m*, 180*o*, respectively.

As a result, sensed signal S+ and sensed signal S− may each have a greater signal to noise relationship than that which would be provided if sensed signal S+ and sensed signal S− were each generated from just one sense electrode. Consequently, the differential output signal, which includes a first signal and a second signal, Out+, Out−, may have a signal to noise relationship that is greater than would be obtained without resonator array 120, i.e., by using a single resonator, e.g., resonator 122*a*, without the other resonators, e.g., resonators 122*b*-122*d*.

For example, oscillation of first bulk mode resonator 122*a* results in electrical currents indicative thereof, into and/or out of the first plurality of sense electrodes 180*a*-180*d*, respectively, and/or a change in the voltage of the first plurality of sense electrodes 180*a*-180*d*. Oscillation of fourth bulk mode resonator 122*d* results in electrical currents indicative thereof, into and/or out of the fourth plurality of sense electrodes 180*m*-180*p*, respectively, and/or a change in the voltage of the fourth plurality of sense electrodes 180*m*-180*p*.

Focusing on the first plurality of sense electrodes 180*a*-180*d* and the first bulk mode resonator 122*a*, in the first phase of oscillation, the increase in the size of the second gap 182*b* causes a decrease in the magnitude of the second capacitance (i.e., defined by the sense electrode 180*b* and the first bulk mode resonator 122*a*), which in turn causes an electrical current i180*b* into or out of the sense electrode 180*b* and a change in the voltage of the sense electrode 180*b* in accordance therewith. The increase in the size of the fourth gap 182*d* causes a decrease in the magnitude of the fourth capacitance (i.e., defined by the sense electrode 180*d* and the first bulk mode resonator 122*a*), which in turn causes an electrical current i180*d* into or out of the sense electrode 180*d* and a change in the voltage of the sense electrode 180*d* in accordance therewith. The decrease in the size of the first gap 182*a* causes an increase in the magnitude of the first capacitance (i.e., defined by the sense electrode 180*a* and first bulk mode resonator 122*a*), which in turn causes an electrical current i180*a* into or out of the sense electrode 180*a* and a change in the voltage of the sense electrode 180*a* in accordance therewith. The decrease in the size of the third gap 182*c* causes an increase in the magnitude of the third capacitance (i.e., defined by the sense electrode 180*c* and the first bulk mode resonator 122*a*), which in turn causes an electrical current i180*c* into or out of the sense electrode 180*c* and a change in the voltage of the sense electrode 180*c* in accordance therewith.

In the second phase of oscillation, the decrease in the size of the second gap 182*b* causes an increase in the magnitude of the second capacitance (i.e., defined by the sense electrode 180*b* and first bulk mode resonator 122*a*), which in turn causes an electrical current i180*b* into or out of the sense electrode 180*b* and a change in the voltage of the sense electrode 180*b* in accordance therewith. The decrease in the size of the fourth gap 182*d* causes an increase in the magnitude of the fourth capacitance (i.e., defined by the sense electrode 180*d* and first bulk mode resonator 122*a*), which in turn causes an electrical current i180*d* into or out of the sense electrode 180*d* and a change in the voltage of the sense electrode 180*d* in accordance therewith. The increase in the size of the first gap 182*a* causes a decrease in the magnitude of the first capacitance (i.e., defined by the sense electrode 180*a* and first bulk mode resonator 122*a*), which in turn causes an electrical current i180*a* into or out of the sense electrode 180*a* and a change in the voltage of the sense electrode 180*a* in accordance therewith. The increase in the size of the third gap 182*c* causes a decrease in the magnitude of the third capacitance (i.e., defined by the sense electrode 180*c* and first bulk mode resonator 122*a*), which in turn causes an electrical current i180*c* into or out of the sense electrode 180*c* and a change in the voltage of the sense electrode 180*c* in accordance therewith.

In a similar manner, oscillation of fourth bulk mode resonator 122*d* results in electrical currents i180*m*-i180*p*, indicative of the oscillation, into and/or out of sense electrodes 180*m*-180*p*, respectively, and/or a change in the voltage of the sense electrodes 180*m*-180*p*.

Notably, the magnitude of the sense signal S+ and the magnitude of the sense signal S− each depends at least in part, on the magnitude of the capacitive transduction between the sense electrodes 180*a*-180*d*, 180*m*-180*p* and the associated resonators 122*a*, 122*d*, respectively, during oscillation. For example, the magnitudes of the electrical currents i180*a*, i180*b*, i180*c*, i180*d* depend at least in part, on the magnitude of the change of the first capacitance (i.e., the magnitude of capacitive transduction between the first bulk mode resonator 122*a* and the sense electrode 180*a*), the magnitude of the change of the second capacitance (i.e., the magnitude of capacitive transduction between the first bulk mode resonator 122*a* and the sense electrode 180*b*), the magnitude of the change of the third capacitance (i.e., the magnitude of capacitive transduction between the first bulk mode resonator 122*a* and the sense electrode 180*c* and the magnitude of the change of the fourth capacitance (i.e., the magnitude of capacitive transduction between the first bulk mode resonator 122*a* and the sense electrode 180*d*), respectively, during oscillation.

The differential sensed signal S+, S− is supplied to the differential sense circuitry 186, for example as described above, which senses, samples and/or detects the differential sensed signal S+, S− and/or a signal having the one or more resonant frequencies and may generate a differential output signal that includes a first signal and a second signals, Out+, Out−, in response thereto. The differential output signal Out+, Out−, may be, for example, a clock signal having a frequency equal to the frequency of one or more of the one or more resonant frequencies of the oscillation exhibited by the resonators 122. The differential output signal Out+, Out− may be supplied via signal lines 192, 194 to the differential drive circuitry 183, which may generate the differential drive signal D+, D− in response thereto, thereby closing the electronic oscillator loop. In this regard, it is desirable for the differential drive signal D+, D− to be suitable to stimulate/drive the desired mode of oscillation.

In some embodiments, differential drive circuitry 183 is configured to provide a differential drive signal D+, D−, wherein signal D+ and signal D− are 180 degrees out of phase or substantially 180 degrees out of phase, and drive electrodes 180*e*-180*h* and 180*i*-180*l* are configured and positioned such that the differential drive signal D+, D− supplied thereto results in one or more electrostatic forces that cause one or more of the resonators 122*a*-122*d*, e.g., resonators 122*b*, 122*c*, to oscillate in plane.

In some embodiments, sense electrodes 180*a*-180*d* and 180*m*-180*p* are configured and positioned to provide, in response to the oscillation of one or more resonators that do not receive the electrostatic force, e.g., resonators 122*a*, 122*d*, a differential sense signal S+, S−, wherein signal S+ and signal S− are 180 degrees out of phase or substantially 180 degrees out of phase, and sense circuitry 186 is configured to receive the differential sense signal S+, S− and provide, in response thereto, a differential output signal Out+, Out−, wherein signal Out+ and signal Out− are 180 degrees out of phase or substantially 180 degrees out of phase.

In this embodiment, the oscillation of each resonator 122 of resonator array 120 is out of phase relative to the oscillation of an adjacent resonator 122. For example, when resonator 122a is contracted in first and/or second directions and expanded in third and/or fourth directions, adjacent resonator 122b is expanded in first and/or second directions and contracted in third and/or fourth directions (See, FIG. 19B). Moreover, when resonator 122a is expanded in first and/or second directions and contracted in third and/or fourth directions, adjacent resonator 122b is contracted in first and/or second directions and expanded in third and/or fourth directions (See, FIG. 19E). In that regard, in some embodiments, the oscillation of each resonator 122 of resonator array 120 is 180 degrees out of phase, or substantially 180 degrees out of phase, relative to the oscillation of an adjacent resonator 122.

Implementing a differential signal configuration may facilitate canceling, limiting, reducing and/or minimizing the effect of capacitive coupling from the drive electrodes to the sense electrodes. In addition, a fully differential signaling configuration may also significantly decrease any sensitivity to electrical and/or mechanical noise coupled from the substrate. Further, implementing MEMS resonator array 120 in a differential signaling configuration may also eliminate, minimize and/or reduce charge flow through the anchor to and from the structure. As such, a voltage drop between the substrate anchor and drive and sense electrodes may be avoided. Notably, this voltage drop could degrade or adversely impact the electric transfer function of the resonators of the array especially at higher frequencies (for example, frequencies greater than 100 MHz).

In the embodiment of FIG. 19A, drive electrodes 180e-180h, 180i-180l and sense electrodes 180a-180d, 180m-180p, are symmetrically configured, which in conjunction with the symmetrical structures of resonators 122a-122d, may help to manage the stress on resonators 122a-122d, resonator coupling sections 126, anchor coupling sections 166a-166d, anchors 168 and/or the substrate 124. In this way, resonator coupling sections 126 and/or anchor coupling sections 166a-166d may be a low stress point which may help manage, minimize and/or reduce energy loss of one, some or all of resonators 122a-122d of MEMS resonator array 120.

The differential drive circuitry 183 and differential sense circuitry 186 may be conventional well-known circuitry. Indeed, differential drive circuitry 183 and differential sense circuitry 186 may be any type of circuitry (whether or not integrated (or fabricated) on the same substrate in which the resonator structure resides), and all such circuitry, whether now known or later developed, are intended to fall within the scope of the present inventions.

Notably, differential drive circuitry 183 and differential sense circuitry 186 may be integrated on the same substrate in which the resonator structure resides (or is fabricated in). In addition thereto, or in lieu thereof, differential drive circuitry 183 and differential sense circuitry 186 may be integrated on a substrate that is physically separate from (and electrically interconnected with) the substrate in which the resonator structure resides.

In addition, drive electrodes, e.g., drive electrodes 180e-180h and 180i-180l, and sense electrodes 180a-180d and 180m-180p, may be of a conventional, well known type or may be any type and/or shaped electrode whether now known or later developed. For example, there are many other configurations and or architectures of the sense and drive electrodes that cause a resonator 122 to generate and/or provide output signals that are (or are substantially) 180 degrees out of phase, and/or in which the driving electrodes induce or cause motion in the plane of resonator 122 and the sensing electrodes sense, sample, and/or detect that motion.

Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present inventions.

In addition, the number and design (e.g., size, shape, type) of drive and/or sense electrodes may be selected to optimize, enhance and/or improve the operation of MEMS resonator array 120. For example, the number and design (e.g., size, shape, type) of drive and/or sense electrodes may be selected provide addition drive signal and/or additional sense signal. In some embodiments, for example, the number of sense electrodes, and the cross-sectional sense electrode-resonator interface, is increased in order to increase the signal provided to sense circuitry (for example, the single ended or differential sense circuitry). (See, for example, FIGS. 21A-21C). As stated above, drive electrodes and sense electrodes may be of any number and design (e.g., size, shape, type), whether now known or later developed.

In some embodiments, drive electrodes, e.g., electrodes 180e-180h and 180i-180l, and/or sense electrodes, e.g., electrodes 180a-180d and 180m-180p, are fabricated without an additional or extra mask(s). For example, in some embodiments, a rectangular and/or square shaped resonator mass 122, drive electrodes, e.g., electrodes 180e-180h and 180i-180l, and/or sense electrodes, e.g., electrodes 180a-180d and 180m-180p, are fabricated contemporaneously.

Thus, the present inventions may employ any sense and drive structure, technique, configurations and/or architectures whether now known or later developed. For example, some embodiments employ capacitive transduction (e.g., changes in capacitance between one or more of the resonators and one or more sense electrodes, during oscillation to provide the differential sensed signal S+, S−. In such embodiments, one or more sense electrodes and or drive electrodes may be disposed or positioned relative to resonators 122 in order to detect one or more selected or predetermined harmonics of one or more resonators 122. However, any other suitable structure(s) and/or technique(s) may be applied in addition thereto and/or in lieu thereof.

As stated above, each resonator 122 of MEMS resonator array 120 may oscillate in an inherently or substantially linear mode. As such, some of the considerations and requirements of the drive and sense circuitry, discussed herein, to provide a linear resonator/oscillator may be less stringent and/or complex because there may be no need to very precisely or very accurately control the resonant amplitude of the resonators 122 of the array 120.

In this regard, some resonator structures (for example, resonators having double-clamped beams, such as double-clamped tuning forks) have modes that are non-linear wherein the output frequency is a function of the resonant amplitude. This effect is evident when a beam transitions from a bending mode transitions to a tensile (elongating) mode. A double-clamped beam, in a primary mode, may exhibit this behavior because at smaller amplitudes the "restring" forces are dominated by bending stress and, at larger amplitudes, the resorting force is dominated by tensile stress. Under this situation, to maintain a constant frequency in such a case the resonant amplitude of the beam may need to be carefully regulated, which may be difficult and likely introduces additional complexity.

Notwithstanding the above, although some embodiments of resonator array 120 employ resonators 122 and/or drive and sense techniques in which the oscillation is linear or substantially linear, e.g., described by linear, stationary differential equations of motion, and all resonators 122 of resonator array 120 oscillate or vibrate at the same or substantially the same frequency and it should be understood, that any type of resonators, drive and sense techniques and/or oscillation may be employed. Further in that regard, although some embodiments may employ one or more resonators 122 that oscillate in a bulk or substantially bulk mode, rather than in a bending mode, and/or having a high "Q" (quality factor), such that the shape of resonator 122 during oscillation depends primarily on the characteristics of the resonator 122, any type of resonators may be employed.

Figure 19F:
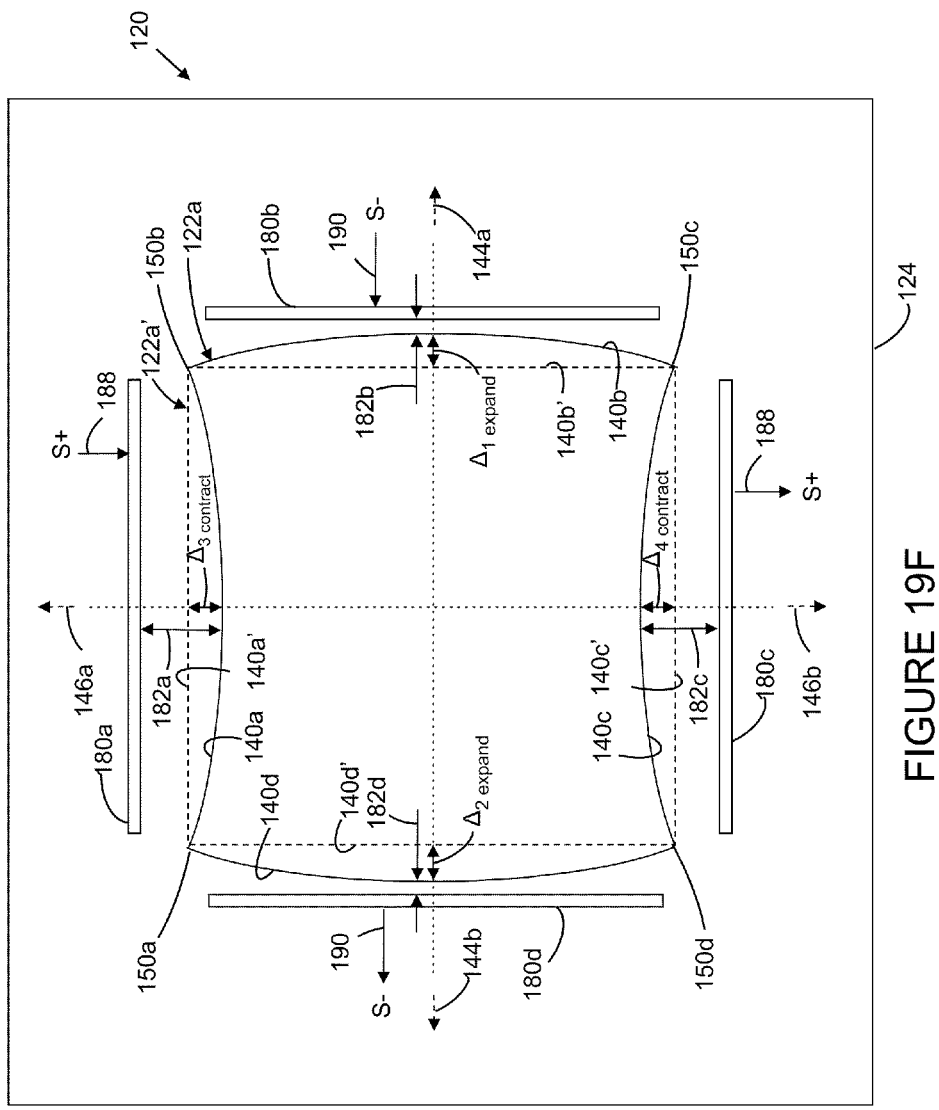
FIG. 19F is an enlarged top view representation of a portion of the resonator array of FIG. 19A, including the first bulk mode resonator and the first plurality of electrodes, with the first bulk mode resonator in a second state of oscillation, wherein in relation to an at rest state, the first bulk mode resonator is expanded in at least one of first and second direction and contracted in at least one of third and fourth directions, according to certain aspects of the present inventions.
Figure 19G:
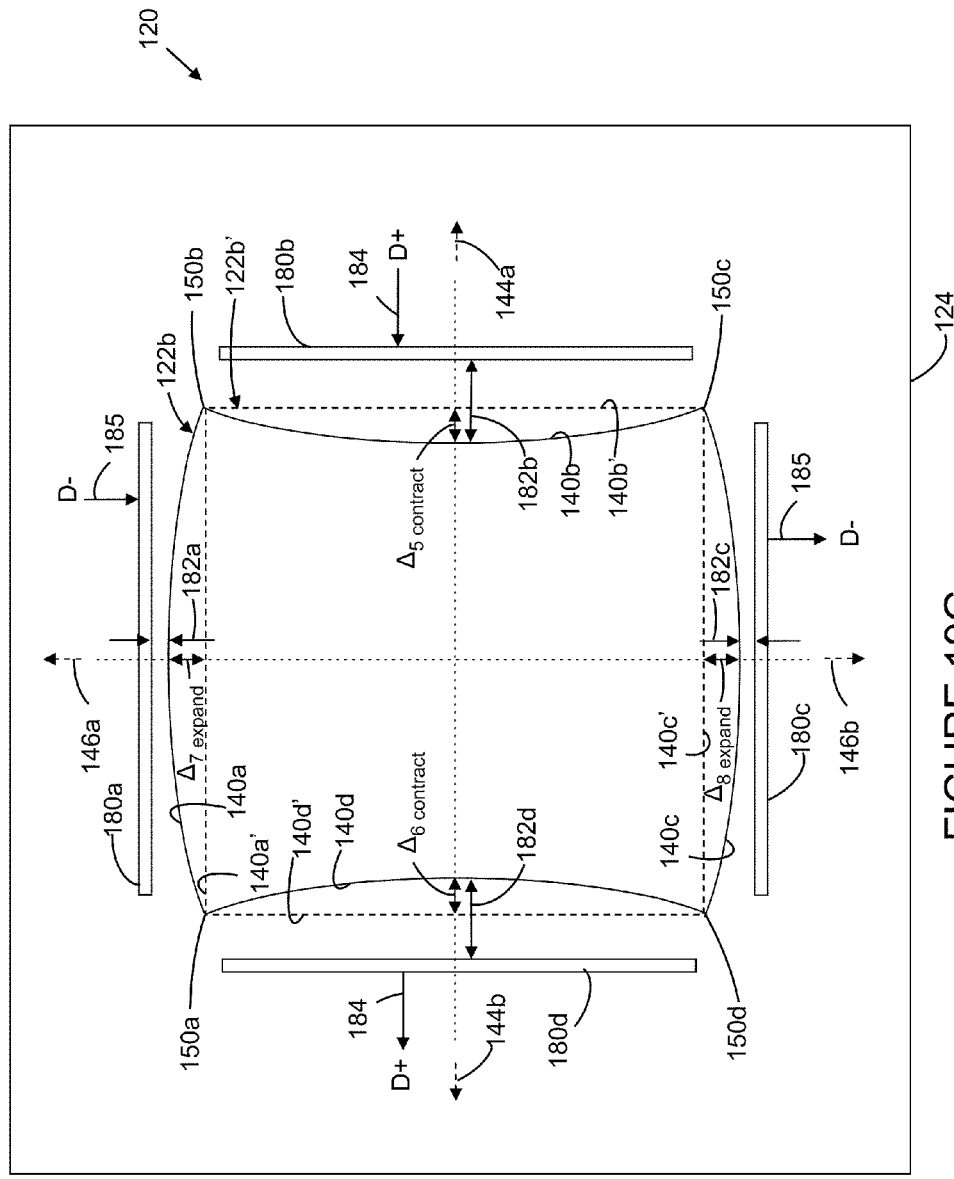
FIG. 19G is an enlarged top view representation of a portion of the resonator array of FIG. 19A, including the second bulk mode resonator and the second plurality of electrodes, with the second bulk mode resonator in a second state of oscillation, wherein in relation to an at rest state, the second bulk resonator is contracted in at least one of first and second direction and expanded in at least one of third and fourth directions, according to certain aspects of the present inventions.
Figure 19H:
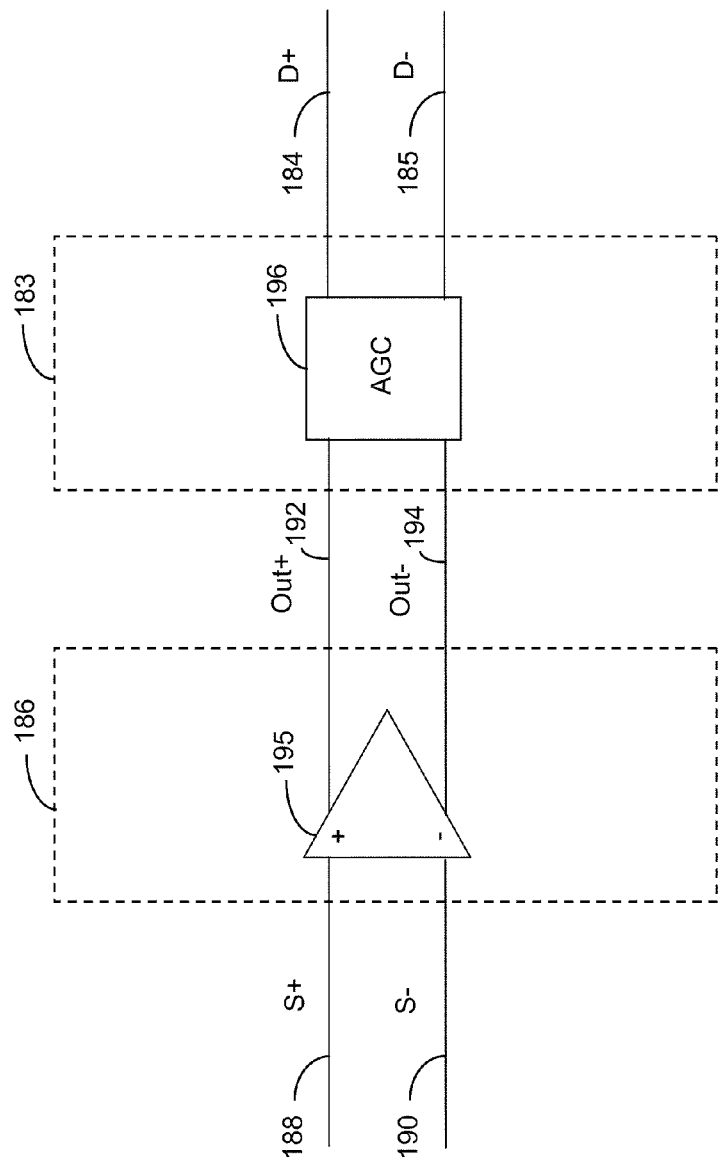
FIG. 19H is schematic block diagram of one embodiment of the sense circuitry and drive circuitry of FIG. 19A, according to certain aspects of the present inventions.

FIG. 19H illustrates one embodiment of the differential sense circuitry 186 and the differential drive circuitry 188. In this embodiment, sense circuitry 186 includes a differential amplifier 195. Drive circuitry 183 includes automatic gain control circuitry 196. The differential amplifier 195 of the sense circuitry 186 receives the differential sense signal S+, S− and provides a differential output signal Out+, Out− in response thereto. The differential output signal Out+, Out− of the differential amplifier 195 is supplied via signal lines 192, 194 to the automatic gain control circuitry 196 of the differential drive circuitry 183, which provides the differential drive signal D+, D− in response thereto.

Figure 19I:
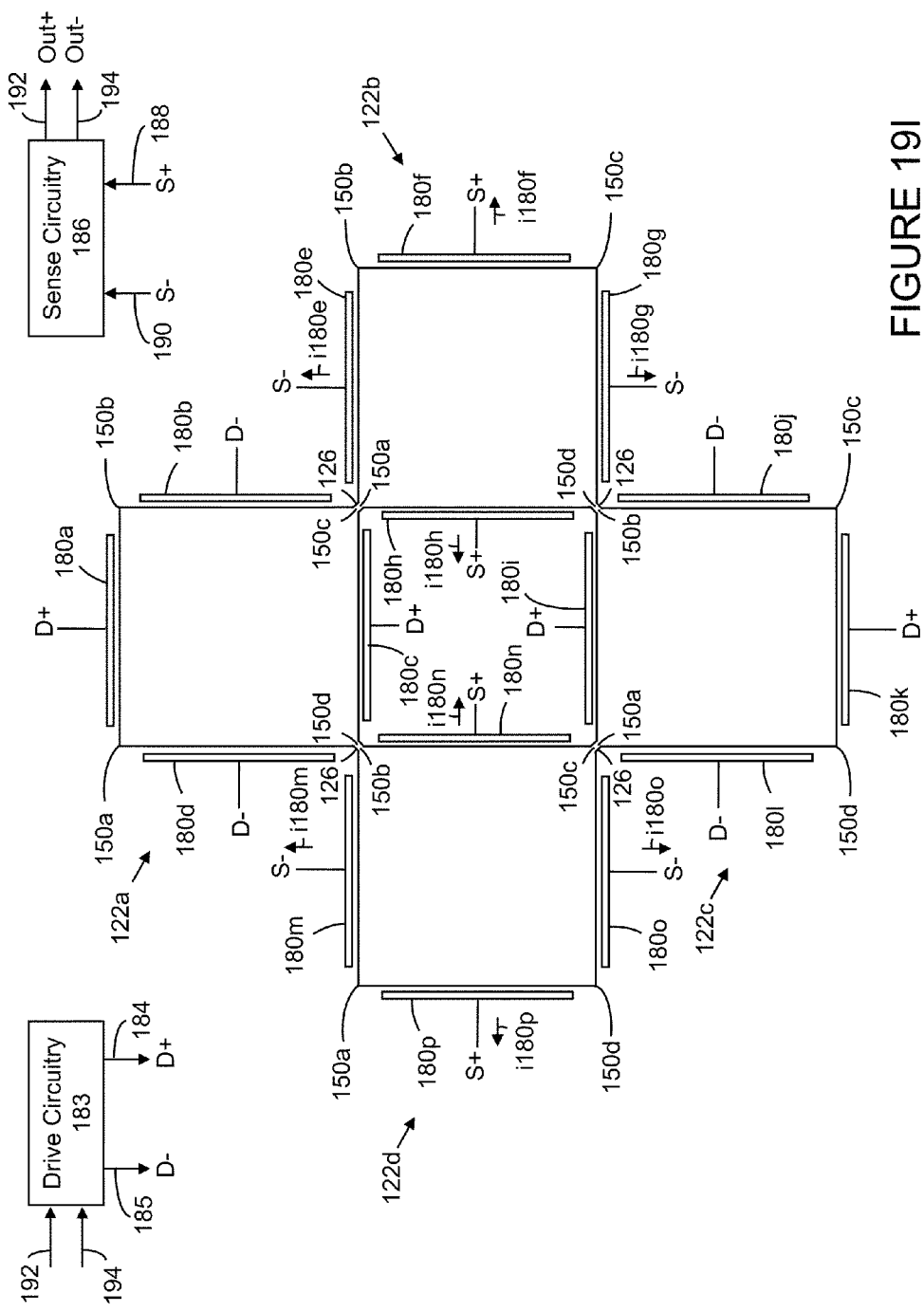
FIG. 19I is a top view of another embodiment of a resonator array including a plurality of bulk mode resonators, a plurality of resonator coupling sections and a plurality of electrodes that may be the same as or similar to the plurality of bulk mode resonators, the plurality of resonator coupling sections and the plurality of electrodes, respectively, of the resonator array illustrated in FIG. 18C, and further including drive circuitry and sense circuitry, according to certain aspects of the present inventions.

FIG. 19I illustrates another embodiment that provides a differential drive signal, a differential sensed signal and a differential output signal.

With reference to FIG. 19I, in another embodiment, the first plurality of electrodes 180a-180d and the third plurality of electrodes 180i-180l are employed as drive electrodes. The second plurality of electrodes 180e-180h and the fourth plurality of electrodes 180m-180p are employed as sense electrodes. The drive electrodes, e.g., electrodes 180a-180d and 180i-180l, are electrically connected to differential drive circuitry 183 and receive a differential drive signal D+, D− therefrom. For example, drive electrodes 180a, 180c, 180i, 180k may receive drive signal D+ from the differential drive circuitry 183 via a signal line 184. Drive electrodes 180b, 180d, 180j, 180l may receive drive signal D− from the differential drive circuitry 183 via a signal line 185.

The sense electrodes, e.g., electrodes 180e-180h and 180m-180p, are electrically connected to differential sense circuitry 186 and provide a differential sense signal S+, S− that is supplied thereto. For example, sense electrodes 180f, 180h, 180n, 180p may collectively provide sensed signal S+, which is supplied to differential sense circuitry 186 via a signal line 188. Sense electrodes 180e, 180g, 180m, 180o may collectively provide sensed signal S−, which is supplied to differential sense circuitry 186 via a signal line 190.

In operation, differential drive circuitry 183 generates the differential drive signal D+, D−, which is supplied to drive electrodes 180a-180d and 180i-180l, for example as described above, to induce a time varying electrostatic force that causes resonator 122a and resonator 122c to oscillate (e.g., in plane) at one or more resonant frequencies. The oscillation of resonators 122a and 122c induces oscillation in resonator 122b and resonator 122d.

The sense electrodes 180e-180h and 180m-180p provide a differential sensed signal S+, S−, representative of the oscillation exhibited by one or more of the resonators 122a-122d (for example, resulting from a change in capacitance between one or more of the resonators 122a-122d (e.g., resonators 122a and 122d) and sense electrodes 180e-180h and 180m-180p due to the oscillating motion of such resonators (e.g., resonators 122a and 122d)).

As in the embodiment of resonator array 120 illustrated in FIG. 19A, sensed signal S+ and sensed signal S− are each a summation of signals, and/or include contributions, from a plurality of sense electrodes. For example, sensed signal S+ is a summation of electrical currents i180f, i180h into and/or out of sense electrodes 180f, 180h, respectively, and electrical currents i180n, i180p into and/or out of sense electrodes 180n, 180p, respectively. The sensed signal S− is a summation of electrical currents 180e, i180g into and/or out of the sense electrodes 180e, 180g, respectively, and electrical currents i180m, i180o into and/or out of the sense electrodes 180m, 180o, respectively.

As a result, sensed signal S+ and sensed signal S− may each have a greater signal to noise relationship than that which would be provided if sensed signal S+ and sensed signal S− were each generated from just one sense electrode. Consequently, the differential output signal Out+, Out− may have a signal to noise relationship that is greater than would be obtained without resonator array 120, i.e., by using a single resonator, e.g., resonator 122b, without the other resonators, e.g., resonators 122a, 122c, 122d.

The differential sensed signal S+, S− is supplied to the differential sense circuitry 186, for example as described above, which senses, samples and/or detects the differential sensed signal S+, S− and/or a signal having the one or more resonant frequencies and may generate a differential output signal Out+, Out− in response thereto. The differential output signal Out+, Out−, may be, for example, a clock signal having a frequency equal to the frequency of one or more of the one or more resonant frequencies of the oscillation exhibited by the resonators 122. The differential output signal Out+, Out− may be supplied via signal lines 192, 194 to the differential drive circuitry 183, which may generate the differential drive signal D+, D− in response thereto, thereby closing the electronic oscillator loop. In this regard, it is desirable for the differential drive signal D+, D− to be suitable to stimulate/drive the desired mode of oscillation.

In this embodiment, resonators 122a-122d of resonator array 120 illustrated in FIG. 19I have a first state of oscillation that is the same as or similar to the first state of oscillation illustrated in FIGS. 19B-19D for the resonators 122a-122d of the resonator array illustrated in FIG. 19A, and a second state of oscillation that is the same as or similar to the second state of oscillation illustrated in FIGS. 19E-19G for the resonators 122a-122d of the resonator array illustrated in FIG. 19A.

In the embodiment of FIG. 19I, drive electrodes 180a-180d, 180i-180l and sense electrodes 180e-180h, 180m-180p, are symmetrically configured, which in conjunction with the symmetrical structures of resonators 122a-122d, may help to manage the stress on resonators 122a-122d, resonator coupling sections 126, anchor coupling sections 166a-166d, anchors 168 and/or the substrate 124. In this way, resonator coupling sections 126 and/or anchor coupling sections 166a-166d may be a low stress point which may help manage, minimize and/or reduce energy loss of one, some or all of resonators 122a-122d of MEMS resonator array 120.

Figure 20A:
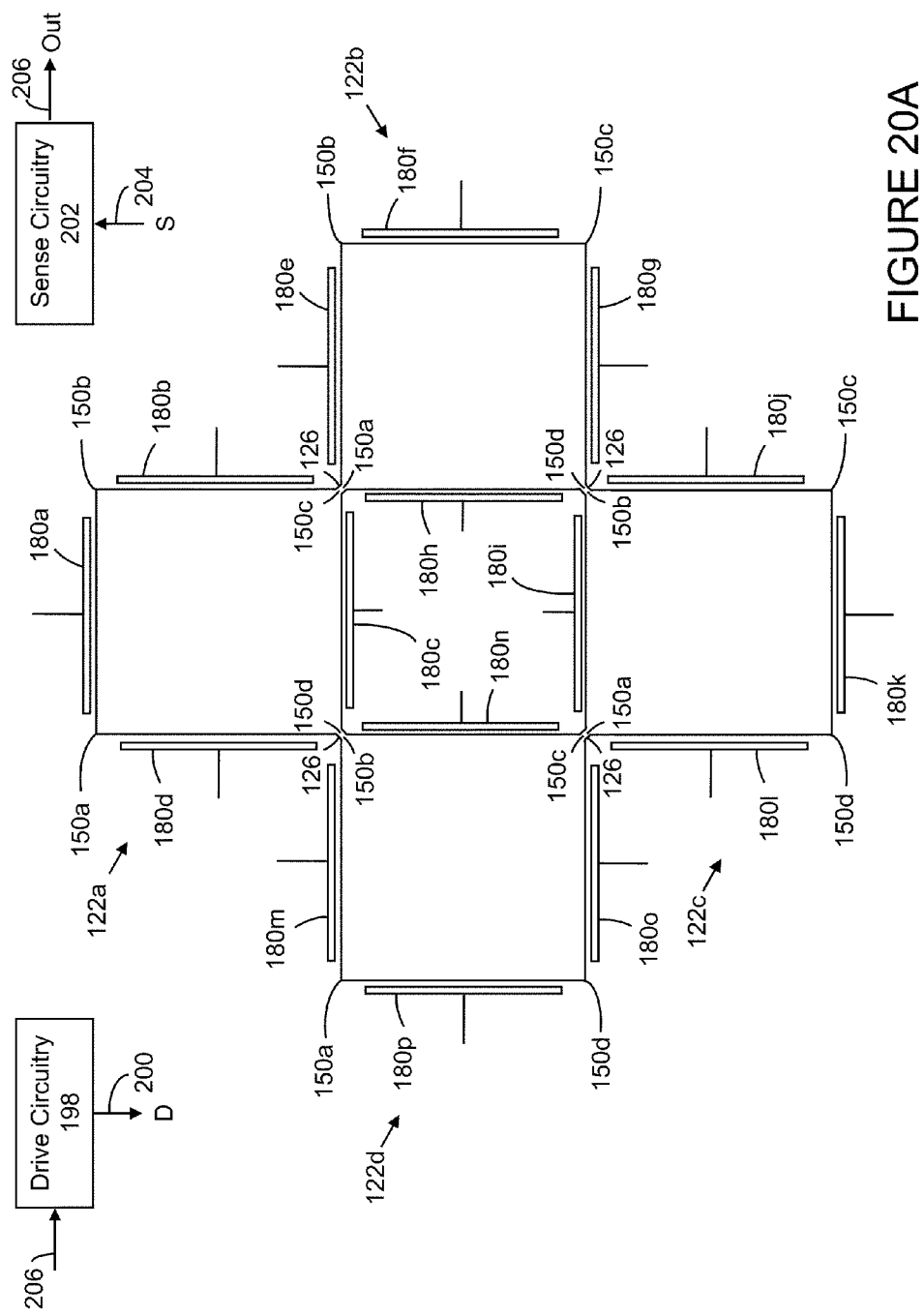
FIG. 20A is a top view of another embodiment of a resonator array including a plurality of bulk mode resonators, a plurality of resonator coupling sections and a plurality of electrodes that may be the same as or similar to the plurality of bulk mode resonators, the plurality of resonator coupling sections and the plurality of electrodes, respectively, of the resonator array illustrated in FIG. 18C, and further including drive circuitry and sense circuitry, according to certain aspects of the present inventions.

The MEMS resonator array 120 may be configured to provide a single ended or differential output. For example, in some embodiments, MEMS resonator array 120 is configured in a single ended configuration that provides a single ended drive signal, a single ended sense signal and/or a single ended output signal. With reference to FIG. 20A, in one embodiment of a single ended configuration, certain electrodes 180 are employed as drive electrodes and certain other electrodes 180 are employed as sense electrodes. The drive electrodes are electrically connected to drive circuitry 198 and receive a drive signal D therefrom. For example, the drive electrodes may receive drive signal D from the drive circuitry 198 via a signal line 200. The sense electrodes are electrically connected to sense circuitry 202 and provide a sense signal S thereto. For example, the sense electrodes may provide sensed signal S, which may be supplied to sense circuitry 202 via a signal line 204.

In operation, drive circuitry 198 generates the single ended drive signal D, which is supplied to the drive electrodes, for example as described above, to induce a time varying electrostatic force that causes one or more of the resonators to oscillate (e.g., in plane) at one or more resonant frequencies. The oscillation of resonators induces oscillation in the resonators.

In this embodiment, each resonator 122 of resonator array 120 oscillates or vibrates at the same or substantially the same frequency. Moreover, in this embodiment, each resonator 122 oscillates in a bulk or substantially bulk mode, rather than in a bending mode. The oscillation may be linear or substantially linear, e.g., described by linear, stationary differential equations of motion. Each resonator 122 may have a high "Q" (quality factor), and as a result, the shape of resonator 122 during oscillation may depend primarily on the characteristics of the resonator 122.

In one embodiment, the resonators 122a-122d of the resonator array 120 illustrated in FIG. 19H exhibit oscillation that is the same as or similar to the oscillation exhibited by resonators 122a-122d in the embodiment of the resonator array 120 illustrated in FIG. 19A.

The sense electrodes provide a single ended sensed signal S (for example, representative of the oscillation exhibited by one or more of the resonators 122a-122d (for example, resulting from a change in capacitance between one or more of the resonators 122a-122b and the sense electrodes due to the oscillating motion of such resonators), representative of the oscillation exhibited by one or more of the resonators 122a-122d.

The sensed signal S is supplied to the sense circuitry 202, for example as described above, which senses, samples and/or detects the sensed signal S and/or a signal having the one or more resonant frequencies and may generates an output signal Out in response thereto. The output signal Out may be, for example, a clock signal having a frequency equal to the frequency of one or more of the one or more resonant frequencies of the oscillation exhibited by the resonator mass 122. The output signal Out may be supplied via signal line 206 to the drive circuitry 198, which may generate the drive signal D in response thereto, thereby closing the electronic oscillator loop. In this regard, the phase of the drive signal should be appropriate to stimulate/drive the desired mode.

Notably, drive circuitry 198 and sense circuitry 202 may be conventional MEMS drive and sense circuitry. However, drive circuitry 198 and sense circuitry 202 are not limited to such. Indeed, drive circuitry 198 and sense circuitry 202 may be any sense and drive circuitry whether now known or later developed. For example, it should be noted that there are many other configurations and/or architectures of the drive and sense circuitry and/or drive and sense electrodes that cause or induce resonators to resonate and/or provide an output signal.

Moreover, drive circuitry 198 and/or sense circuitry 202 may be integrated on the same substrate in which MEMS resonator array 120 resides (or is fabricated in). In addition thereto, or in lieu thereof, drive circuitry 198 and/or sense circuitry 202 may be integrated on a substrate that is physically separate from (and electrically interconnected with) the substrate in which MEMS resonator array 120 resides.

In addition, drive electrodes and sense electrodes, may be conventional MEMS drive and sense electrodes. However, drive and sense electrodes are not limited to such. Indeed, drive and sense electrodes may be any drive and sense electrodes whether now known or later developed. For example, it should be noted that there are many other configurations and/or architectures of the sense and drive electrodes that cause or induce resonators to resonate and generate and/or provide output signals that are (or are substantially) 180 degrees out of phase.

Further, the physical electrode mechanisms may include, for example, capacitive, piezoresistive, piezoelectric, inductive, magnetorestrictive and thermal. Indeed, all physical electrode mechanisms whether now known or later developed are intended to fall within the scope of the present inventions.

The number and design (e.g., size, shape, type) of drive and/or sense electrodes may be selected to optimize, enhance and/or improve the operation of MEMS resonator array 120. For example, the number and design (e.g., size, shape, type) of drive and/or sense electrodes may be selected provide addition drive signal and/or additional sense signal. In some embodiments, for example, the number of sense electrodes, and the cross-sectional sense electrode-resonator interface, is increased in order to increase the signal provided to sense circuitry (for example, the single ended circuitry). As stated above, drive electrodes and sense electrodes may be of any number and design (e.g., size, shape, type), whether now known or later developed.

Moreover, although FIG. 20A shows drive circuitry 198, sense circuitry 202, drive electrodes and sense electrodes, it should be understood that the present inventions are not limited to such. Rather, the present inventions may employ any sense and drive structure, technique, configurations and/or architectures whether now known or later developed. For example, some embodiments employ capacitive transduction (e.g., changes in capacitance between one or more of the resonators and one or more sense electrodes, during oscillation to provide the sensed signal S. In such embodiments, one or more sense electrodes and or drive electrodes may be disposed or positioned relative to resonators 122 in order to detect one or more selected or predetermined harmonics of resonators 122. However, any other suitable structure(s) and/or technique(s) may be employed in addition thereto and/or in lieu thereof.

Moreover, although some embodiments of resonator array 120 employ resonators 122 and/or drive and sense techniques in which the oscillation is linear or substantially linear, e.g., described by linear, stationary differential equations of motion, and all resonators 122 of resonator array 120 oscillate or vibrate at the same or substantially the same frequency and it should be understood, that any type of resonators, drive and sense techniques and/or oscillation may be employed. Further in that regard, although some embodiments may employ one or more resonators 122 that oscillate in a bulk or substantially bulk mode, rather than in a bending mode, and/or having a high "Q" (quality factor), such that the shape of resonator 122 during oscillation depends primarily on the characteristics of the resonator 122, any type of resonators may be employed.

Figure 20B:
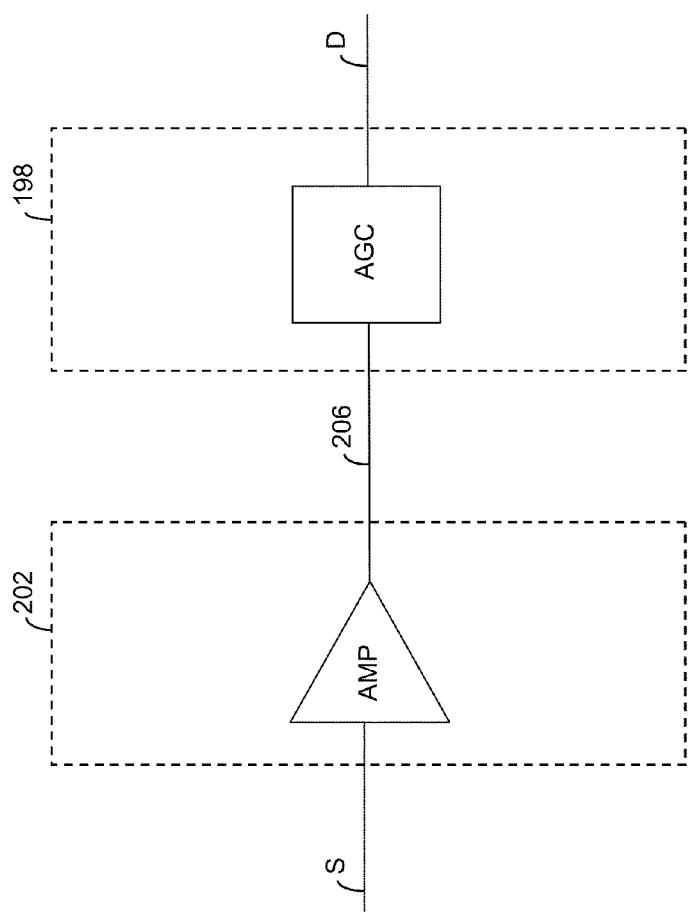
FIG. 20B is schematic block diagram of one embodiment of the sense circuitry and drive circuitry of FIG. 20A, according to certain aspects of the present inventions.

FIG. 20B illustrates one embodiment of the single ended sense circuitry 202 and the single ended drive circuitry 198. In this embodiment, sense circuitry 202 includes an amplifier. The drive circuitry 198 includes automatic gain control circuitry AGC. The amplifier of the sense circuitry 202 receives the sense signal S and provides a single ended output signal in response thereto. The output signal of the amplifier is supplied via signal lines 197 to the automatic gain control circuitry AGC of drive circuitry 198, which provides the single ended drive signal D in response thereto.

Notably, a differential output signal configuration and/or a single ended output signal configuration may also be implemented in MEMS resonator arrays 120 having less than or greater than four resonators 122. Indeed, all of the features, embodiments and alternatives discussed herein with respect to MEMS resonator array 120 in the context of sensing and driving the array are applicable to arrays of any size (for example, an array having 2, 3, 4, 5, 6, 7 and 8 resonators 122) and/or configuration (for example, arrays comprised of the same or different geometric shapes of resonators 122 such as squares, triangles, hexagons, rounded squares, rounded hexagons or rounded triangles). For the sake of brevity, those discussions will not be repeated.

Any of the drive and/or sense techniques (e.g., drive electrodes, sense electrodes, drive circuitry and/or sense circuitry) disclosed herein may be employed in conjunction with any of the resonator coupling structures or techniques and/or any of the anchoring structures or techniques described above.

Figure 21B:
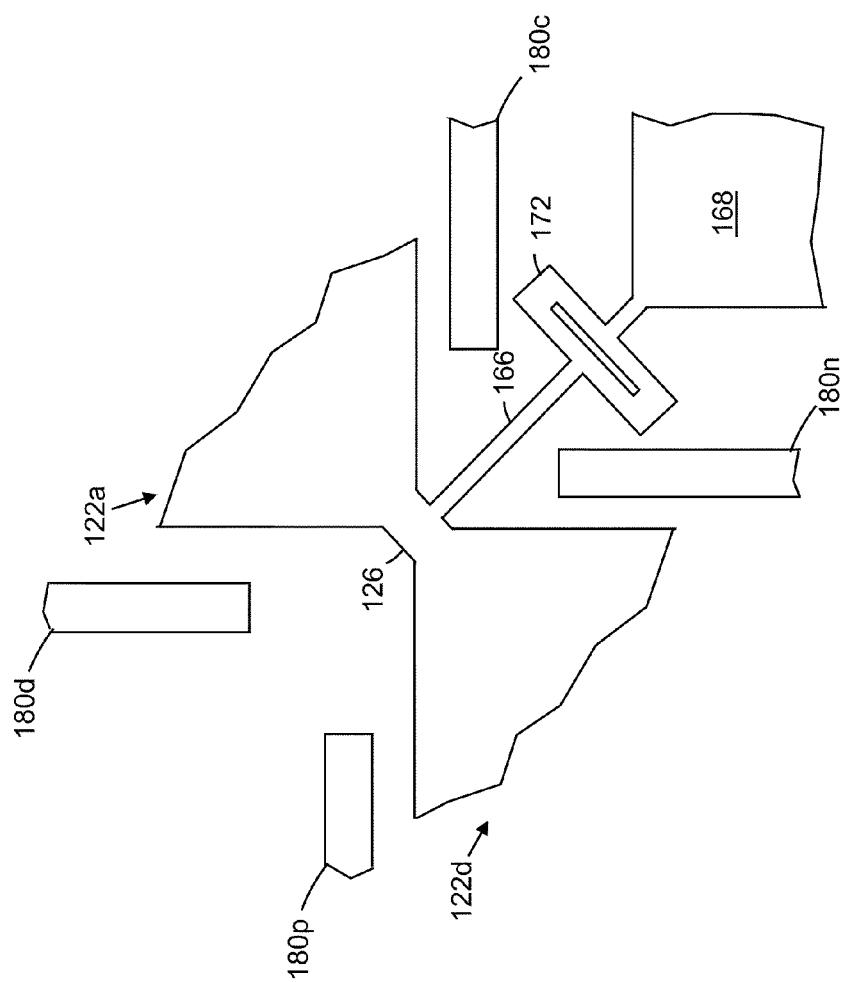
FIG. 21B illustrates an enlarged top view of a portion of one embodiment of the resonator array of FIG. 21A including the first and fourth bulk mode resonators, one of the resonator coupling sections, one of the anchor coupling sections, the anchor, two of the first plurality of electrodes and two of the fourth plurality of electrodes, with the portion of the resonator array shown in an at rest state, according to certain aspects of present the inventions.

For example, with reference to FIGS. 21A-21B, in one embodiment, a resonator array includes a plurality of bulk mode resonators 122a-122d, a plurality of resonator coupling sections 126 and a plurality of electrodes 180a-180p as illustrated in FIGS. 18C-18G, in conjunction with a plurality of anchor coupling sections 166a-166d having stress/strain mechanisms 172a-172d, respectively, to couple the plurality of resonators 122a-122d to a common anchor 168 as illustrated in FIG. 11D.

In another embodiment, resonator array 120 further includes a differential drive and differential sense configuration that is the same as or similar to the differential drive and differential sense configuration illustrated in FIG. 19A.

Figure 21C:
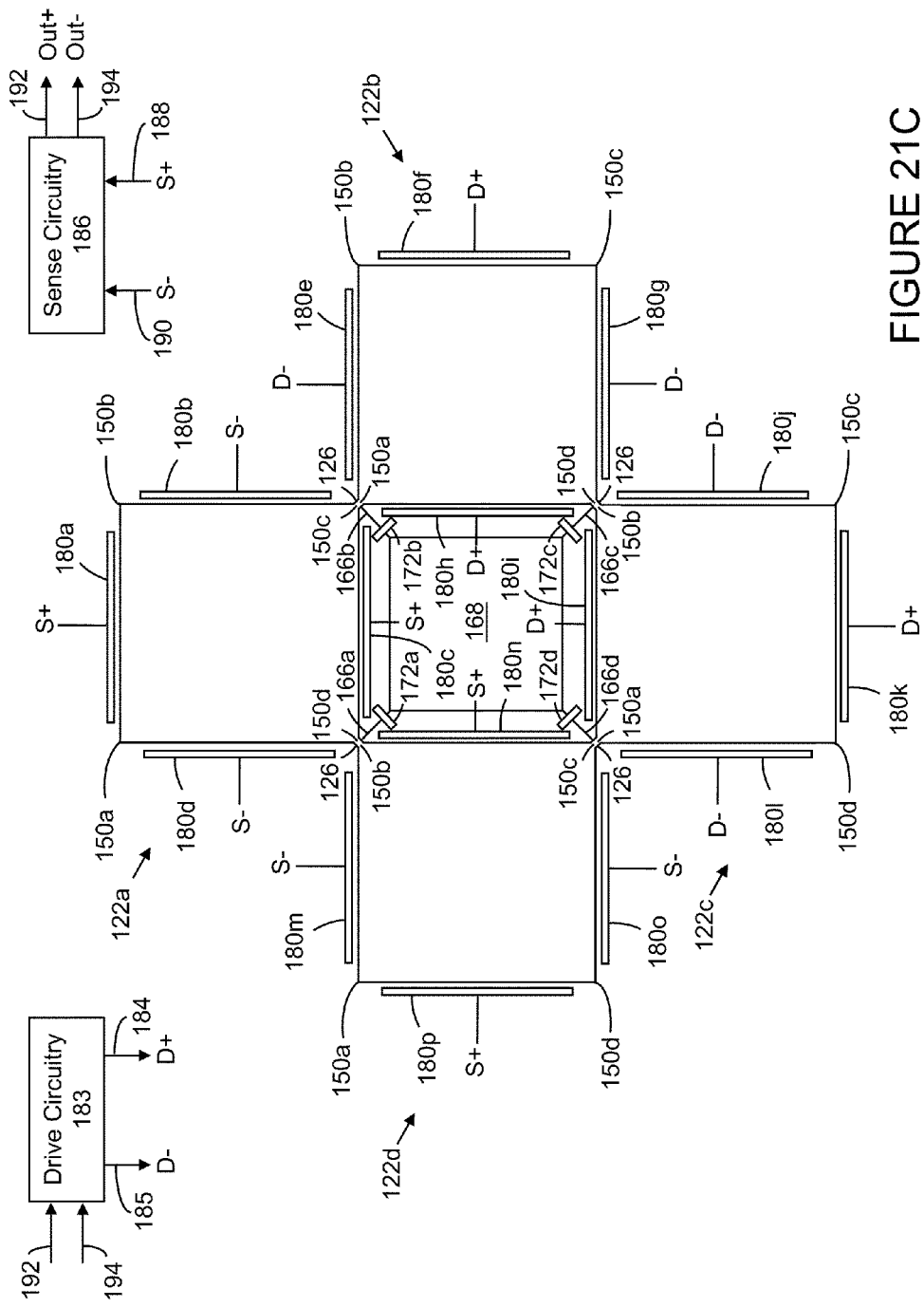
FIG. 21C is a top view of one embodiment of a resonator array including a plurality of bulk mode resonators, a plurality of resonator coupling sections, a plurality of electrodes, drive circuitry and sense circuitry that may be the same as or similar to the plurality of bulk mode resonators, the plurality of resonator coupling sections, the plurality of electrodes, drive circuitry and sense circuitry, respectively, of the resonator array illustrated in FIGS. 19A-19G, and further including a plurality of anchor coupling sections and a substrate anchor that may be the same as or similar to the plurality of anchor coupling sections and the substrate anchor, respectively, of the resonator array illustrated in FIG. 11D, according to certain aspects of the present inventions.
Figure 21D:
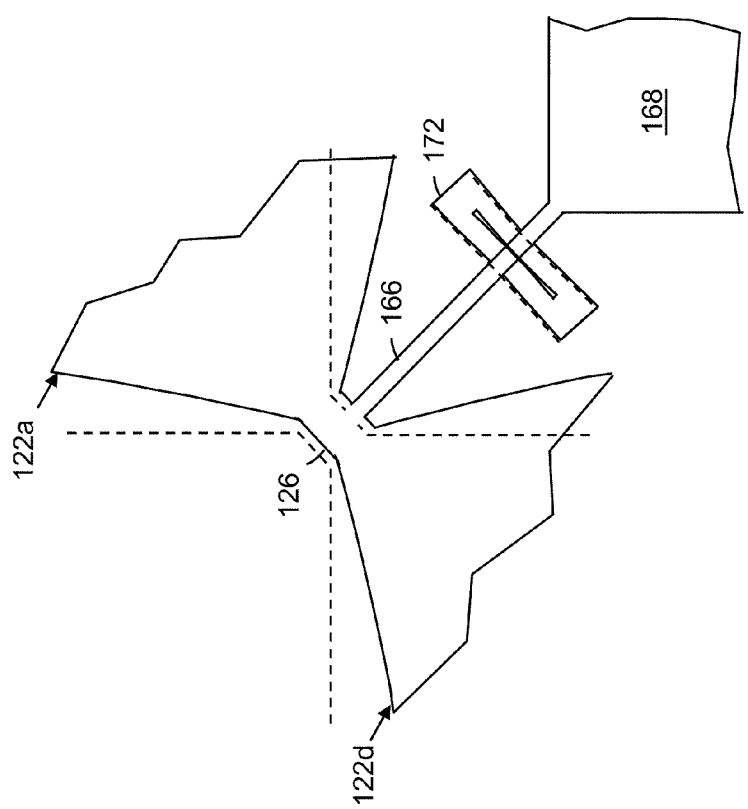
FIG. 21D illustrates an enlarged top view of a portion of one embodiment of the resonator array of FIG. 21C including the first and fourth bulk mode resonators, one of the resonator coupling sections, one of the anchor coupling sections and the anchor, which may be the same as or similar to the plurality of bulk mode resonators, the resonator coupling section, the anchor coupling section and the anchor of the portion of the resonator array illustrated in FIG. 11C, with the portion of the resonator array shown in a state corresponding to the first state of oscillation illustrated in FIGS. 19B-19D, wherein in relation to an at rest state, the first bulk mode resonator is contracted in at least one of first and second directions and expanded in at least one of third and fourth directions, and the fourth bulk mode resonator is expanded in at least one of first and second directions and contracted in at least one of third and fourth directions, according to certain aspects of present the inventions.
Figure 21E:
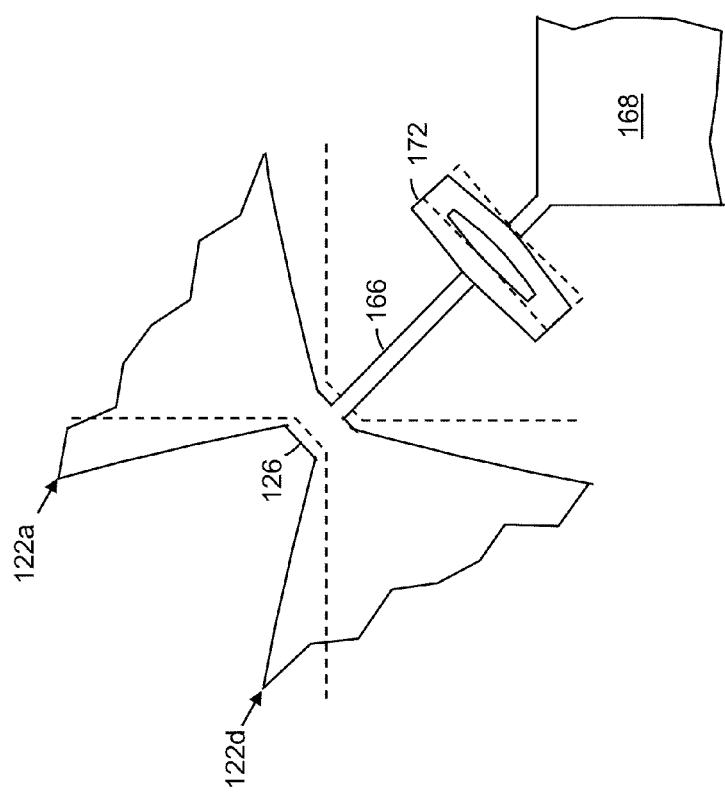
FIG. 21E illustrates an enlarged top view of a portion of one embodiment of the resonator array of FIG. 21C including the first and fourth bulk mode resonators, one of the resonator coupling sections, one of the anchor coupling sections and the anchor, which may be the same as or similar to the plurality of bulk mode resonators, the resonator coupling section, the anchor coupling section and the anchor of the portion of the resonator array illustrated in FIG. 11C, with the portion of the resonator array shown in a state corresponding to the second state of oscillation illustrated in FIGS. 19E-19G, wherein in relation to an at rest state, the first bulk mode resonator is expanded in at least one of first and second directions and contracted in at least one of third and fourth directions, and the fourth bulk mode resonator is contracted in at least one of first and second directions and expanded in at least one of third and fourth directions, according to certain aspects of present the inventions.

For example, with reference to FIGS. 21C-21E, in one embodiment, a resonator array includes a plurality of bulk mode resonators 122a-122d, a plurality of resonator coupling sections 126, a plurality of electrodes 180a-180p, drive circuitry 183 and sense circuitry 186 as illustrated in FIG. 19A, in conjunction with a plurality of anchor coupling sections 166a-166d having stress/strain mechanisms 172a-172d, respectively, to couple the plurality of resonators 122a-122d to a common anchor 168 as illustrated in FIG. 11D. In this embodiment, resonator array 120 operates as described above for the resonator array 120 illustrated in FIG. 19A such that resonators 122a-122d have a first state of oscillation that is the same as or similar to the first state of oscillation illustrated in FIGS. 19B-19D and a second state of oscillation that is the same as or similar to the second state of oscillation illustrated in FIGS. 19E-19G. FIG. 21D shows a portion of the resonator array 120 in a state corresponding to the first state of oscillation illustrated in FIGS. 19B-19D. FIG. 21E shows a portion of the resonator array 120 in a state corresponding to the second state of oscillation illustrated in FIGS. 19E-19G.

In another embodiment, resonator array 120 includes a differential drive and differential sense configuration that is the same as or similar to the differential drive and differential sense configuration illustrated in FIG. 19I.

For example, with reference to FIG. 21F, in one embodiment, a resonator array 120 includes a plurality of bulk mode resonators 122a-122d, a plurality of resonator coupling sections 126, a plurality of electrodes 180a-180p, drive circuitry 183 and sense circuitry 186 as illustrated in FIG. 19I, in conjunction with a plurality of anchor coupling sections 166a-166d having stress/strain mechanisms 172a-172d to couple the plurality of resonators 122a-122d to a common anchor 168 as illustrated in FIG. 11D. In one embodiment, the resonator array 120 operates as described above for the resonator array 120 illustrated in FIG. 19I such that resonators 122a-122d have a first state of oscillation that is the same as or similar to the first state of oscillation illustrated in FIGS. 19B-19D and a second state of oscillation that is the same as or similar to the second state of oscillation illustrated in FIGS. 19E-19G. In this regard, in the first state of oscillation, the state of the first and fourth bulk mode resonators 122a, 122d, the resonator coupling section 126, the anchor coupling section 166a (including stress/strain mechanism 172a) and the substrate anchor 168 may be the same as or similar to the state illustrated in FIG. 21D. In the second state of oscillation, the state of the first and fourth bulk mode resonators 122a, 122d, the resonator coupling section 126, the anchor coupling section 166a (including stress/strain mechanism 172a) and the substrate anchor 168 may be the same as or similar to the state illustrated in FIG. 21E.

In another embodiment, resonator array 120 includes a single ended drive and single ended sense configuration that is the same as or similar to the single ended drive and single ended sense configuration illustrated in FIGS. 20A-20B.

Figure 21G:
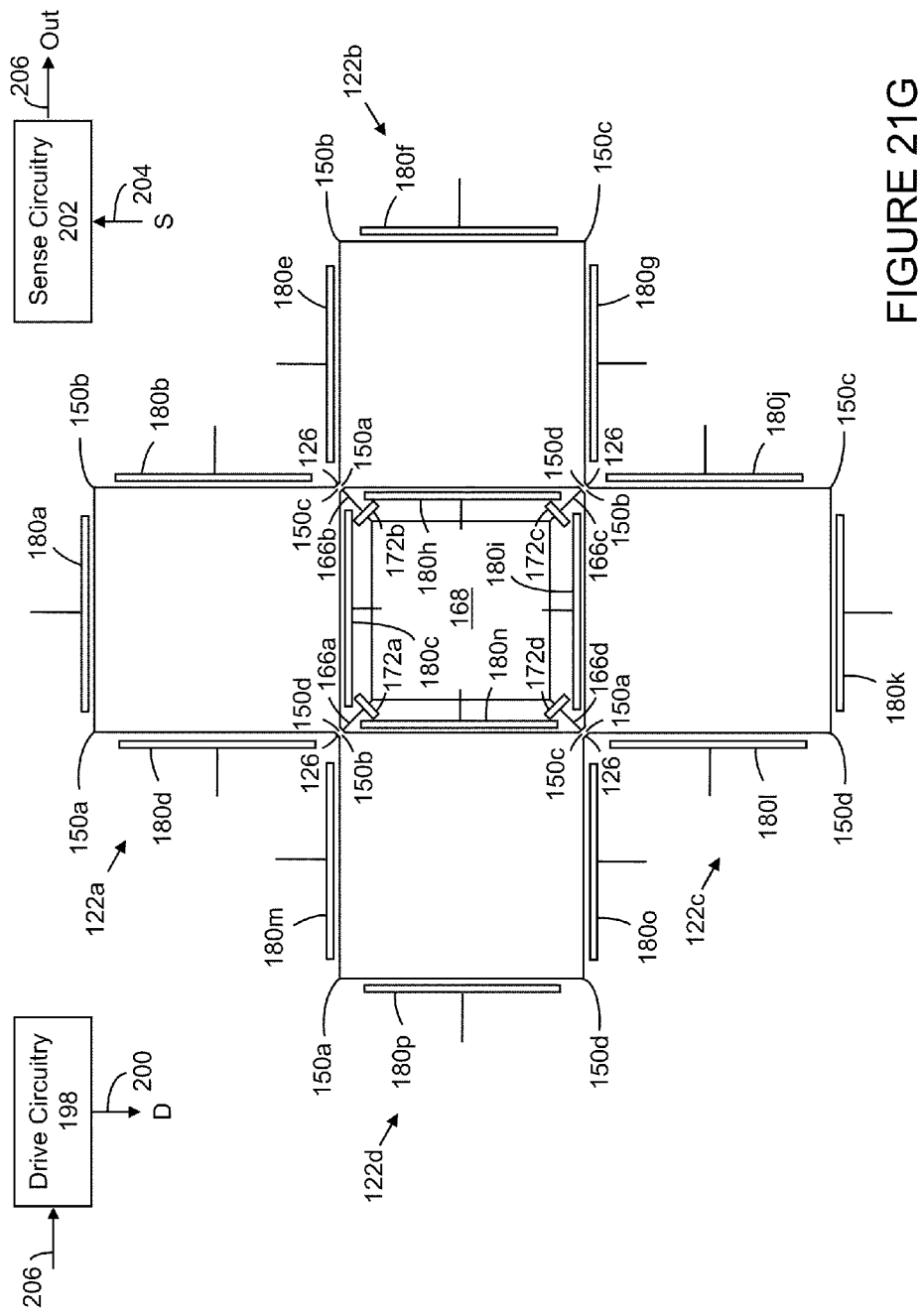
FIG. 21G is a top view of one embodiment of a resonator array including a plurality of bulk mode resonators, a plurality of resonator coupling sections, a plurality of electrodes, drive circuitry and sense circuitry that may be the same as or similar to the plurality of bulk mode resonators, the plurality of resonator coupling sections, the plurality of electrodes, drive circuitry and sense circuitry, respectively, of the resonator array illustrated in FIG. 20A, and further including a plurality of anchor coupling sections and a substrate anchor that may be the same as or similar to the plurality of anchor coupling sections and the substrate anchor, respectively, of the resonator array illustrated in FIG. 11D, according to certain aspects of the present inventions.

For example, with reference to FIG. 21G, in one embodiment, a resonator array 120 includes a plurality of resonators 122a-122d, a plurality of resonator coupling sections 126, a plurality of electrodes 180a-180p, single ended drive circuitry 198 and single ended sense circuitry 202 as illustrated in FIGS. 20A-20B in conjunction with anchor coupling sections 166a-166d having stress/strain mechanisms 172a-172, respectively, to couple the plurality of resonators 122a-122d to a common anchor 168 as illustrated in FIG. 11D. In one embodiment, the resonator array 120 operates as described above for the resonator array 120 illustrated in FIGS. 20A-20B.

As stated above, each of the plurality of electrodes 180a-180p may have any suitable configuration (e.g., size, shape) and positioning. Thus, for example, some embodiments may employ one or more electrodes that have a shape and/or size that is different than the shape and/or size of one or more of the electrodes illustrated in FIGS. 18A-18G, 19A-19I and 20A-20B. Some embodiments may employ one or more electrodes that are disposed in position(s) that are different than the position(s) of one or more of the electrodes illustrated in FIGS. 18A-18G, 19A-19I and 20A-20B.

Figure 21H:
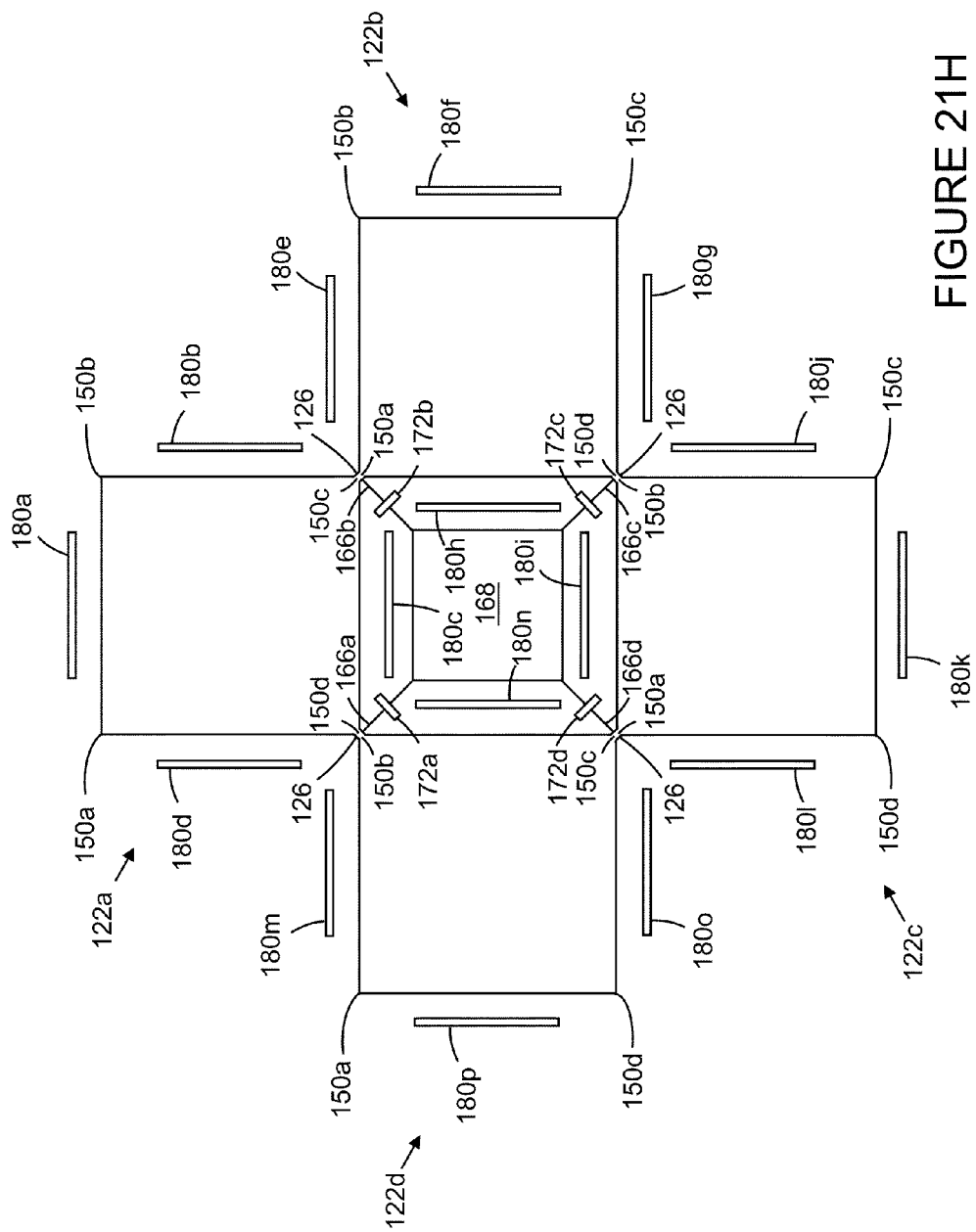
FIG. 21H is a top view of another embodiment of a resonator array including a plurality of bulk mode resonators and a plurality of resonator coupling sections that may be the same as or similar to the plurality of bulk mode resonators and the plurality of resonator coupling sections, respectively, of the resonator array illustrated in FIG. 4E, a plurality of electrodes that include a first plurality of electrodes, a second plurality of electrodes, a third plurality of electrodes and a fourth plurality of electrodes and further including a plurality of anchor coupling sections and a substrate anchor, according to certain aspects of the present inventions.
Figure 21I:
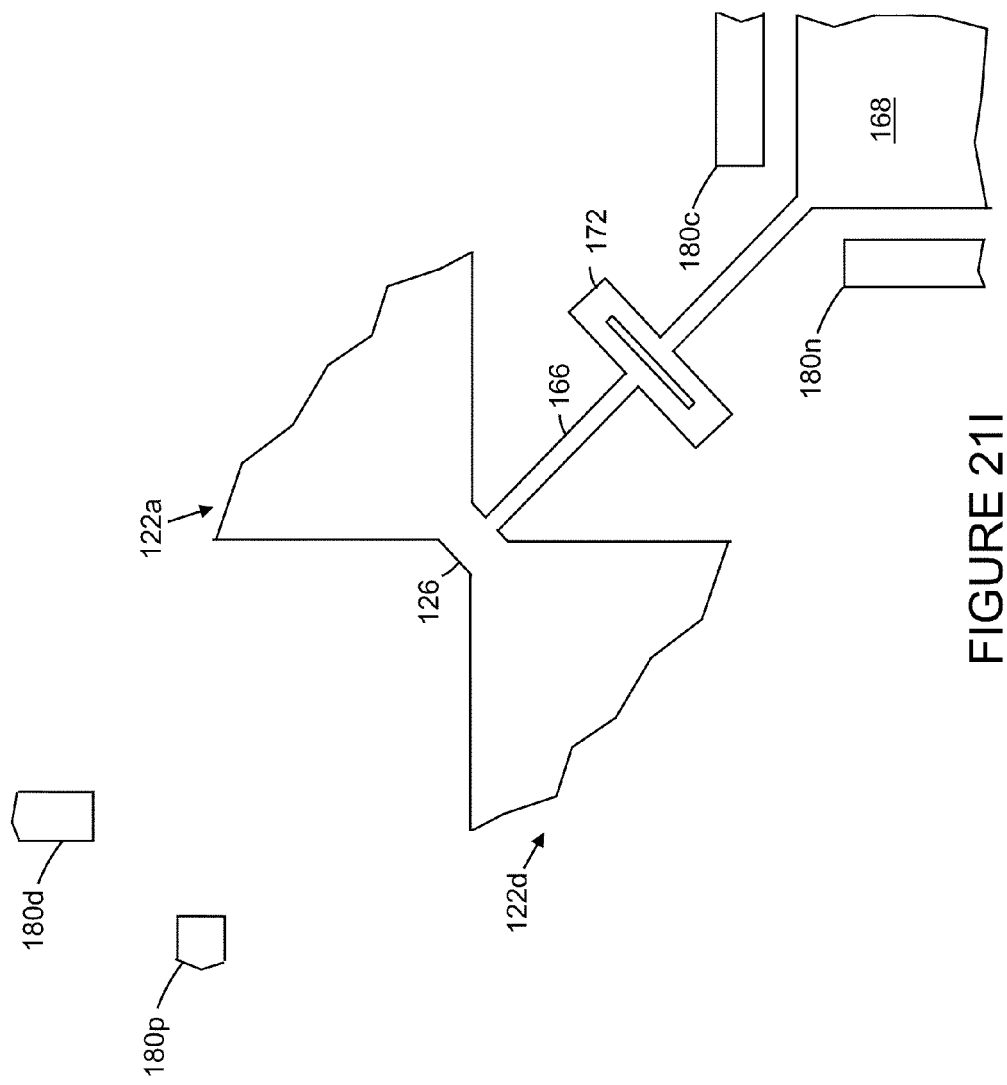
FIG. 21I illustrates an enlarged top view of a portion of one embodiment of the resonator array of FIG. 21H including the first and fourth bulk mode resonators, one of the resonator coupling sections, one of the anchor coupling sections, the substrate anchor, two of the first plurality of electrodes and two of the fourth plurality of electrodes, with the portion of the resonator array shown in an at rest state, according to certain aspects of the present inventions.

For example, with reference to FIGS. 21H-21I, in one embodiment, a resonator array includes a plurality of bulk mode resonators 122a-122d, a plurality of resonator coupling sections 126 and a plurality of electrodes 180a-180p (including a first plurality of electrodes 180a-180d, a second plurality of electrodes 180e-180h, a third plurality of electrodes 180i-180l and a fourth plurality of electrodes 180m-180p), in conjunction with a plurality of anchor coupling sections 166a-166d having stress/strain mechanisms 172a-172d, respectively, to couple the plurality of resonators 122a-122d to a common anchor 168 as illustrated in FIG. 11D.

In another embodiment, resonator array 120 further includes a drive and sense configuration that is the same as or similar to the drive and sense configuration illustrated in FIGS. 19A-19H, FIG. 19I and/or FIGS. 20A-20B.

Figure 21J:
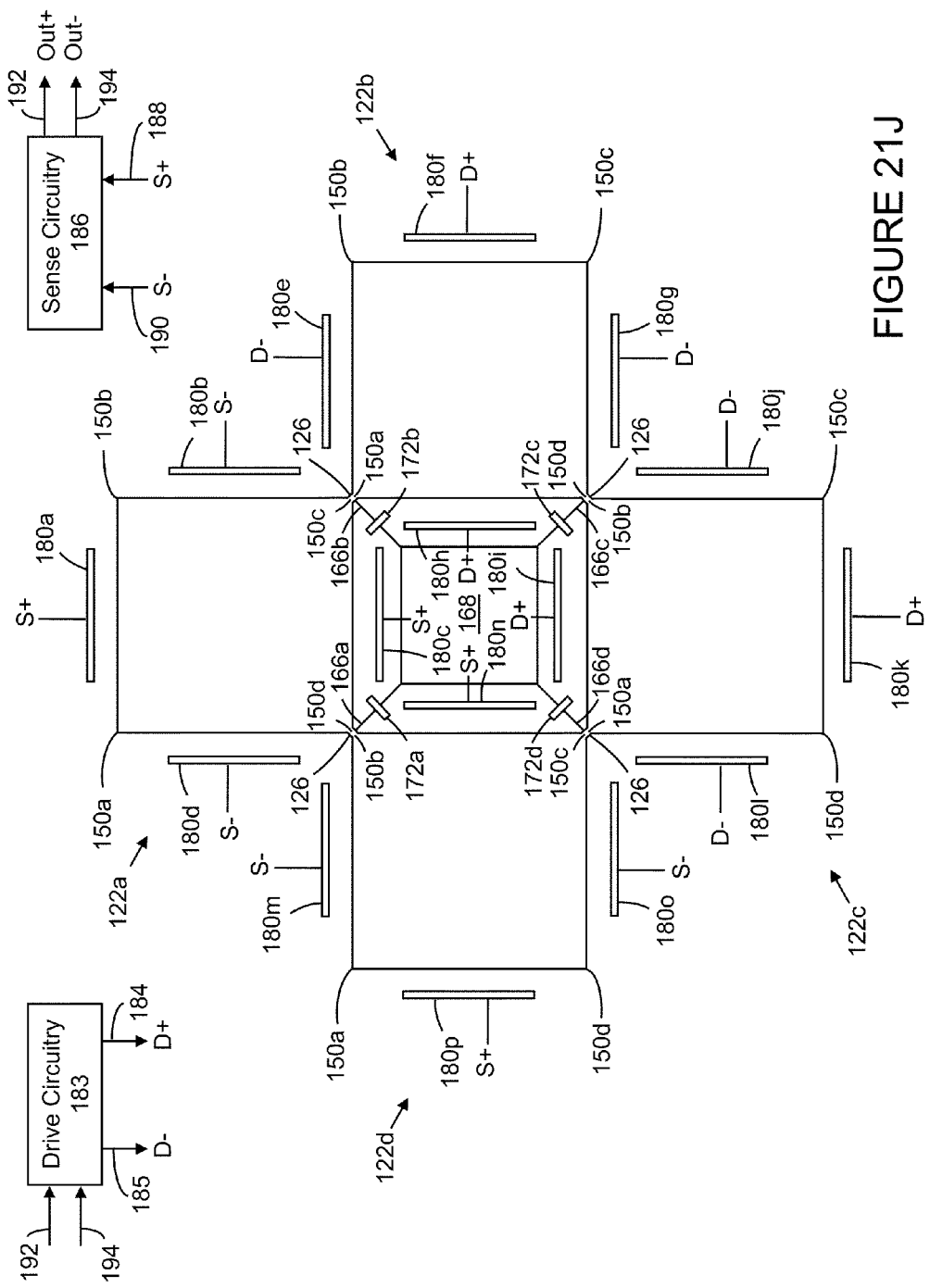
FIG. 21J is a top view of one embodiment of a resonator array including a plurality of bulk mode resonators, a plurality of resonator coupling sections, a plurality of electrodes, a plurality of anchor coupling sections and a substrate anchor that may be the same as or similar to the bulk mode resonators, the plurality of resonator coupling sections, the plurality of electrodes, the plurality of anchor coupling sections and the substrate anchor, respectively, of the resonator array illustrated in FIG. 21H, and further including drive circuitry and sense circuitry, according to certain aspects of the present inventions.
Figure 21L:
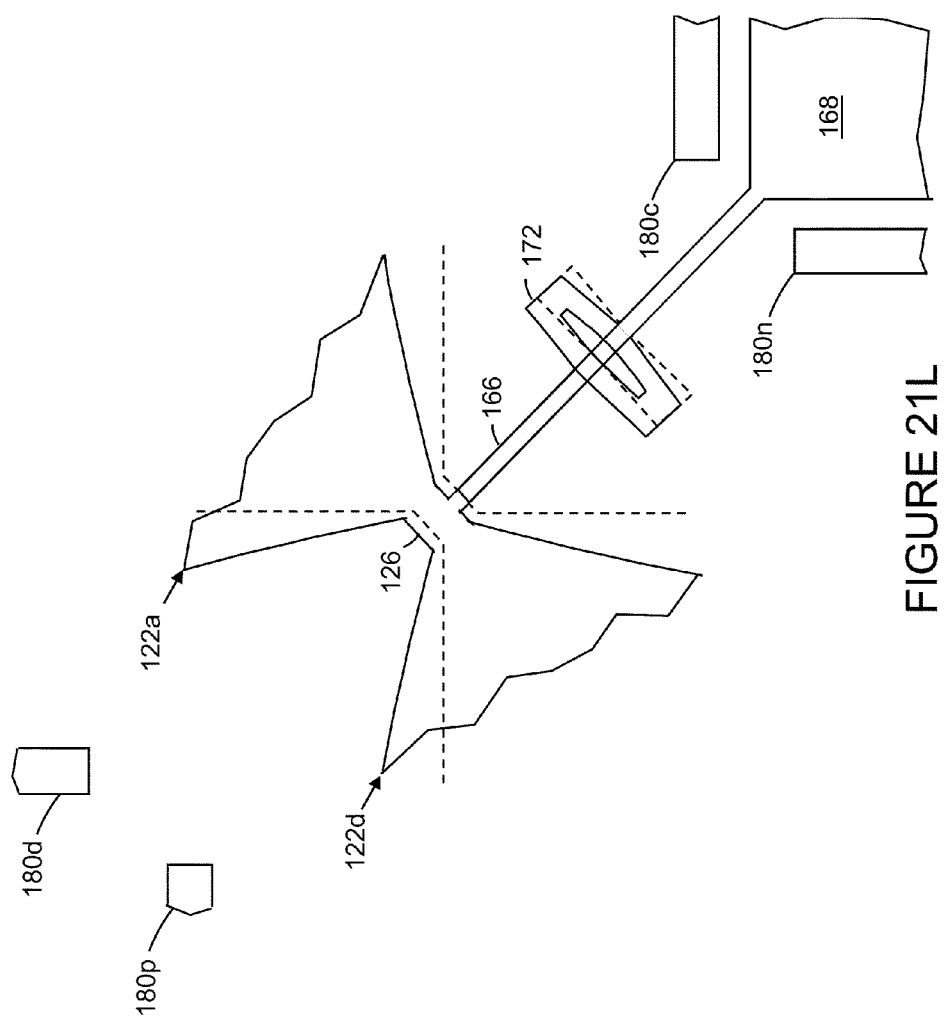
FIG. 21L illustrates an enlarged top view of a portion of one embodiment of the resonator array of FIG. 21J including the first and fourth bulk mode resonators, one of the resonator coupling sections, one of the anchor coupling sections and the anchor, with the portion of the resonator array shown in a state corresponding to the second state of oscillation illustrated in FIGS. 19E-19G, wherein in relation to an at rest state, the first bulk mode resonator is expanded in at least one of first and second directions and contracted in at least one of third and fourth directions, and the fourth bulk mode resonator is contracted in at least one of first and second directions and expanded in at least one of third and fourth directions, according to certain aspects of present the inventions.

For example, with reference to FIGS. 21J-21L, in one embodiment, a resonator array includes a plurality of bulk mode resonators 122a-122d, a plurality of resonator coupling sections 126, a plurality of electrodes 180a-180p, drive circuitry 183 and sense circuitry 186, in conjunction with a plurality of anchor coupling sections 166a-166d having stress/strain mechanisms 172a-172d, respectively, to couple the plurality of resonators 122a-122d to a common anchor 168 as illustrated in FIG. 11D. In this embodiment, resonator array 120 operates as described above for the resonator array 120 illustrated in FIG. 19A such that resonators 122a-122d have a first state of oscillation that is the same as or similar to the first state of oscillation illustrated in FIGS. 19B-19D and a second state of oscillation that is the same as or similar to the second state of oscillation illustrated in FIGS. 19E-19G. FIG. 21K shows a portion of the resonator array 120 in a state corresponding to the first state of oscillation illustrated in FIGS. 19B-19D. FIG. 21L shows a portion of the resonator array 120 in a state corresponding to the second state of oscillation illustrated in FIGS. 19E-19G.

In one embodiment, MEMS resonator array 120 employs temperature management techniques in order to manage and/or control the Q factor of resonators 122. In this regard, as resonator expands and contracts, slight cooling may occur in one or more areas as such areas expand, and slight heating may occur in one or more areas as such areas contract. Such cooling and/or heating may result in a heat gradient that causes diffusion of heat ("heat flow) from the "hotter" side to the "cooler" side. The diffusion of heat ("heat flow") may result in a loss of energy, which may impact (for example, reduce) the Q factor of resonator 122. This effect is often referred to as Thermoelastic Dissipation ("TED"), which may be a dominant limit of the Q factor of a resonant structure. As such, is may be advantageous to implement temperature management techniques in order to manage, control, limit, minimize and/or reduce TED.

Figure 22B:
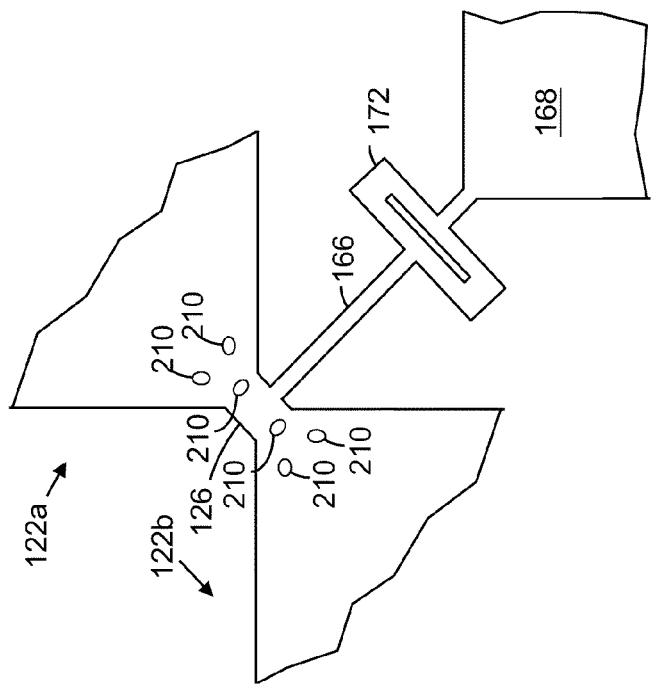
FIG. 22B is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators further include openings, voids or slots for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 22A:
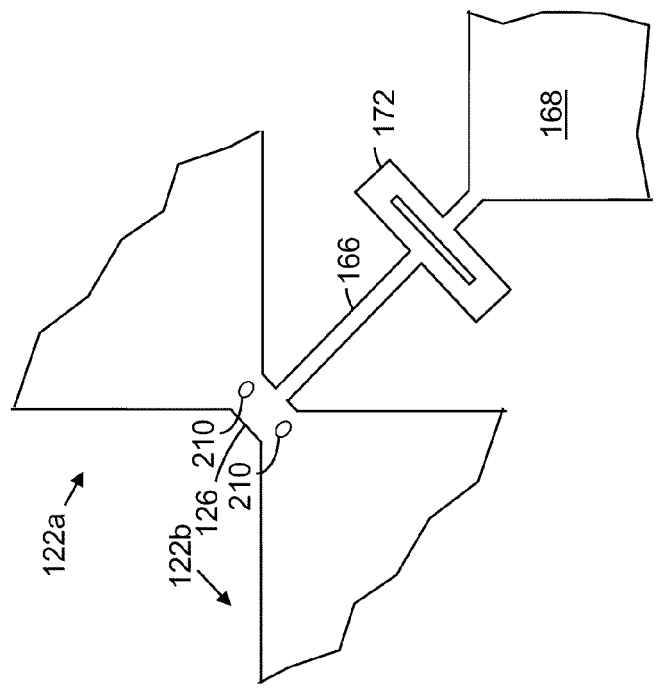
FIG. 22A is an enlarged top view of a portion of one embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators further include at least one opening, void or slot for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 22C:
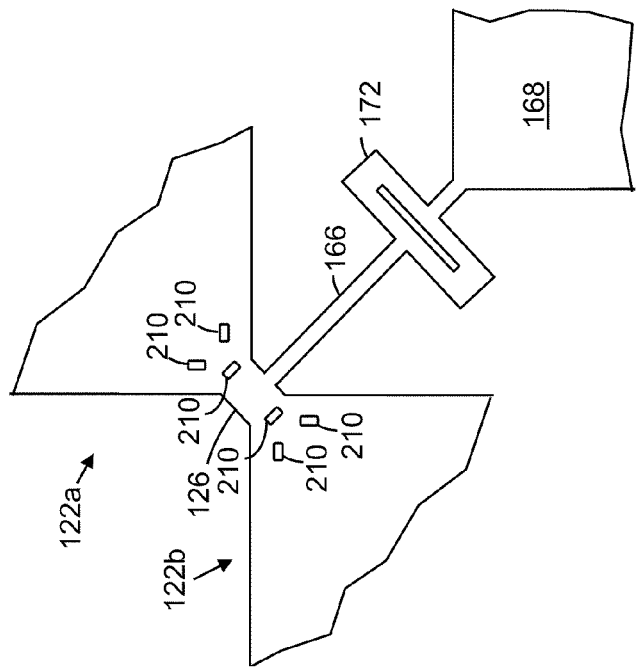
FIG. 22C is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators further include openings, voids or slots for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 22D:
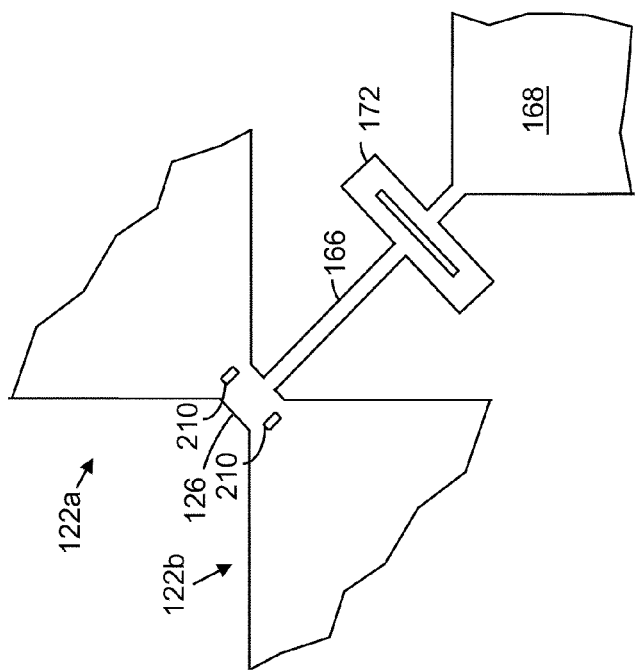
FIG. 22D is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators further include openings, voids or slots for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 23A:
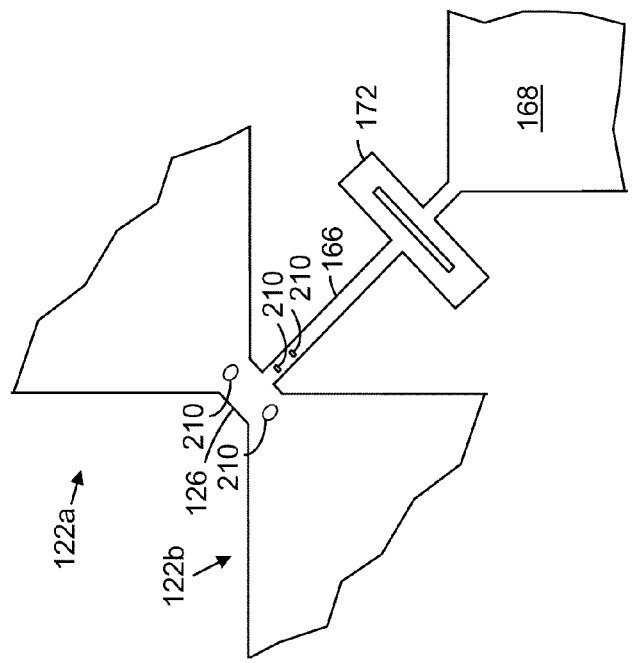
FIG. 23A is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the anchor coupling section further includes openings, voids or slots for improved manufacturability and/or to improve temperature management techniques (for example, to decrease thermo elastic energy dissipation), according to certain aspects of the present inventions.
Figure 23B:
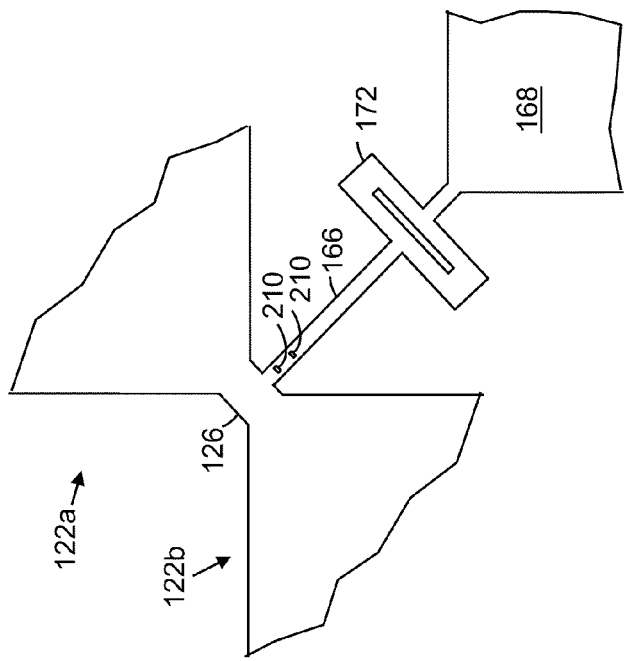
FIG. 23B is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators and the anchor coupling section further include at least one opening, void or slot for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 23D:
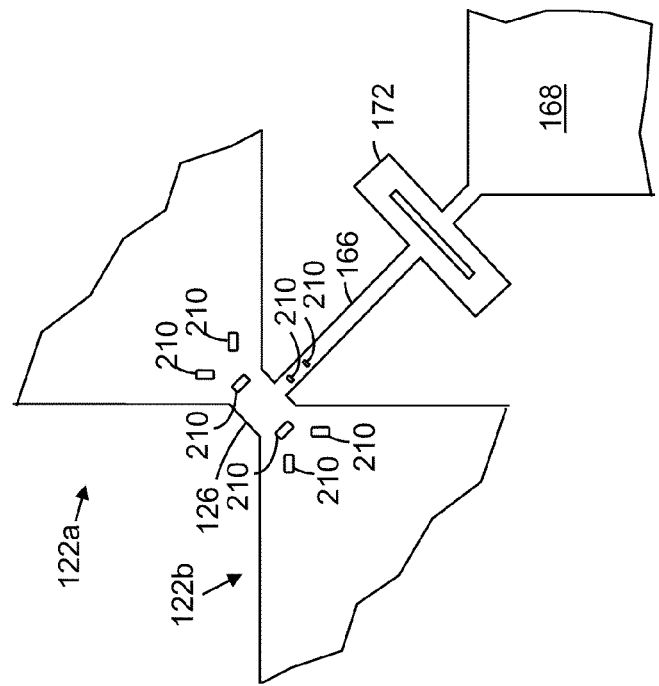
FIG. 23D is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators and the anchor coupling section further include openings, voids or slots for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 23C:
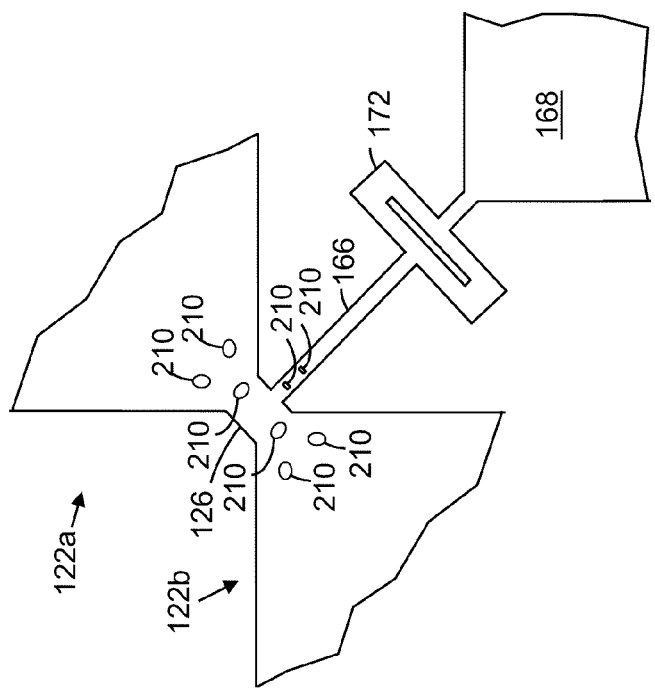
FIG. 23C is an enlarged top view of a portion of another embodiment of a MEMS resonator array having a plurality of bulk mode resonators, a resonator coupling section, an anchor coupling section and a substrate anchor that may the same as or similar to the plurality of bulk mode resonators, the resonator coupling section, the anchor coupling section and the substrate anchor of the portion of the resonator array illustrated in FIG. 11C, wherein the resonators and the anchor coupling section further include openings, voids or slots for improved manufacturability (for example, faster release of the mechanical structures in those instances where the opening, void or slot extends the entire height/thickness of the resonator) and/or to improve temperature management techniques (for example, to decrease thermo elastic energy dissipation), according to certain aspects of the present inventions.
Figure 24B:
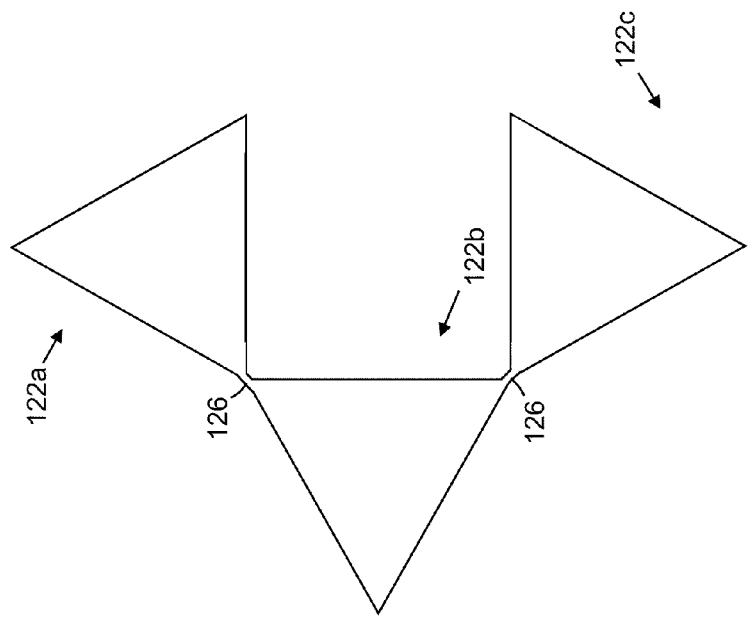
FIGS. 24A-24D illustrate top views of various embodiments of MEMS resonator arrays each having a plurality of bulk mode resonators that may be the same as or similar to the bulk mode resonator of FIG. 3C, and one or more resonator coupling sections to mechanically couple each of the plurality of resonators to one or more other resonators of the plurality of bulk mode resonators, according to certain aspects of the present inventions.
Figure 24A:
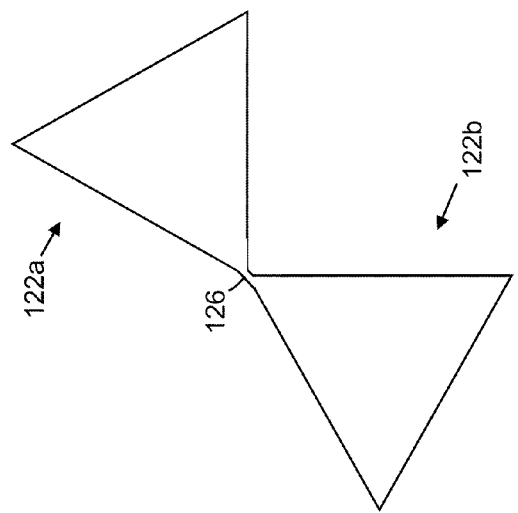
Figures 24C, 24D:
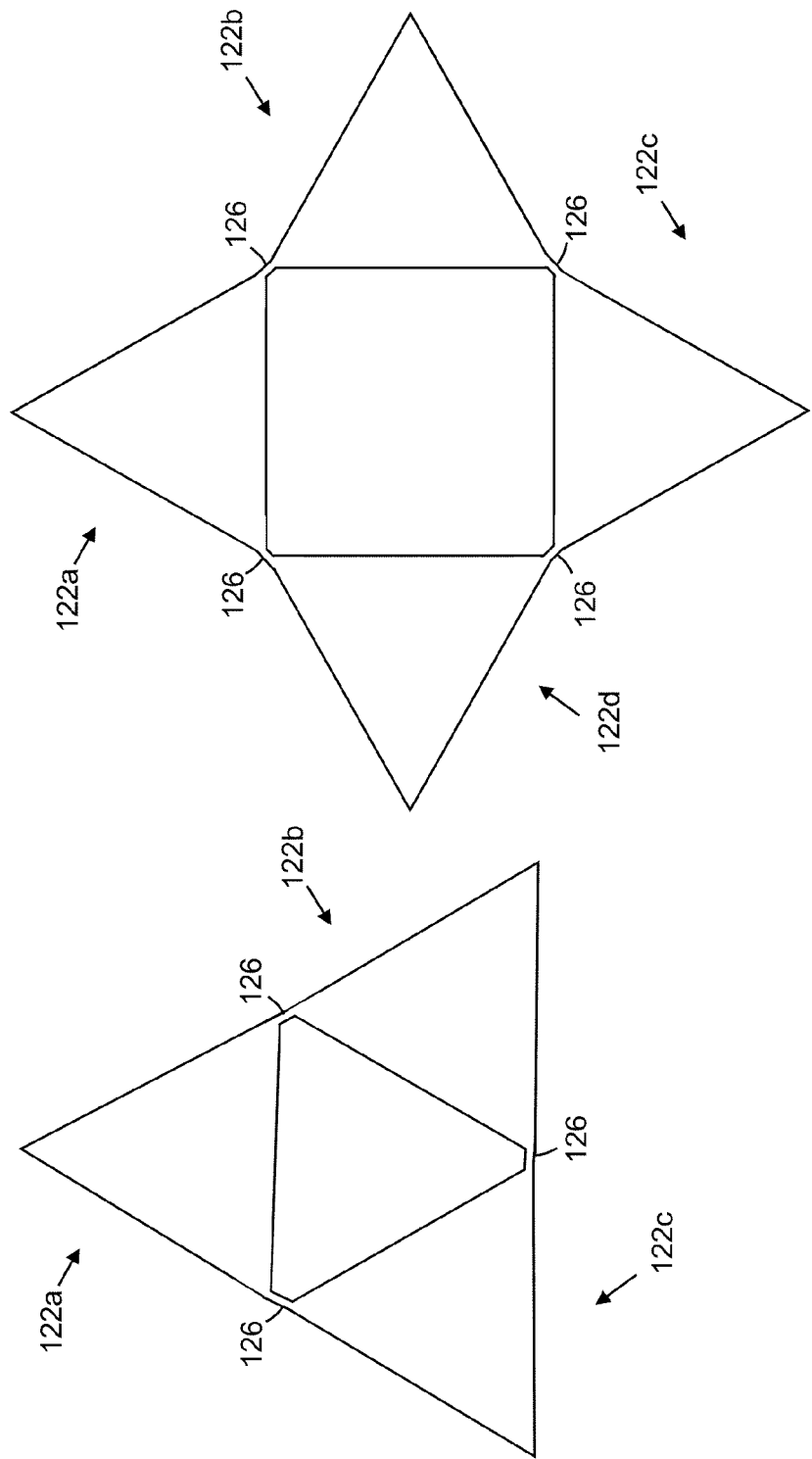
Figure 25B:
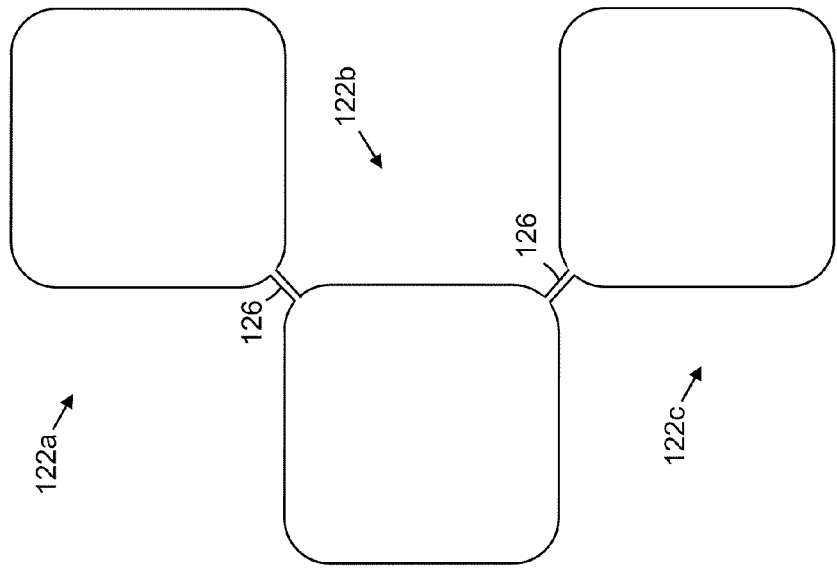
FIGS. 25A-25C illustrate top views of various embodiments of MEMS resonator arrays each having a plurality of bulk mode resonators that may be the same as or similar to the bulk mode resonator of FIG. 3D, and one or more resonator coupling sections to mechanically couple each of the plurality of resonators to one or more other resonators of the plurality of bulk mode resonators, according to certain aspects of the present inventions.
Figure 25A:
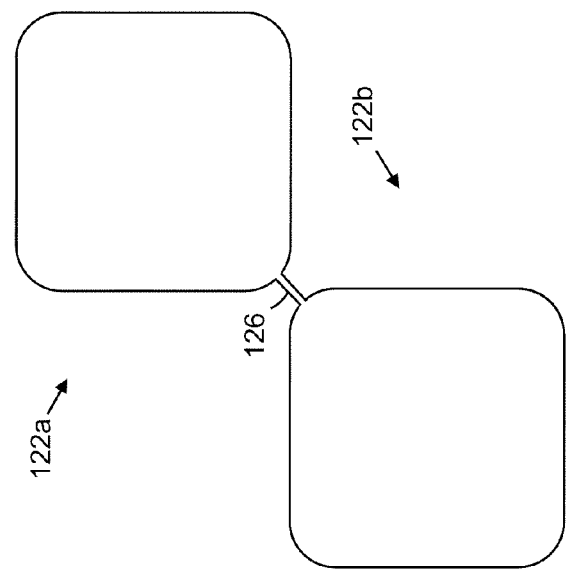
Figure 25C:
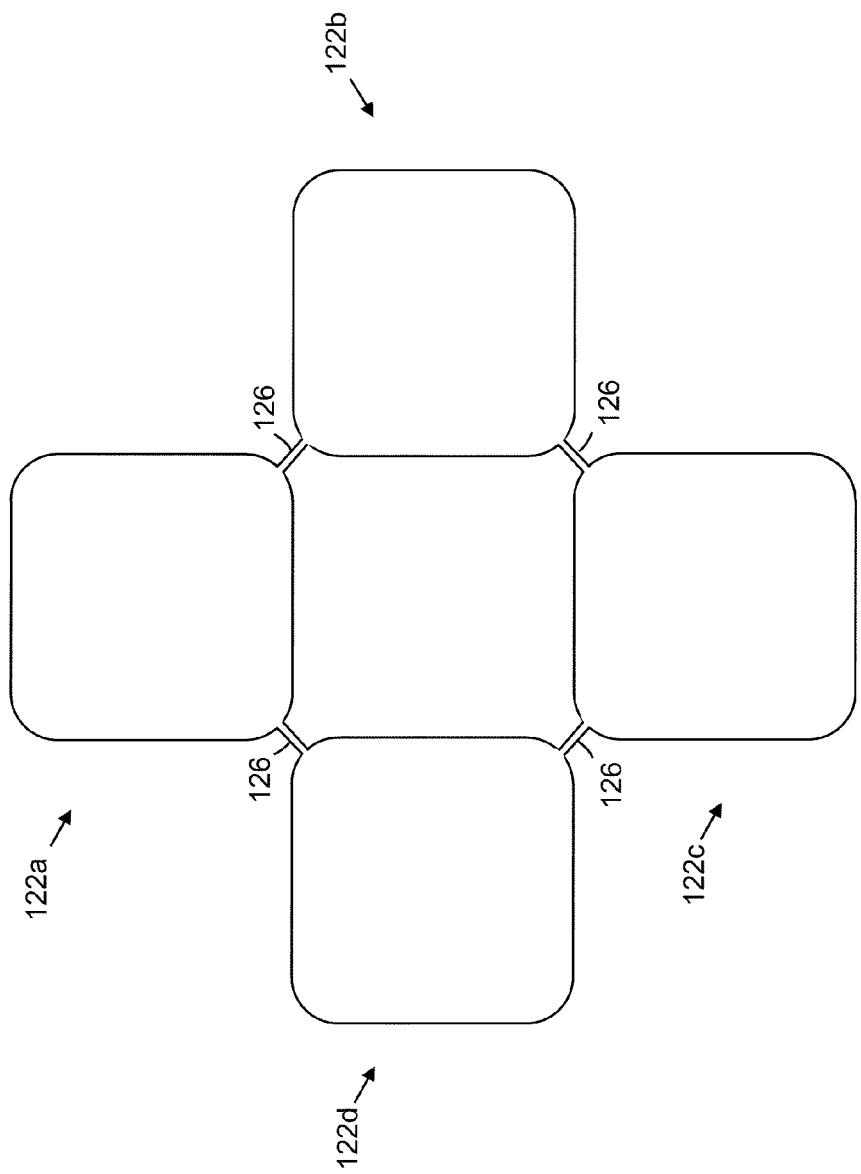
Figure 28A:
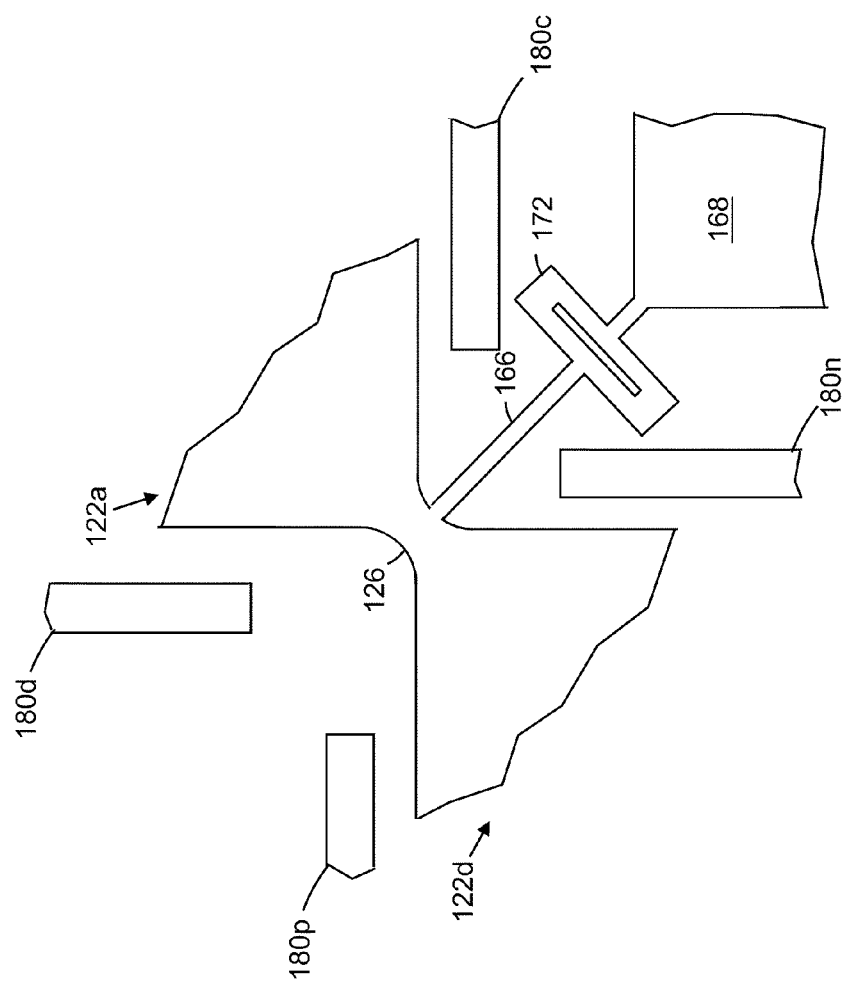
FIGS. 28A-28F are enlarged top views of portions of various embodiments of MEMS resonator arrays each having a plurality of bulk mode resonators that may each be the same as or similar to the bulk mode resonator of FIG. 3A, a resonator coupling section, an anchoring coupling section and a substrate anchor showing various embodiments of anchoring techniques and stress/strain mechanisms in conjunction with various embodiments of resonator mechanical coupling techniques, according to certain aspects of the present inventions.
Figure 28B:
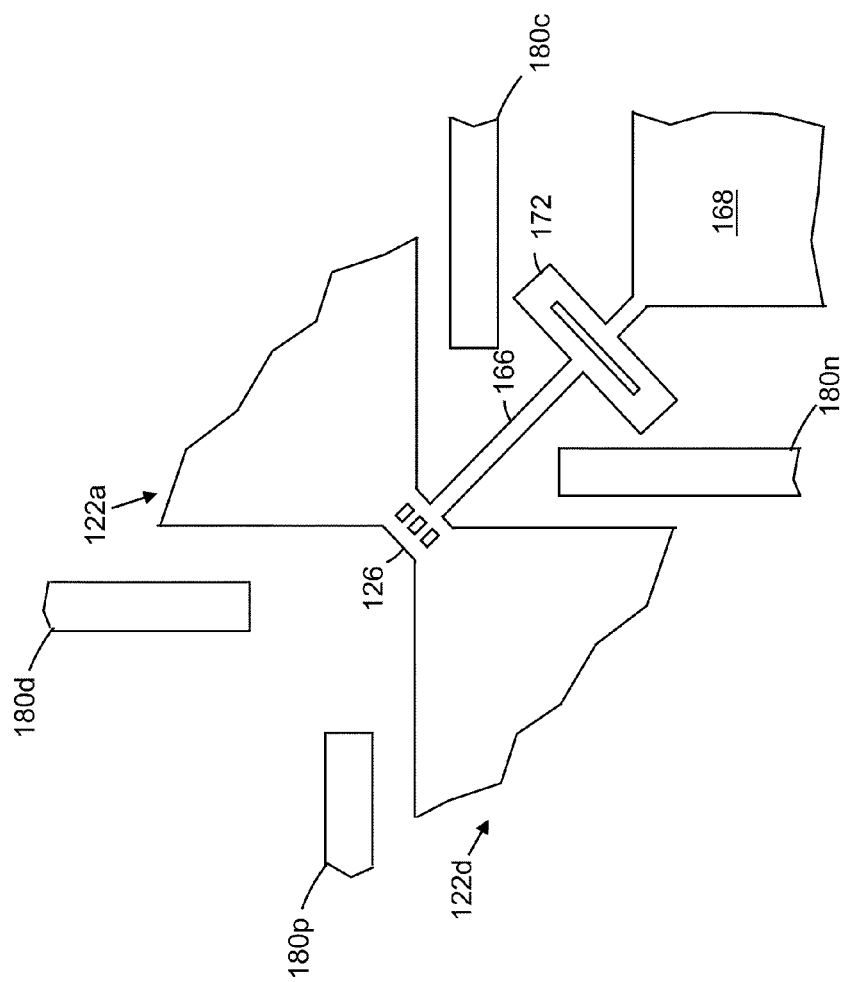
Figure 28C:
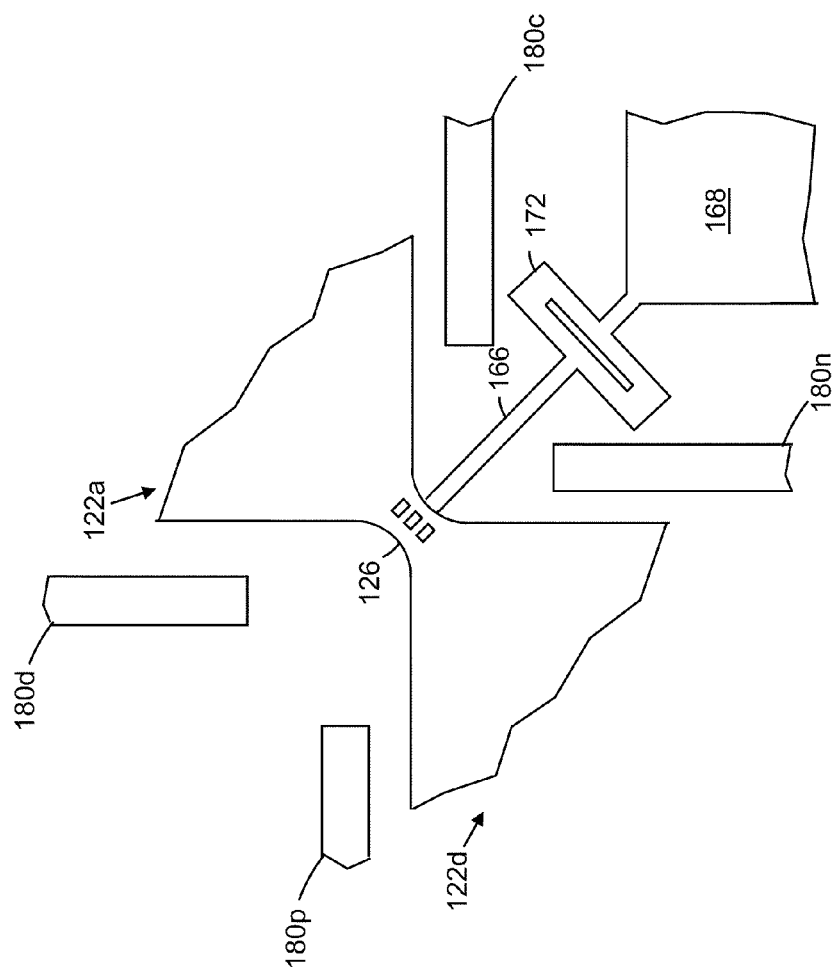
Figure 28D:
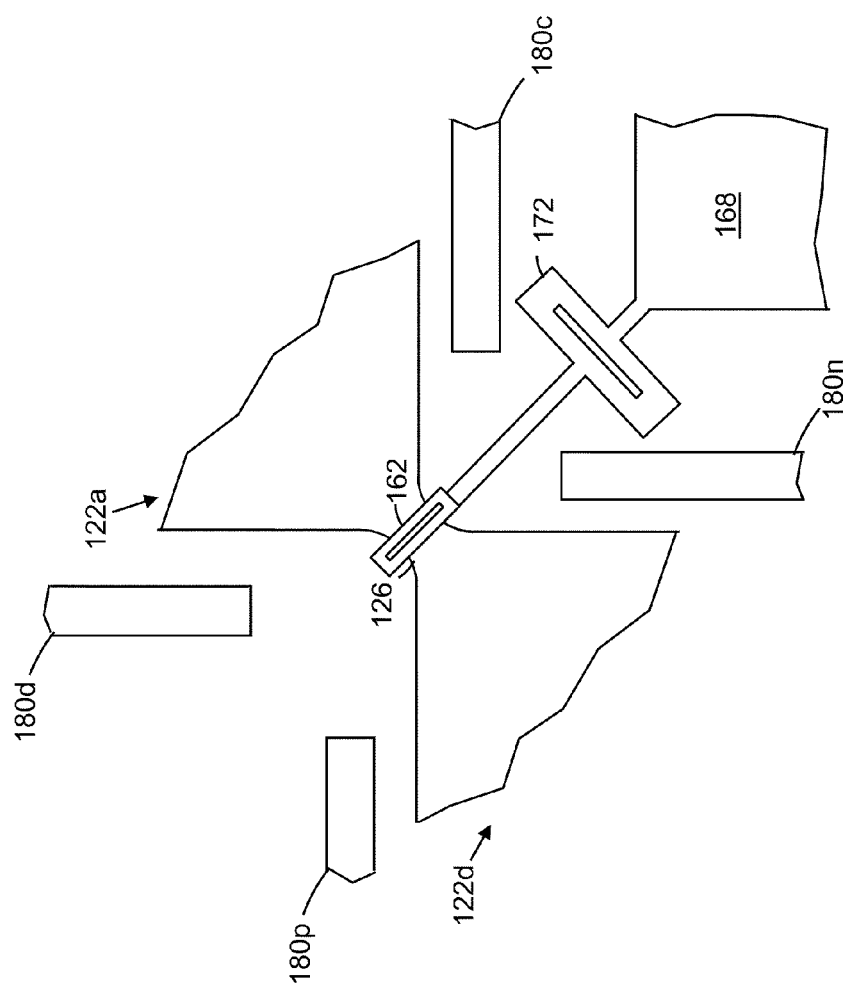
Figure 28E:
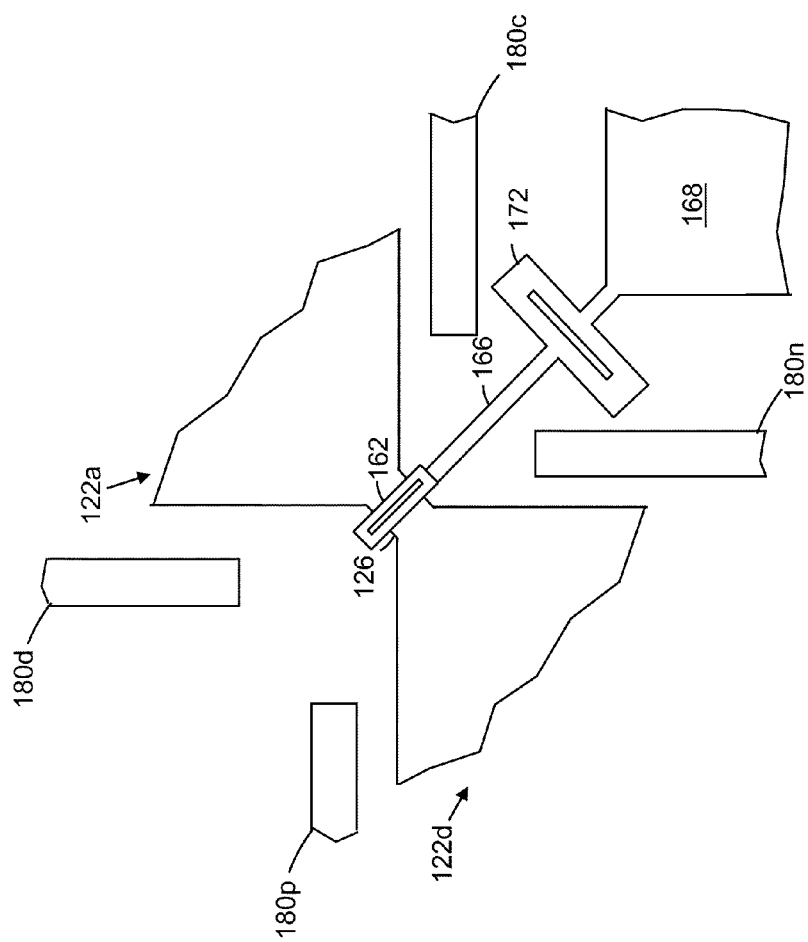
Figure 28F:
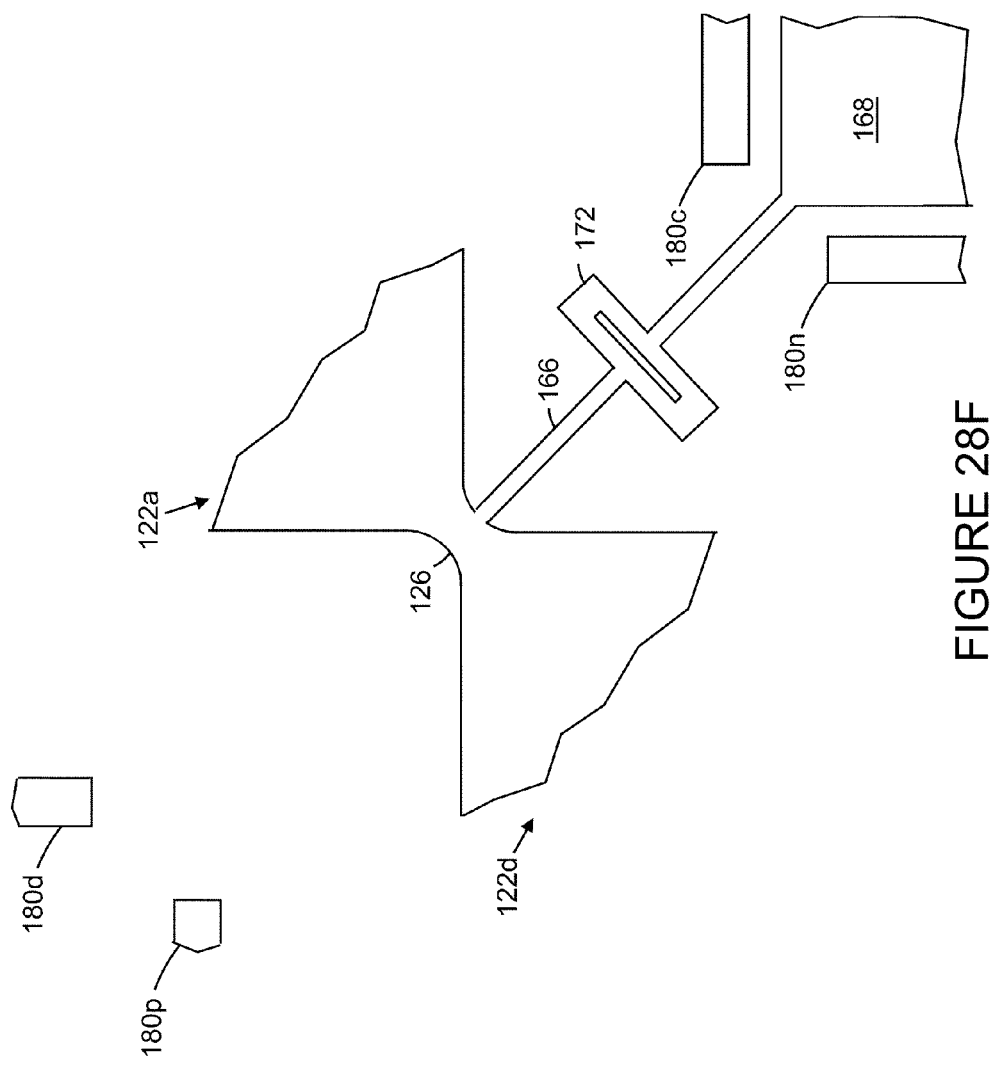
Figure 29:
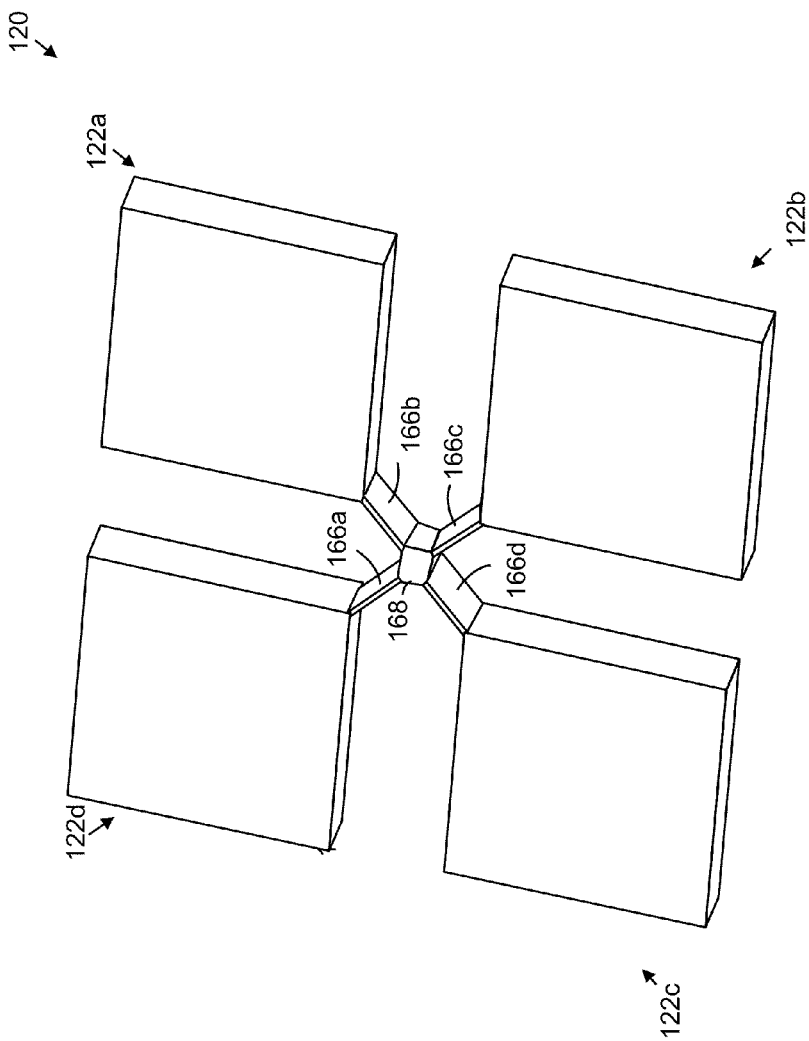
FIG. 29 is perspective view of one embodiment of a portion of a MEMS resonator array having a plurality of bulk mode resonators that may each be the same as or similar to the bulk mode resonator of FIG. 3A, a plurality of resonator coupling sections, a plurality of anchor coupling sections and a substrate anchor, according to certain aspects of the present inventions.

With reference to FIG. 22A, in one temperature management embodiment, slots 210 are formed in one or more sections of resonator 122. The slots 210 suppress/reduce heat flow within resonator 122 and/or MEMS resonator array 122. The suppression/reduction of heat transfer within resonator 122 and/or MEMS resonator array 122 may lead to a higher Q factor for resonator 122 and MEMS resonator array 120. It has to be noted that the methods of temperature management by using slots affects the optimization of the zero movement at the anchoring point and has to be considered by the design (for example, FEA).

The temperature management techniques may be employed in one or more sections of one or more resonators 122 (see, for example, FIGS. 22A-22D). In addition thereto, or in lieu thereof, the temperature management techniques may also be implemented in anchor coupling sections 166 (see, for example, FIGS. 23A-23D). The slots 210 may be any shape including, for example, square, rectangle, circular, elliptical and/or oval. Indeed, slots 210 of any shape, whether geometric or otherwise, may be incorporated into one or more resonators 122 and/or one or more anchoring coupling sections 166. Notably, slots 210 may also change the stiffness of the resonator 122 and/or anchoring coupling sections 166.

Notably, in some embodiments, one or more resonators may include at least one opening, void or slot to improve manufacturability (for example, faster release of the mechanical structures in those instances where the opening, void or slot extends the entire height/thickness of the resonator). In some embodiments, one, some or all of the at least one opening, void or slot may also be used to improve temperature management. In some other embodiments, none of the at least one opening, void or slot is used to improve temperature management. Thus, in some embodiments, an opening, void or slot may be employed to improve temperature management and/or to improve manufacturability.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

Notably, although a significant portion of the description of the present inventions was set forth in the context of a MEMS resonator array having a plurality of bulk mode resonators each having, in an at rest state, a square shape, such as, for example, illustrated in FIGS. 3A-3B, a MEMS resonator array according to the present inventions may include resonators of any geometric shaped resonator architecture or structure. All of the features, embodiments and alternatives discussed herein with respect to a resonator having a square shape and/or any other shape are applicable to resonators, according to the present inventions, which have other shapes, although, unless stated otherwise, resonators are not limited to such features, embodiments and alternatives. For the sake of brevity, those discussions will not be repeated.

For example, as mentioned above, in one embodiment, a MEMS resonator array may include one or more resonators having a triangular shape, for example, as illustrated in FIG. 3C and FIGS. 24A-24D. In another embodiment, a MEMS resonator array in accordance with one or more aspects of the present inventions may include one or more resonators having a rounded square shape, for example, as illustrated in FIGS. 3D and 25A-25C. In another embodiment, a MEMS resonator array may include one or more resonators having a rounded triangle shape, for example, as illustrated in FIGS. 3E and 26A-26B.

Moreover, all of the features, embodiments and alternatives discussed herein with respect to a MEMS resonator array 100 having a plurality of square shaped resonators are applicable to MEMS resonator arrays, according to the present inventions, that include resonators which have other shapes, although, unless stated otherwise, resonator arrays are not limited to such features, embodiments and alternatives. For the sake of brevity, those discussions will not be repeated.

In some embodiments, a MEMS resonator array may include a plurality of resonators 122 having different shapes. For example, with reference to FIG. 27A, in one embodiment, a MEMS resonator array includes a triangular shaped resonator 122a mechanically coupled to a square shaped resonator 122b. With reference to FIG. 27B, in another embodiment, resonator array 120 includes a triangular shaped resonator 122a, a square shaped resonator 122b, a triangular shaped resonator 122c and a square shaped resonator 122d, wherein the triangular shaped resonators 122a, 122c are mechanically coupled to the square shaped resonators 122b, 122d.

All of the features, embodiments and alternatives discussed herein with respect to a MEMS resonator array 120 having a plurality of square shaped resonators are applicable to MEMS resonator array including a plurality of resonators 122 having two or more different shapes, although, unless stated otherwise, resonator arrays are not limited to such features, embodiments and alternatives. For the sake of brevity, those discussions will not be repeated.

Further a MEMS resonator array may employ any sense and drive techniques whether now known or later developed. The drive and sense circuitry (whether differential or not) may be integrated on the same substrate in which the resonators of the array resides (or is fabricated in). In addition thereto, or in lieu thereof, drive and sense circuitry may be integrated on a substrate that is physically separate from (and electrically interconnected with) the substrate in which the resonators resides. Moreover, the drive and sense electrode may be of a conventional type or may be any type and/or shape whether now known or later developed.

Notably, the dimensions, characteristics and/or parameters of the resonators and MEMS resonator array according to the present inventions may be determined using a variety of techniques including finite element modeling and simulation techniques (for example, a finite element modeling via a computer driven analysis engine such as FemLab (from Consol), ANSYS (from ANSYS INC.), IDEAS and/or ABAKUS and/or empirical data/measurements. For example, a finite element modeling engine, using or based on a set of boundary conditions (for example, the size of the resonator structure), may be employed to design, determine and/or assess the dimensions, characteristics and/or parameters of (i) resonator mass 122, (ii) loading relief mechanisms 162, (iii) nodal point(s) 114 (if any), (iv) anchor coupling sections 166 and/or (v) stress/strain mechanisms 172. Indeed, the impact and/or response of resonator 122, alone or incorporated into a MEMS resonator array 120, on or at the anchor and/or substrates may also be observed and/or determined using such a finite element modeling, simulation and analysis engine.

As mentioned above, a finite element analysis and simulation engine may also be employed to design and/or determine the location of any nodal points. Such nodal points may provide a suitable location at which MEMS resonator array 120 (and/or one or more of resonator 122) may be anchored to the substrate with predetermined, minimal and/or reduced energy loss (among other things). In this regard, resonator 122, when induced, expands and contracts during oscillation. As such, the size and/or shape of resonator mass 122 may determine the location of nodal points, if any, of resonator 122 (when incorporated into the MEMS resonator array 120) whereby there is little, no or reduced rotation movement due to the expanding and contracting mode of oscillation. A finite element analysis engine may be employed to design, determine or predict the location of such nodal points based on a given size and/or shape of each resonator 122 of MEMS resonator array 120. In this way, locations that exhibit acceptable, predetermined, and/or little or no movement (radial and/or otherwise) for anchoring MEMS resonator array 120 and/or one or more resonators 122 may be rapidly determined and/or identified.

Moreover, an empirical approach may also be employed (in addition to or in lieu of a finite element analysis (or the like) approach) to design, determine, define and/or assess the dimensions, characteristics and/or parameters of (i) resonator 122, (ii) loading relief mechanisms 162, (iii) nodal point(s) 114 (if any), (iv) anchor coupling sections 166 and/or (v) stress/strain mechanisms 172. Such an empirical approach may be implemented in the context of one or more resonators 122 and/or MEMS resonator array 120.

As mentioned above, in the context of MEMS resonator array 120, a finite element analysis and simulation engine, using or based on a set of boundary conditions (for example, the size of the resonator structure), may be employed to design, determine and/or assess the dimensions, characteristics and/or parameters of (i) resonator 122 and/or (ii) nodal point(s) 114 (if any) of the resonators 122, and/or (iii) loading relief mechanisms 162, (iv) anchor coupling sections 166 and/or (v) stress/strain mechanisms 172.

Further, a thermo-mechanical finite element analysis engine may be employed to enhance any temperature considerations of resonator 122 and/or anchoring coupling sections 166 during operation. In this regard, thermo-mechanical finite element analysis engine may model the operation of MEMS resonator array 120 and/or resonators 122 and thereby determine the size, location, dimensions, and number of slots to implement in resonator 122, and/or anchoring coupling sections 166. In this way, the characteristics of MEMS resonator array 120 and/or resonators 122, having temperature management techniques implemented therein, may be enhanced and/or optimized and the TED loss minimized and/or reduced.

Thus, as mentioned above, many of the properties of the structures of the present inventions may be optimized with Finite Element Modeling (FEM), which is also known as "FEA" or "FE Analysis".

The resonators 122 may or may not include identical or substantially identical dimensions/designs (i.e., have the same or substantially the same width, thickness, height, length and/or shape). As such, resonators 122 of array 120 may have different dimensions, shapes and/or designs.

A MEMS resonator array in accordance with one or more aspects of the present inventions may be fabricated from well-known materials using well-known techniques. For example, the MEMS resonator array (including its constituent parts) may be fabricated from well-known semiconductors such as silicon, germanium, silicon-germanium or gallium-arsenide. Indeed, the MEMS resonator array may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

Moreover, a MEMS resonator array in accordance with one or more aspects of the present inventions may be formed in or on semiconductor on insulator (SOI) substrate using well-known lithographic, etching, deposition and/or doping techniques. For the sake of brevity, such fabrication techniques are not discussed herein. However, all techniques for forming or fabricating the resonator structure of the present invention, whether now known or later developed, are intended to fall within the scope of the present invention (for example, well-known formation, lithographic, etching and/or deposition techniques using a standard or over-sized ("thick") wafer (not illustrated) and/or bonding techniques (i.e., bonding two standard wafers together where the lower/bottom wafer includes a sacrificial layer (for example, silicon oxide) disposed thereon and the upper/top wafer is thereafter thinned (ground down or back) and polished to receive the mechanical structures in or on).

Notably, the SOI substrate may include a first substrate layer (for example, a semiconductor (such as silicon), glass or sapphire), a first sacrificial/insulation layer (for example, silicon dioxide or silicon nitride) and a first semiconductor layer (for example, silicon, gallium arsenide or germanium) disposed on or above the sacrificial/insulation layer. The mechanical structure may be formed using well-known lithographic, etching, deposition and/or doping techniques in or on the first semiconductor layer (for example, semiconductors such as silicon, germanium, silicon-germanium or gallium-arsenide).

In one embodiment, the SOI substrate may be a SIMOX wafer which is fabricated using well-known techniques. In another embodiment, the SOI substrate may be a conventional SOI wafer having a first semiconductor layer. In this regard, SOI substrate, having a relatively thin first semiconductor layer, may be fabricated using a bulk silicon wafer which is implanted and oxidized by oxygen to thereby form a relatively thin $SiO_2$ beneath or underneath the single or mono crystalline wafer surface. In this embodiment, the first semiconductor layer (i.e., monocrystalline silicon) is disposed on the first sacrificial/insulation layer (i.e. silicon dioxide) which is disposed on a first substrate layer (i.e., monocrystalline silicon in this example).

In those instances where the resonators of a MEMS resonator array are fabricated in or on polycrystalline silicon or monocrystalline silicon, certain geometric shaped resonator structures according to the present inventions, for example, the rounded square shaped resonator, may maintain structural and material symmetry with polycrystalline silicon or monocrystalline silicon. In particular, a rounded square shape resonator according to the present inventions may be inherently more compatible with the cubic structure of monocrystalline silicon. In each lateral orthogonal direction on a standard wafer (e.g. 100, 010, or 110), the properties of the monocrystalline silicon may be matched to one or more geometric shaped resonators. In this regard, the crystalline properties of monocrystalline silicon may have the same or suitable symmetry as the one or more geometric shaped resonator structure.

A MEMS resonator array 120 in accordance with one or more aspects of the present inventions may be packaged using a variety of techniques and materials, for example, thin film techniques, substrate bonding techniques (for example, bonding semiconductor or glass-like substrates) and prefabricated package (for example, a TO-8 "can"). Indeed, any packaging and/or fabricating techniques may be employed, whether now known or later developed; as such, all such fabrication and/or packaging techniques are intended to fall within the scope of the present invention. For example, the systems, devices and/or techniques described and illustrated in the following patent application publications and patents may be implemented:

(1) U.S. Patent Application Publication No. 20040183214 of non-provisional patent application entitled "Electromechanical System having a Controlled Atmosphere, and Method of Fabricating Same", which was filed on Mar. 20, 2003 and assigned Ser. No. 10/392,528;

(2) U.S. Patent Application Publication No. 20040248344 of non-provisional patent application entitled "Microelectromechanical Systems, and Method of Encapsulating and Fabricating Same", which was filed on Jun. 4, 2003 and assigned Ser. No. 10/454,867; and (3) U.S. Pat. No. 6,936,491 issued to Partridge et al. and entitled "Microelectromechanical Systems Having Trench Isolated Contacts, and Methods of Fabricating Same", filed on Jun. 4, 2003 and assigned Ser. No. 10/455,555.

The inventions described and illustrated in the aforementioned patent application publications and patents may be employed to fabricate resonators and the array of the present inventions. For the sake of brevity, those discussions will not be repeated. It is expressly noted, however, that the entire contents of the aforementioned patent application publications, including, for example, the features, attributes, alternatives, materials, techniques and/or advantages of all of the inventions/embodiments, are incorporated by reference herein although, unless stated otherwise, the aspects and/or embodiments of the present invention are not limited to such features, attributes alternatives, materials, techniques and/or advantages.

In some embodiments, resonator 122 has a center of gravity that remains relatively stationary or fixed during operation. For example, in some embodiments in which resonator 122 has a square shape and/or a rounded square shape resonator structure that is symmetrically anchored (see, for example, FIGS. 8A, 9B, 13A), the center of gravity of the structure may remain relatively stationary or fixed during operation. In some embodiments, the resonator 122 may statistically average Gaussian process tolerances which may provide better parameter control. For example, in some embodiments in which a resonator 122 has a square shape and/or a rounded square shape, the resonator 122 having a square shape and/or a rounded square shape resonator structure may statistically average Gaussian process tolerances which may provide better parameter control.

As mentioned above, MEMS resonator array 120 may employ any anchoring technique or anchor structure, whether now known or later developed. In addition, the stress/strain management techniques/structures (for example, stress/strain mechanisms 172) may be implemented in conjunction with any of the anchoring technique or anchor structure described and illustrated herein and/or, whether now known or later developed. For example, the substrate anchors and/or stress/strain management techniques/structures may be placed at one, some or all of nodal points, if any, and/or anchors of one or more of the resonators 122. Other substrate anchoring-stress/strain management techniques may also be suitable. Indeed, resonator 122 may be coupled to a substrate anchor (and stress/strain mechanism 172) at non-nodal points in a symmetrical or non-symmetrical manner. Notably, the anchoring-stress/strain management techniques may be implemented in conjunction with any of the embodiments described and illustrated herein. (See, for example, FIGS. 11A-11F, 12A-12C, 13A-13B, 14B, 14D, 15B, 15D, 16B, 17B, 21A-21L, 21A-21B, 22A-22D, 23A-23D and 28A-28F).

Further, the loading relief techniques/structures (for example, loading relief mechanisms 162) may also be implemented in conjunction with any of the embodiments described and illustrated herein. (See, for example, FIGS. 4H-4J, 5A-5B, 14C-14D, 15C-15D, 28A-28F).

It should be further noted that while aspects and/or embodiments of the present inventions have been described in the context of microelectromechanical systems including micromechanical structures or elements, the present inventions are not limited in this regard. Rather, the inventions described herein are applicable to other electromechanical systems including, for example, nanoelectromechanical systems. In that regard, unless specified otherwise, the term "micromechanical structure", as used hereinafter and in the claims, includes, micromechanical structures, nanomechanical structures and combinations thereof.

As used herein, the term "portion" includes, but is not limited to, a part of an integral structure and/or a separate part or parts that together with one or more other parts forms a whole element or assembly. For example, some structures may be of single piece construction or may be formed of two or more separate pieces. If the structure is of a single piece construction, the single piece may have one or more portions (i.e., any number of portions). Moreover, if a single piece has more than one portion, there may or may not be any type of demarcation between the portions. If the structure is of separate piece construction, each piece may be referred to as a portion. In addition, each of such separate pieces may itself have one or more portions. A group of separate pieces that collectively represent part of a structure may also be referred to collectively as a portion. If the structure is of separate piece construction, each piece may or may not physically contact one or more of the other pieces.

Further, in the claims, the term "slots" means openings, voids and/or slots (whether extending partially or entirely through the entire height/thickness of the elongated beam section or curved section), of any shape and/or size. Moreover, in the claims, the term "voids" means openings, voids and/or slots (whether extending partially or entirely through the entire height/thickness of the resonator coupling section), of any shape and/or size.

Further, unless otherwise stated, terms such as, for example, "in response to" and "based on" mean "in response at least to" and "based at least on", respectively, so as not to preclude being responsive to and/or based on, more than one thing.

In addition, unless stated otherwise, the phrase "differential signal", for example, as used in phrases, differential drive signal, differential sense signal and differential output signal, means a signal that includes a first signal and a second signal.

In addition, unless stated otherwise, terms such as, for example, "comprises", "has", "includes", and all forms thereof, are considered open-ended, so as not to preclude additional elements and/or features.

In addition, unless stated otherwise, terms such as, for example, "a", "one", "first", are each considered open-ended.

Notably, any of the aspects and/or embodiments disclosed herein, or portion(s) thereof, may be employed alone, in combination with any other aspect and/or embodiment disclosed herein, or portion(s) thereof, and/or in combination with any other structure(s) and/or method(s), or portion(s) thereof, now known or later developed.

Aspects and/or embodiments of the present inventions may be implemented in a wide variety of applications including, for example, timing or clock devices or clock alignment circuitry wherein a resonator or oscillator is employed. Indeed, aspects and/or embodiments of the present inventions may be implemented, for example, in any system or device where a clock signal or reference clock is employed, for example, in data, satellite and/or wireless communication systems/networks, mobile phone systems/networks, Bluetooth systems/networks, zig bee systems/networks, watches, real time clocks, set top boxes and systems/networks therefor, computer systems (for example, laptops, PCs and/or handheld devices), televisions and systems/networks therefor, consumer electronics (such as DVD player/recorder, MP3, MP2, DIVX or similar audio/video systems).

While various embodiments have been described, such description should not be interpreted in a limiting sense. Thus, for example, the various embodiments described herein are not intended to be exhaustive or to limit the inventions to the precise forms, techniques, materials and/or configurations disclosed. Other embodiments, which may be different from and/or similar to, the embodiments described herein, will be apparent from the description, illustrations and/or claims set forth below. It is to be understood that other embodiments may be utilized and operational changes may be made without departing from the scope of the present invention. Many modifications and variations are possible in light of the above teaching. Thus, it is intended that the scope of the present inventions not be limited solely to this detailed description.

What is claimed is:

1. A MEMS array structure comprising:
   a plurality of bulk mode resonators including a first bulk mode resonator and a second bulk mode resonator; and
   at least one resonator coupling section including a first resonator coupling section disposed between the first bulk mode resonator and the second bulk mode resonator to mechanically couple the first bulk mode resonator and the second bulk mode resonator;
   wherein:
      each of the first and second bulk mode resonators includes at least one respective nodal point;
      the first resonator coupling section is disposed between a specified one of the at least one nodal point of the first bulk mode resonator and a specified one of the at least one nodal point of the second bulk mode resonator; and
      each of at least one of the first and second bulk mode resonators is mechanically coupled to a substrate via or approximately at its respective specified one of the at least one nodal point.

2. The MEMS array structure of claim 1 wherein oscillation by the first bulk mode resonator induces oscillation by the second bulk mode resonator.

3. The MEMS array structure of claim 1 further including a plurality of sense electrodes to provide a sense signal indicative of oscillation of at least one of the plurality of bulk mode resonators.

4. The MEMS array structure of claim 3 wherein the sense signal comprises a differential sense signal.

5. The MEMS array structure of claim 3 further including sense circuitry to receive the sense signal and to provide an output signal in response thereto.

6. The MEMS array structure of claim 5 wherein the output signal comprises a differential output signal.

7. The MEMS array structure of claim 5 further including a plurality of drive electrodes to receive a drive signal to induce at least one of the plurality of bulk mode resonators to oscillate.

8. The MEMS array structure of claim 7 wherein the drive signal comprises a differential drive signal.

9. The MEMS array structure of claim 1 further including a first plurality of electrodes and a second plurality of electrodes, the first plurality of electrodes being disposed juxtaposed the first bulk mode resonator, the second plurality of electrodes being disposed juxtaposed the second bulk mode resonator.

10. The MEMS array structure of claim 9 wherein the first plurality of electrodes includes at least one electrode to sense oscillation of the first bulk mode resonator.

11. The MEMS array structure of claim 9 wherein the second plurality of electrodes includes at least one electrode to receive a drive signal to induce oscillation of the second bulk mode resonator.

12. The MEMS array structure of claim 9 wherein the first plurality of electrodes includes a first electrode, a second electrode, a third electrode and a fourth electrode and the second plurality of electrodes includes a first electrode, a second electrode, a third electrode and a fourth electrode.

13. The MEMS array structure of claim 9 wherein the first bulk mode resonator includes a first outer surface and a second outer surface, the second bulk mode resonator includes a first outer surface and a second outer surface, the first plurality of electrodes includes a first electrode and a second electrode, the first electrode of the first plurality of electrodes being disposed juxtaposed the first outer surface of the first bulk mode resonator, the second electrode of the first plurality of electrodes being disposed juxtaposed the second outer surface of the first bulk mode resonator, the second plurality of electrodes includes a first electrode and a second electrode, the first electrode of the second plurality of electrodes being disposed juxtaposed the first outer surface of the second bulk mode resonator, the second electrode of the second plurality of electrodes being disposed juxtaposed the second outer surface of the second bulk mode resonator.

14. The MEMS array structure of claim 13 wherein the first bulk mode resonator further includes a third outer surface, the second bulk mode resonator further includes a third outer surface, the first plurality of electrodes further includes a third electrode disposed juxtaposed the third outer surface of the first bulk mode resonator, the second plurality of electrodes further includes a third electrode disposed juxtaposed the third outer surface of the second bulk mode resonator.

15. The MEMS array structure of claim 14 wherein the first bulk mode resonator further includes a fourth outer surface, the second bulk mode resonator further includes a fourth outer surface, the first plurality of electrodes further including a fourth electrode disposed juxtaposed the fourth outer surface of the first bulk mode resonator, the second plurality of electrodes further including a fourth electrode disposed juxtaposed the fourth outer surface of the second bulk mode resonator.

16. The MEMS array structure of claim 9 further including a third bulk mode resonator and a third plurality of electrodes, the third plurality of electrodes being disposed juxtaposed the third bulk mode resonator, the at least one resonator coupling section further including a second resonator coupling section disposed between the second bulk mode resonator and the third bulk mode resonator to mechanically couple the second bulk mode resonator and the third bulk mode resonator.

17. The MEMS array structure of claim 16 wherein the third plurality of electrodes includes a first electrode, a second electrode, a third electrode and a fourth electrode.

18. The MEMS array structure of claim 17 further including a fourth bulk mode resonator and a fourth plurality of electrodes, the fourth plurality of electrodes being disposed juxtaposed the fourth bulk mode resonator, the at least one resonator coupling section further including a third resonator coupling section disposed between the third bulk mode resonator and the fourth bulk mode resonator to mechanically couple the third bulk mode resonator and the fourth bulk mode resonator.

19. The MEMS array structure of claim 18 wherein the fourth plurality of electrodes includes a first electrode, a second electrode, a third electrode and a fourth electrode.

20. The MEMS array structure of claim 9 wherein the first plurality of electrodes includes a first electrode and a second electrode, the first electrode and the first bulk mode resonator defining a capacitance, the capacitance defined by the first electrode and the first bulk mode resonator having a first magnitude if the first bulk mode resonator is in a first state of oscillation and a second magnitude if the first bulk mode resonator is in a second state of oscillation.

21. A MEMS array structure comprising:
a plurality of bulk mode resonators including a first bulk mode resonator and a second bulk mode resonator; and
at least one resonator coupling section including a first resonator coupling section disposed between the first bulk mode resonator and the second bulk mode resonator to mechanically couple the first bulk mode resonator and the second bulk mode resonator;
wherein:
each of the first and second bulk mode resonators includes at least one respective nodal point;
the first resonator coupling section is disposed between the at least one nodal point of the first bulk mode resonator and the at least one nodal point of the second bulk mode resonator;
at least one of the first and second bulk mode resonators is mechanically coupled to a substrate via or approximately at its respective at least one nodal point; and
the plurality of bulk mode resonators have a first state of oscillation in which the first bulk mode resonator is contracted, at least in part, in at least one of a first direction and a second direction, and expanded, at least in part, in at least one of a third direction and a fourth direction, and in which the second bulk mode resonator is expanded, at least in part, in at least one of the first direction and the second direction, and contracted, at least in part, in at least one of the third direction and the fourth direction, wherein the second direction is opposite the first direction, and the fourth direction is opposite the third direction.

22. The MEMS array structure of claim 21 wherein the third direction and the fourth direction are perpendicular to the first direction and the second direction.

23. The MEMS array structure of claim 22 wherein the plurality of bulk mode resonators have a second state of oscillation in which the first bulk mode resonator is expanded, at least in part, in at least one of the first direction and the second direction, and contracted, at least in part, in at least one of the third direction and the fourth direction, and the second bulk mode resonator is contracted, at least in part, in at least one of the first direction and the second direction, and expanded, at least in part, in at least one of the third direction and the fourth direction.

24. The MEMS array structure of claim 21 wherein at least one anchor coupling section mechanically couples the at least one of the bulk mode resonators to the substrate.

25. A MEMS array structure comprising:
a plurality of resonators including a first resonator and a second resonator, wherein the plurality of resonators have a first state of oscillation in which the first resonator is contracted, at least in part, in at least one of a first direction and a second direction, and expanded, at least in part, in at least one of a third direction and a fourth direction, and in which the second resonator is expanded, at least in part, in at least one of the first direction and the second direction, and contracted, at least in part, in at least one of the third direction and the fourth direction, wherein the second direction is opposite the first direction, and the fourth direction is opposite the third direction; and
at least one resonator coupling section including a first resonator coupling section disposed between the first resonator and the second resonator to mechanically couple the first resonator and the second resonator;
wherein:
each of the first and second resonators includes at least one respective nodal point;
the first resonator coupling section is disposed between the at least one nodal point of the first resonator and the at least one nodal point of the second resonator; and
each of at least one of the first and second resonators is mechanically coupled to a substrate via or approximately at its respective at least one nodal point.

26. The MEMS array structure of claim 25 wherein the third direction and the fourth direction are perpendicular to the first direction and the second direction.

27. The MEMS array structure of claim 25 wherein the plurality of resonators have a second state of oscillation in which the first resonator is expanded, at least in part, in at least one of the first direction and the second direction, and contracted, at least in part, in at least one of the third direction and the fourth direction, and the second resonator is contracted, at least in part, in at least one of the first direction and the second direction, and expanded, at least in part, in at least one of the third direction and the fourth direction.

28. The MEMS array structure of claim 27 wherein the third direction and the fourth direction are perpendicular to the first direction and the second direction.

29. A MEMS array structure comprising:
- a plurality of bulk mode resonators including a first bulk mode resonator and a second bulk mode resonator;
- a first plurality of electrodes disposed juxtaposed the first bulk mode resonator; and
- a second plurality of electrodes disposed juxtaposed the second bulk mode resonator;
- wherein:
  - at least one electrode of the first plurality of electrodes is coupled to at least one electrode of the second plurality of electrodes;
  - each of the first and second bulk mode resonators includes at least one respective nodal point;
  - a first resonator coupling section is disposed between a specified one of the at least one nodal point of the first bulk mode resonator and a specified one of the at least one nodal point of the second bulk mode resonator; and
  - each of at least one of the first and second bulk mode resonators is mechanically coupled to a substrate via or approximately at its respective specified one of the at least one nodal point.

30. The MEMS array structure of claim 29 further including circuitry coupled to the at least one electrode of the first plurality of electrodes and the at least one electrode of the second plurality of electrodes.

31. A MEMS array structure comprising:
- a plurality of bulk mode resonators including a first bulk mode resonator and a second bulk mode resonator;
- a first plurality of electrodes to receive a drive signal and induce oscillation of the first bulk mode resonator; and
- a second plurality of electrodes to receive the drive signal and induce oscillation of the second bulk mode resonator;
- wherein:
  - at least one electrode of the first plurality of electrodes is coupled to at least one electrode of the second plurality of electrodes;
  - each of the first and second bulk mode resonators includes at least one respective nodal point;
  - a first resonator coupling section is disposed between a specified one of the at least one nodal point of the first bulk mode resonator and a specified one of the at least one nodal point of the second bulk mode resonator; and
  - each of at least one of the first and second bulk mode resonators is mechanically coupled to a substrate via or approximately at its respective specified one of the at least one nodal point.

32. The MEMS array structure of claim 31 further including drive circuitry to provide the drive signal.

33. A MEMS array structure comprising:
- a plurality of bulk mode resonators including a first bulk mode resonator and a second bulk mode resonator;
- a first plurality of electrodes to sense oscillation of the first bulk mode resonator;
- a second plurality of electrodes to sense oscillation of the second bulk mode resonator; and
- wherein:
  - at least one of the first plurality of electrodes is coupled to at least one of the second plurality of electrodes;
  - each of the first and second bulk mode resonators includes at least one respective nodal point;
  - a first resonator coupling section is disposed between a specified one of the at least one nodal point of the first bulk mode resonator and a specified one of the at least one nodal point of the second bulk mode resonator; and
  - each of at least one of the first and second bulk mode resonators is mechanically coupled to a substrate via or approximately at the specified one of the at least one nodal point.

34. The MEMS array structure of claim 33 further including sense circuitry, coupled to the first plurality of electrodes and the second plurality of electrodes, to provide an output signal.

\* \* \* \* \*